United States Patent [19]
Sorrells et al.

[11] Patent Number: 6,091,940
[45] Date of Patent: Jul. 18, 2000

[54] METHOD AND SYSTEM FOR FREQUENCY UP-CONVERSION

[75] Inventors: David F. Sorrells; Michael J. Bultman, both of Jacksonville; Robert W. Cook, Switzerland; Richard C. Looke; Charley D. Moses, Jr., both of Jacksonville, all of Fla.

[73] Assignee: ParkerVision, Inc., Jacksonville, Fla.

[21] Appl. No.: 09/176,154

[22] Filed: Oct. 21, 1998

[51] Int. Cl.$^7$ ...................................................... H04B 1/04
[52] U.S. Cl. ........................ 455/118; 455/115; 375/350; 327/103
[58] Field of Search .................................. 455/115, 103, 455/102, 118, 126, 127, 129, 295; 375/285, 346, 350; 327/103, 124, 143

[56] References Cited

U.S. PATENT DOCUMENTS

| Re. 35,494 | 4/1997 | Nicollini | 327/554 |
|---|---|---|---|
| Re. 35,829 | 6/1998 | Sanderford, Jr. | 375/200 |
| 2,057,613 | 10/1936 | Gardner | 250/8 |
| 2,241,078 | 5/1941 | Vreeland | 179/15 |
| 2,270,385 | 1/1942 | Skillman | 179/15 |

(List continued on next page.)

FOREIGN PATENT DOCUMENTS

| 0 035 166 A1 | 2/1981 | European Pat. Off. | H04B 1/26 |
|---|---|---|---|
| 0 193 899 B1 | 9/1986 | European Pat. Off. | G01S 7/52 |
| 0 380 351 A2 | 8/1990 | European Pat. Off. | H03H 17/04 |
| 0 380 351 A3 | 2/1991 | European Pat. Off. | H03H 17/04 |
| 0 411 840 A2 | 2/1991 | European Pat. Off. | G01R 33/36 |

(List continued on next page.)

OTHER PUBLICATIONS

Shen, D. et al., "A 900 MHz Integrated Discrete–Time Filtering RF Front–End," IEEE International Solid State Circuits Conference, vol. 39, Feb. 1996, pp. 54–55 and 417.

Richard A. Groshong and Stephen Ruscak, "Undersampling Techniques Simplify Digital Radio," *Electronic Design*, May 23, 1993, v39, n10, p67.

Jeff Kirsten and Tarlton Fleming, "Undersampling Reduces Data–Acquisition Costs for Select Applications," *EDN*, Jun. 21, 1990, v35, n13, p217.

H.E. Rowe, *Signals and Noise in Communication Systems*, D. Van Nostrand Company, Inc., Princeton, New Jersey, 1965, including, for example, Chapter V, Pulse Modulation Systems.

(List continued on next page.)

*Primary Examiner*—Reinhard J. Eisenzopf
*Assistant Examiner*—Sam Bhattacharya
*Attorney, Agent, or Firm*—Sterne, Kessler, Goldstei & Fox P.L.L.C.

[57] ABSTRACT

A method and system is described wherein a signal with a lower frequency is up-converted to a higher frequency. In one embodiment, the higher frequency signal is used as a stable frequency and phase reference. In another embodiment, the invention is used as a transmitter. The up-conversion is accomplished by controlling a switch with an oscillating signal, the frequency of the oscillating signal being selected as a sub-harmonic of the desired output frequency. When the invention is being used as a frequency or phase reference, the oscillating signal is not modulated, and controls a switch that is connected to a bias signal. When the invention is being used in the frequency modulation (FM) or phase modulation (PM) implementations, the oscillating signal is modulated by an information signal before it causes the switch to gate the bias signal. In the amplitude modulation implementation (AM), the oscillating signal is not modulated, but rather causes the switch to gate a reference signal that is substantially equal to or proportional to the information signal. In the FM and PM implementations, the signal that is output from the switch is modulated substantially the same as the modulated oscillating signal. In the AM implementation, the signal that is output from the switch has an amplitude that is a function of the information signal. In both embodiments, the output of the switch is filtered, and the desired harmonic is output.

374 Claims, 59 Drawing Sheets

U.S. PATENT DOCUMENTS

| | | | |
|---|---|---|---|
| 2,283,575 | 5/1942 | Roberts | 250/6 |
| 2,358,152 | 9/1944 | Earp | 179/171.5 |
| 2,410,350 | 10/1946 | Labin et al. | 179/15 |
| 2,451,430 | 10/1948 | Barone | 250/8 |
| 2,462,069 | 2/1949 | Chatterjea et al. | 250/17 |
| 2,462,181 | 2/1949 | Grosselfinger | 250/17 |
| 2,472,798 | 6/1949 | Fredendall | 178/44 |
| 2,497,859 | 2/1950 | Boughtwood et al. | 250/8 |
| 2,499,279 | 2/1950 | Peterson | 332/41 |
| 2,802,208 | 8/1957 | Hobbs | 343/176 |
| 2,985,875 | 5/1961 | Grisdale et al. | 343/100 |
| 3,023,309 | 2/1962 | Foulkes | 250/17 |
| 3,069,679 | 12/1962 | Sweeney et al. | 343/200 |
| 3,104,393 | 9/1963 | Vogelman | 343/200 |
| 3,114,106 | 12/1963 | McManus | 325/56 |
| 3,118,117 | 1/1964 | King et al. | 332/22 |
| 3,226,643 | 12/1965 | McNair | 325/40 |
| 3,258,694 | 6/1966 | Shepherd | 325/145 |
| 3,383,598 | 5/1968 | Sanders | 325/163 |
| 3,384,822 | 5/1968 | Miyagi | 325/30 |
| 3,454,718 | 7/1969 | Perreault | 178/66 |
| 3,523,291 | 8/1970 | Pierret | 340/347 |
| 3,548,342 | 12/1970 | Maxey | 332/9 |
| 3,555,428 | 1/1971 | Perreault | 325/320 |
| 3,617,892 | 11/1971 | Hawley et al. | 325/145 |
| 3,621,402 | 11/1971 | Gardner | 328/37 |
| 3,623,160 | 11/1971 | Giles et al. | 340/347 DA |
| 3,626,417 | 12/1971 | Gilbert | 343/203 |
| 3,629,696 | 12/1971 | Bartelink | 324/57 R |
| 3,662,268 | 5/1972 | Gans et al. | 325/56 |
| 3,689,841 | 9/1972 | Bello et al. | 325/39 |
| 3,714,577 | 1/1973 | Hayes | 325/145 |
| 3,717,844 | 2/1973 | Barret et al. | 340/5 R |
| 3,735,048 | 5/1973 | Tomsa et al. | 179/15 BM |
| 3,806,811 | 4/1974 | Thompson | 325/146 |
| 3,868,601 | 2/1975 | MacAfee | 332/45 |
| 3,949,300 | 4/1976 | Sadler | 325/31 |
| 3,967,202 | 6/1976 | Batz | 325/31 |
| 3,980,945 | 9/1976 | Bickford | 325/30 |
| 3,987,280 | 10/1976 | Bauer | 235/150.53 |
| 3,991,277 | 11/1976 | Hirata | 179/15 FD |
| 4,003,002 | 1/1977 | Snijders et al. | 332/10 |
| 4,013,966 | 3/1977 | Campbell | 325/363 |
| 4,019,140 | 4/1977 | Swerdlow | 322/65 |
| 4,035,732 | 7/1977 | Lohrmann | 325/446 |
| 4,047,121 | 9/1977 | Campbell | 331/76 |
| 4,066,841 | 1/1978 | Young | 178/6 R |
| 4,066,919 | 1/1978 | Huntington | 307/353 |
| 4,081,748 | 3/1978 | Batz | 325/56 |
| 4,130,765 | 12/1978 | Arakelian et al. | 307/220 R |
| 4,130,806 | 12/1978 | Van Gerwen et al. | 325/487 |
| 4,142,155 | 2/1979 | Adachi | 325/47 |
| 4,170,764 | 10/1979 | Salz et al. | 332/17 |
| 4,204,171 | 5/1980 | Sutphin, Jr. | 328/167 |
| 4,210,872 | 7/1980 | Gregorian | 330/9 |
| 4,245,355 | 1/1981 | Pascoe et al. | 455/326 |
| 4,253,066 | 2/1981 | Fisher et al. | 329/50 |
| 4,253,069 | 2/1981 | Nossek | 330/107 |
| 4,308,614 | 12/1981 | Fisher et al. | 370/119 |
| 4,320,361 | 3/1982 | Kikkert | 332/16 R |
| 4,320,536 | 3/1982 | Dietrich | 455/325 |
| 4,346,477 | 8/1982 | Gordy | 455/257 |
| 4,355,401 | 10/1982 | Ikoma et al. | 375/5 |
| 4,356,558 | 10/1982 | Owen et al. | 364/724 |
| 4,360,867 | 11/1982 | Gonda | 363/158 |
| 4,363,132 | 12/1982 | Collin | 455/52 |
| 4,365,217 | 12/1982 | Berger et al. | 333/165 |
| 4,370,572 | 1/1983 | Cosand et al. | 307/353 |
| 4,389,579 | 6/1983 | Stein | 307/353 |
| 4,392,255 | 7/1983 | Del Giudice | 455/328 |
| 4,430,629 | 2/1984 | Betzl et al. | 333/165 |
| 4,446,438 | 5/1984 | Chang et al. | 328/127 |
| 4,456,990 | 6/1984 | Fisher et al. | 370/119 |
| 4,472,785 | 9/1984 | Kasuga | 364/718 |
| 4,479,226 | 10/1984 | Prabhu et al. | 375/1 |
| 4,481,490 | 11/1984 | Huntley | 332/41 |
| 4,481,642 | 11/1984 | Hanson | 375/9 |
| 4,485,488 | 11/1984 | Houdart | 455/327 |
| 4,504,803 | 3/1985 | Lee et al. | 332/31 R |
| 4,517,519 | 5/1985 | Mukaiyama | 329/126 |
| 4,517,520 | 5/1985 | Ogawa | 329/145 |
| 4,518,935 | 5/1985 | van Roermund | 333/173 |
| 4,521,892 | 6/1985 | Vance et al. | 375/88 |
| 4,563,773 | 1/1986 | Dixon, Jr. et al. | 455/327 |
| 4,577,157 | 3/1986 | Reed | 329/50 |
| 4,583,239 | 4/1986 | Vance | 375/94 |
| 4,591,736 | 5/1986 | Hirao et al. | 307/267 |
| 4,602,220 | 7/1986 | Kurihara | 331/19 |
| 4,603,300 | 7/1986 | Welles, II et al. | 329/50 |
| 4,612,464 | 9/1986 | Ishikawa et al. | 307/496 |
| 4,612,518 | 9/1986 | Gans et al. | 332/21 |
| 4,616,191 | 10/1986 | Galani et al. | 331/4 |
| 4,621,217 | 11/1986 | Saxe et al. | 315/1 |
| 4,628,517 | 12/1986 | Schwarz et al. | 375/40 |
| 4,634,998 | 1/1987 | Crawford | 331/1 A |
| 4,648,021 | 3/1987 | Alberkrack | 363/157 |
| 4,651,034 | 3/1987 | Sato | 307/556 |
| 4,675,882 | 6/1987 | Lillie et al. | 375/80 |
| 4,688,253 | 8/1987 | Gumm | 381/7 |
| 4,716,376 | 12/1987 | Daudelin | 329/107 |
| 4,716,388 | 12/1987 | Jacobs | 333/173 |
| 4,718,113 | 1/1988 | Rother et al. | 455/209 |
| 4,726,041 | 2/1988 | Prohaska et al. | 375/91 |
| 4,733,403 | 3/1988 | Simone | 375/103 |
| 4,734,591 | 3/1988 | Ichitsubo | 307/219.1 |
| 4,737,969 | 4/1988 | Steel et al. | 375/67 |
| 4,743,858 | 5/1988 | Everard | 330/10 |
| 4,745,463 | 5/1988 | Lu | 358/23 |
| 4,751,468 | 6/1988 | Agoston | 328/133 |
| 4,757,538 | 7/1988 | Zink | 381/7 |
| 4,768,187 | 8/1988 | Marshall | 370/69.1 |
| 4,769,612 | 9/1988 | Tamakoshi et al. | 328/167 |
| 4,785,463 | 11/1988 | Janc et al. | 375/1 |
| 4,791,584 | 12/1988 | Greivenkamp, Jr. | 364/525 |
| 4,801,823 | 1/1989 | Yokoyama | 307/353 |
| 4,806,790 | 2/1989 | Sone | 307/353 |
| 4,810,904 | 3/1989 | Crawford | 307/353 |
| 4,810,976 | 3/1989 | Cowley et al. | 331/117 R |
| 4,811,362 | 3/1989 | Yester, Jr. et al. | 375/75 |
| 4,819,252 | 4/1989 | Christopher | 375/122 |
| 4,833,445 | 5/1989 | Buchele | 341/118 |
| 4,862,121 | 8/1989 | Hochschild et al. | 333/173 |
| 4,868,654 | 9/1989 | Juri et al. | 358/133 |
| 4,870,659 | 9/1989 | Oishi et al. | 375/82 |
| 4,871,987 | 10/1989 | Kawase | 332/100 |
| 4,885,587 | 12/1989 | Wiegand et al. | 42/14 |
| 4,885,756 | 12/1989 | Fontanes et al. | 375/82 |
| 4,888,557 | 12/1989 | Puckette, IV et al. | 329/341 |
| 4,890,302 | 12/1989 | Muilwijk | 375/80 |
| 4,893,316 | 1/1990 | Janc et al. | 375/44 |
| 4,893,341 | 1/1990 | Gehring | 381/7 |
| 4,894,766 | 1/1990 | De Agro | 363/159 |
| 4,896,152 | 1/1990 | Tiemann | 340/853 |
| 4,902,979 | 2/1990 | Puckette, IV | 329/343 |
| 4,908,579 | 3/1990 | Tawfik et al. | 328/167 |
| 4,910,752 | 3/1990 | Yester, Jr. et al. | 375/75 |
| 4,914,405 | 4/1990 | Wells | 331/25 |
| 4,920,510 | 4/1990 | Senderowicz et al. | 364/825 |
| 4,922,452 | 5/1990 | Larsen et al. | 365/45 |
| 4,931,921 | 6/1990 | Anderson | 363/163 |
| 4,944,025 | 7/1990 | Gehring et al. | 455/207 |
| 4,955,079 | 9/1990 | Connerney et al. | 455/325 |

| Patent | Date | Inventor | Class |
|---|---|---|---|
| 4,965,467 | 10/1990 | Bilterijst | 307/352 |
| 4,967,160 | 10/1990 | Quievy et al. | 328/16 |
| 4,970,703 | 11/1990 | Hariharan et al. | 367/138 |
| 4,982,353 | 1/1991 | Jacob et al. | 364/724.1 |
| 4,984,077 | 1/1991 | Uchida | 358/140 |
| 4,995,055 | 2/1991 | Weinberger et al. | 375/5 |
| 5,005,169 | 4/1991 | Bronder et al. | 370/76 |
| 5,006,810 | 4/1991 | Popescu | 328/167 |
| 5,010,585 | 4/1991 | Garcia | 455/118 |
| 5,014,304 | 5/1991 | Nicollini et al. | 379/399 |
| 5,015,963 | 5/1991 | Sutton | 329/361 |
| 5,017,924 | 5/1991 | Guiberteau et al. | 342/195 |
| 5,020,149 | 5/1991 | Hemmie | 455/325 |
| 5,020,154 | 5/1991 | Zierhut | 455/608 |
| 5,052,050 | 9/1991 | Collier et al. | 455/296 |
| 5,065,409 | 11/1991 | Hughes et al. | 375/91 |
| 5,083,050 | 1/1992 | Vasile | 307/529 |
| 5,091,921 | 2/1992 | Minami | 375/88 |
| 5,095,533 | 3/1992 | Loper et al. | 455/245 |
| 5,095,536 | 3/1992 | Loper | 455/324 |
| 5,111,152 | 5/1992 | Makino | 329/300 |
| 5,113,094 | 5/1992 | Grace et al. | 307/529 |
| 5,113,129 | 5/1992 | Hughes | 323/316 |
| 5,122,765 | 6/1992 | Pataut | 332/105 |
| 5,124,592 | 6/1992 | Hagino | 307/520 |
| 5,136,267 | 8/1992 | Cabot | 333/174 |
| 5,140,705 | 8/1992 | Kosuga | 455/318 |
| 5,150,124 | 9/1992 | Moore et al. | 342/68 |
| 5,151,661 | 9/1992 | Caldwell et al. | 328/14 |
| 5,159,710 | 10/1992 | Cusdin | 455/304 |
| 5,170,414 | 12/1992 | Silvian | 375/59 |
| 5,172,070 | 12/1992 | Hiraiwa et al. | 329/304 |
| 5,191,459 | 3/1993 | Thompson et al. | 359/133 |
| 5,204,642 | 4/1993 | Ashgar et al. | 331/135 |
| 5,212,827 | 5/1993 | Meszko et al. | 455/219 |
| 5,214,787 | 5/1993 | Karkota, Jr. | 455/3.2 |
| 5,220,583 | 6/1993 | Solomon | 375/82 |
| 5,220,680 | 6/1993 | Lee | 455/102 |
| 5,222,144 | 6/1993 | Whikehart | 381/15 |
| 5,230,097 | 7/1993 | Currie et al. | 455/226.1 |
| 5,239,686 | 8/1993 | Downey | 455/78 |
| 5,241,561 | 8/1993 | Barnard | 375/1 |
| 5,249,203 | 9/1993 | Loper | 375/97 |
| 5,251,218 | 10/1993 | Stone et al. | 370/120 |
| 5,251,232 | 10/1993 | Nonami | 375/5 |
| 5,260,970 | 11/1993 | Henry et al. | 375/10 |
| 5,263,194 | 11/1993 | Ragan | 455/316 |
| 5,263,196 | 11/1993 | Jasper | 455/324 |
| 5,267,023 | 11/1993 | Kawasaki | 358/23 |
| 5,278,826 | 1/1994 | Murphy et al. | 370/76 |
| 5,282,023 | 1/1994 | Scarpa | 358/36 |
| 5,287,516 | 2/1994 | Schaub | 375/88 |
| 5,293,398 | 3/1994 | Hamao et al. | 375/1 |
| 5,303,417 | 4/1994 | Laws | 455/314 |
| 5,307,517 | 4/1994 | Rich | 455/306 |
| 5,315,583 | 5/1994 | Murphy et al. | 370/18 |
| 5,321,852 | 6/1994 | Seong | 455/182.1 |
| 5,325,204 | 6/1994 | Scarpa | 348/607 |
| 5,337,014 | 8/1994 | Najle et al. | 324/613 |
| 5,339,054 | 8/1994 | Taguchi | 332/100 |
| 5,339,459 | 8/1994 | Schiltz et al. | 455/333 |
| 5,355,114 | 10/1994 | Sutterlin et al. | 340/310 A |
| 5,361,408 | 11/1994 | Watanabe et al. | 455/324 |
| 5,369,800 | 11/1994 | Takagi et al. | 455/59 |
| 5,375,146 | 12/1994 | Chalmers | 375/103 |
| 5,379,040 | 1/1995 | Mizomoto et al. | 341/143 |
| 5,379,141 | 1/1995 | Thompson et al. | 359/125 |
| 5,388,063 | 2/1995 | Takatori et al. | 364/724.17 |
| 5,390,364 | 2/1995 | Webster et al. | 455/52.3 |
| 5,400,084 | 3/1995 | Scarpa | 348/624 |
| 5,404,127 | 4/1995 | Lee et al. | 340/310.02 |
| 5,410,541 | 4/1995 | Hotto | 370/76 |
| 5,410,743 | 4/1995 | Seely et al. | 455/326 |
| 5,412,352 | 5/1995 | Graham | 332/103 |
| 5,416,803 | 5/1995 | Janer | 375/324 |
| 5,422,913 | 6/1995 | Wilkinson | 375/347 |
| 5,423,082 | 6/1995 | Cygan et al. | 455/126 |
| 5,428,638 | 6/1995 | Cioffi et al. | 375/224 |
| 5,428,640 | 6/1995 | Townley | 375/257 |
| 5,434,546 | 7/1995 | Palmer | 332/151 |
| 5,438,692 | 8/1995 | Mohindra | 455/324 |
| 5,444,415 | 8/1995 | Dent et al. | 329/302 |
| 5,444,416 | 8/1995 | Ishikawa et al. | 329/341 |
| 5,444,865 | 8/1995 | Heck et al. | 455/86 |
| 5,446,421 | 8/1995 | Kechkaylo | 332/100 |
| 5,446,422 | 8/1995 | Mattila et al. | 332/103 |
| 5,448,602 | 9/1995 | Ohmori et al. | 375/347 |
| 5,451,899 | 9/1995 | Lawton | 329/302 |
| 5,454,007 | 9/1995 | Dutta | 375/322 |
| 5,454,009 | 9/1995 | Fruit et al. | 372/202 |
| 5,463,356 | 10/1995 | Palmer | 332/117 |
| 5,463,357 | 10/1995 | Hobden | 332/151 |
| 5,465,071 | 11/1995 | Kobayashi et al. | 329/315 |
| 5,465,410 | 11/1995 | Hiben et al. | 455/266 |
| 5,465,415 | 11/1995 | Bien | 455/326 |
| 5,471,162 | 11/1995 | McEwan | 327/92 |
| 5,479,120 | 12/1995 | McEwan | 327/91 |
| 5,479,447 | 12/1995 | Chow et al. | 375/260 |
| 5,483,193 | 1/1996 | Kennedy et al. | 329/300 |
| 5,483,549 | 1/1996 | Weinberg et al. | 375/200 |
| 5,483,691 | 1/1996 | Heck et al. | 455/234.2 |
| 5,490,173 | 2/1996 | Whikehart et al. | 375/316 |
| 5,493,581 | 2/1996 | Young et al. | 375/350 |
| 5,493,721 | 2/1996 | Reis | 455/339 |
| 5,495,200 | 2/1996 | Kwan et al. | 327/554 |
| 5,495,202 | 2/1996 | Hsu | 327/113 |
| 5,495,500 | 2/1996 | Jovanovich et al. | 375/206 |
| 5,499,267 | 3/1996 | Ohe et al. | 375/206 |
| 5,500,758 | 3/1996 | Thompson et al. | 359/189 |
| 5,517,688 | 5/1996 | Fajen et al. | 455/333 |
| 5,519,890 | 5/1996 | Pinckley | 455/307 |
| 5,523,719 | 6/1996 | Longo et al. | 327/557 |
| 5,523,726 | 6/1996 | Kroeger et al. | 332/103 |
| 5,523,760 | 6/1996 | McEwan | 342/89 |
| 5,539,770 | 7/1996 | Ishigaki | 375/206 |
| 5,555,453 | 9/1996 | Kajimoto et al. | 455/266 |
| 5,557,641 | 9/1996 | Weinberg | 375/295 |
| 5,557,642 | 9/1996 | Williams | 375/316 |
| 5,579,341 | 11/1996 | Smith et al. | 375/267 |
| 5,579,347 | 11/1996 | Lindquist et al. | 375/346 |
| 5,584,068 | 12/1996 | Mohindra | 455/324 |
| 5,592,131 | 1/1997 | Labreche et al. | 332/103 |
| 5,602,847 | 2/1997 | Pagano et al. | 370/484 |
| 5,602,868 | 2/1997 | Wilson | 375/219 |
| 5,604,732 | 2/1997 | Kim et al. | 370/342 |
| 5,608,531 | 3/1997 | Honda et al. | 386/1 |
| 5,610,946 | 3/1997 | Tanaka et al. | 375/269 |
| 5,617,451 | 4/1997 | Mimura et al. | 375/340 |
| 5,619,538 | 4/1997 | Sempel et al. | 375/328 |
| 5,621,455 | 4/1997 | Rogers et al. | 348/6 |
| 5,630,227 | 5/1997 | Bella et al. | 455/324 |
| 5,640,415 | 6/1997 | Pandula | 375/202 |
| 5,640,424 | 6/1997 | Banavong et al. | 375/316 |
| 5,640,428 | 6/1997 | Abe et al. | 375/334 |
| 5,640,698 | 6/1997 | Shen et al. | 455/323 |
| 5,648,985 | 7/1997 | Bjerede et al. | 375/219 |
| 5,650,785 | 7/1997 | Rodal | 342/357 |
| 5,661,424 | 8/1997 | Tang | 327/105 |
| 5,663,878 | 9/1997 | Walker | 363/159 |
| 5,663,986 | 9/1997 | Striffler | 375/260 |
| 5,668,835 | 9/1997 | Smith et al. | 375/316 |
| 5,680,078 | 10/1997 | Ariie | 332/178 |
| 5,680,418 | 10/1997 | Croft et al. | 375/346 |
| 5,689,413 | 11/1997 | Jaramillo et al. | 363/146 |

| | | | |
|---|---|---|---|
| 5,699,006 | 12/1997 | Zele et al. | 327/341 |
| 5,705,955 | 1/1998 | Freeburg et al. | 331/14 |
| 5,710,998 | 1/1998 | Opas | 455/324 |
| 5,714,910 | 2/1998 | Skoczen et al. | 331/3 |
| 5,715,281 | 2/1998 | Bly et al. | 375/344 |
| 5,721,514 | 2/1998 | Crockett et al. | 331/3 |
| 5,724,002 | 3/1998 | Hulick | 329/361 |
| 5,724,653 | 3/1998 | Baker et al. | 455/296 |
| 5,729,577 | 3/1998 | Chen | 375/334 |
| 5,729,829 | 3/1998 | Talwar et al. | 455/63 |
| 5,732,333 | 3/1998 | Cox et al. | 455/129 |
| 5,736,895 | 4/1998 | Yu et al. | 327/554 |
| 5,737,035 | 4/1998 | Rotzoll | 348/725 |
| 5,742,189 | 4/1998 | Yoshida et al. | 327/113 |
| 5,748,683 | 5/1998 | Smith et al. | 375/347 |
| 5,760,645 | 6/1998 | Comte et al. | 329/304 |
| 5,764,087 | 6/1998 | Clark | 327/105 |
| 5,767,726 | 6/1998 | Wang | 327/356 |
| 5,768,118 | 6/1998 | Faulk et al. | 363/72 |
| 5,771,442 | 6/1998 | Wang et al. | 455/93 |
| 5,777,692 | 7/1998 | Ghosh | 348/725 |
| 5,777,771 | 7/1998 | Smith | 359/180 |
| 5,786,844 | 7/1998 | Rogers et al. | 348/6 |
| 5,793,801 | 8/1998 | Fertner | 375/219 |
| 5,802,463 | 9/1998 | Zuckerman | 455/208 |
| 5,809,060 | 9/1998 | Cafarella et al. | 375/204 |
| 5,818,582 | 10/1998 | Fernandez et al. | 356/318 |
| 5,825,254 | 10/1998 | Lee | 331/25 |
| 5,834,985 | 11/1998 | Sundegård | 332/100 |
| 5,864,754 | 1/1999 | Hotto | 455/280 |
| 5,881,375 | 3/1999 | Bonds | 455/118 |
| 5,892,380 | 4/1999 | Quist | 327/172 |
| 5,894,239 | 4/1999 | Bonaccio et al. | 327/176 |
| 5,896,562 | 4/1999 | Heinonen | 455/76 |
| 5,900,747 | 5/1999 | Brauns | 327/9 |
| 5,901,054 | 5/1999 | Leu et al. | 363/41 |
| 5,901,187 | 5/1999 | Iinuma | 375/347 |
| 5,901,344 | 5/1999 | Opas | 455/76 |
| 5,901,347 | 5/1999 | Chambers et al. | 455/234.1 |
| 5,901,348 | 5/1999 | Bang et al. | 455/254 |
| 5,901,349 | 5/1999 | Guegnaud et al. | 455/302 |
| 5,903,178 | 5/1999 | Miyatsuji et al. | 327/308 |
| 5,903,187 | 5/1999 | Claverie et al. | 329/342 |
| 5,903,196 | 5/1999 | Salvi et al. | 331/16 |
| 5,903,421 | 5/1999 | Furutani et al. | 361/58 |
| 5,903,553 | 5/1999 | Sakamoto et al. | 370/338 |
| 5,903,595 | 5/1999 | Suzuki | 375/207 |
| 5,903,609 | 5/1999 | Kool et al. | 375/261 |
| 5,903,827 | 5/1999 | Kennan et al. | 455/326 |
| 5,903,854 | 5/1999 | Abe et al. | 455/575 |
| 5,905,449 | 5/1999 | Tsubouchi et al. | 340/825.69 |
| 5,907,149 | 5/1999 | Marckini | 235/487 |
| 5,907,197 | 5/1999 | Faulk | 307/119 |
| 5,911,116 | 6/1999 | Nosswitz | 455/83 |
| 5,911,123 | 6/1999 | Shaffer et al. | 455/554 |
| 5,914,622 | 6/1999 | Inoue | 327/172 |
| 5,920,199 | 7/1999 | Sauer | 324/678 |
| 5,943,370 | 8/1999 | Smith | 375/334 |

FOREIGN PATENT DOCUMENTS

| | | | |
|---|---|---|---|
| 0 411 840 A3 | 2/1991 | European Pat. Off. | G01R 33/36 |
| 0 423 718 A2 | 4/1991 | European Pat. Off. | H04N 7/01 |
| 0 423 718 A3 | 4/1991 | European Pat. Off. | H04N 7/01 |
| 0 486 095 A1 | 5/1992 | European Pat. Off. | H03D 3/00 |
| 0 512 748 A2 | 11/1992 | European Pat. Off. | H04N 9/64 |
| 0 512 748 A3 | 11/1992 | European Pat. Off. | H04N 9/64 |
| 0 548 542 A1 | 6/1993 | European Pat. Off. | H03B 19/14 |
| 0 632 288 A2 | 1/1995 | European Pat. Off. | G01S 13/75 |
| 0 411 840 B1 | 10/1995 | European Pat. Off. | G01R 33/36 |
| 0 696 854 A1 | 2/1996 | European Pat. Off. | H04B 1/26 |
| 0 632 288 A3 | 7/1996 | European Pat. Off. | G01S 13/75 |
| 0 486 095 B1 | 2/1997 | European Pat. Off. | H03D 3/00 |
| 0 782 275 A2 | 7/1997 | European Pat. Off. | H04B 7/02 |
| 0 785 635 A1 | 7/1997 | European Pat. Off. | H04B 1/713 |
| 0 795 978 A2 | 9/1997 | European Pat. Off. | H04L 5/06 |
| 0 837 565 A1 | 4/1998 | European Pat. Off. | H04B 1/69 |
| 0 862 274 A1 | 9/1998 | European Pat. Off. | H03M 1/06 |
| 0 874 499 A2 | 10/1998 | European Pat. Off. | H04L 25/64 |
| 0 512 748 B1 | 11/1998 | European Pat. Off. | H04N 9/64 |
| 2 743 231 A1 | 7/1997 | France | H04B 7/12 |
| 42 37 692 C1 | 3/1994 | Germany | H04B 1/26 |
| 3-39632 | 2/1990 | Japan | H04B 7/12 |
| 2-131629 | 5/1990 | Japan | H04B 7/12 |
| 2-276351 | 11/1990 | Japan | H04L 27/22 |
| 2 161 344 | 1/1986 | United Kingdom | H04B 7/12 |
| 2 215 945 | 9/1989 | United Kingdom | G04L 27/00 |
| WO 80/01633 | 8/1980 | WIPO | H04J 1/08 |
| WO 94/05087 | 3/1994 | WIPO | H03M 1/00 |
| WO 96/02977 | 2/1996 | WIPO | H04B 1/26 |
| WO 96/08078 | 3/1996 | WIPO | H03D 3/00 |
| WO 96/39750 | 12/1996 | WIPO | H04B 1/26 |
| WO 97/38490 | 10/1997 | WIPO | H03K 7/00 |
| WO 98/00953 | 1/1998 | WIPO | H04L 27/26 |
| WO 98/24201 | 6/1998 | WIPO | H04H 1/00 |

OTHER PUBLICATIONS

Akers, N.P. et al., "RF Sampling Gates: a Brief Review," IEE Proc., vol. 133, Part A, No. 1, Jan. 1986, pp. 45–49.

Faulkner, N.D. and Vilar, E., "Subharmonic Sampling for the Measurement of Short Term Stability of Microwave Oscillators," *IEEE Trans. On Instrumentation and Measurement*, vol. IM–32, No. 1, Mar. 1983, pp. 208–213.

Itakura, T., "Effects of the sampling pulse width on the frequency of characteristics of a sample–and–hold circuit," IEE Proceedings—Circuits, Devices and Systems, Aug. 1994, vol. 141, No. 4, pp. 328–336.

Oppenheim, A.V. et al., *Signals and Systems*, Prentice–Hall, 1983, pp. 527–531 and 561–562.

Razavi, B., *RF Microelectronics*, Prentice–Hall, 1998, pp. 147–149.

Russell, R. and Hoare, L., "Millimeter Wave Phase Locked Oscillators," Military Microwaves '78 Conference Proceedings, Oct. 25–27, 1978, pp. 238–242.

Vollmer, A., "Complete GPS Receiver Fits on Two Chips," *Electronic Design*, Jul. 6, 1998, pp. 50, 52, 54, 56.

Chan, P. et al., "A Highly Linear 1–Ghz CMOS Downconversion Mixer," European Solid State Circuits Conference, Seville, Spain, Sep. 22–24, 1993, pp. 210–213.

Pärssinen, A. et al., "A 2–Ghz Subharmonic Sampler for Signal Downconversion," *IEEE Trans On Microwave Theory and Techniques*, vol. 45, No. 12, Dec. 1997, (7 Pages).

Thomas, G.B., "Calculus and Analytic Geometry, "Third Edition, Addison–Wesley Publishing, 1960, pp. 119–133.

Wang, H., "A 1–V Multigigahertz RF Mixer Core in 0.5–$\mu m$ CMOS," *IEEE*, Jul. 1, 1998, 3 pages.

Weast, R.C. et al. (Ed.), *Handbook of Mathematical Tables*, Second Edition, The Chemical Rubber Co., 1964, pp. 480–485.

EPO Search Report for U.S. application No. 09/176,154; Completed Mar. 11, 1999, 3 pages.

Press Release, "Parkervision, Inc. Announces Fiscal 1993 Results," 2 pages, Apr. 6, 1994.

Press Release, "Parkervision, Inc. Announces the Appointment of Michael Baker to the New Position of National Sales Manager," 1 Page, Apr. 7, 1994.

Press Release, "Parkervision's Cameraman Well–Received by Distance Learning Market," 2 Pages, Apr. 8, 1994.

Press Release, "Parkervision, Inc. Announces First Quarter Financial Results," 2 Pages, Apr. 26, 1994.
Press Release, "Parkervision, Inc. Announces The Retirement of William H. Fletcher, Chief Financial Officer," 1 Page, May 11, 1994.
Press Release, "Parkervision, Inc. Announces New Cameraman System II™ At Infocom Trade Show," 3 Pages, Jun. 9, 1994.
Press Release, "Parkevision, Inc. Announces Appointments to its National Sales Force," 2 Pages, Jun. 17, 1994.
Press Release, "Parkervision, Inc. Announces Second Quarter and Six Months Financial Results," 3 Pages, Aug. 9, 1994.
Press Release, "Parkervision, Inc. Announces Third Quarter and Nine Months Financial Results," 3 Pages, Oct. 28, 1994.
Press Release, "Parkervision, Inc. Announces First Significant Dealer Sale of Its Cameraman® System II," 2 Pages, Nov. 7, 1994.
Press Release, "Parkervision, Inc. Announces Fourth Quarter and Year End Results," 2 Pages, Mar. 1, 1995.
Press Release, "Parkervision, Inc. Announces Joint Product Developments With VTEL," 2 Pages, Mar. 21, 1995.
Press Release, "Parkervision, Inc. Announces First Quarter Financial Results," 3 Pages, Apr. 28, 1995.
Press Release, "Parkervision Wins Top 100 Product Districts' Choice Award," 1 Page, Jun. 29, 1995.
Press Release, "Parkervision National Sales Manager Next President of USDLA," 1 Page, Jul. 6, 1995.
Press Release, "Parkervision Granted New Patent," 1 Page, Jul. 21, 1995.
Press Release, "Parkervision, Inc. Announces Second Quarter and Six Months Financial Results," 2 Pages, Jul. 31, 1995.
Press Release, "Parkervision, Inc. Expands Its Cameraman System II Product Line," 2 Pages, Sep. 22, 1995.
Press Release, "Parkervision Announces New Camera Control Technology," 2 Pages, Oct. 25, 1995.
Press Release, "Parkervision, Inc. Announces Completion of VTEL/Parkervision Joint Product Line," 2 Pages, Oct. 30, 1995.
Press Release, "Parkervision, Inc. Announces Third Quarter and Nine Months Financial Results," 2 Pages, Oct. 30, 1995.
Press Release, "Parkervision's Cameraman Personal Locator Camera System Wins Telecon XV Award," 2 Pages, Nov. 1, 1995.
Press Release, "Parkervision, Inc. Announces Purchase Commitment From VTEL Corporation," 1 Page, Feb. 26, 1996.
Press Release, "ParkerVision, Inc. Announces Fourth Quarter and Year End Results," 2 Pages, Feb. 27, 1996.
Press Release, "ParkerVision, Inc. Expands its Product Line," 2 Pages, Mar. 7, 1996.
Press Release, "ParkerVision Files Patents for its Research of Wireless Technology," 1 Page, Mar. 28, 1996.
Press Release, "Parkervision, Inc. Announces First Significant Sale of Its Cameraman® Three Chip System," 2 pages, Apr. 12, 1996.
Press Release, "Parkervision, Inc. Introduces New Product Line For Studio Production Market," 2 Pages, Apr. 15, 1996.
Press Release, "Parkervision, Inc. Announces Private Placement of 800,000 Shares," 1 Page, Apr. 15, 1996.
Press Release, "Parkervision, Inc. Announces First Quarter Financial Results," 3 Pages, Apr. 30, 1996.
Press Release, "ParkerVision's New Studio Product Wins Award," 2 Pages, Jun. 5, 1996.
Press Release, "Parkervision, Inc. Announces Second Quarter and Six Months Financial Results," 3 Pages, Aug. 1, 1996.
Press Release, "Parkervision, Inc. Announces Third Quarter and Nine Months Financial Results," 2 Pages, Oct. 29, 1996.
Press Release, "PictureTel and ParkerVision Sign Reseller Agreement," 2 Pages, Oct. 30, 1996.
Press Release, "CLI and ParkerVision Bring Enhanced Ease–of–Use to Videoconferencing," 2 Pages, Jan. 20, 1997.
Press Release, "Parkervision, Inc. Announces Fourth Quarter and Year End Results," 3 Pages, Feb. 27, 1997.
Press Release, "Parkervision, Inc. Announces First Quarter Financial Results," 3 Pages, Apr. 29, 1997.
Press Release, "NEC and Parkervision Make Distance Learning Closer," 2 Pages, Jun. 18, 1997.
Press Release, "Parkervision Supplies JPL with Robotic Cameras, Cameraman Shot Director for Mars Mission," 2 pages, Jul. 8, 1997.
Press Release, "ParkerVision and IBM Join Forces to Create Wireless Computer Peripherals," 2 Pages, Jul. 23, 1997.
Press Release, "Parkervision, Inc. Announces Second Quarter and Six Months Financial Results," 3 Pages, Jul. 31, 1997.
Press Release, "Parkervision, Inc. Announces Private Placement of 990,000 Shares," 2 Pages, Sep. 8, 1997.
Press Release, "Wal–Mart Chooses Parkervision for Broadcast Production," 2 Pages, Oct. 24, 1997.
Press Release, "Parkervision, Inc. Announces Third Quarter Financial Results," 3 Pages, Oct. 30, 1997.
Press Release, "ParkerVision, Inc. Announces Breakthrough in Wireless Radio Frequency Technology," 3 Pages, Dec. 10, 1997.
Press Release, "Parkervision, Inc. Announces the Appointment of Joseph F. Skovron to the Position of Vice President, Licensing—Wireless Technologies," 2 Pages, Jan. 9, 1998.
Press Release, "Parkervision Announces Existing Agreement with IBM Terminates—Company Continues with Strategic Focus Announced in Dec.," 2 Pages, Jan. 27, 1998.
Press Release, "Laboratory Tests Verify Parkervision Wireless Technology," 2 Pages, Mar. 3, 1998.
Press Release, "Parkervision, Inc. Announces Fourth Quarter and Year End Financial Results," 3 Pages, Mar. 5, 1998.
Press Release, "Parkervision Awarded Editors' Pick of Show for NAB 98," 2 Pages, Apr. 15, 1998.
Press Release, "Parkervision Announces First Quarter Financial Results," 3 Pages, May 4, 1998.
Press Release, "Parkervision 'DIRECT2DATA' Introduced in Response to Market Demand," 3 Pages, Jul. 9, 1998.
Press Release, "Parkervision Expands Senior Management Team," 2 Pages, Jul. 29, 1998.
Press Release, "Parkervision Announces Second Quarter and Six Month Financial Results," 4 Pages, Jul. 30, 1998.
Press Release, "Parkervision Announces Third Quarter and Nine Month Financial Results," 3 Pages, Oct. 30, 1998.
Press Release, "Questar Infocomm, Inc. Invests $5 Million in Parkervision Common Stock," 3 Pages, Dec. 2, 1998.
Press Release, "Parkervision Adds Two New Directors," 2 Pages, Mar. 5, 1999.
Press Release, "Parkervision Announces Fourth Quarter and Year End Financial Results," 3 Pages, Mar. 5, 1999.
Press Release, "Joint Marketing Agreement Offers New Automated Production Solution," 2 Pages, Apr. 13, 1999.
Copy of Declaration of Michael J. Bultman, Filed in U.S. application No. 09/176,022, directed to related subject matter.

Copy of Declaration of Robert W. Cook, Filed in U.S. application No. 09/176,022, directed to related subject matter.

Copy of Declaration of Alex Holtz, Filed in U.S. application No. 09/176,022, directed to related subject matter.

Copy of Declaration of Richard C. Looke, Filed in U.S. application No. 09/176,022, directed to related subject matter.

Copy of Declaration of Charley D. Moses, Jr., Filed in U.S. application No. 09/176,022, directed to related subject matter.

Copy of Declaration of Jeffrey L. Parker and David F. Sorrells, with attachment Exhibit 1., Filed in U.S. application No. 09/176,022, directed to related subject matter.

DIALOG File 348 (European Patents) English Language Patent Abstract for EP 35166 A1, published Feb. 18, 1981, (2 Pages).

DIALOG File 347 (JAPIO) English Language Patent Abstract for JP 2–39632, published Feb. 8, 1990, (1 Page).

DIALOG File 347 (JAPIO) English Language Patent Abstract for JP 2–131629, published May 21, 1990, (1 Page).

DIALOG File 347 (JAPIO) English Language Patent Abstract for JP 2–276351, published Nov. 13, 1990, (1 Page).

DIALOG File 348 (European Patents) English Language Patent Abstract for EP 0 785 635 A1, published Dec. 26, 1996, (3 Pages).

Sasikumar, M. et al., "Active Compensation in the Switched–Capacitor Biquad," Proceedings of the IEEE, vol. 71, No. 8, Aug. 1983, pp. 1008–1009.

Temes, G.C. and Tsividis, T., "The Special Section on Switched–Capacitor Circuits," Proceedings of the IEEE, vol. 71, No. 8, Aug. 1983, pp. 915–916.

Aghvami, H. et al., "Land Mobile Satellites Using the Highly Elliptic Orbits—The UK T–SAT Mobile Payload," $4^{th}$ International Conf. On Satellite Systems for Mobile Communications and Navigation, Oct. 17–18, 1988, pp. 147–153.

Al Ahmad, H.A.M. et al., "Doppler Frequency Correction for a Non–Geostationary Communications Satellite. Techniques for CERS and T–SAT," Electronics Division Colloquium on Low Noise Oscillators and Synthesizer, Jan. 23, 1986, pp. 4/1–4/5.

Ali, I. et al., "Doppler Characterization for LEO Satellites," IEEE Transactions On Communications, vol. 46, No. 3, Mar. 1998, pp. 309–313.

Allan, D.W., "Statistics of Atomic Frequency Standards," Proc. Of the IEEE Special Issue on Frequency Stability, Feb. 1996, pp. 221–230.

Allstot, D.J. et al., "MOS Switched Capacitor Ladder Filters," IEEE Journal of Solid State Circuits, vol. SC–13, No. 6, Dec. 1978, pp. 806–814.

Allstot, D.J. and Black, W.C. Jr., "Technological Design Considerations for Monolithic MOS Switched–Capacitor Filtering Systems," Proceedings of the IEEE, vol. 71, No. 8, Aug. 1983, pp. 967–986.

Alouini, M. et al., "Channel Characterization and Modeling for Ka–Band Very Small Aperture Terminals," Proc. Of the IEEE, vol. 85, No. 6, Jun. 1997, pp. 981–997.

Andreyev, G.A. and Ogarev, S.A., "Phase Distortions of Keyed Millimeter–Wave Signals in the Case of Propagation in a Turbulent Atmosphere," Telecommunications and Radio Engineering, vol. 43, No. 12, Dec. 1988, pp. 87–90.

Antonetti, A. et al., "Optoelectronic Sampling in the Picosecond Range," Optics Communications, vol. 21, No. 2, May 1977, pp. 211–214.

Austin, J. et al., "Doppler Correction of the Telecommunication Payload Oscillators in the UK T–SAT," $18^{th}$ European Microwave Conference, Sep. 12–15, 1988, pp. 851–857.

Auston, D.H., "Picosecond optoelectronic switching and gating in silicon," Applied Physics Letters, vol. 26, No. 3, Feb. 1, 1975, pp. 101–103.

Baher, H., "Transfer Functions for Switched Capacitor and Wave Digital Filters," IEEE Transactions on Circuits and Systems, vol. CAS–33, No. 11, Nov. 1986, pp. 1138–1142.

Baines, R., "The DSP Bottleneck," IEEE Communications Magazine, May 1995, pp. 46–54.

Banjo, O.P. and Vilar E., "Binary Error Probabilities on Earth–Space Links Subject to Scintillation Fading," Electronics Letters, vol. 21, No. 7, Mar. 28, 1985, pp. 296–297.

Banjo, O.P. and Vilar, E., "The Dependence of Slant Path Amplitude Scintillations on Various Meteorological Parameters," Antennas and Propagation (ICAP 87) Part 2: Propagation, Mar. 30–Apr. 2, 1987, pp. 277–280.

Banjo, O.P. and Vilar, E., "Measurement and Modeling of Amplitude Scintillations on Low–Elevation Earth–Space Paths and Impact on Communication Systems," IEEE Transactions On Communications, vol. COM–34, No. 8, Aug. 1986, pp. 774–780.

Banjo, O.P. et al., "Tropospheric Amplitude Spectra Due to Absorption and Scattering in Earth–Space Paths," Antennas and Propagation (ICAP 85), Apr. 16–19, 1985, pp. 77–82.

Basili, P. et al., "Case Study of Intense Scintillation Events on the OTS Path," IEEE Transactions On Antennas and Propagation, vol. 38, No. 1, Jan. 1990, pp. 107–113.

Basili, P. et al., "Observations of High $C^2$ and Turbulent Path Length on OTS Space–Earth Link," Electronics Letters, vol. 24, No. 17, Aug. 18, 1988, pp. 1114–1116.

Blakey, J.R. et al., "Measurement of Atmospheric Millimetre–Wave Phase Scintillations in an Absorption Region," Electronic Letters, vol. 21, No. 11, May 23, 1985, pp. 486–487.

Burgueño, A. et al., "Influence of rain gauge integration time on the rain rate statistics used in microwave communications," annales des telecommunications, Sep./Oct. 1988, pp. 522–527.

Burgueño, A. et al., "Long–Term Joint Statistical Analysis of Duration and Intensity of Rainfall Rate with Application to Microwave Communications," Antennas and Propagation (ICAP 87) Part 2: Propagation, Mar. 30–Apr. 2, 1987, pp. 198–201.

Burgueño, A. et al., "Long Term Statistics of Precipitation Rate Return Periods in the Context of Microwave Communications," Antennas and Propagation (ICAP 89) Part 2: Propagation, Apr. 4–7, 1989, pp. 297–301.

Burgueo, A. et al., "Spectral Analysis of 49 Years of Rainfall Rate and Relation to Fade Dynamics," IEEE Transactions On Communications, vol. 38, No. 9, Sep. 1990, pp. 1359–1366.

Catalan, C. and Vilar, E., "Approach for satellite slant path remote sensing," Electronics Letters, vol. 34, No. 12, Jun. 11, 1998, pp. 1238–1239.

Dewey, R.J. and Collier, C.J., "Multi–Mode Radio Receiver," pp. 3/1–3/5.

"DSO takes sampling rate to 1 Ghz," Electronic Engineering, Mar. 1987, pp. 77, 79.

Erdi, G. and Henneuse, P.R., "A Precision FET–Less Sample–and–Hold with High Charge–to–Droop Current Ratio," *IEEE Journal of Solid–State Circuits,* vol. SC–13, No. 6, Dec. 1978, pp. 864–873.

Faulkner, N.D. et al., "Sub–Harmonic Sampling for the Accurate Measurement of Frequency Stability of Microwave Oscillators," CPEM 82 Digest: Conf. On Precision Electromagnetic Measurements, 1982, pp. M–10 & M–11.

Faulkner, N.D. and Vilar, E., "Time Domain Analysis of Frequency Stability Using Non–Zero Dead–Time Counter Techniques," CPEM 84 Digest Conf. On Precision Electromagnetic Measurements, 1984, pp. 81–82.

Filip, M. and Vilar, E., "Optimum Utilization of the Channel Capacity of a Satellite Link in the Presence of Amplitude Scintillations and Rain Attenuation," *IEEE Transactions On Communications,* vol. 38, No. 11, Nov. 1990, pp. 1958–1965.

Fukahori, K., "A CMOS Narrow–Band Signaling Filter with Q Reduction," *IEEE Journal of Solid–State Circuits,* vol. SC–19, No. 6, Dec. 1984, pp. 926–932.

Fukuchi, H. and Otsu, Y., "Available time statistics of rain attenuation on earth–space path," IEE Proceedings–H: Microwaves, Antennas & Propagation, vol. 135, No. 6, Dec. 1988, pp. 387–390.

Gibbins, C.J. and Chadha, R., "Millimetre–wave propagation through hydrocarbon flame," IEE Proceedings–H: Microwaves, Antennas & Propagation, vol. 134, No. 2, Apr. 1987, pp. 169–173.

Gilchrist, B. et al., "Sampling hikes performance of frequency synthesizers," *Microwaves & RF,* Jan. 1984, pp. 93–94 and 110.

Gossard, E.E., "Clear weather meteorological effects on propagation at frequencies above 1 Ghz," *Radio Science,* vol. 16, No. 5, Sep.–Oct. 1981, pp. 589–608.

Gregorian, R. et al., "Switched–Capacitor Circuit Design," Proceedings of the IEEE, vol. 71, No. 8, Aug. 1983, pp. 941–966.

Grove, W.M., "Sampling for Oscilloscopes and Other RF Systems: Dc through X–Band," *IEEE Transactions On Microwave Theory and Techniques,* Dec. 1966, pp. 629–635.

Haddon, J. et al., "Measurement of Microwave Scintillations on a Satellite Down–Line at X–Band," $2^{nd}$ Int'l Conf. On Antennas and Propagation Part 2: Propagation, Apr. 13–16, 1991, pp. 113–117.

Haddon, J. and Vilar, E., "Scattering Induced Microwave Scintillations from Clear Air and Rain on Earth Space Paths and the Influence of Antenna Aperture," *IEEE Transactions On Antennas and Propagation,* vol. AP–34, No. 5, May 1986, pp. 646–657.

Hafdallah, H. et al., "2–4 Ghz MESFET Sampler," *Electronic Letters,* vol. 24, No. 3, Feb. 4, 1988, pp. 151–153.

Herben, M.H.A.J., "Amplitude and Phase Scintillation Measurements on 8–2 km Line–Of–Sight Path at 30 Ghz," *Electronics Letters,* vol. 18, No. 7, Apr. 1, 1982, pp. 287–289.

Hewitt, A. et al., "An 18 Ghz Wideband LOS Multipath Experiment," Int'l Conf. On Measurements for Telecommunication Transmission Systems—MTTS 85, Nov. 27–28, 1985, pp. 112–116.

Hewitt, A. et al., "An Autoregressive Approach to the Identification of Multipath Ray Parameters from Field Measurements," *IEEE Transactions On Communications,* vol. 37, No. 11, Nov. 1989, pp. 1136–1143.

Hewitt, A. and Vilar, E., "Selective Fading on LOS Microwave Links: Classical and Spread–Spectrum Measurement Techniques," *IEEE Transactions On Communications,* vol. 36, No. 7, Jul. 1988, pp. 789–796.

Hospitalier, E., "Instruments for Recording and Observing Rapidly Varying Phenomena," *Science Abstracts,* vol. VII, 1904, pp. 22–23.

Howard, I.M. and Swansson, N.S., "Demodulating High Frequence Resonance Signals for Bearing Fault Detection," The Institution of Engineers Australia Communications Conference, Melbourne Sep. 18–20, 1990, pp. 115–121.

Hu, X., *A Switched–Current Sample–and–Hold Amplifier for FM Demodulation,* Thesis for Master of Applied Science, Dept. of Electrical and Computer Engineering, University of Toronto, 1995, pp. 1–64.

Hung et al., "Characterization of Microwave Integrated Circuits Using An Optical Phase–Locking and Sampling System," *IEEE MTT–S Digest,* 1991, pp. 507–510.

Hurst, P.J., "Shifting the Frequence Response of Switched–Capacitor Filters by Nonuniform Sampling," *IEEE Transactions on Circuits and Systems,* vol. 38, No. 1, Jan. 1991, pp. 12–19.

Janssen, J.M.L., "An Experimental 'Stroboscopic' Oscilloscope for Frequencies up to about 50 Mc/s: I. Fundamentals," *Philips Technical Review,* vol. 12, No. 2, Aug. 1950, pp. 52–59.

Janssen, J.M.L. and Michels, A.J., "An Experimental 'Stroboscopic' Oscilloscope for Frequencies up to about 50 Mc/s: II. Electrical Build–Up," *Philips Technical Review,* vol. 12, No. 3, Sep. 1950, pp. 83–82.

Jondral, V.F. et al., "Doppler Profiles for Communication Satellites," *Frequenz,* May–Jun. 1996, pp. 111–116.

Kaleh, G.K., "A Frequency Diversity Spread Spectrum System for Communication in the Presence of In–band Interference," *1995 IEEE Globecom,* pp. 66–70.

Karasawa, Y. et al., "A New Prediction Method for Tropospheric Scintillation on Earth–Space Paths," *IEEE Transactions On Antennas and Propagation,* vol. 36, No. 11, Nov. 1988, pp. 1608–1614.

Lam, W.K. et al., "Measurement of the Phase Noise Characteristics of an Unlocked Communications Channel Identifier," Proc. Of the 1993 IEEE Frequency Control Symposium, Jun. 2–4, 1993, pp. 283–288.

Lam, W.K. et al., "Wideband sounding of 11.6 Ghz transhorizon channel," *Electronics Letters,* vol. 30, No. 9, Apr. 28, 1994, pp. 738–739.

Larkin, K.G., "Efficient demodulator for bandpass sampled AM signals," *Electronics Letters,* vol. 32, No. 2, Jan. 18, 1996, pp. 101–102.

Lau, W.H. et al., "Analysis of the Time Variant Structure of Microwave Line–of–sight Multipath Phenomena," IEEE Global Telecommunications Conference & Exhibition, Nov. 28–Dec. 1, 1988, pp. 1707–1711.

Lau, W.H. et al., "Improved Prony Algorithm to Identify Multipath Components," *Electronics Letters,* vol. 23, No. 20, Sep. 24, 1987, pp. 1059–1060.

Lesage, P. and Audoin, C., "Effect of Dead–Time on the Estimation of the Two–Sample Variance," *IEEE Transactions On Instrumentation and Measurement,* vol. IM–28, No. 1, Mar. 1979, pp. 6–10.

Liechti, C.A., "Performance of Dual–Gate GaAs MESFET's as Gain–Controlled Low–Noise Amplifiers and High–Speed Modulators," *IEEE Transactions On Microwave Theory and Techniques,* vol. MTT–23, No. 6, Jun. 1975, pp. 461–469.

Linnenbrink, T.E. et al., "A One Gigasample Per Second Transient Recorder," *IEEE Transactions On Nuclear Science*, vol. NS–26, No. 4, Aug. 1979, pp. 4443–4449.

Liou, M.L., "A Tutorial on Computer–Aided Analysis of Switched–Capacitor Circuits," Proceedings of the IEEE, vol. 71, No. 8, Aug. 1983, pp. 987–1005.

Lo, P. et al., "Coherent Automatic Gain Control," IEE Colloquium on Phase Locked Techniques, Mar. 26, 1980, pp. 2/1–2/6.

Lo, P. et al., "Computation of Rain Induced Scintillations on Satellite Down–Links at Microwave Frequencies," Third Int'l Conf. On Antennas and Propagation (ICAP 83) Part 2: Propagation, Apr. 12–15, 1983, pp. 127–131.

Lo, P.S.L.O. et al., "Observations of Amplitude Scintillations on a Low–Elevation Earth–Space Path," *Electronics Letters*, vol. 20, No. 7, Mar. 29, 1984, pp. 307–308.

Madani, K. and Aithison, C.S., "A 20 Ghz Microwave Sampler," *IEEE Transactions On Microwave Theory and Techniques*, vol. 40, No. 10, Oct. 1992, pp. 1960–1963.

Marsland, R.A. et al., "130 Ghz monolithic integrated circuit sampling head," *Appl. Phys. Lett.*, vol. 55, No. 6, Aug. 7, 1989, pp. 592–594.

Martin, K. and Sedra, A.S., "Switched–Capacitor Building Blocks for Adaptive Systems," *IEEE Transactions on Circuits and Systems*, vol. CAS–28, No. 6, Jun. 1981, pp. 576–584.

Marzano, F.S. and d'Auria, G., "Model–based Prediction of Amplitude Scintillation Variance Due to Clear–Air Tropospheric Turbulence on Earth–Satellite Microwave Links," *IEEE Transactions On Antennas and Propagation*, vol. 46, No. 10, Oct. 1998, pp. 1506–1518.

Matricciani, E., "Prediction of fade durations due to rain in satellite communication systems," *Radio Science*, vol. 32, No. 3, May–Jun. 1997, pp. 935–941.

McQueen, J.G., "The Monitoring of High–Speed Waveforms," *Electronic Engineering*, Oct. 1952, pp. 436–441.

Merkelo, J. and Hall, R.D., "Broad–Band Thin–Film Signal Sampler," *IEEE Journal of Solid–State Circuits*, vol. SC–7, No. 1, Feb. 1972, pp. 50–54.

Merlo, U. et al., "Amplitude Scintillation Cycles in a Sirio Satellite–Earth Link," *Electronics Letters*, vol. 21, No. 23, Nov. 7, 1985, pp. 1094–1096.

Morris, D., "Radio–holographics reflector measurement of the 30–m millimeter radio telescope at 22 Ghz with a cosmic signal source," *Astronomy and Astrophysics*, vol. 203, No. 2, Sep. (II) 1988, pp. 399–406.

Moulsley, T.J. et al., "The efficient acquisition and processing of propagation statistics," *Journal of the Institution of Electronic and Radio Engineers*, vol. 55, No. 3, Mar. 1985, pp. 97–103.

Ndzi, D. et al., "Wide–Band Statistical Characterization of an Over–the–Sea Experimental Transhorizon Link," *IEE Colloquium on Radio Communications at Microwave and Millimetre Wave Frequencies*, Dec. 16, 1996, pp. 1/1–1/6.

Ndzi, D. et al., "Wideband Statistics of Signal Levels and Doppler Spread on an Over–The–Sea Transhorizon Link," *IEE Colloquium on Propagation Characteristics and Related System Techniques for Beyond Line–of–Sight Radio*, Nov. 24, 1997, pp. 9/1–9/6.

"New zero IF chipset from Philips," *Electronic Engineering*, Sep. 1995, p. 10.

Ohara, H. et al., "First monolithic PCM filter cuts cost of telecomm systems," *Electronic Design*, vol. 27, No. 8, Apr. 12, 1979, (6 pages).

Ortgies, G., "Experimental Parameters Affecting Amplitude Scintillation Measurements on Satellite Links," *Electronics Letters*, vol. 21, No. 17, Aug. 15, 1985, pp. 771–772.

Peeters, G. et al., "Evaluation of Statistical Models for Clear–Air Scintillation Prediction Using Olympus Satellite Measurements," *International Journal of Satellite Communications*, vol. 15, No. 2, Mar.–Apr. 1997, pp. 73–88.

Perrey, A.G. and Schoenwetter, H.K., NBS Technical Note 1121: A Schottky Diode Bridge Sampling Gate, May 1980, pp. 1–14.

Poulton, K. et al., "A 1–Ghz 6–bit ADC System," *IEEE Journal of Solid–State Circuits*, vol. SC–22, No. 6, Dec. 1987, pp. 962–969.

"Project COST 205: Scintillations in Earth–satellite links," *Alta Frequenza: Scientific Review in Electronics*, vol. LIV, No. 3, May–Jun., 1985, pp. 209–211.

Reeves, R.J.D., "The Recording and Collocation of Waveforms (Part 1)," *Electronic Engineering*, Mar. 1959, pp. 130–137.

Reeves, R.J.D., "The Recording and Collocation of Waveforms (Part 2)," *Electronic Engineering*, Apr. 1959, pp. 204–212.

Rein, H.M. and Zahn, M., "Subnanosecond–Pulse Generator with Variable Pulsewidth Using Avalanche Transistors," *Electronics Letters*, vol. 11, No. 1, Jan. 9, 1975, pp. 21–23.

Riad, S.M. and Nahman, N.S., "Modeling Of The Feed–Through Wideband (DC to 12.4 Ghz) Sampling–Head," IEEE MTT–S International Microwave Symposium Digest, Jun. 27–29, 1978, pp. 267–269.

Rizzoli, V. et al., "Computer–Aided Analysis of MESFET and HEMT Mixers," *IEEE Transactions On Microwave Theory and Techniques*, vol. 37, No. 9, Sep. 1989, pp. 1401–1410.

Rücker, F. and Dintelmann, F., "Effect of Antenna Size on OTS Signal Scintillations and Their Seasonal Dependence," *Electronics Letters*, vol. 19, No. 24, Nov. 1983, pp. 1032–1034.

Sabel, L.P., "A DSP Implementation of a Robust Flexible Receiver/Demultiplexer for Broadcast Data Satellite Communications," The Institution of Engineers Australia Communications Conference, Melbourne Oct. 16–18, 1990, pp. 218–223.

Salous, S., "IF digital generation of FMCW waveforms for wideband channel characterization," IEE Proceedings–I, vol. 139, No. 3, Jun. 1992, pp. 281–288.

"Sampling Loops Lock Sources to 23 Ghz," *Microwaves & RF*, Sep. 1990, p. 212.

Saul, P.H., "A GaAs MESFET Sample and Hold Switch," $5^{th}$ European Solid State Circuits Conference—ESSCIRC 79, 1979, pp. 5–7.

Shen, D. H. et al., "A 900–MHZ RF Front–End with Integrated Discrete–Time Filtering," *IEEE Journal of Solid–State Circuits*, vol. 31, No. 12, Dec. 1996, pp. 1945–1954.

Shen, X.D., and Vilar, E., "Anomalous transhorizon propagation and meteorological processes of a multilink path," *Radio Science*, vol. 30, No. 5, Sep.–Oct. 1995, pp. 1467–1479.

Shen, X., and Tawfik, A.N., "Dynamic Behaviour of Radio Channels Due to Trans–Horizon Propagation Mechanisms," *Electronics Letters*, vol. 29, No. 17, Aug. 19, 1993, pp. 1582–1583.

Shen, X. et al., "Modeling Enhanced Spherical Diffraction and Troposcattering on a Transhorizon Path with aid of the parabolic Equation and Ray Tracing Methods," IEE Colloquium on Common modeling techniques for electromagnetic wave and acoustic wave propagation, Mar. 8, 1996, pp. 4/1–47/6.

Shen, X. and Vilar, E., "Path loss statistics and mechanisms of transhorizon propagation over a sea path," *Electronics Letters*, vol. 32, No. 3, Feb. 1, 1996, pp. 259–261.

Spillard, C. et al., "X–Band Tropospheric Transhorizon Propagation Under Differing Meteorological Conditions," Antennas and Propagation (ICAP 89) Part 2: Propagation, Apr. 4–7, 1989, pp. 451–455.

Stafford, K.R. et al., "A Complete Monolithic Sample/Hold Amplifier," *IEEE Journal of Solid–State Circuits*, vol. SC–9, No. 6, Dec. 1974, pp. 381–387.

Staruk, W. Jr. et al., "Pushing HF Data Rates," *Defense Electronics*, May 1985, pp. 211, 213, 215, 217, 220 &222.

Stephenson, A.G., "Digitizing multiple RF signals requires an optimum sampling rate," *Electronics*, Mar. 27, 1972, pp. 106–110.

Sugarman, R., "Sampling Oscilloscope for Statistically Varying Pulses," *The Review of Scientific Instruments*, vol. 28, No. 11, Nov. 1957, pp. 933–938.

Sylvain, M., "Experimental probing of multipath microwave channels," *Radio Science*, vol. 24, No. 2, Mar.–Apr. 1989, pp. 160–178.

Takano, T., "NOVEL GaAs Pet Phase Detector Operable To Ka Band," *IEEE MT–S Digest*, 1984, pp. 381–383.

Tan, M.A., "Biquadratic Transconductance Switched–Capacitor Filters," *IEEE Transactions on Circuits and Systems—I: Fundamental Theory and Applications*, vol. 40, No. 4, Apr. 1993, pp. 272–275.

Tanaka, K. et al., "Single Chip Multisystem AM Stereo Decoder IC," *IEEE Transactions On Consumer Electronics*, vol. CE–32, No. 3, Aug. 1986, pp. 482–496.

Tawfik, A.N., "Amplitude, Duration and Predictability of Long Hop Trans–Horizon X–band Signals Over the Sea," *Electronics Letters*, vol. 28, No. 6, Mar. 12, 1992, pp. 571–572.

Tawfik, A.N. and Vilar, E., "Correlation of Transhorizon Signal Level Strength with Localized Surface Meteorological Parameters," 8th International Conf. On Antennas and Propagation, Mar. 30–Apr. 2, 1993, pp. 335–339.

Tawfik, A.N. and Vilar, E., "Dynamic Structure of a Transhorizon Signal at X–band Over a Sea Path," Antennas and Propagation (ICAP 89) Part 2: Propagation, Apr. 4–7, 1989, pp. 446–450.

Tawfik, A.N. and Vilar, E., "Statistics of Duration and Intensity of Path Loss in a Microwave Transhorizon Sea–Path," *Electronics Letters*, vol. 26, No. 7, Mar. 29, 1990, pp. 474–476.

Tawfik, A.N. and Vilar, E., "X–Band Transhorizon Measurements of CW Transmissions Over the Sea—Part 1: Path Loss, Duration of Events, and Their Modeling," *IEEE Transactions On Antennas and Propagation*, vol. 41, No. 11, Nov. 1993, pp. 1491–1500.

Tomassetti, Q., "An Unusual Microwave Mixer," 16th European Microwave Conference, Sep. 8–12, 1986, pp. 754–759.

Tortoli, P. et al., "Bidirectional Doppler Signal Analysis Based on a Single RF Sampling Channel," *IEEE Transactions On Ultrasonics, Ferroelectrics, and Frequency Control*, vol. 41, No. 1, Jan. 1984, pp. 1–3.

Tsividis, Y. and Antognetti, P. (Ed.), *Design of MOS VLSI Circuits for Telecommunications*, p. 304.

Tsividis, Y., "Principles of Operation and Analysis of Switched–Capacitor Circuits," Proceedings of the IEEE, vol. 71, No. 8, Aug. 1983, pp. 926–940.

Tsurumi, H. and Maeda, T., "Design Study on a Direct Conversion Receiver Front–End for 280 MHZ, 900 MHZ, and 2.6 Ghz Band radio Communication Systems," 41st IEEE Vehicular Technology Conference, May 19–22, 1991, pp. 457–462.

Valdmanis, J.A. et al., "Picosecond and Subpicosend Optoelectronics for Measurements of Future High Speed Electronic Devices," *IEDM Technical Digest*, Dec. 5–7, 1983, pp. 597–600.

van de Kamp, M.M.J.L., "Asymmetric signal level distribution due to tropospheric scintillation," *Electronics Letters*, vol. 34, No. 11, May 28, 1998, pp. 1145–1146.

Vasseur, H. and Vanhoenacker, D., "Characterization of tropospheric turbulent layers from radiosonde data," *Electronics Letters*, vol. 34, No. 4, Feb. 19, 1998, pp. 318–319.

Verdone, R., "Outage Probability Analysis for Short–Range Communication Systems at 60 Ghz in ATT Urban Environments," *IEEE Transactions On Vehicular Technology*, vol. 46, No. 4, Nov. 1997, pp. 1027–1039.

Vierira–Ribeiro, S.A., *Single–IF DECT Receiver Architecture using a Quadrature Sub–Sampling Band–Pass Sigma–Delta Modulator*, Thesis for Degree of Master's of Engineering, Carleton University, Apr. 1955, pp. 1–180.

Vilar, E. et al., "A Comprehensive/Selective MM–Wave Satellite Downlink Experiment on Fade Dynamics," 10th International Conf. On Antennas and Propagation, Apr. 14–17, 1997, pp. 2.98–2.101.

Vilar, E. et al., "A System to Measure LOS Atmospheric Transmittance at 19 Ghz," Agard. Conf. Proc. No. 346: Characteristics of the Lower Atmosphere Influencing Radio Wave Propagation, Oct. 4–7, 1983, pp. 8–1–8–16.

Vilar, E. and Smith, H., "A Theoretical and Experimental Study of Angular Scintillations in Earth Space Paths," *IEEE Transactions On Antennas and Propagation*, vol. AP–34, No. 1, Jan. 1986, pp. 2–10.

Vilar, E. et al., "A Wide Band Transhorizon Experiment at 11.6 Ghz," 8th International Conf. On Antennas and Propagation, Mar. 30–Apr. 2, 1993, pp. 441–445.

Vilar, E.and Matthew, P.A., "Amplitude Dependence of Frequency in Oscillators," *Electronics Letters*, vol. 8, No. 20, Oct. 5, 1972, pp. 509–511.

Vilar, E. et al., "An experimental mm–wave receiver system for measuring phase noise due to atmospheric turbulence," Conf. Proc. 25th Europan Microwave Conference, 1995, pp. 114–119.

Vilar, E. and Burgueño, A., "Analysis and Modeling of Time Intervals Between Rain Rate Exceedances in the Context of Fade Dynamics," *IEEE Transactions On Communications*, vol. 39, No. 9, Sep. 1991, pp. 1306–1312.

Vilar, E. et al., "Angle of Arrival Fluctuations in High and Low Elevation Earth Space Paths," Antennas and Propagation (ICAP 85), Apr. 16–19, 1985, pp. 83–88.

Vilar, E., "Antennas and Propagation: A Telecommunications Systems Subject," *Electronics Division Colloquium on Teaching Antennas and Propagation to Undergraduates*, Mar. 8, 1988, (6 Pages).

Vilar, E. et al., "CERS*. Millimetre–Wave Beacon Package and Related Payload Doppler Correction Strategies," *Electronics Division Colloquium on CERS—Communications Engineering Research Satellite*, Apr. 10, 1984, pp. 10/1–10/10.

Vilar, E. and Moulsley, T.J., "Comment and Reply: Probability Density Function of Amplitude Scintillations," *Electronics Letters*, vol. 21, No. 14, Jul. 4, 1995, pp. 620–622.

Vilar, E. et al., "Comparison of Rainfall Rate Duration Distributions for ILE–IFE and Barcelona," *Electronics Letters*, vol. 28, No. 20, Sep. 24, 1992, pp. 1922–1924.

Vilar, E. "Depolarisation and Field Transmittances in Indoor Communications," *Electronics Letters*, vol. 27, No. 9, Apr. 25, 1991, pp. 723–733.

Vilar, E. and Larsen, J.R., "Elevation Dependence of Amplitude Scintillations on Low Elevation Earth Space Paths," Antennas and Propagation (ICAP 89) Part 2: Propagation, Apr. 4–7, 1989, pp. 150–154.

Vilar, E. et al., "Experimental System and Measurements of Transhorizon Signal Levels at 11 Ghz," $18^{th}$ European Microwave Conference, Sep. 12–15, 1988, pp. 429–435.

Vilar, E. and Matthews, P.A., "Importance of Amplitude Scintillations in Millimetric Radio Links," Conf. Proc. $4^{th}$ European Microwave Conference, Sep. 10–13, 1974, pp. 202–206.

Vilar, E. and Haddon, J., "Measurement and Modeling of Scintillation Intensity to Estimate Turbulence Parameters in an Earth–Space Path," *IEEE Transactions On Antennas and Propagation*, vol. AP–32, No. 4, Apr. 1984, pp. 340–346.

Vilar, E. and Matthew, P.A., "Measurement of Phase Fluctuations on Millimetric Radiowave Propagation," *Electronic Letters*, vol. 7, No. 18, Sep. 9, 1971, pp. 566–568.

Vilar, E. and Wan, K.W., "Narrow and Wide Band Estimates of Field Strength for Indoor Communications in the Millimetre Band," *Electronics Division Colloquium on Radiocommunications in the Range 30–60 Ghz*, Jan. 17, 1991, pp. 5/1–5/8.

Vilar, E.and Faulkner, N.D., "Phase Noise and Frequency Stability Measurements. Numerical Techniques and Limitations," *Electronics Division Colloquium on Low Noise Oscillators and Synthesizer*, Jan. 23, 1986, (5 Pages).

Vilar, E. and Senin, S., "Propagation phase noise identified using 40 Ghz satellite downlink," *Electronics Letters*, vol. 33, No. 22, Oct. 23, 1997, pp. 1901–1902.

Vilar, E. et al., "Scattering and Extinction: Dependence Upon Raindrop Size Distribution in Temperate (Barcelona) and Tropical (Belem) Regions," $10^{th}$ International Conf. On Antennas and Propagation, Apr. 14–17, 1997, pp. 2.230–2.233.

Vilar, E. and Haddon, J., "Scintillation Modeling and Measurement—A Tool for Remote–Sensing Slant Paths," Agard Conf. Proc. No. 332: Propagation Aspects of Frequency Sharing, Interference AND System Diversity, Oct. 18–22, 1982, pp. 27–1–27–13.

Vilar, E., "Some Limitations on Digital Transmission Through Turbulent Atmosphere," Int'l Conf. On Satellite Communication Systems Technology, Apr. 7–10, 1975, pp. 169–187.

Vilar, E. and Matthews, P.A., "Summary of Scintillation Observations in 36 Ghz Link Across London," Int'l Conf. On Antennas and Propagation Part 2: Propagation, Nov. 28–30, 1978, pp. 36–40.

Vilar, E. et al., "Wideband Characterization of Scattering Channels," $10^{th}$ International Conf. On Antennas and Propagation, Apr. 14–17, 1997, pp. 2.353–2.358.

Voltage and Time Resolution in Digitizing Oscilloscopes: Application Note 348, Hewlett Packard, Nov. 1986, pp. 1–11.

Wan, K.W. et al., "A Novel Approach to the Simultaneous Measurement of Phase and Amplitude Noises in Oscillator," $19^{th}$ European Microwave Conference Proceedings, Sep. 4–7, 1989, pp. 809–813.

Wan, K.W. et al., "Extended Variances and Autoregressive/ Moving Average Algorithm for the Measurement and Synthesis of Oscillator Phase Noise," Proc. Of the $43^{rd}$ Annual Symposium on Frequency Control, 1989, pp. 331–335.

Wan, K.W. et al., "Wideband Transhorizon Channel Sounder at 11 Ghz," *Electronics Division Colloquium on High Bit Rate UHF/SHF Channel Sounders—Technology and Measurement*, Dec. 3, 1993, pp. 3/1–3/5.

Watson, A.W.D. et al., "Digital Conversion and Signal Processing for High Performance Communications Receivers," pp. 367–373.

Wiley, R.G., "Approximate FM Demodulation Using Zero Crossings," *IEEE Transactions On Communications*, vol. COM–29, No. 7, Jul. 1981, pp. 1061–1065.

Wortham, W., "Convergence . . . Again," *RF Design*, Mar. 1999, p. 102.

Young, I.A. and Hodges, D.A., "MOS Switched–Capacitor Analog Sampled–Data Direct–Form Recursive Filters," *IEEE Journal of Solid–State Circuits*, vol. SC–14, No. 6, Dec. 1979, pp. 1020–1044.

FREQUENCY MODULATION CIRCUIT

PHASE MODULATION CIRCUIT

AMPLITUDE MODULATION CIRCUIT

INFORMATION SIGNAL 502

OSCILLATOR SIGNAL 508

AMPLITUDE MODULATED SIGNAL 512

IN PHASE/QUADRATURE PHASE MODULATION CIRCUIT

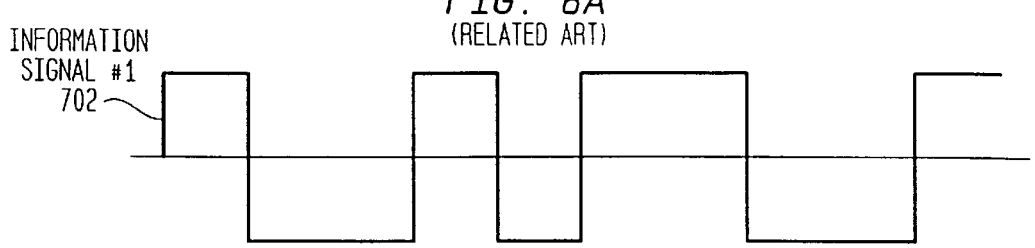
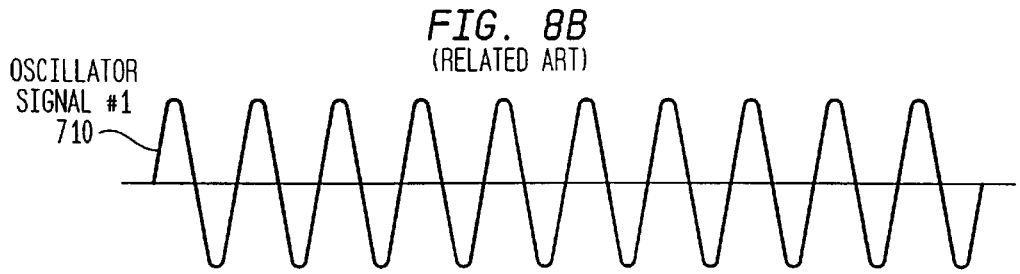
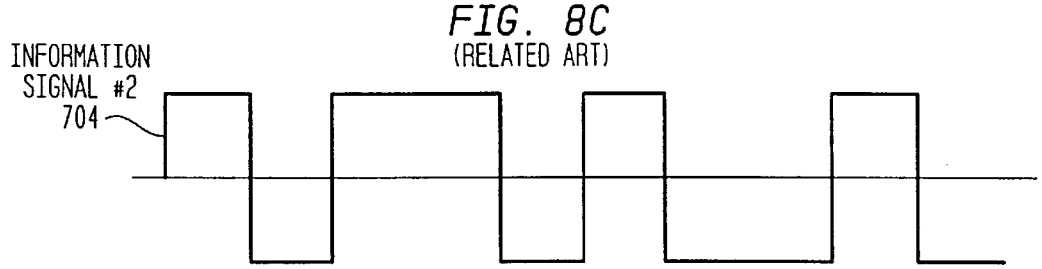
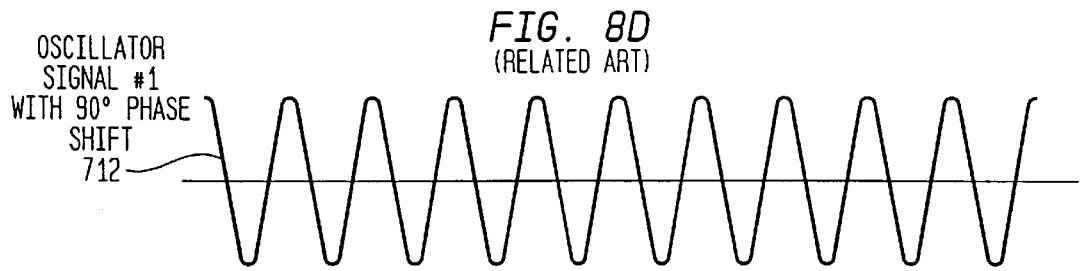
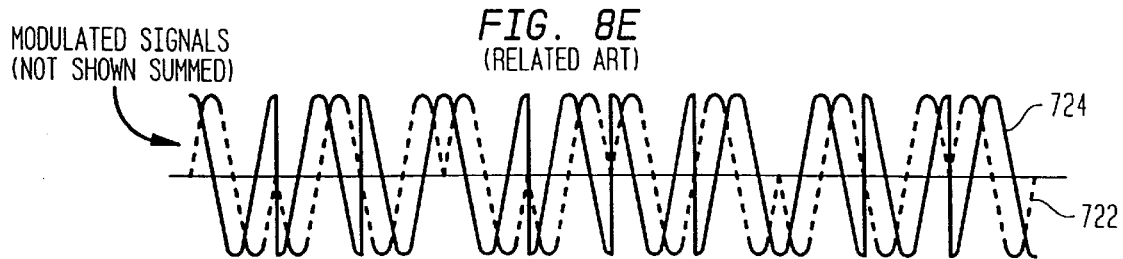

TRANSMITTER

TRANSMITTER EMBODIMENT

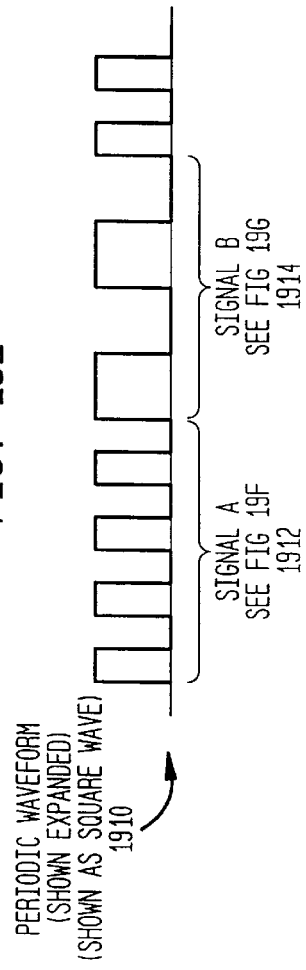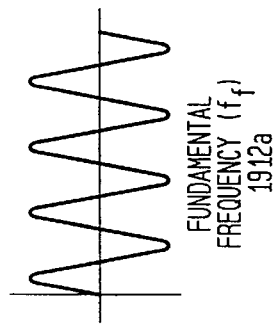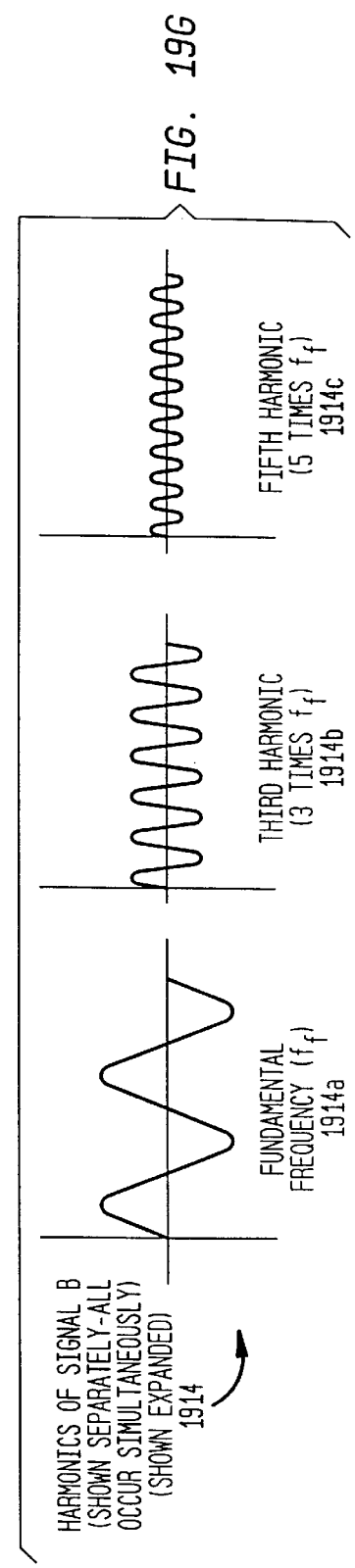

HORMONICS OF
SIGNAL A & B
(SHOWN SIMULTANEOUSLY
BUT NOT SUMMED)
(SHOWN EXPANDED)
1916

1912   1914

FILTERED
SIGNAL A & B
(SHOWN EXPANDED)
1918

1912c   1914c

INFORMATION SIGNAL 2002

OSCILLATING CARRIER SIGNAL 202

FREQUENCY MODULATED SIGNAL 2004

INFORMATION SIGNAL 2102

OSCILLATING CARRIER SIGNAL 308

PHASE MODULATED SIGNAL 2104

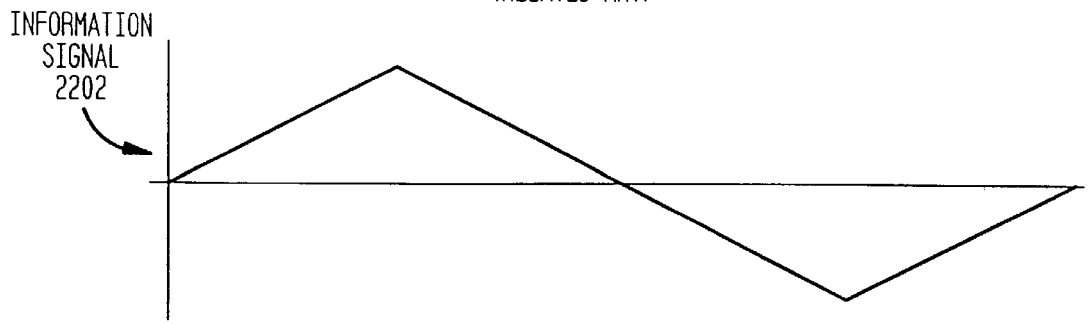
FIG. 22A
(RELATED ART)
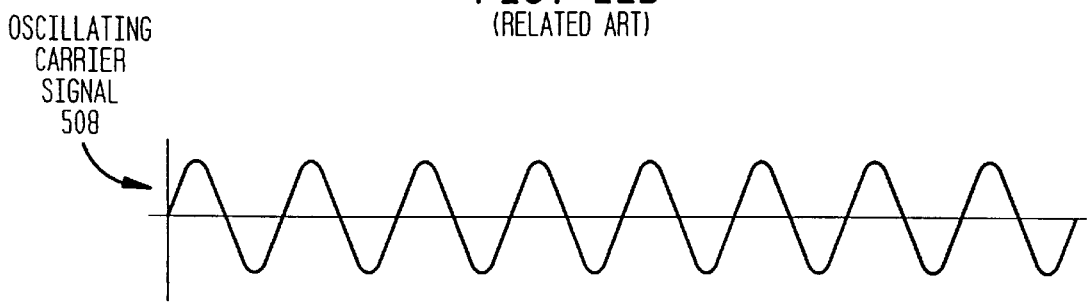
FIG. 22B
(RELATED ART)
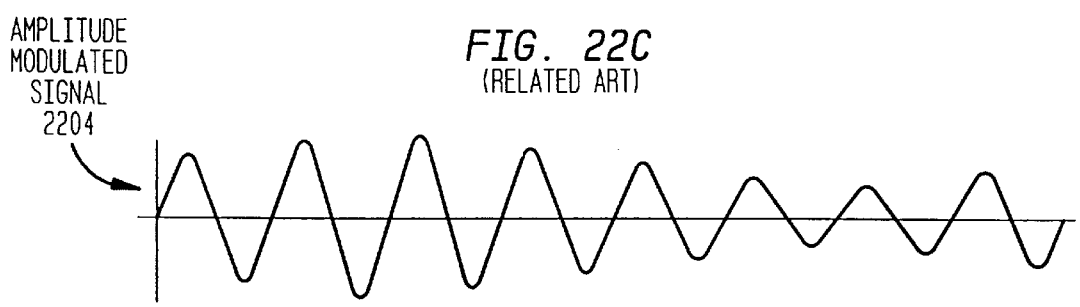
FIG. 22C
(RELATED ART)
FIG. 23
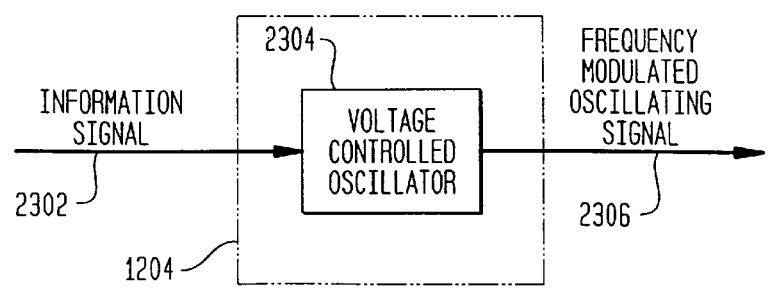

INFORMATION SIGNAL 4502

CARRIER SIGNAL 4504

HARMONICALLY RICH SIGNAL 4506

FUNDAMENTAL HARMONIC 4510

SECOND HARMONIC 4512

THIRD HARMONIC 4514

EXEMPLARY RECEIVER FOR
UNIVERSAL FREQUENCY DOWN-CONVERSION

EXEMPLARY TRANSMITTER USING
THE PRESENT INVENTION

TRANSMITTER USING PRESENT INVENTION IN FULL DUPLEX COMMUNICATIONS CIRCUIT WITH UNIVERSAL FREQUENCY DOWN-CONVERTER

TRANSMITTER IN THE FM EMBODIMENT

TRANSMITTER IN THE PM EMBODIMENT

TRANSMITTER IN THE AM EMBODIMENT

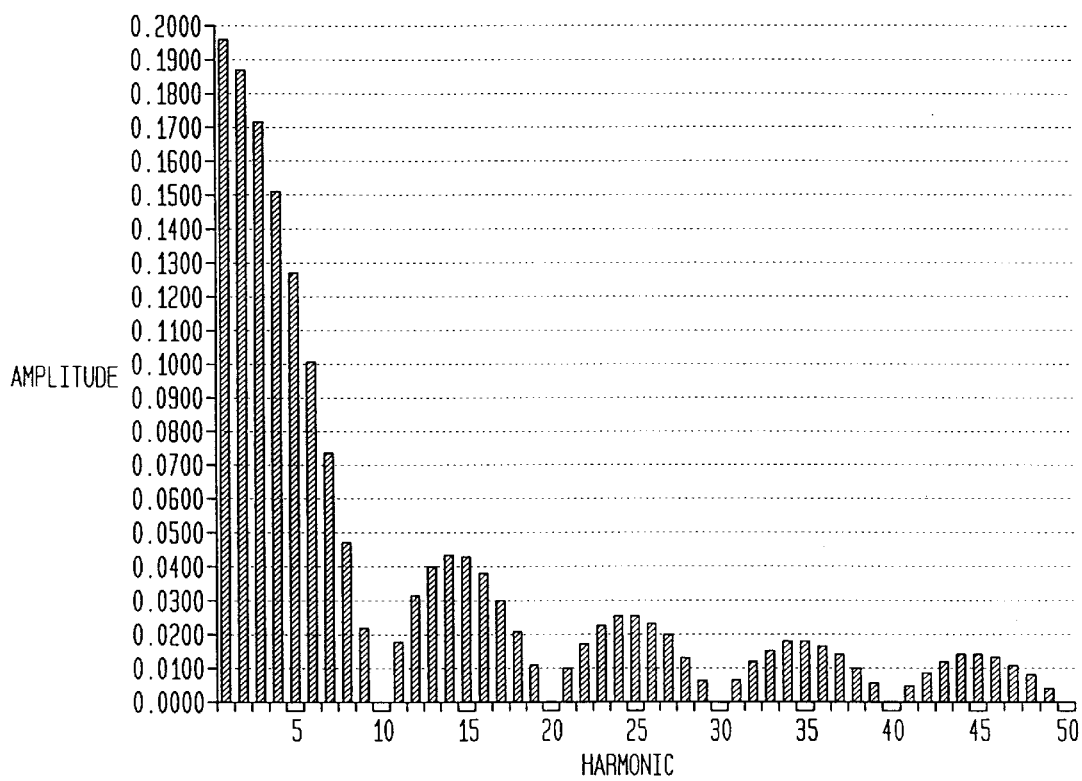

FIG. 60

| τ/T = | 0.500 | 0.250 | 0.100 | 0.050 | 0.010 | 0.005 |
|---|---|---|---|---|---|---|
| HARMONIC | | | | | | |
| 1 | 0.6366 | 0.4502 | 0.1967 | 0.0996 | 0.0200 | 0.01000 |
| 2 | 0.00 | 0.3183 | 0.1871 | 0.0984 | 0.0200 | 0.01000 |
| 3 | 0.2122 | 0.1501 | 0.1717 | 0.0963 | 0.0200 | 0.01000 |
| 4 | 0.00 | 0.00 | 0.1514 | 0.0935 | 0.0199 | 0.00999 |
| 5 | 0.1273 | 0.0900 | 0.1273 | 0.0900 | 0.0199 | 0.00999 |
| 6 | 0.00 | 0.1061 | 0.1009 | 0.0858 | 0.0199 | 0.00999 |
| 7 | 0.0909 | 0.0643 | 0.0736 | 0.0810 | 0.0198 | 0.00998 |
| 8 | 0.00 | 0.00 | 0.0468 | 0.0757 | 0.0198 | 0.00997 |
| 9 | 0.0707 | 0.0500 | 0.0219 | 0.0699 | 0.0197 | 0.00997 |
| 10 | 0.00 | 0.0637 | 0.00 | 0.0637 | 0.0197 | 0.00996 |
| 11 | 0.0579 | 0.0409 | 0.0179 | 0.0572 | 0.0196 | 0.00995 |
| 12 | 0.00 | 0.00 | 0.0312 | 0.0505 | 0.0195 | 0.00994 |
| 13 | 0.0490 | 0.0346 | 0.0396 | 0.0436 | 0.0194 | 0.00993 |
| 14 | 0.00 | 0.0455 | 0.0432 | 0.0368 | 0.0194 | 0.00992 |
| 15 | 0.0424 | 0.0300 | 0.0424 | 0.0300 | 0.0193 | 0.00991 |
| 16 | 0.00 | 0.00 | 0.0378 | 0.0234 | 0.0192 | 0.00990 |
| 17 | 0.0374 | 0.0265 | 0.0303 | 0.0170 | 0.0191 | 0.00988 |
| 18 | 0.00 | 0.0354 | 0.0208 | 0.0109 | 0.0190 | 0.00987 |
| 19 | 0.0335 | 0.0237 | 0.0104 | 0.0052 | 0.0188 | 0.00985 |
| 20 | 0.00 | 0.00 | 0.00 | 0.00 | 0.0187 | 0.00984 |
| 21 | 0.0303 | 0.0214 | 0.0094 | 0.0047 | 0.0186 | 0.00982 |
| 22 | 0.00 | 0.0289 | 0.0170 | 0.0089 | 0.0184 | 0.00980 |
| 23 | 0.0277 | 0.0196 | 0.0224 | 0.0126 | 0.0183 | 0.00978 |
| 24 | 0.00 | 0.00 | 0.0252 | 0.0156 | 0.0182 | 0.00976 |
| 25 | 0.0255 | 0.0180 | 0.0255 | 0.0180 | 0.0180 | 0.00974 |
| 26 | 0.00 | 0.0245 | 0.0233 | 0.0198 | 0.0178 | 0.00972 |
| 27 | 0.0236 | 0.0167 | 0.0191 | 0.0210 | 0.0177 | 0.00970 |
| 28 | 0.00 | 0.00 | 0.0134 | 0.0216 | 0.0175 | 0.00968 |
| 29 | 0.0220 | 0.0155 | 0.0068 | 0.0217 | 0.0173 | 0.00966 |
| 30 | 0.00 | 0.0212 | 0.00 | 0.0212 | 0.0172 | 0.00963 |
| 31 | 0.0205 | 0.0145 | 0.0063 | 0.0203 | 0.0170 | 0.00961 |
| 32 | 0.00 | 0.00 | 0.0117 | 0.0189 | 0.0168 | 0.00958 |
| 33 | 0.0193 | 0.0136 | 0.0156 | 0.0172 | 0.0166 | 0.00956 |
| 34 | 0.00 | 0.0187 | 0.0178 | 0.0151 | 0.0164 | 0.00953 |
| 35 | 0.0182 | 0.0129 | 0.0182 | 0.0129 | 0.0162 | 0.00950 |
| 36 | 0.00 | 0.00 | 0.0168 | 0.0104 | 0.0160 | 0.00948 |
| 37 | 0.0172 | 0.0122 | 0.0139 | 0.0078 | 0.0158 | 0.00945 |
| 38 | 0.00 | 0.0168 | 0.0098 | 0.0052 | 0.0156 | 0.00942 |
| 39 | 0.0163 | 0.0115 | 0.0050 | 0.0026 | 0.0154 | 0.00939 |
| 40 | 0.00 | 0.00 | 0.00 | 0.00 | 0.0151 | 0.00935 |
| 41 | 0.0155 | 0.0110 | 0.0048 | 0.0024 | 0.0149 | 0.00932 |
| 42 | 0.00 | 0.0152 | 0.0089 | 0.0047 | 0.0147 | 0.00929 |
| 43 | 0.0148 | 0.0105 | 0.0120 | 0.0067 | 0.0144 | 0.00926 |
| 44 | 0.00 | 0.00 | 0.0138 | 0.0085 | 0.0142 | 0.00922 |
| 45 | 0.0141 | 0.0100 | 0.0141 | 0.0100 | 0.0140 | 0.00919 |
| 46 | 0.00 | 0.0138 | 0.0132 | 0.0112 | 0.0137 | 0.00915 |
| 47 | 0.0135 | 0.0096 | 0.0110 | 0.0121 | 0.0135 | 0.00912 |
| 48 | 0.00 | 0.00 | 0.0078 | 0.0126 | 0.0132 | 0.00908 |
| 49 | 0.0130 | 0.0092 | 0.0040 | 0.0128 | 0.0130 | 0.00904 |
| 50 | 0.00 | 0.0127 | 0.00 | 0.0127 | 0.0127 | 0.00900 |

FIG. 61

| τ/T = | 0.5000 | 0.2500 | 0.1667 | 0.1250 | 0.1000 | 0.0833 | 0.0714 | 0.0625 | 0.0556 | 0.0500 |
|---|---|---|---|---|---|---|---|---|---|---|
| HARMONIC | 1 | 2 | 3 | 4 | 5 | 6 | 7 | 8 | 9 | 10 |
| 1 | 0.6366 | 0.4502 | 0.3183 | 0.2436 | 0.1967 | 0.1648 | 0.1417 | 0.1242 | 0.1105 | 0.0996 |
| 2 | 0.0000 | 0.3183 | 0.2757 | 0.2251 | 0.1871 | 0.1592 | 0.1381 | 0.1218 | 0.1089 | 0.0984 |
| 3 | 0.2122 | 0.1501 | 0.2122 | 0.1961 | 0.1717 | 0.1501 | 0.1323 | 0.1179 | 0.1061 | 0.0963 |
| 4 | 0.0000 | 0.0000 | 0.1378 | 0.1592 | 0.1514 | 0.1378 | 0.1244 | 0.1125 | 0.1023 | 0.0935 |
| 5 | 0.1273 | 0.0900 | 0.0637 | 0.1176 | 0.1273 | 0.1230 | 0.1147 | 0.1059 | 0.0975 | 0.0900 |
| 6 | 0.0000 | 0.1061 | 0.0000 | 0.0750 | 0.1009 | 0.1061 | 0.1034 | 0.0980 | 0.0919 | 0.0858 |
| 7 | 0.0909 | 0.0643 | 0.0455 | 0.0348 | 0.0736 | 0.0878 | 0.0909 | 0.0892 | 0.0855 | 0.0810 |
| 8 | 0.0000 | 0.0000 | 0.0689 | 0.0000 | 0.0468 | 0.0689 | 0.0776 | 0.0796 | 0.0784 | 0.0757 |
| 9 | 0.0707 | 0.0500 | 0.0707 | 0.0271 | 0.0219 | 0.0500 | 0.0637 | 0.0694 | 0.0707 | 0.0699 |
| 10 | 0.0000 | 0.0637 | 0.0551 | 0.0450 | 0.0000 | 0.0318 | 0.0498 | 0.0588 | 0.0627 | 0.0637 |
| 11 | 0.0579 | 0.0409 | 0.0289 | 0.0535 | 0.0179 | 0.0150 | 0.0361 | 0.0481 | 0.0544 | 0.0572 |
| 12 | 0.0000 | 0.0000 | 0.0000 | 0.0531 | 0.0312 | 0.0000 | 0.0230 | 0.0375 | 0.0459 | 0.0505 |
| 13 | 0.0490 | 0.0346 | 0.0245 | 0.0452 | 0.0396 | 0.0127 | 0.0109 | 0.0272 | 0.0375 | 0.0436 |
| 14 | 0.0000 | 0.0455 | 0.0394 | 0.0322 | 0.0432 | 0.0227 | 0.0000 | 0.0174 | 0.0292 | 0.0368 |
| 15 | 0.0424 | 0.0300 | 0.0424 | 0.0162 | 0.0424 | 0.0300 | 0.0094 | 0.0083 | 0.0212 | 0.0300 |
| 16 | 0.0000 | 0.0000 | 0.0345 | 0.0000 | 0.0378 | 0.0345 | 0.0173 | 0.0000 | 0.0136 | 0.0234 |
| 17 | 0.0374 | 0.0265 | 0.0187 | 0.0143 | 0.0303 | 0.0362 | 0.0233 | 0.0073 | 0.0065 | 0.0170 |
| 18 | 0.0000 | 0.0354 | 0.0000 | 0.0250 | 0.0208 | 0.0354 | 0.0277 | 0.0135 | 0.0000 | 0.0109 |
| 19 | 0.0335 | 0.0237 | 0.0168 | 0.0310 | 0.0104 | 0.0324 | 0.0302 | 0.0186 | 0.0058 | 0.0052 |
| 20 | 0.0000 | 0.0000 | 0.0276 | 0.0318 | 0.0000 | 0.0276 | 0.0310 | 0.0225 | 0.0109 | 0.0000 |
| 21 | 0.0303 | 0.0214 | 0.0303 | 0.0280 | 0.0094 | 0.0214 | 0.0303 | 0.0252 | 0.0152 | 0.0047 |
| 22 | 0.0000 | 0.0289 | 0.0251 | 0.0205 | 0.0170 | 0.0145 | 0.0282 | 0.0267 | 0.0186 | 0.0089 |
| 23 | 0.0277 | 0.0196 | 0.0138 | 0.0106 | 0.0224 | 0.0072 | 0.0249 | 0.0271 | 0.0212 | 0.0126 |
| 24 | 0.0000 | 0.0000 | 0.0000 | 0.0000 | 0.0252 | 0.0000 | 0.0207 | 0.0265 | 0.0230 | 0.0156 |
| 25 | 0.0255 | 0.0180 | 0.0127 | 0.0097 | 0.0255 | 0.0066 | 0.0159 | 0.0250 | 0.0239 | 0.0180 |

6100

INFORMATION
SIGNAL A
6204

OSCILLATING
SIGNAL
6216

PHASE
MODULATED
SIGNAL
6208

PULSE-SHAPED
PM SIGNAL
6210

6,091,940

METHOD AND SYSTEM FOR FREQUENCY UP-CONVERSION

CROSS-REFERENCE TO OTHER APPLICATIONS

The following applications of common assignee are related to the present application, have the same filing date as the present application, and are herein incorporated by reference in their entireties:

"Method and System for Down-Converting Electromagnetic Signals," application Ser. No. 09/170,002.

"Method and System for Ensuring Reception of a Communications Signal," application Ser. No. 09/176,415.

"Integrated Frequency Translation And Selectivity," application Ser. No. 09/175,966.

"Universal Frequency Translation, and Applications of Same," application Ser. No. 09/176,027.

BACKGROUND OF THE INVENTION

1. Field of the Invention

The present invention is generally directed to frequency up-conversion of electromagnetic (EM) signals.

2. Related Art

Modern day communication systems employ components such as transmitters and receivers to transmit information from a source to a destination. To accomplish this transmission, information is imparted on a carrier signal and the carrier signal is then transmitted. Typically, the carrier signal is at a frequency higher than the baseband frequency of the information signal. Typical ways that the information is imparted on the carrier signal are called modulation.

Three widely used modulation schemes include: frequency modulation (FM), where the frequency of the carrier wave changes to reflect the information that has been modulated on the signal; phase modulation (PM), where the phase of the carrier signal changes to reflect the information imparted on it; and amplitude modulation (AM), where the amplitude of the carrier signal changes to reflect the information. Also, these modulation schemes are used in combination with each other (e.g., AM combined with FM and AM combined with PM).

SUMMARY OF THE INVENTION

The present invention is directed to methods and systems to up-convert a signal from a lower frequency to a higher frequency, and applications thereof.

In one embodiment, the invention uses a stable, low frequency signal to generate a higher frequency signal with a frequency and phase that can be used as stable references.

In another embodiment, the present invention is used as a transmitter. In this embodiment, the invention accepts an information signal at a baseband frequency and transmits a modulated signal at a frequency higher than the baseband frequency.

The methods and systems of transmitting vary slightly depending on the modulation scheme being used. For some embodiments using frequency modulation (FM) or phase modulation (PM), the information signal is used to modulate an oscillating signal to create a modulated intermediate signal. If needed, this modulated intermediate signal is "shaped" to provide a substantially optimum pulse-width-to-period ratio. This shaped signal is then used to control a switch which opens and closes as a function of the frequency and pulse width of the shaped signal. As a result of this opening and closing, a signal that is harmonically rich is produced with each harmonic of the harmonically rich signal being modulated substantially the same as the modulated intermediate signal. Through proper filtering, the desired harmonic (or harmonics) is selected and transmitted.

For some embodiments using amplitude modulation (AM), the switch is controlled by an unmodulated oscillating signal (which may, if needed, be shaped). As the switch opens and closes, it gates a reference signal which is the information signal. In an alternate implementation, the information signal is combined with a bias signal to create the reference signal, which is then gated. The result of the gating is a harmonically rich signal having a fundamental frequency substantially proportional to the oscillating signal and an amplitude substantially proportional to the amplitude of the reference signal. Each of the harmonics of the harmonically rich signal also have amplitudes proportional to the reference signal, and are thus considered to be amplitude modulated. Just as with the FM/PM embodiments described above, through proper filtering, the desired harmonic (or harmonics) is selected and transmitted.

Further features and advantages of the invention, as well as the structure and operation of various embodiments of the invention, are described in detail below with reference to the accompanying figures. The left-most digit(s) of a reference number typically identifies the figure in which the reference number first appears.

BRIEF DESCRIPTION OF THE FIGURES

FIGS. 8A, 8B, 8C, 8D, and 8E illustrate typical waveforms associated with the FIG. 7 "I/Q" circuit for digital information signal;

FIGS. 19A–19I illustrate exemplary waveforms (for a frequency modulation mode operating in a frequency shift keying embodiment) at a plurality of points in an exemplary high level circuit diagram;

FIGS. 22A, 22B, 22C illustrate typical waveforms associated with the FIG. 5 AM circuit for an analog information signal;

FIG. 23 illustrates an implementation example of a voltage controlled oscillator (VCO);

FIG. 58 illustrates harmonic amplitudes for a pulse-width-to-period ratio of 0.01;

FIG. 60 is a table that illustrates the relative amplitudes of the first 50 harmonics for six exemplary pulse-width-to-period ratios;

FIG. 61 is a table that illustrates the relative amplitudes of the first 25 harmonics for six pulse-width-to-period ratios optimized for the $1^{st}$ through $10^{th}$ subharmonics;

FIGS. 64A and 64A1 illustrate exemplary implementations of aliasing modules.

DETAILED DESCRIPTION OF THE PREFERRED EMBODIMENTS

Figure 1:
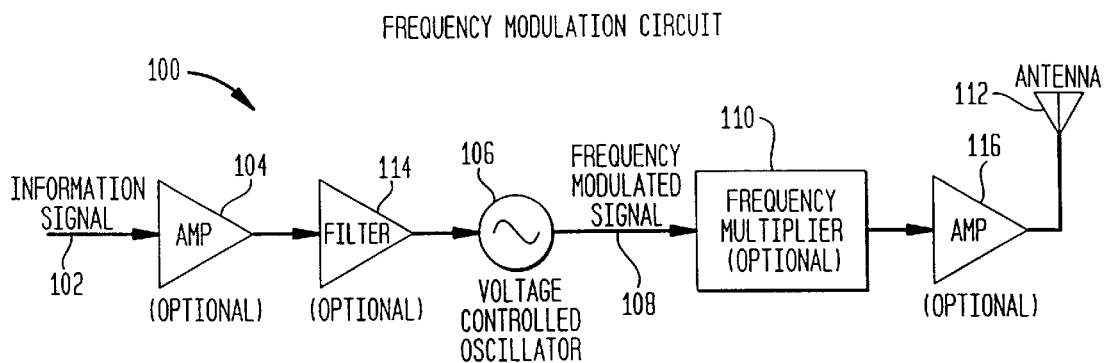
FIG. 1 illustrates a circuit for a frequency modulation (FM) transmitter.
Figure 2A:
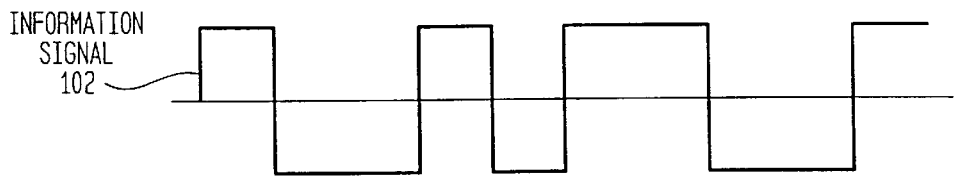
FIGS. 2A, 2B, and 2C illustrate typical waveforms associated with the FIG. 1 FM circuit for a digital information signal.
Figure 2B:
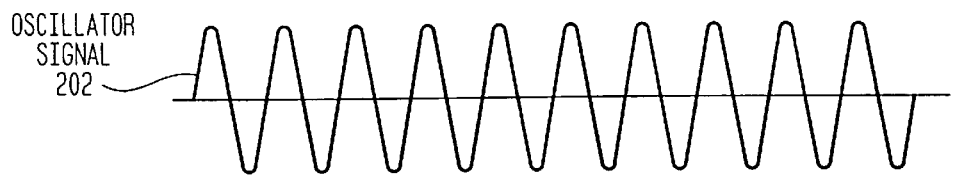
Figure 2C:
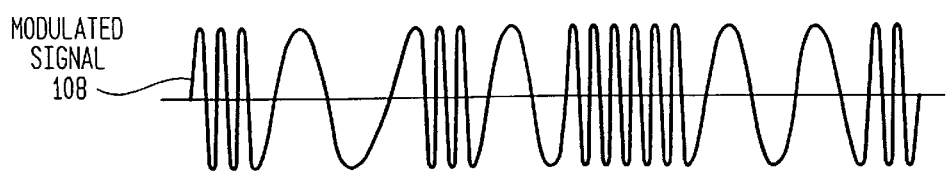

Table of contents
1. Terminology.
2. Overview of the Invention.
   2.1 Discussion of Modulation Techniques.
   2.2 Explanation of Exemplary Circuits and Waveforms.
      2.2.1 Frequency Modulation.
      2.2.2 Phase Modulation.
      2.2.3 Amplitude Modulation.
      2.2.4 In-phase/Quadrature-phase Modulation.
   2.3 Features of the Invention.
3. Frequency Up-conversion.
   3.1 High Level Description.
      3.1.1 Operational Description.
      3.1.2 Structural Description.
   3.2 Exemplary Embodiments.
      3.2.1 First Embodiment: Frequency Modulation (FM) Mode.
         3.2.1.1 Operational Description.
         3.2.1.2 Structural Description.
      3.2.2 Second Embodiment: Phase Modulation (PM) Mode.
         3.2.2.1 Operational Description.
         3.2.2.2 Structural Description.
      3.2.3 Third Embodiment: Amplitude Modulation (AM) Mode.
         3.2.3.1 Operational Description.
         3.2.3.2 Structural Description.
      3.2.4 Fourth Embodiment: In-phase/Quadrature-phase ("I/Q") Modulation Mode.
         3.2.4.1 Operational Description.
         3.2.4.2 Structural Description.
      3.2.5 Other Embodiments.
   3.3 Methods and Systems for Implementing the Embodiments.
      3.3.1 The Voltage Controlled Oscillator (FM Mode).
         3.3.1.1 Operational Description.
         3.3.1.2 Structural Description.
      3.3.2 The Local Oscillator (PM, AM, and "I/Q" Modes).
         3.3.2.1 Operational Description.
         3.3.2.2 Structural Description.
      3.3.3 The Phase Shifter (PM Mode).
         3.3.3.1 Operational Description.
         3.3.3.2 Structural Description.
      3.3.4 The Phase Modulator (PM and "I/Q" Modes).
         3.3.4.1 Operational Description.
         3.3.4.2 Structural Description.
      3.3.5 The Summing Module (AM Mode).
         3.3.5.1 Operational Description.
         3.3.5.2 Structural Description.
      3.3.6 The Switch Module (FM, PM, and "I/Q" Modes).
         3.3.6.1 Operational Description.
         3.3.6.2 Structural Description.
      3.3.7 The Switch Module (AM Mode).
         3.3.7.1 Operational Description.
         3.3.7.2 Structural Description.
      3.3.8 The Summer ("I/Q" Mode).
         3.3.8.1 Operational Description.
         3.3.8.2 Structural Description.
      3.3.9 The Filter (FM, PM, AM, and "I/Q" Modes).
         3.3.9.1 Operational Description.
         3.3.9.2 Structural Description.
      3.3.10 The Transmission Module (FM, PM, AM, and "I/Q" Modes).
         3.3.10.1 Operational Description.
         3.3.10.2 Structural Description.
      3.3.11 Other Implementations.
4. Harmonic Enhancement.
   4.1 High Level Description.
      4.1.1 Operational Description.
      4.1.2 Structural Description.
   4.2 Exemplary Embodiments.
      4.2.1 First Embodiment: When a Square Wave Feeds the Harmonic Enhancement Module to Create One Pulse per Cycle.
         4.2.1.1 Operational Description.
         4.2.1.2 Structural Description.
      4.2.2 Second Embodiment: When a Square Wave Feeds the Harmonic Enhancement Module to Create Two Pulses per Cycle.
         4.2.2.1 Operational Description.
         4.2.2.2 Structural Description.
      4.2.3 Third Embodiment: When Any Waveform Feeds the Harmonic Enhancement Module.
         4.2.3.1 Operational Description.
         .4.2.3.2 Structural Description.
      4.2.4 Other Embodiments.
   4.3 Implementation Examples.
      4.3.1 First Digital Logic Circuit.
      4.3.2 Second Digital Logic Circuit.
      4.3.3 Analog Circuit.
      4.3.4 Other Implementations.
5. Amplifier Module.
   5.1 High Level Description.
      5.1.1 Operational Description.
      5.1.2 Structural Description.
   5.2 Exemplary Embodiment.
      5.2.1 Linear Amplifier.
         5.2.1.1 Operational Description.
         5.2.1.2 Structural Description.
      5.2.2 Other Embodiments.
   5.3 Implementation Examples.
      5.3.1 Linear Amplifier.
         5.3.1.1 Operational Description.
         5.3.1.2 Structural Description.
      5.3.2 Other Implementations.
6. Receiver/Transmitter System.
   6.1 High Level Description.
   6.2 Exemplary Embodiments and Implementation Examples.
      6.2.1 First Embodiment: The Transmitter of the Present Invention Being Used in a Circuit with a Superheterodyne Receiver.
      6.2.2 Second Embodiment: The Transmitter of the Present Invention Being Used with a Universal Frequency Down Converter in a Half-Duplex Mode.

6.2.3 Third Embodiment: The Transmitter of the Present Invention Being Used with a Universal Frequency Down Converter in a Full-Duplex Mode.

6.2.4 Other Embodiments and Implementations.

6.3 Summary Description of Down-conversion Using a Universal Frequency Translation Module.

7. Designing a Transmitter According to an Embodiment of the Present Invention.

7.1 Frequency of the Transmission Signal.

7.2 Characteristics of the Transmission Signal.

7.3 Modulation Scheme.

7.4 Characteristics of the Information Signal.

7.5 Characteristic of the Oscillating Signal.

7.5.1 Frequency of the Oscillating Signal.

7.5.2 Pulse Width of the String of Pulses.

7.6 Design of the Pulse Shaping Circuit.

7.7 Selection of the Switch.

7.8 Design of the Filter.

7.9 Selection of an Amplifier.

7.10 Design of the Transmission Module.

1. Terminology.

Various terms used in this application are generally described in this section. Each description in this section is provided for illustrative and convenience purposes only, and is not limiting. The meaning of these terms will be apparent to persons skilled in the relevant art(s) based on the entirety of the teachings provided herein.

Amplitude Modulation (AM): A modulation technique wherein the amplitude of the carrier signal is shifted (i.e., varied) as a function of the information signal. The frequency of the carrier signal typically remains constant. A subset of AM is referred to as "amplitude shift keying" which is used primarily for digital communications where the amplitude of the carrier signal shifts between discrete states rather than varying continuously as it does for analog information.

Analog signal: A signal in which the information contained therein is continuous as contrasted to discrete, and represents a time varying physical event or quantity. The information content is conveyed by varying at least one characteristic of the signal, such as but not limited to amplitude, frequency, or phase, or any combinations thereof.

Baseband signal: Any generic information signal desired for transmission and/or reception. As used herein, it refers to both the information signal that is generated at a source prior to any transmission (also referred to as the modulating baseband signal), and to the signal that is to be used by the recipient after transmission (also referred to as the demodulated baseband signal).

Carrier signal: A signal capable of carrying information. Typically, it is an electromagnetic signal that can be varied through a process called modulation. The frequency of the carrier signal is referred to as the carrier frequency. A communications system may have multiple carrier signals at different carrier frequencies.

Control a switch: Causing a switch to open and close. The switch may be, without limitation, mechanical, electrical, electronic, optical, etc., or any combination thereof. Typically, it is controlled by an electrical or electronic input. If the switch is controlled by an electronic signal, it is typically a different signal than the signals connected to either terminal of the switch.

Demodulated baseband signal: The baseband signal that is to be used by the recipient after transmission. Typically it has been down converted from a carrier signal and has been demodulated. The demodulated baseband signal should closely approximate the information signal (i.e., the modulating baseband signal) in frequency, amplitude, and information.

Demodulation: The process of removing information from a carrier or intermediate frequency signal.

Digital signal: A signal in which the information contained therein has discrete states as contrasted to a signal that has a property that may be continuously variable.

Direct down conversion: A down conversion technique wherein a received signal is directly down converted and demodulated, if applicable, from the original transmitted frequency (i.e., a carrier frequency) to baseband without having an intermediate frequency.

Down conversion: A process for performing frequency translation in which the final frequency is lower than the initial frequency.

Drive a switch: Same as control a switch.

Frequency Modulation (FM): A modulation technique wherein the frequency of the carrier signal is shifted (i.e., varied) as a function of the information signal. A subset of FM is referred to as "frequency shift keying" which is used primarily for digital communications where the frequency of the carrier signal shifts between discrete states rather than varying continuously as it does for analog information.

Harmonic: A harmonic is a frequency or tone that, when compared to its fundamental or reference frequency or tone, is an integer multiple of it. In other words, if a periodic waveform has a fundamental frequency of "f" (also called the first harmonic), then its harmonics may be located at frequencies of "n•f," where "n" is 2, 3, 4, etc. The harmonic corresponding to n=2 is referred to as the second harmonic, the harmonic corresponding to n=3 is referred to as the third harmonic, and so on.

In-phase ("I") signal: The signal typically generated by an oscillator. It has not had its phase shifted and is often represented as a sine wave to distinguish it from a "Q" signal. The "I" signal can, itself, be modulated by any means. When the "I" signal is combined with a "Q" signal, the resultant signal is referred to as an "I/Q" signal.

In-phase/Quadrature-phase ("I/Q") signal: The signal that results when an "I" signal is summed with a "Q" signal. Typically, both the "I" and "Q" signals have been phase modulated, although other modulation techniques may also be used, such as amplitude modulation. An "I/Q" signal is used to transmit separate streams of information simultaneously on a single transmitted carrier. Note that the modulated "I" signal and the modulated "Q" signal are both carrier signals having the same frequency. When combined, the resultant "I/Q" signal is also a carrier signal at the same frequency.

Information signal: The signal that contains the information that is to be transmitted. As used herein, it refers to the original baseband signal at the source. When it is intended that the information signal modulate a carrier signal, it is also referred to as the "modulating baseband signal." It may be voice or data, analog or digital, or any other signal or combination thereof.

Intermediate frequency (IF) signal: A signal that is at a frequency between the frequency of the baseband signal and the frequency of the transmitted signal.

Modulation: The process of varying one or more physical characteristics of a signal to represent the information to be transmitted. Three commonly used modulation techniques are frequency modulation, phase modulation, and amplitude modulation. There are also variations, subsets, and combinations of these three techniques.

Operate a switch: Same as control a switch.

Phase Modulation (PM): A modulation technique wherein the phase of the carrier signal is shifted (i.e., varied) as a function of the information signal. A subset of PM is referred to as "phase shift keying" which is used primarily for digital communications where the phase of the carrier signal shifts between discrete states rather than varying continuously as it does for analog information. Quadrature-phase ("Q") signal: A signal that is out of phase with an in-phase ("I") signal. The amount of phase shift is predetermined for a particular application, but in a typical implementation, the "Q" signal is 90° out of phase with the "I" signal. Thus, if the "I" signal were a sine wave, the "Q" signal would be a cosine wave. When discussed together, the "I" signal and the "Q" signal have the same frequencies.

Spectrum: Spectrum is used to signify a continuous range of frequencies, usually wide, within which electromagnetic (EM) waves have some specific common characteristic. Such waves may be propagated in any communication medium, both natural and manmade, including but not limited to air, space, wire, cable, liquid, waveguide, microstrip, stripline, optical fiber, etc. The EM spectrum includes all frequencies greater than zero hertz.

Subharmonic: A subharmonic is a frequency or tone that is an integer submultiple of a referenced fundamental frequency or tone. That is, a subharmonic frequency is the quotient obtained by dividing the fundamental frequency by an integer. For example, if a periodic waveform has a frequency of "f" (also called the "fundamental frequency" or first subharmonic), then its subharmonics have frequencies of "f/n," where n is 2, 3, 4, etc. The subharmonic corresponding to n=2 is referred to as the second subharmonic, the subharmonic corresponding to n=3 is referred to as the third subharmonic, and so on. A subharmonic itself has possible harmonics, and the $i^{th}$ harmonic of the $j^{th}$ subharmonic will be at the fundamental frequency of the original periodic waveform. For example, the third subharmonic (which has a frequency of "f/3") may have harmonics at integer multiples of itself (i.e., a second harmonic at "2•f/3," a third harmonic at "3•f/3," and so on). The third harmonic of the third subharmonic of the original signal (i.e., "3•f/3") is at the frequency of the original signal.

Trigger a switch: Same as control a switch.

Up conversion: A process for performing frequency translation in which the final frequency is higher than the initial frequency.

2. Overview of the Invention.

The present invention is directed to systems and methods for frequency up-conversion, and applications thereof.

In one embodiment, the frequency up-converter of the present invention is used as a stable reference frequency source in a phase comparator or in a frequency comparator. This embodiment of the present invention achieves this through the use of a stable, low frequency local oscillator, a switch, and a filter. Because it up-converts frequency, the present invention can take advantage of the relatively low cost of low frequency oscillators to generate stable, high frequency signals.

In a second embodiment, the frequency up-converter is used as a system and method for transmitting an electromagnetic (EM) signal.

Based on the discussion contained herein, one skilled in the relevant art(s) will recognize that there are other, alternative embodiments in which the frequency up-converter of the present invention could be used in other applications, and that these alternative embodiments fall within the scope of the present invention.

For illustrative purposes, various modulation examples are discussed below. However, it should be understood that the invention is not limited by these examples. Other modulation techniques that might be used with the present invention will be apparent to persons skilled in the relevant art(s) based on the teaching contained herein.

Also for illustrative purposes, frequency up-conversion according to the present invention is described below in the context of a transmitter. However, the invention is not limited to this embodiment. Equivalents, extensions, variations, deviations, etc., of the following will be apparent to persons skilled in the relevant art(s) based on the teachings contained herein. Such equivalents, extensions, variations, deviations, etc., are within the scope and spirit of the present invention.

2.1 Discussion of Modulation Techniques.

Techniques by which information can be imparted onto EM signals to be transmitted are called modulation. These techniques are generally well known to one skilled in the relevant art(s), and include, but are not limited to, frequency modulation (FM), phase modulation (PM), amplitude modulation (AM), quadrature-phase shift keying (QPSK), frequency shift keying (FSK), phase shift keying (PSK), amplitude shift keying (ASK), etc., and combinations thereof. These last three modulation techniques, FSK, PSK, and ASK, are subsets of FM, PM, and AM, respectively, and refer to circuits having discrete input signals (e.g., digital input signals).

For illustrative purposes only, the circuits and techniques described below all refer to the EM broadcast medium. However, the invention is not limited by this embodiment. Persons skilled in the relevant art(s) will recognize that these same circuits and techniques can be used in all transmission media (e.g., over-the-air broadcast, point-to-point cable, etc.).

2.2 Explanation of Exemplary Circuits and Waveforms.

2.2.1 Frequency Modulation.

Figure 20A:
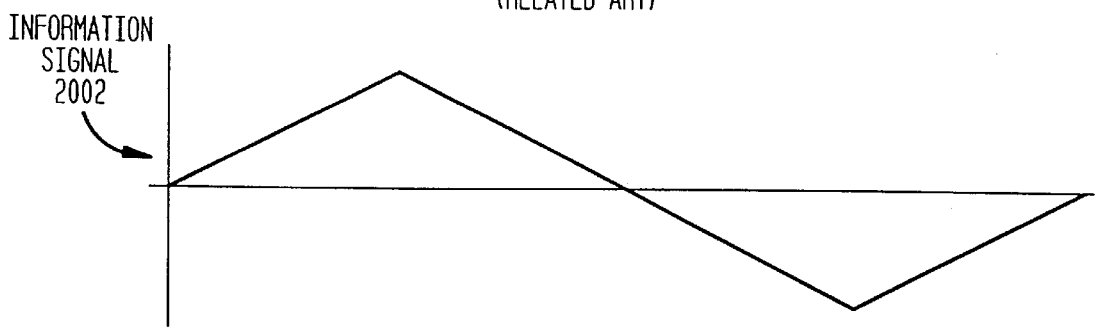
FIGS. 20A, 20B, 20C illustrate typical waveforms associated with the FIG. 1 FM circuit for an analog information signal.
Figure 20B:
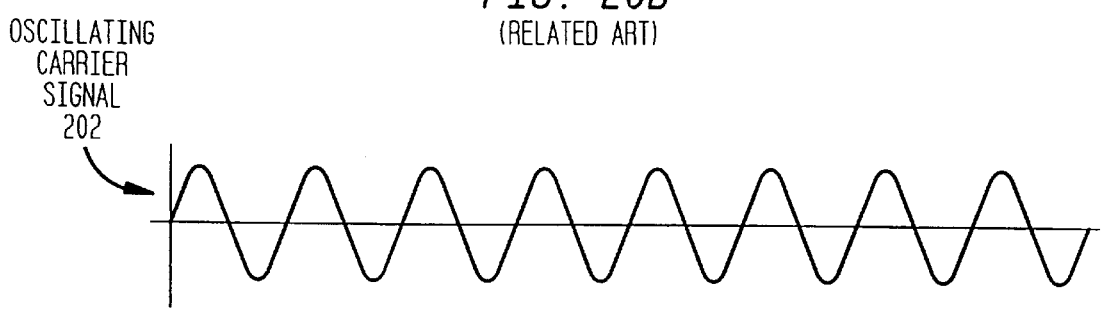
Figure 20C:
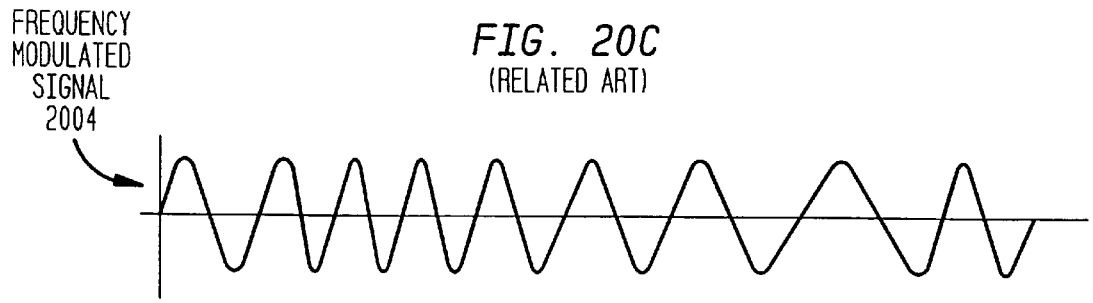

FIG. 1 illustrates an example of a frequency modulation (FM) circuit 100 and FIGS. 2A, 2B, and 2C, and FIGS. 20A, 20B, and 20C illustrate examples of waveforms at several points in FM circuit 100. In an FM system, the frequency of a carrier signal, such as an oscillating signal 202 (FIG. 2B and FIG. 20B), is varied to represent the data to be communicated, such as information signals 102 of FIG. 2A and 2002 of FIG. 20A. In FIG. 20A, information signal 2002 is a continuous signal (i.e., an analog signal), and in FIG. 2A, information signal 102 is a discrete signal (i.e., a digital signal). In the case of the discrete information signal 102, the FM circuit 100 is referred to as a frequency shift keying (FSK) system, which is a subset of an FM system.

Frequency modulation circuit 100 receives an information signal 102, 2002 from a source (not shown). Information signal 102, 2002 can be amplified by an optional amplifier 104 and filtered by an optional filter 114 and is the voltage input that drives a voltage controlled oscillator (VCO) 106. Within VCO 106, an oscillating signal 202 (seen on FIG. 2B and FIG. 20B) is generated. The purpose of VCO 106 is to vary the frequency of oscillating signal 202 as a function of the input voltage, i.e., information signal 102, 2002. The output of VCO 106 is a modulated signal shown as modulated signal 108 (FIG. 2C) when the information signal is the digital information signal 102 and shown as modulated signal 2004 (FIG. 20C) when the information signal is the analog signal 2002. Modulated signal 108, 2004 is at a relatively low frequency (e.g., generally between 50 MHz and 100 MHz) and can have its frequency increased by an optional frequency multiplier 110 (e.g., to 900 MHz, 1.8 GHz) and have its amplitude increased by an optional amplifier 116. The output of optional frequency multiplier 110 and/or optional amplifier 116 is then transmitted by an exemplary antenna 112.

2.2.2 Phase Modulation.

Figure 3:
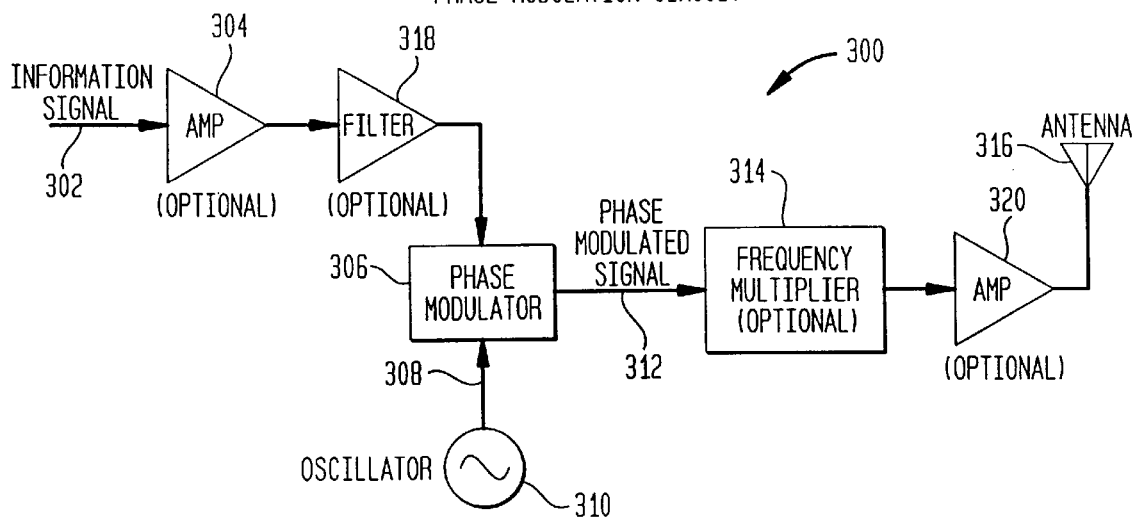
FIG. 3 illustrates a circuit for a phase modulation (PM) transmitter.
Figure 4A:
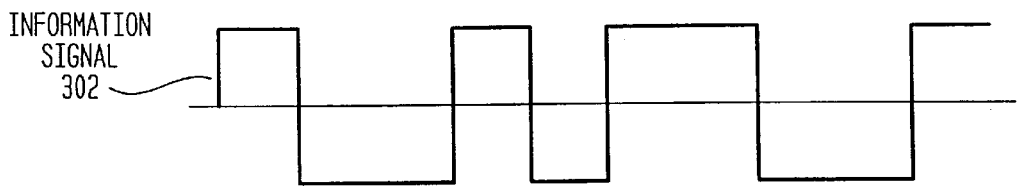
FIGS. 4A, 4B, and 4C illustrate typical waveforms associated with the FIG. 3 PM circuit for a digital information signal.
Figure 4B:
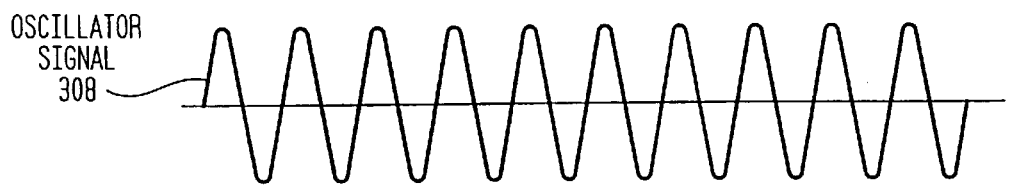
Figure 4C:
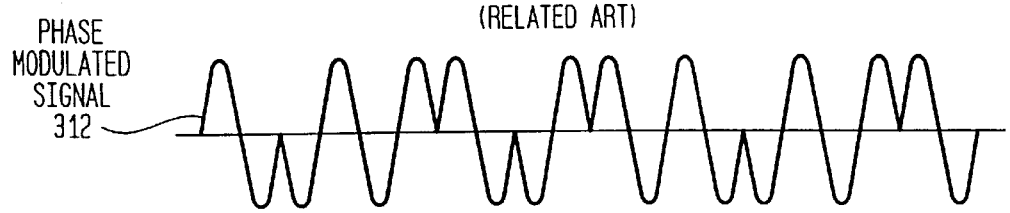
Figure 21A:
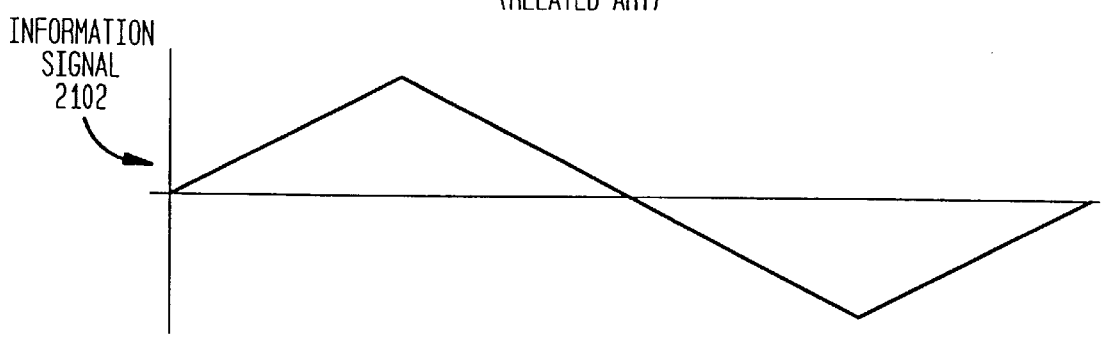
FIGS. 21A, 21B, 21C illustrate typical waveforms associated with the FIG. 3 PM circuit for an analog information signal.
Figure 21B:
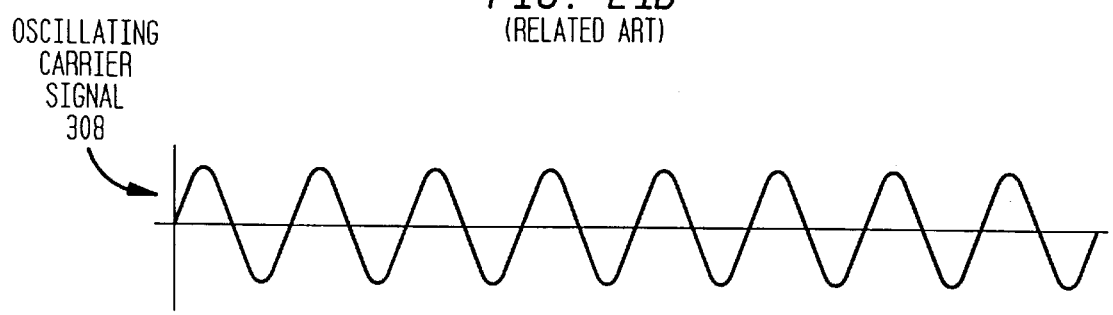
Figure 21C:
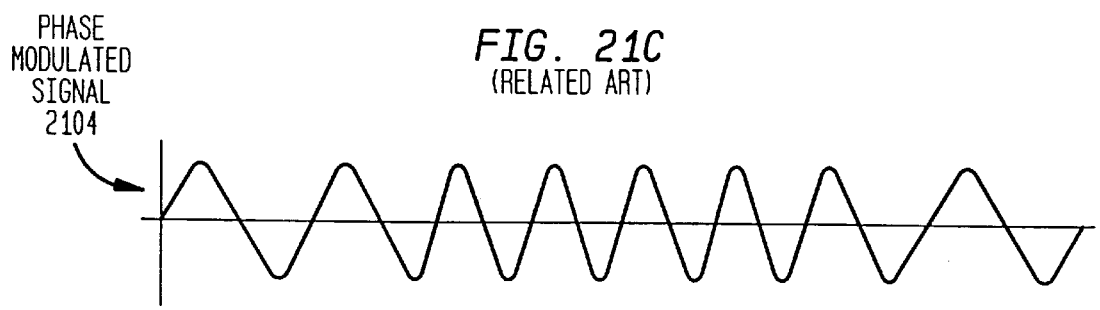

FIG. 3 illustrates an example of a phase modulation (PM) circuit 300 and FIGS. 4A, 4B, and 4C, and FIGS. 21A, 21B, and 21C illustrate examples of waveforms at several points in PM circuit 300. In a PM system, the phase of a carrier signal, such as a local oscillator (LO) output 308 (FIG. 4B and FIG. 21B), is varied to represent the data to be communicated, such as an information signals 302 of FIG. 4A and 2102 of FIG. 21A. In FIG. 21A, information signal 2102 is a continuous signal (i.e., an analog signal), and in FIG. 4A, information signal 302 is a discrete signal (i.e., a digital signal). In the case of the discrete information signal 302, the PM circuit is referred to as a phase shift keying (PSK) system. This is the typical implementation, and is a subset of a PM system.

Phase modulation circuit 300 receives information signal 302, 2102 from a source (not shown). Information signal 302, 2102 can be amplified by an optional amplifier 304 and filtered by an optional filter 318 and is routed to a phase modulator 306. Also feeding phase modulator 306 is LO output 308 of a local oscillator 310. LO output 308 is shown on FIG. 4B and FIG. 21B. Local oscillators, such as local oscillator 310, output an electromagnetic wave at a predetermined frequency and amplitude.

The output of phase modulator 306 is a modulated signal shown as a phase modulated signal 312 (FIG. 4C) when the information signal is the discrete information signal 302 and shown as a phase modulated signal 2104 (FIG. 21C) when the information signal is the analog information signal 2102. The purpose of phase modulator 306 is to change the phase of LO output 308 as a function of the value of information signal 302, 2102. That is, for example in a PSK mode, if LO output 308 were a sine wave, and the value of information signal 302 changed from a binary high to a binary low, the phase of LO output 308 would change from a sine wave with a zero phase to a sine wave with, for example, a phase of 180°. The result of this phase change would be phase modulated signal 312 of FIG. 4C which would have the same frequency as LO output 308, but would be out of phase by 180° in this example. For a PSK system, the phase changes in phase modulated signal 312 that are representative of the information in information signal 302 can be seen by comparing waveforms 302, 308, and 312 on FIGS. 4A, 4B, and 4C. For the case of an analog information signal 2102 of FIG. 21A, the phase of LO output 308 of FIG. 21B changes continuously as a function of the amplitude of the information signal 2102. That is, for example, as information signal 2102 increases from a value of "X" to "X+δx", the PM signal 2104 of FIG. 21C changes from a signal which may be represented by the equation $\sin(\omega t)$ to a signal which can be represented by the equation $\sin(\omega t+\phi)$, where $\phi$ is the phase change associated with a change of δx in information signal 2102. For an analog PM system, the phase changes in phase modulated signal 2104 that are representative of the information in information signal 2102 can be seen by comparing waveforms 2102, 308, and 2104 on FIGS. 21A, 21B, and 21C.

After information signal 302, 2102 and LO output 308 have been modulated by phase modulator 306, phase modulated signal 312, 2104 can be routed to an optional frequency multiplier 314 and optional amplifier 320. The purpose of optional frequency multiplier 314 is to increase the frequency of phase modulated signal 312 from a relatively low frequency (e.g., 50 MHz to 100 MHz) to a desired broadcast frequency (e.g., 900 MHz, 1.8 GHz). Optional amplifier 320 raises the signal strength of phase modulated signal 312, 2104 to a desired level to be transmitted by an exemplary antenna 316.

2.2.3 Amplitude Modulation.

Figure 5:
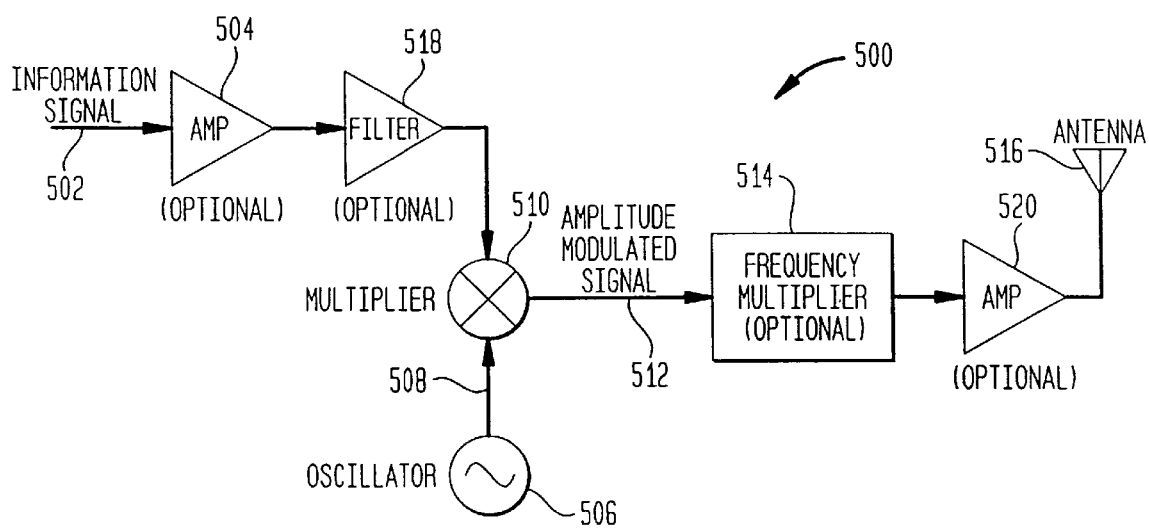
FIG. 5 illustrates a circuit for an amplitude modulation (AM) transmitter.
Figure 6A:
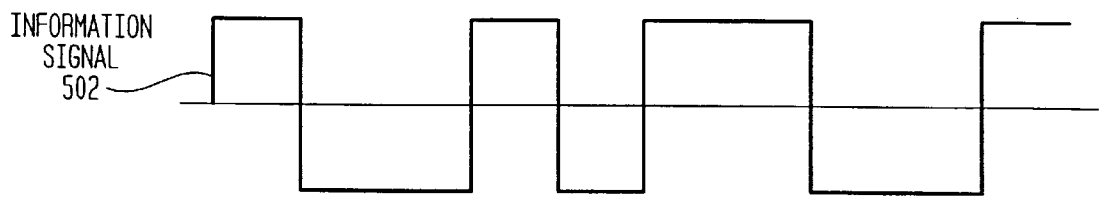
FIGS. 6A, 6B, and 6C illustrate typical waveforms associated with the FIG. 5 AM circuit for a digital information signal.
Figure 6B:
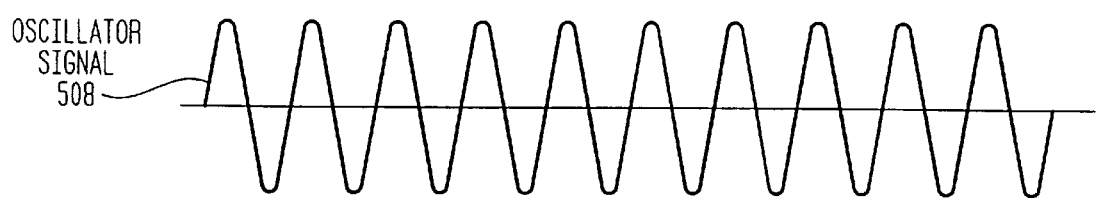
Figure 6C:
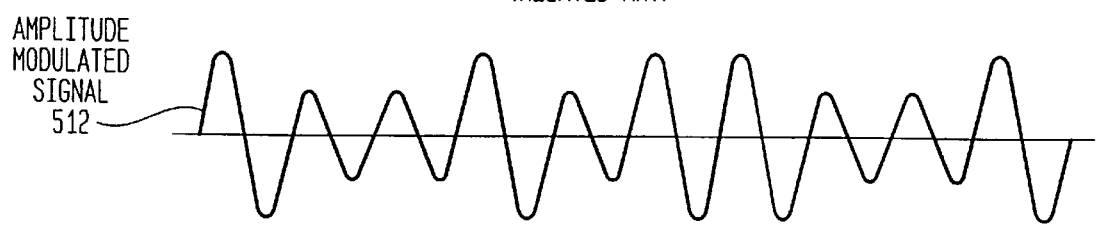

FIG. 5 illustrates an example of an amplitude modulation (AM) circuit 500 and FIGS. 6A, 6B, and 6C, and FIGS. 22A, 22B, and 22C illustrate examples of waveforms at several points in AM circuit 500. In an AM system, the amplitude of a carrier signal, such as a local oscillator (LO) signal 508 (FIG. 6B and FIG. 22B), is varied to represent the data to be communicated, such as information signals 502 of FIG. 6A and 2202 of FIG. 22A. In FIG. 22A, information signal 2202 is a continuous signal (i.e., an analog signal), and in FIG. 6A, information signal 502 is a discrete signal (i.e., a digital signal). In the case of the discrete information signal 502, the AM circuit is referred to as an amplitude shift keying (ASK) system, which is a subset of an AM system.

Amplitude modulation circuit 500 receives information signal 502 from a source (not shown). Information signal 502, 2202 can be amplified by an optional amplifier 504 and filtered by an optional filter 518. Amplitude modulation circuit 500 also includes a local oscillator (LO) 506 which has an LO output 508. Information signal 502, 2202 and LO output 508 are then multiplied by a multiplier 510. The purpose of multiplier 510 is to cause the amplitude of LO output 508 to vary as a function of the amplitude of information signal 502, 2202. The output of multiplier 510 is a modulated signal shown as amplitude modulated signal 512 (FIG. 6C) when the information signal is the digital information signal 502 and shown as modulated signal 2204 (FIG. 22C) when the information signal is the analog information signal 2202. AM signal 512, 2204 can then be routed to an optional frequency multiplier 514 where the frequency of AM signal 512, 2204 is increased from a relatively low level (e.g., 50 MHz to 100 MHz) to a higher level desired for broadcast (e.g., 900 MHz, 1.8 GHz) and an optional amplifier 520, which increases the signal strength of AM signal 512, 2204 to a desired level for broadcast by an exemplary antenna 516.

2.2.4 In-phase/Quadrature-phase Modulation.

Figure 7:
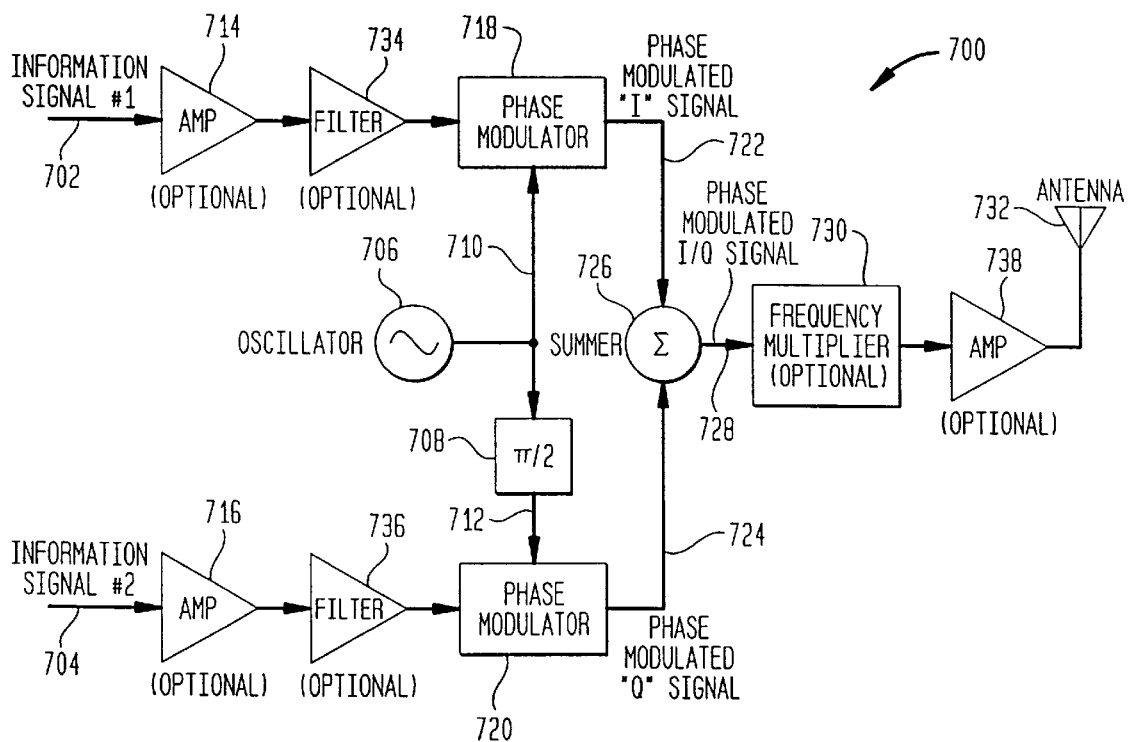
FIG. 7 illustrates a circuit for an in-phase/quadrature-phase modulation ("I/Q") transmitter.

FIG. 7 illustrates an example of an in-phase/quadrature-phase ("I/Q") modulation circuit 700 and FIGS. 8A, 8B, 8C, 8D, and 8E illustrate examples of waveforms at several points in "I/Q" modulation circuit 700. In this technique, which increases bandwidth efficiency, separate information signals can be simultaneously transmitted on carrier signals that are out of phase with each other. That is, a first information signal 702 of FIG. 8A can be modulated onto the in-phase ("I") oscillator signal 710 of FIG. 8B and a second information signal 704 of FIG. 8C can be modulated onto the quadrature-phase ("Q") oscillator signal 712 of FIG. 8D. The "I" modulated signal is combined with the "Q" modulated signal and the resulting "I/Q" modulated signal is then transmitted. In a typical usage, both information signals are digital, and both are phase modulated onto the "I" and "Q" oscillating signals. One skilled in the relevant art(s) will recognize that the "I/Q" mode can also work with analog information signals, with combinations of analog and digital signals, with other modulation techniques, or any combinations thereof.

This "I/Q" modulation system uses two PM circuits together in order to increase the bandwidth efficiency. As stated above, in a PM circuit, the phase of an oscillating signal, such as 710 (or 712) (FIGS. 8B or 8D), is varied to represent the data to be communicated, such as an information signal such as 702 (or 704). For ease of understanding and display, the discussion herein will describe the more typical use of the "I/Q" mode, that is, with digital information signals and phase modulation on both oscillating signals. Thus, both signal streams are phase shift keying (PSK), which is a subset of PM.

"I/Q" modulation circuit 700 receives an information signal 702 from a first source (not shown) and an information signal 704 from a second source (not shown). Examples of information signals 702 and 704 are shown in FIG. 8A and 8C. Information signals 702 and 704 can be amplified by optional amplifiers 714 and 716 and filtered by optional filters 734 and 736. It is then routed to phase modulators 718 and 720. Also feeding phase modulators 718 and 720 are oscillating signals 710 and 712. Oscillating signal 710 was generated by a local oscillator 706, and is shown in FIG. 8B, and oscillating signal 712 is the phase shifted output of local oscillator 706. Local oscillators, such as local oscillator 706, output an electromagnetic wave at a predetermined frequency and amplitude.

The output of phase modulator 718 is a phase modulated signal 722 which is shown using a dotted line as one of the waveforms in FIG. 8E. Similarly, the output of phase modulator 720, which operates in a manner similar to phase modulator 718, is a phase modulated signal 724 which is shown using a solid line as the other waveform in FIG. 8E. The effect of phase modulators 718 and 720 on oscillating signals 710 and 712 is to cause them to change phase. As stated above, the system shown here is a PSK system, and as such, the phase of oscillating signals 710 and 712 is shifted by phase modulators 718 and 720 by a discrete amount as a function of information signals 702 and 704.

For simplicity of discussion and ease of display, oscillating signal 710 is shown on FIG. 8B as a sine wave and is referred to as the "I" signal in the "I/Q" circuit 700. After the output of oscillator 706 has gone through a phase shifter 708, shown here as shifting the phase by $-\pi/2$, oscillating signal 712 is a cosine wave, shown on FIG. 8D, and is referred to as the "Q" signal in the "I/Q" circuit. Again, for ease of display, phase modulators 718 and 720 are shown as shifting the phase of the respective oscillating signals 710 and 712 by 180°. This is seen on FIG. 8E. Modulated signal 722 is summed with modulated signal 724 by a summer 726. The output of summer 726 is the arithmetic sum of modulated signal 722 and 724 and is an "I/Q" signal 728. (For clarity of the display on FIG. 8E, the combined signal 728 is not shown. However, one skilled in the relevant art(s) will recognize that the arithmetic sum of 2 sinusoidal waves having the same frequency is also a sinusoidal wave at that frequency.)

"I/Q" signal 728 can then be routed to an optional frequency multiplier 730, where the frequency of "I/Q" signal 718 is increased from a relatively low level (e.g., 50 MHz to 100 MHz) to a higher level desired for broadcast (e.g., 900 MHz, 1.8 GHz), and to an optional amplifier 738 which increases the signal strength of "I/Q" signal 728 to a desired level for broadcast by an exemplary antenna 732.

2.3 Features of the Invention.

As apparent from the above, several frequencies are involved in a communications system. The frequency of the information signal is relatively low. The frequency of the local oscillator (both the voltage controlled oscillator as well as the other oscillators) is higher than that of the information signal, but typically not high enough for efficient transmission. A third frequency, not specifically mentioned above, is the frequency of the transmitted signal which is greater than or equal to the frequency of the oscillating signal. This is the frequency that is routed from the optional frequency multipliers and optional amplifiers to the antennas in the previously described circuits.

Typically, in the transmitter subsystem of a communications system, upconverting the information signal to broadcast frequency requires, at least, filters, amplifiers, and frequency multipliers. Each of these components is costly, not only in terms of the purchase price of the component, but also because of the power required to operate them.

The present invention provides a more efficient means for producing a modulated carrier for transmission, uses less power, and requires fewer components. These and additional advantages of the present invention will be apparent from the following description.

3. Frequency Up-conversion.

The present invention is directed to systems and methods for frequency up-conversion and applications of the same. In one embodiment, the frequency up-converter of the present invention allows the use of a stable, low frequency oscillator to generate a stable high frequency signal that, for example and without limitation, can be used as a reference signal in a phase comparator or a frequency comparator. In another embodiment, the up-converter of the present invention is used in a transmitter. The invention is also directed to a transmitter. Based on the discussion contained herein, one skilled in the relevant art(s) will recognize that there are other, alternative embodiments and applications in which the frequency up-converter of the present invention could be used, and that these alternative embodiments and applications fall within the scope of the present invention.

For illustrative purposes, frequency up-conversion according to the present invention is described below in the context of a transmitter. However, as apparent from the preceding paragraph, the invention is not limited to this embodiment.

The following sections describe methods related to a transmitter and frequency up-converter. Structural exemplary embodiments for achieving these methods are also described. It should be understood that the invention is not limited to the particular embodiments described below. Equivalents, extensions, variations, deviations, etc., of the following will be apparent to persons skilled in the relevant art(s) based on the teachings contained herein. Such equivalents, extensions, variations, deviations, etc., are within the scope and spirit of the present invention.

3.1. High Level Description.

This section (including its subsections) provides a high-level description of up-converting and transmitting signals according to the present invention. In particular, an operational process of frequency up-conversion in the context of transmitting signals is described at a high-level. The operational process is often represented by flowcharts. The flowcharts are presented herein for illustrative purposes only, and are not limiting. In particular, the use of flowcharts should not be interpreted as limiting the invention to discrete or digital operation. In practice, those skilled in the relevant art(s) will appreciate, based on the teachings contained herein, that the invention can be achieved via discrete operation, continuous operation, or any combination thereof. Furthermore, the flow of control represented by the flowcharts is also provided for illustrative purposes only, and it will be appreciated by persons skilled in the relevant art(s) that other operational control flows are within the scope and spirit of the invention.

Also, a structural implementation for achieving this process is described at a high-level. This structural implementation is described herein for illustrative purposes, and is not limiting. In particular, the process described in this section can be achieved using any number of structural implementations, one of which is described in this section. The details of such structural implementations will be apparent to persons skilled in the relevant art(s) based on the teachings contained herein.

3.1.1 Operational Description.

Figure 9:
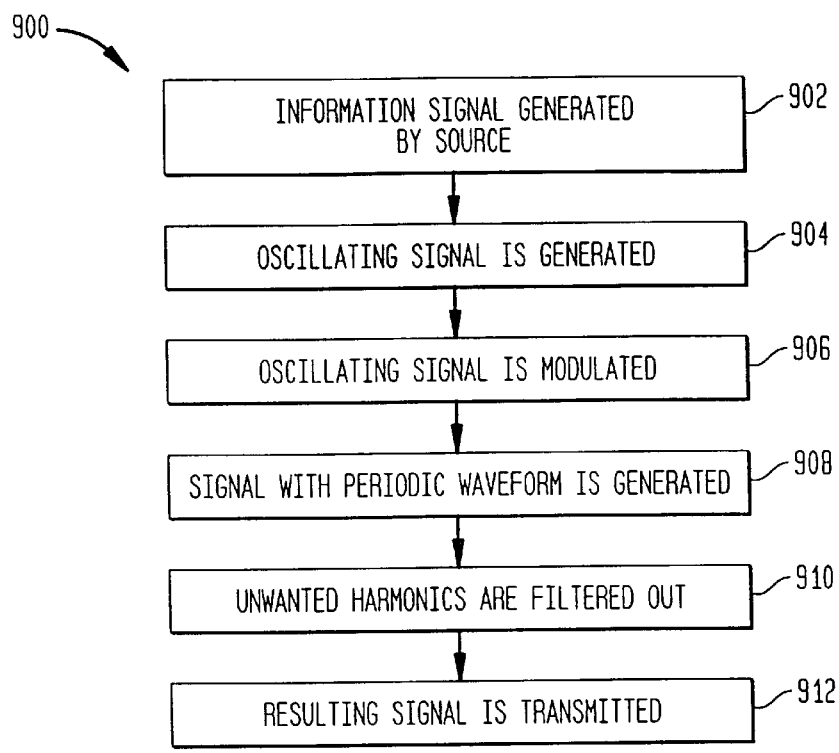
FIG. 9 illustrates the high level operational flowchart of a transmitter according to an embodiment of the present invention.

The flow chart 900 of FIG. 9 demonstrates the operational method of frequency up-conversion in the context of transmitting a signal according to an embodiment of the present invention. The invention is directed to both frequency up-conversion and transmitting signals as represented in FIG. 9. Representative waveforms for signals generated in flow chart 900 are depicted in FIG. 19. For purposes of illustrating the high level operation of the invention, frequency modulation of a digital information signal is depicted. The invention is not limited to this exemplary embodiment. One skilled in the relevant art(s) will appreciate that other modulation modes could alternatively be used (as described in later sections).

Figure 19A:
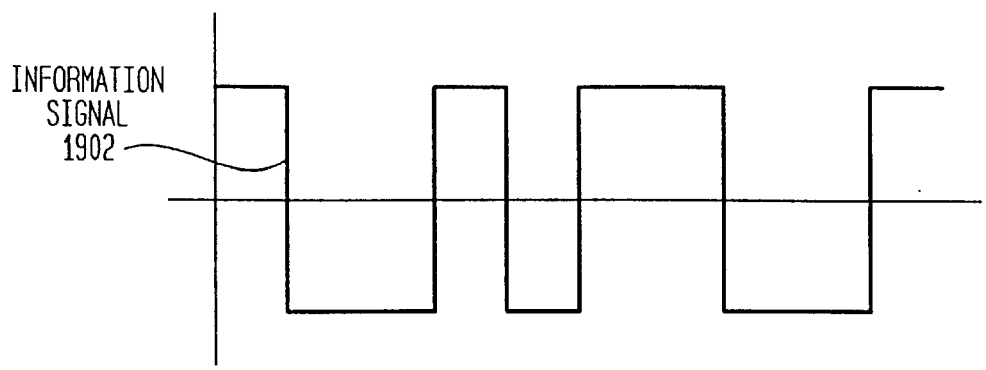

In step 902, an information signal 1902 (FIG. 19A) is generated by a source. This information signal may be analog, digital, and any combination thereof, or anything else that is desired to be transmitted, and is at the baseband frequency. As described below, the information signal 1902 is used to modulate an intermediate signal 1904. Accordingly, the information signal 1902 is also herein called a modulating baseband information signal. In the example of FIG. 19A, the information signal 1902 is illustrated as a digital signal. However, the invention is not limited to this embodiment. As noted above, the information signal 1902 can be analog, digital, and/or any combination thereof.

An oscillating signal 1904 (FIG. 19B) is generated in step 904. In step 906, the oscillating signal 1904 is modulated, where the modulation is a result of, and a function of, the information signal 1902. Step 906 produces a modulated oscillating signal 1906 (FIG. 19C), also called a modulated intermediate signal. As noted above, the flowchart of FIG. 9 is being described in the context of an example where the information signal 1902 is a digital signal. However, alternatively, the information signal 1902 can be analog or any combination of analog and digital. Also, the example shown in FIG. 19 uses frequency shift keying (FSK) as the modulation technique. Alternatively, any modulation technique (e.g., FM, AM, PM, ASK, PSK, etc., or any combination thereof) can be used. The remaining steps 908–912 of the flowchart of FIG. 9 operate in the same way, whether the information signal 1902 is digital, analog, etc., or any combination thereof, and regardless of what modulation technique is used.

Figure 19B:
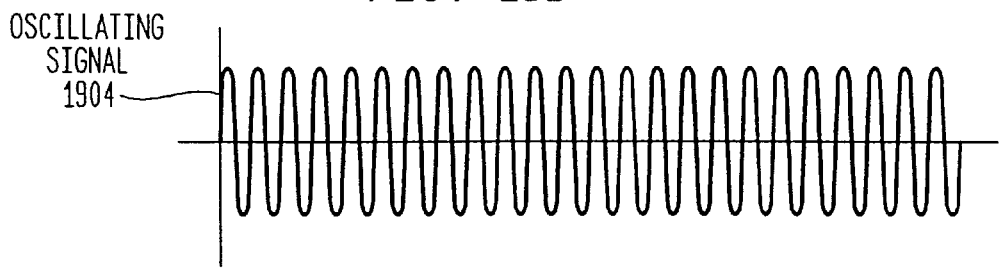
Figure 19C:
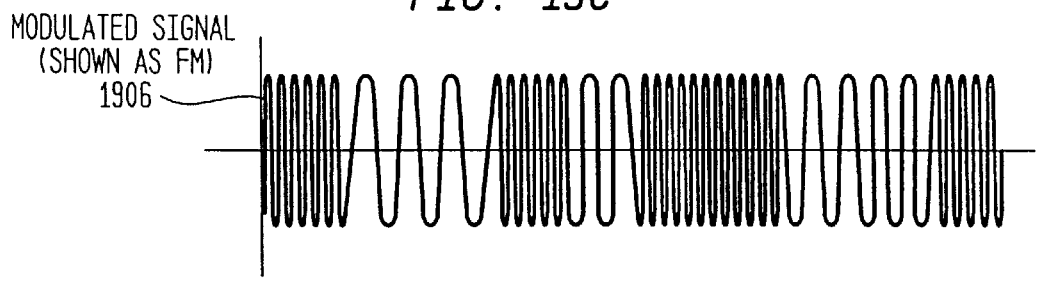

A harmonically rich signal 1908 (FIG. 19D) is generated from the modulated signal 1906 in step 908. Signal 1908 has a substantially continuous and periodically repeated waveform. In an embodiment, the waveform of signal 1908 is substantially rectangular, as is seen in the expanded waveform 1910 of FIG. 19E. One skilled in the relevant art(s) will recognize the physical limitations to and mathematical obstacles against achieving an exact or perfect rectangular waveform and it is not the intent or requirement of the present invention that a perfect rectangular waveform be generated or needed. However, for ease of discussion, the term "rectangular waveform" will be used herein and will refer to waveforms that are substantially rectangular, and will include but will not be limited to those waveforms that are generally referred to as square waves or pulses. It should be noted that if the situation arises wherein a perfect rectangular waveform is proven to be both technically and mathematically feasible, that situation will also fall within the scope and intent of this invention A continuous periodic waveform (such as waveform 1908) is composed of a series of sinusoidal waves of specific amplitudes and phases, the frequencies of which are integer multiples of the repetition frequency of the waveform. (A waveform's repetition frequency is the number of times per second the periodic waveform repeats.) A portion of the waveform of signal 1908 is shown in an expanded view as waveform 1910 of FIG. 19E. The first three sinusoidal components of waveform 1910 (FIG. 19E) are depicted as waveforms 1912a, b, & c of FIG. 19F and waveforms 1914a, b, & c of FIG. 19G. (In the examples of FIGS. 19F & G, the three sinusoidal components are shown separately. In actuality, these waveforms, along with all the other sinusoidal components which are not shown, occur simultaneously, as seen in FIG. 19H Note that in FIG. 19H, the waveforms are shown simultaneously, but are not shown summed. If waveforms 1912 and 1914 were shown summed, they would, in the limit, i.e., with an infinite number of sinusoidal components, be identical to the periodic waveform 1910 of FIG. 19E. For ease of illustration, only the first three of the infinite number of sinusoidal components are shown.) These sinusoidal waves are called harmonics, and their existence can be demonstrated both graphically and mathematically. Each harmonic (waveforms 1912a, b, & c and 1914a, b, & c) has the same information content as does waveform 1910 (which has the same information as the corresponding portion of waveform 1908). Accordingly, the information content of waveform 1908 can be obtained from any of its harmonics. As the harmonics have frequencies that are integer multiples of the repetition frequency of signal 1908, and since they have the same information content as signal 1908 (as just stated), the harmonics each represent an up-converted representation of signal 1908. Some of the harmonics are at desired frequencies (such as the frequencies desired to be transmitted). These harmonics are called "desired harmonics" or "wanted harmonics." According to the invention, desired harmonics have sufficient amplitude for accomplishing the desired processing (i.e., being transmitted). Other harmonics are not at the desired frequencies. These harmonics are called "undesired harmonics" or "unwanted harmonics."

In step 910, any unwanted harmonics of the continuous periodic waveform of signal 1908 are filtered out (for example, any harmonics that are not at frequencies desired to be transmitted). In the example of FIG. 19, the first and second harmonics (i.e., those depicted by waveforms 1912a & b of FIG. 19F and 1914a & b of FIG. 19G) are the unwanted harmonics. In step 912, the remaining harmonic, in the example of FIG. 19, the third harmonic (i.e., those depicted by waveforms 1912c of FIG. 19F and 1914c of FIG. 19G), is transmitted. This is depicted by waveform 1918 of FIG. 19I. In the example of FIG. 19, only three harmonics are shown, and the lowest two are filtered out to leave the third harmonic as the desired harmonic. In actual practice, there are an infinite number of harmonics, and the filtering can be made to remove unwanted harmonics that are both lower in frequency than the desired harmonic as well as those that are higher in frequency than the desired harmonic.

3.1.2 Structural Description.

Figure 10:
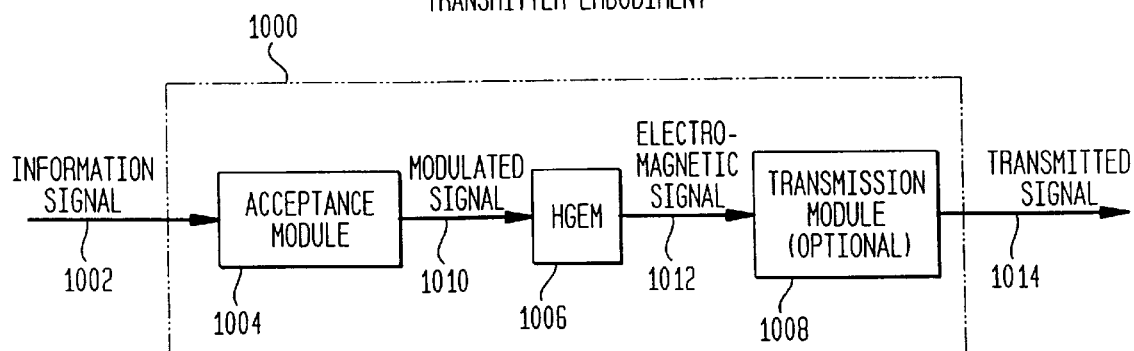
FIG. 10 illustrates the high level structural block diagram of the transmitter of an embodiment of the present invention.

FIG. 10 is a block diagram of an up-conversion system according to an embodiment of the invention. This embodiment of the up-conversion system is shown as a transmitter 1000. Transmitter 1000 includes an acceptance module 1004, a harmonic generation and extraction module 1006, and a transmission module 1008 that accepts an information signal 1002 and outputs a transmitted signal 1014.

Preferably, the acceptance module 1004, harmonic generation and extraction module 1006, and transmission module 1008 process the information signal in the manner shown in the operational flowchart 900. In other words, transmitter 1000 is the structural embodiment for performing the operational steps of flowchart 900. However, it should be understood that the scope and spirit of the present invention includes other structural embodiments for performing the steps of flowchart 900. The specifics of these other structural embodiments will be apparent to persons skilled in the relevant art(s) based on the discussion contained herein.

The operation of the transmitter 1000 will now be described in detail with reference to the flowchart 900. In step 902, an information signal 1002 (for example, see FIG. 19A) from a source (not shown) is routed to acceptance module 1004. In step 904, an oscillating signal (for example, see FIG. 19B) is generated and in step 906, it is modulated, thereby producing a modulated signal 1010 (for an example of FM, see FIG. 19C). The oscillating signal can be modulated using any modulation technique, examples of which are described below. In step 908, the harmonic generation and extraction module (HGEM) generates a harmonically rich signal with a continuous and periodic waveform (an example of FM can be seen in FIG. 19D). This waveform is preferably a rectangular wave, such as a square wave or a pulse (although, the invention is not limited to this embodiment), and is comprised of a plurality of sinusoidal waves whose frequencies are integer multiples of the fundamental frequency of the waveform. These sinusoidal waves are referred to as the harmonics of the underlying waveform. A Fourier series analysis can be used to determine the amplitude of each harmonic (for example, see FIGS. 19F and 19G). In step 910, a filter (not shown) within HGEM 1006 filters out the undesired frequencies (harmonics), and outputs an electromagnetic (EM) signal 1012 at the desired frequency (for example, see FIG. 19I). In step 912, EM signal 1012 is routed to transmission module 1008 (optional), where it is prepared for transmission. The transmission module 1008 then outputs a transmitted signal 1014.

3.2 Exemplary Embodiments.

Various embodiments related to the method(s) and structure(s) described above are presented in this section (and its subsections). These embodiments are described herein for purposes of illustration, and not limitation. The invention is not limited to these embodiments. Alternate embodiments (including equivalents, extensions, variations, deviations, etc., of the embodiments described herein) will be apparent to persons skilled in the relevant art(s) based on the teachings contained herein. The invention is intended and adapted to include such alternate embodiments.

3.2.1 First Embodiment: Frequency Modulation (FM) Mode.

In this embodiment, an information signal is accepted and a modulated signal whose frequency varies as a function of the information signal results.

3.2.1.1 Operational Description.

Figure 11:
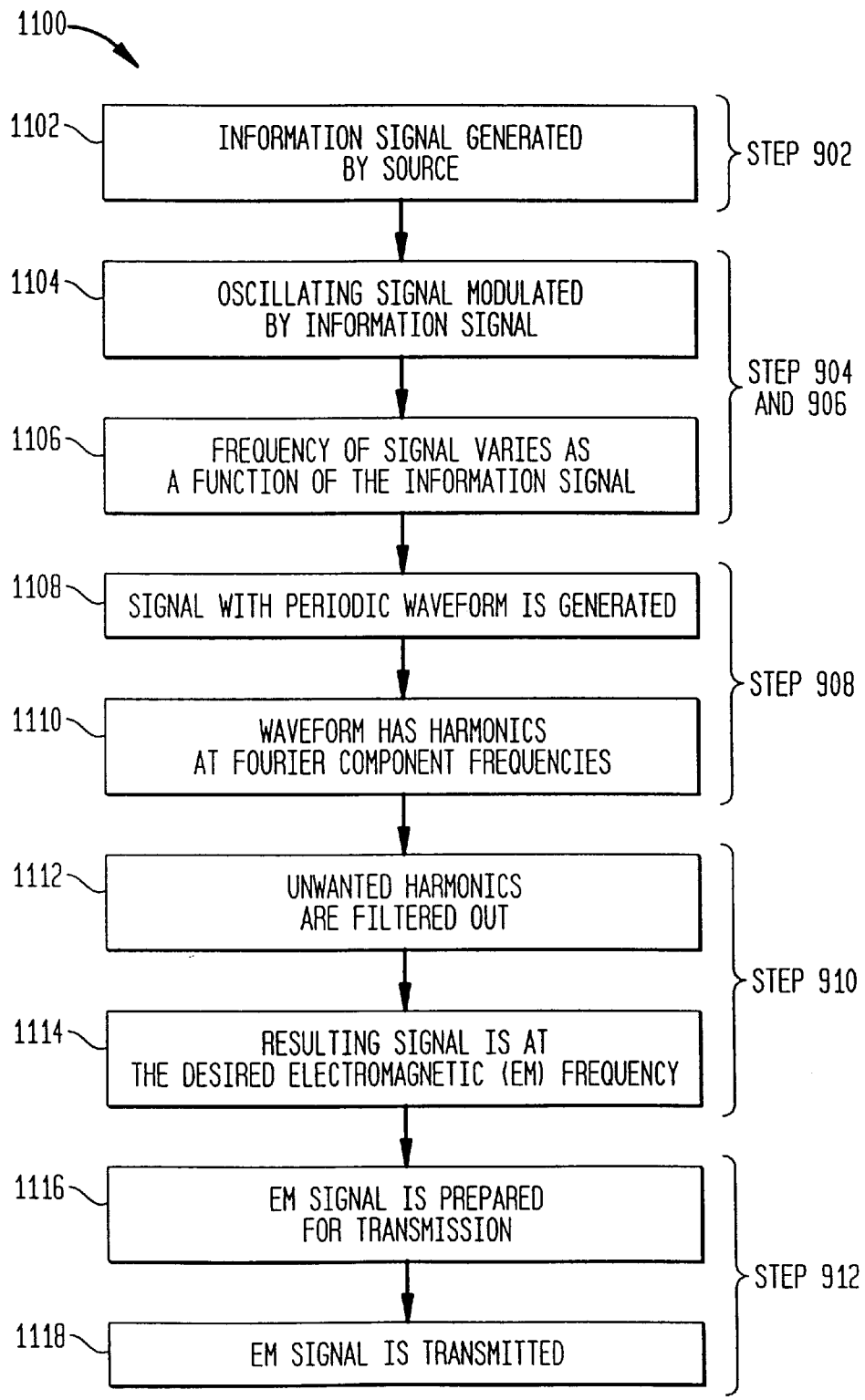
FIG. 11 illustrates the operational flowchart of a first embodiment (i.e., FM mode) of the present invention.

The flow chart of FIG. 11 demonstrates the method of operation of a transmitter in the frequency modulation (FM) mode according to an embodiment of the present invention. As stated above, the representative waveforms shown in FIG. 19 depict the invention operating as a transmitter in the FM mode.

In step 1102, an information signal 1902 (FIG. 19A) is generated by a source by any means and/or process. (Information signal 1902 is a baseband signal, and, because it is used to modulate a signal, may also be referred to as a modulating baseband signal 1902.) Information signal 1902 may be, for example, analog, digital, or any combination thereof. The signals shown in FIG. 19 depict a digital information signal wherein the information is represented by discrete states of the signal. It will be apparent to persons skilled in the relevant art(s) that the invention is also adapted to working with an analog information signal wherein the information is represented by a continuously varying signal. In step 1104, information signal 1902 modulates an oscillating signal 1904 (FIG. 19B). The result of this modulation is the modulated signal 1906 (FIG. 19C) as indicated in block 1106. Modulated signal 1906 has a frequency that varies as a function of information signal 1902 and is referred to as an FM signal.

Figure 19D:
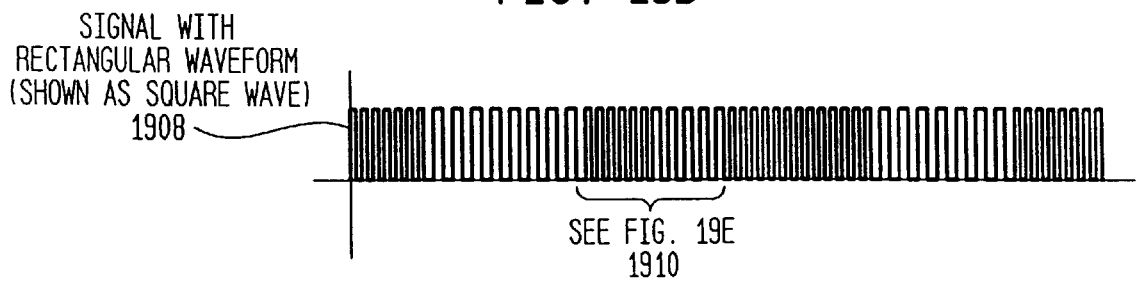
Figure 19H:
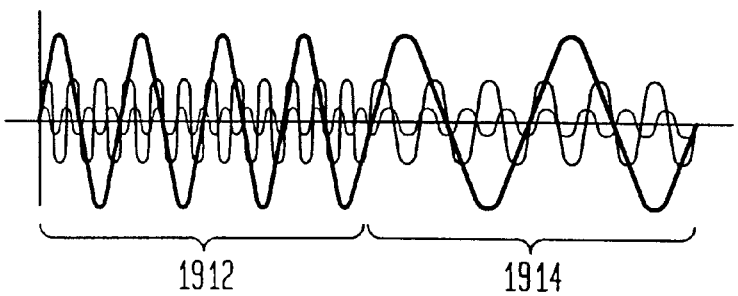
Figure 19I:
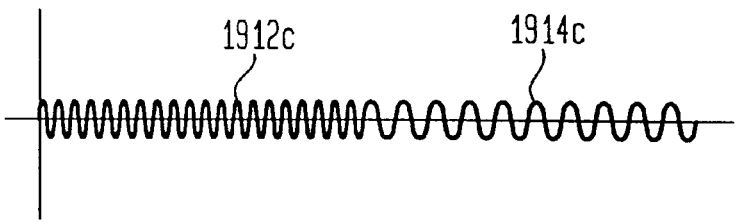

In step 1108, a harmonically rich signal with a continuous periodic waveform, shown in FIG. 19D as rectangular waveform 1908, is generated. Rectangular waveform 1908 is generated using the modulated signal 1906. One skilled in the relevant art(s) will recognize the physical limitations to and mathematical obstacles against achieving an exact or perfect rectangular waveform and it is not the intent of the present invention that a perfect rectangular waveform be generated or needed. Again, as stated above, for ease of discussion, the term "rectangular waveform" will be used to refer to waveforms that are substantially rectangular. In a similar manner, the term "square wave" will refer to those waveforms that are substantially square and it is not the intent of the present invention that a perfect square wave be generated or needed. A portion of rectangular waveform 1908 is shown in an expanded view as periodic waveform 1910 in FIG. 19E. The first part of waveform 1910 is designated "signal A" and represents information signal 1902 being "high," and the second part of waveform 1910 is designated "signal B" and information signal 1902 being "low." It should be noted that this convention is used for illustrative purposes only, and alternatively, other conventions could be used.

As stated before, a continuous and periodic waveform, such as a rectangular wave 1908 as indicated in block 1110 of flowchart 1100, has sinusoidal components (harmonics) at frequencies that are integer multiples of the fundamental frequency of the underlying waveform (i.e., at the Fourier component frequencies). Three harmonics of periodic waveform 1910 are shown separately, in expanded views, in FIGS. 19F and 19G. Since waveform 1910 (and also waveform 1908) is shown as a square wave in this exemplary embodiment, only the odd harmonics are present, i.e., the first, third, fifth, seventh, etc. As shown in FIG. 19, if rectangular waveform 1908 has a fundamental frequency of $f_1$ (also known as the first harmonic), the third harmonic will have a frequency of $3 \cdot f_1$, the fifth harmonic will have a frequency of $5 \cdot f_1$, and so on. The first, third, and fifth harmonics of signal A are shown as waveforms 1912a, 1912b, and 1912c of FIG. 19F, and the first, third, and fifth harmonics of signal B are shown as waveforms 1914a, 1914b, and 1914c of FIG. 19G. In actuality, these harmonics (as well as all of the higher order harmonics) occur simultaneously, as shown by waveform 1916 of FIG. 19H. Note that if all of the harmonic components of FIG. 19H were shown summed together with all of the higher harmonics (i.e., the seventh, the ninth, etc.) the resulting waveform would, in the limit, be identical to waveform 1910.

In step 1112, the unwanted frequencies of waveform 1916 are removed. In the example of FIG. 19, the first and third harmonics are shown to be removed, and as indicated in block 1114, the remaining waveform 1918 (i.e., waveforms 1912c and 1914c) is at the desired EM frequency. Although not shown, the higher harmonics (e.g., the seventh, ninth, etc.) are also removed.

The EM signal, shown here as remaining waveform 1918, is prepared for transmission in step 1116, and in step 1118, the EM signal is transmitted.

3.2.1.2 Structural Description.

Figure 12:
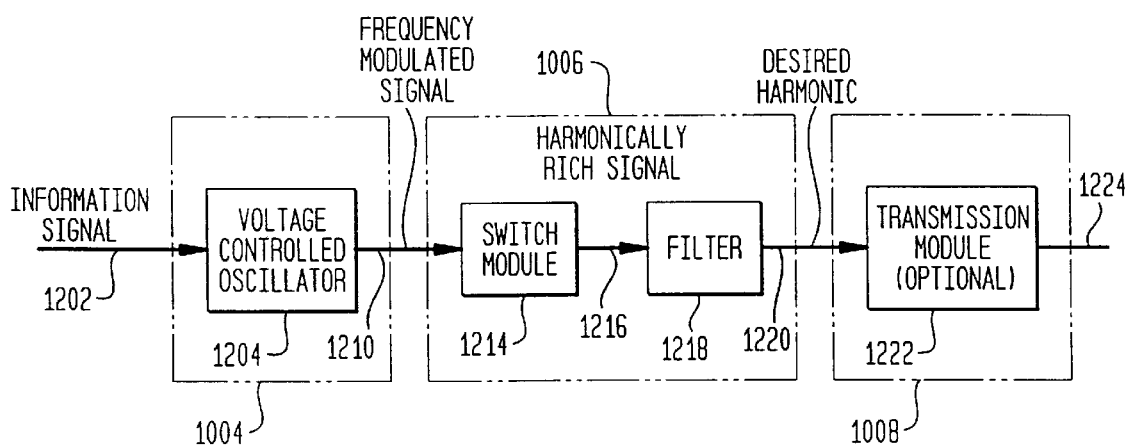
FIG. 12 illustrates an exemplary structural block diagram of the first embodiment (i.e., FM mode) of the present invention.

FIG. 12 is a block diagram of a transmitter according to an embodiment of the invention. This embodiment of the transmitter is shown as an FM transmitter 1200. FM transmitter 1200 includes a voltage controlled oscillator (VCO) 1204, a switch module 1214, a filter 1218, and a transmission module 1222 that accepts an information signal 1202 and outputs a transmitted signal 1224. The operation and structure of exemplary components are described below: an exemplary VCO is described below at sections 3.3.1–3.3.1.2; an exemplary switch module is described below at sections 3.3.6–3.3.6.2; an exemplary filter is described below at sections 3.3.9–3.3.9.2; and an exemplary transmission module is described below at sections 3.3.10–3.3.10.2.

Preferably, the voltage controlled oscillator 1204, switch module 1214, filter 1218, and transmission module 1222 process the information signal in the manner shown in the operational flowchart 1100. In other words, FM transmitter 1200 is the structural embodiment for performing the operational steps of flowchart 1100. However, it should be understood that the scope and spirit of the present invention includes other structural embodiments for performing the steps of flowchart 1100. The specifics of these other structural embodiments will be apparent to persons skilled in the relevant art(s) based on the discussion contained herein.

The operation of the transmitter 1200 will now be described in detail with reference to the flowchart 1100. In step 1102, an information signal 1202 (for example, see FIG. 19A) from a source (not shown) is routed to VCO 1204. In step 1104, an oscillating signal (for example, see FIG. 19B) is generated and modulated, thereby producing a frequency modulated signal 1210 (for example, see FIG. 19C). In step 1108, the switch module 1214 generates a harmonically rich signal 1216 with a continuous and periodic waveform (for example, see FIG. 19D). This waveform is preferably a rectangular wave, such as a square wave or a pulse (although, the invention is not limited to this embodiment), and is comprised of a plurality of sinusoidal waves whose frequencies are integer multiples of the fundamental frequency of the waveform. These sinusoidal waves are referred to as the harmonics of the underlying waveform, and a Fourier analysis will determine the amplitude of each harmonic (for example, see FIGS. 19F and 19G). In step 1112, a filter 1218 filters out the undesired frequencies (harmonics), and outputs an electromagnetic (EM) signal 1220 at the desired harmonic frequency (for example, see FIG. 19I). In step 1116, EM signal 1220 is routed to transmission module 1222 (optional), where it is prepared for transmission. In step 1118, transmission module 1222 outputs a transmitted signal 1224.

3.2.2 Second Embodiment: Phase Modulation (PM) Mode.

In this embodiment, an information signal is accepted and a modulated signal whose phase varies as a function of the information signal is transmitted.

3.2.2.1 Operational Description.

Figure 13:
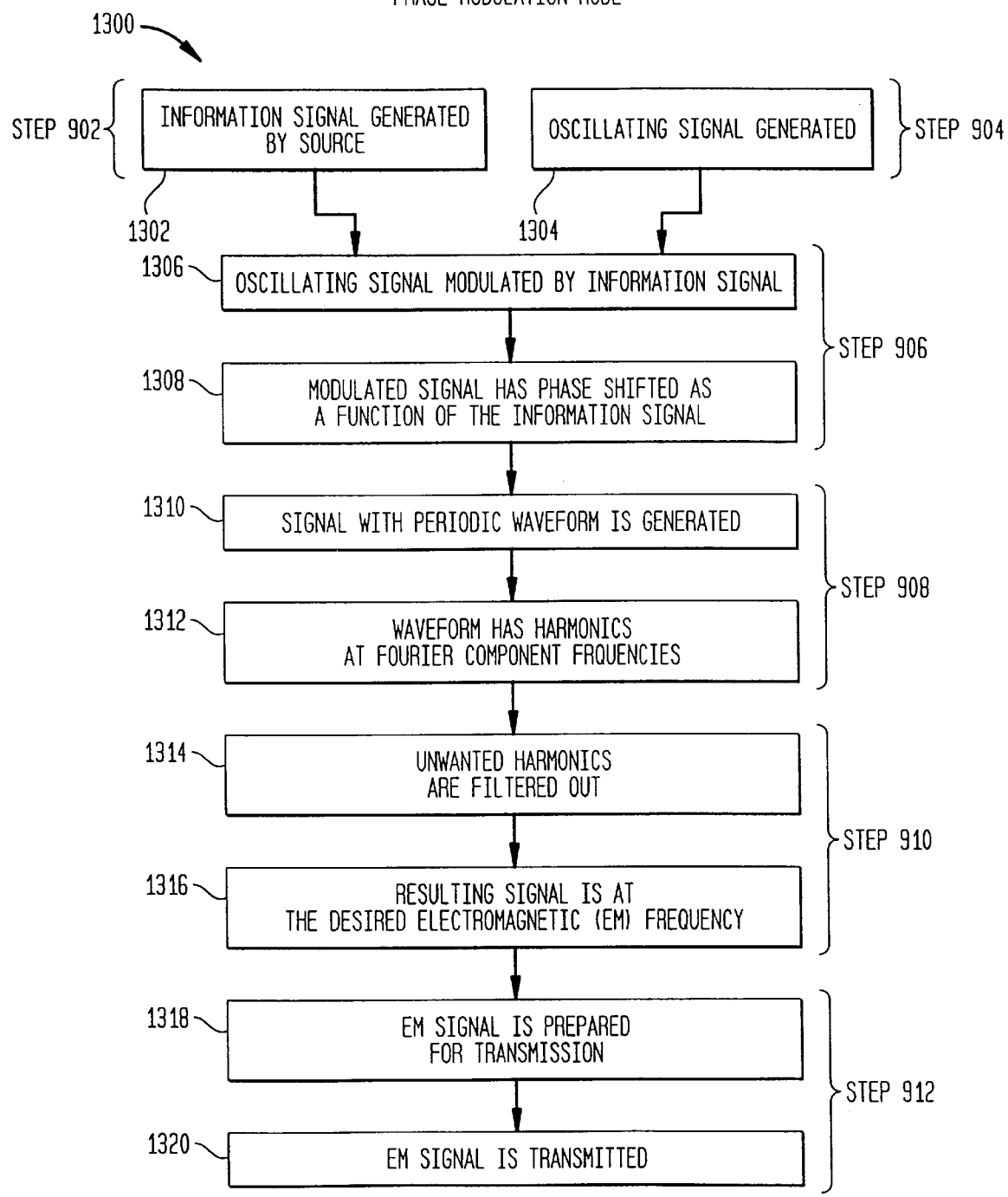
FIG. 13 illustrates the operational flowchart of a second embodiment (i.e., PM mode) of the present invention.

The flow chart of FIG. 13 demonstrates the method of operation of the transmitter in the phase modulation (PM) mode. The representative waveforms shown in FIG. 44 depict the invention operating as a transmitter in the PM mode.

In step 1302, an information signal 4402 (FIG. 44A) is generated by a source. Information signal 4402 may be, for example, analog, digital, or any combination thereof. The signals shown in FIG. 44 depict a digital information signal wherein the information is represented by discrete states of the signal. It will be apparent to persons skilled in the relevant art(s) that the invention is also adapted to working with an analog information signal wherein the information is represented by a continuously varying signal. In step 1304, an oscillating signal 4404 is generated and in step 1306, the oscillating signal 4404 (FIG. 44B) is modulated by the information signal 4402, resulting in the modulated signal 4406 (FIG. 44C) as indicated in block 1308. The phase of this modulated signal 4406 is varied as a function of the information signal 4402.

Figure 44A:
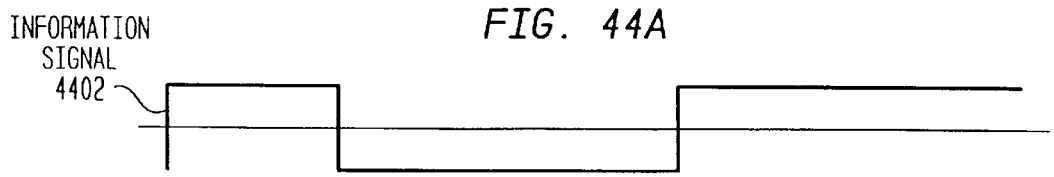
FIGS. 44A–44G illustrate exemplary waveforms (for a pulse modulation mode operating in a pulse shift keying embodiment) at a plurality of points in an exemplary high level circuit diagram, highlighting the characteristics of the first three harmonics.
Figure 44B:
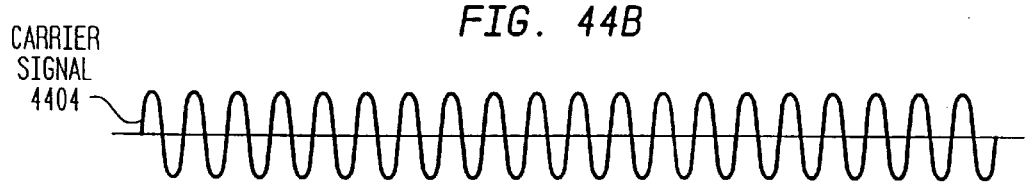
Figure 44C:
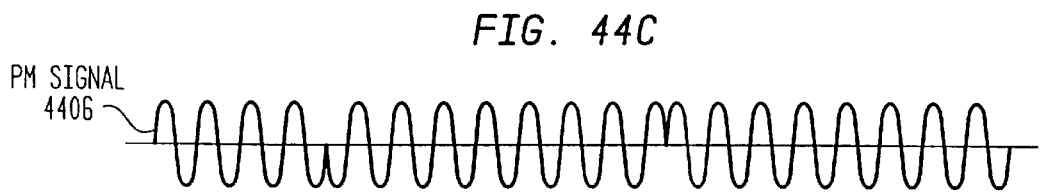
Figure 44D:
Figure 44E:
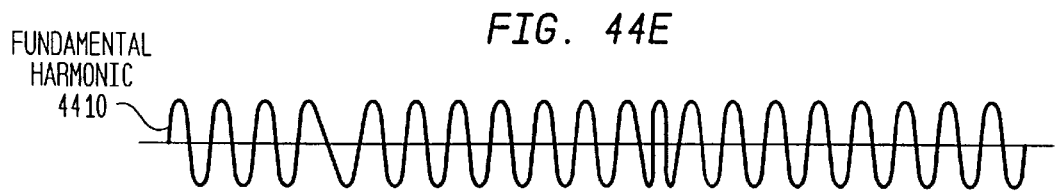
Figure 44F:
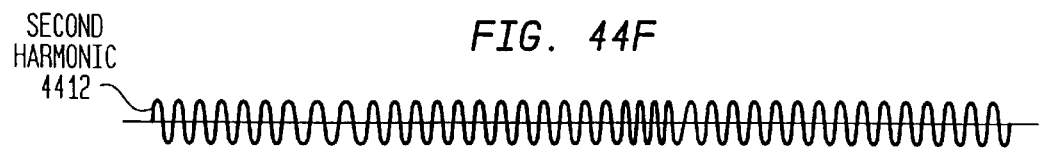
Figure 44G:
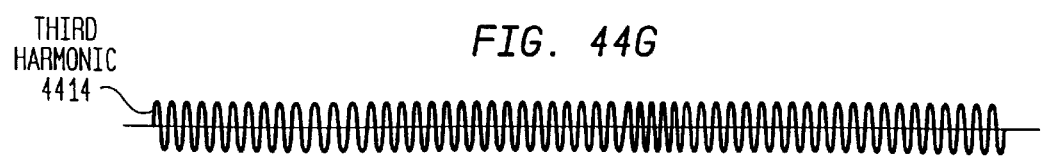

A harmonically rich signal 4408 (FIG. 44D) with a continuous periodic waveform is generated at step 1310 using modulated signal 4406. Harmonically rich signal 4408 is a substantially rectangular waveform. One skilled in the relevant art(s) will recognize the physical limitations to and mathematical obstacles against achieving an exact or perfect rectangular waveform and it is not the intent of the present invention that a perfect rectangular waveform be generated or needed. Again, as stated above, for ease of discussion, the term "rectangular waveform" will be used to refer to waveforms that are substantially rectangular. In a similar manner, the term "square wave" will refer to those waveforms that are substantially square and it is not the intent of the present invention that a perfect square wave be generated or needed. As stated before, a continuous and periodic waveform, such as the harmonically rich signal 4408 as indicated in block 1312, has sinusoidal components (harmonics) at frequencies that are integer multiples of the fundamental frequency of the underlying waveform (the Fourier component frequencies). The first three harmonic waveforms are shown in FIGS. 44E, 44F, and 44G. In actual fact, there are an infinite number of harmonics. In step 1314, the unwanted frequencies are removed, and as indicated in block 1316, the remaining frequency is at the desired EM output. As an example, the first (fundamental) harmonic 4410 and the second harmonic 4412 along with the fourth, fifth, etc., harmonics (not shown) might be filtered out, leaving the third harmonic 4414 as the desired EM signal as indicated in block 1316.

The EM signal is prepared for transmission in step 1318, and in step 1320, the EM signal is transmitted.

3.2.2.2 Structural Description.

Figure 14:
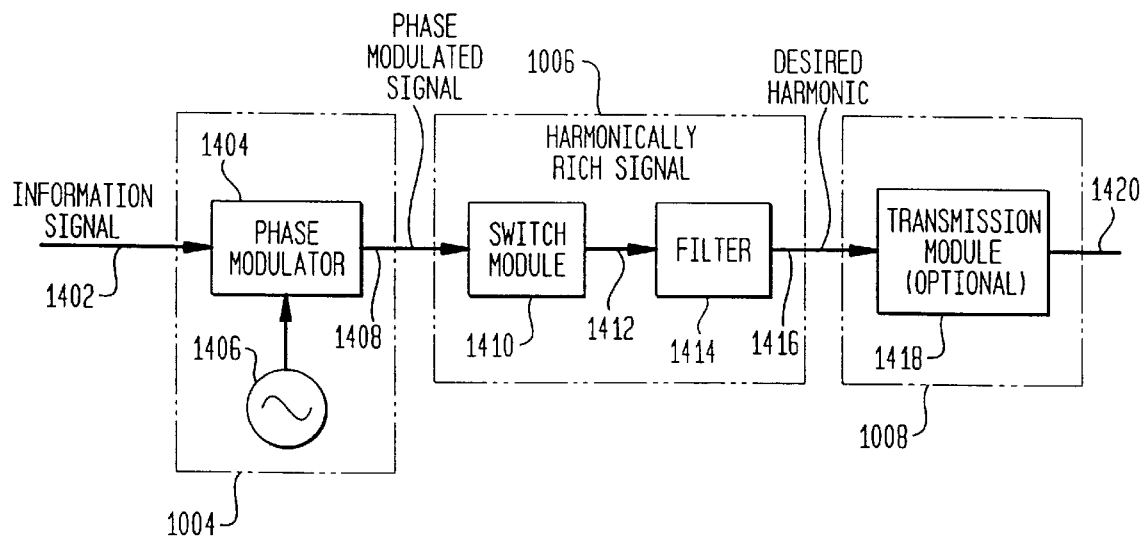
FIG. 14 illustrates an exemplary structural block diagram of the second embodiment (i.e., PM mode) of the present invention.

FIG. 14 is a block diagram of a transmitter according to an embodiment of the invention. This embodiment of the transmitter is shown as a PM transmitter 1400. PM transmitter 1400 includes a local oscillator 1406, a phase modulator 1404, a switch module 1410, a filter 1414, and a transmission module 1418 that accepts an information signal 1402 and outputs a transmitted signal 1420. The operation and structure of exemplary components are described below: an exemplary phase modulator is described below at sections 3.3.4–3.3.4.2; an exemplary local oscillator is described below at sections 3.3.2–3.3.2.2; an exemplary switch module is described below at sections 3.3.6–3.3.6.2; an exemplary filter is described below at sections 3.3.9–3.3.9.2; and an exemplary transmission module is described below at sections 3.3.10–3.3.10.2.

Preferably, the local oscillator 1406, phase modulator 1404, switch module 1410, filter 1414, and transmission module 1418 process the information signal in the manner shown in the operational flowchart 1300. In other words, PM transmitter 1400 is the structural embodiment for performing the operational steps of flowchart 1300. However, it should be understood that the scope and spirit of the present invention includes other structural embodiments for performing the steps of flowchart 1300. The specifics of these other structural embodiments will be apparent to persons skilled in the relevant art(s) based on the discussion contained herein.

The operation of the transmitter 1400 will now be described in detail with reference to the flowchart 1300. In step 1302, an information signal 1402 (for example, see FIG. 44A) from a source (not shown) is routed to phase modulator 1404. In step 1304, an oscillating signal from local oscillator 1406 (for example, see FIG. 44B) is generated and modulated, thereby producing a modulated signal 1408 (for example, see FIG. 44C). In step 1310, the switch module 1410 generates a harmonically rich signal 1412 with a continuous and periodic waveform (for example, see FIG. 44D). This waveform is preferably a rectangular wave, such as a square wave or a pulse (although, the invention is not limited to this embodiment), and is comprised of a plurality of sinusoidal waves whose frequencies are integer multiples of the fundamental frequency of the waveform. These sinusoidal waves are referred to as the harmonics of the underlying waveform, and a Fourier analysis will determine the amplitude of each harmonic (for an example of the first three harmonics, see FIGS. 44E, 44F, and 44G). In step 1314, a filter 1414 filters out the undesired harmonic frequencies (for example, the first harmonic 4410, the second harmonic 4412, and the fourth, fifth, etc., harmonics, not shown), and outputs an electromagnetic (EM) signal 1416 at the desired harmonic frequency (for example, the third harmonic, see FIG. 44G). In step 1318, EM signal 1416 is routed to transmission module 1418 (optional), where it is prepared for transmission. In step 1320, the transmission module 1418 outputs a transmitted signal 1420.

3.2.3 Third Embodiment: Amplitude Modulation (AM) Mode.

In this embodiment, an information signal is accepted and a modulated signal whose amplitude varies as a function of the information signal is transmitted.

3.2.3.1 Operational Description.

Figure 15:
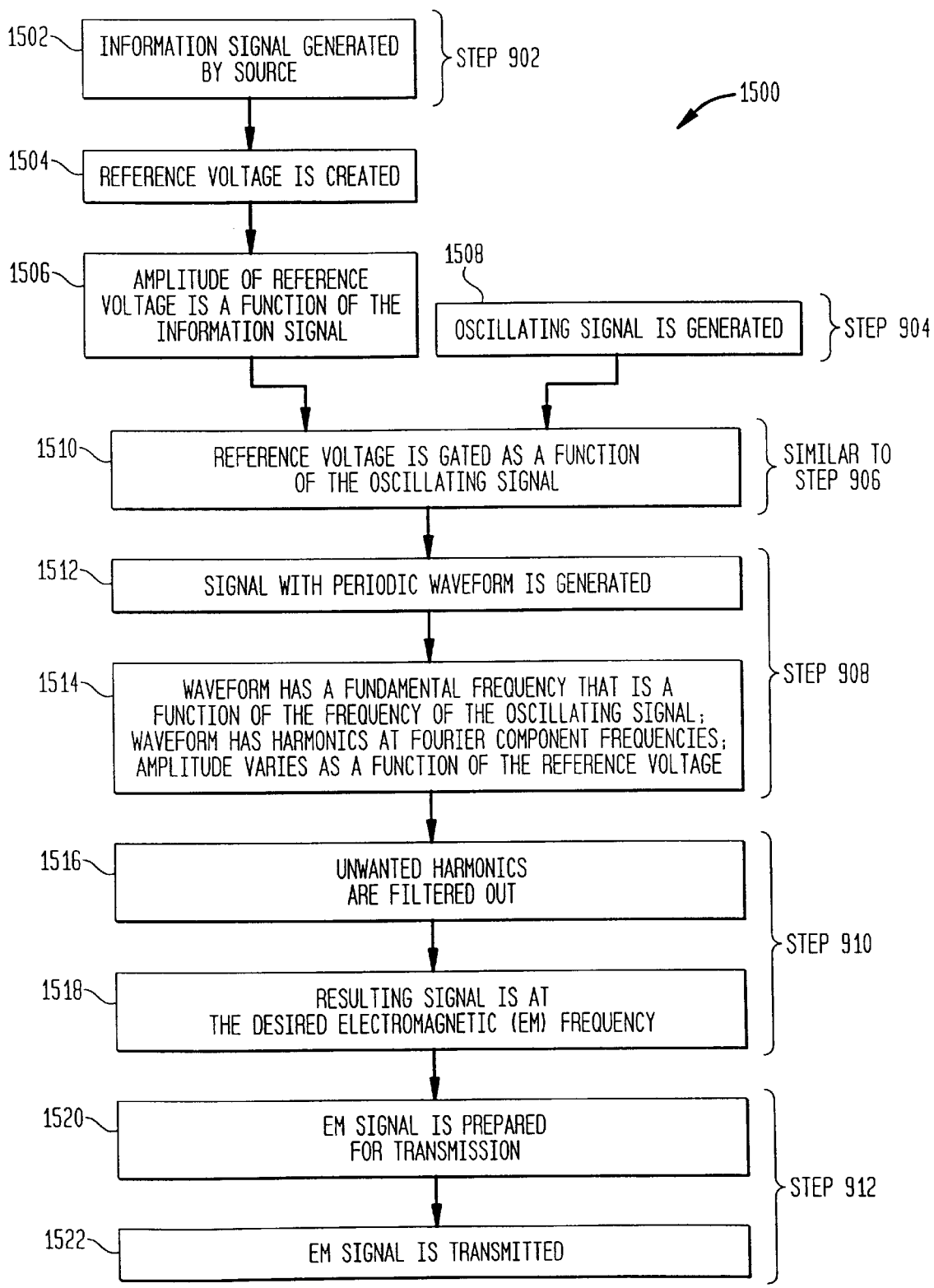
FIG. 15 illustrates the operational flowchart of a third embodiment (i.e., AM mode) of the present invention.

The flow chart of FIG. 15 demonstrates the method of operation of the transmitter in the amplitude modulation (AM) mode. The representative waveforms shown in FIG. 45 depict the invention operating as a transmitter in the AM mode.

In step 1502, an information signal 4502 (FIG. 45A) is generated by a source. Information signal 4502 may be, for example, analog, digital, or any combination thereof. The signals shown in FIG. 45 depict a digital information signal wherein the information is represented by discrete states of the signal. It will be apparent to persons skilled in the relevant art(s) that the invention is also adapted to working with an analog information signal wherein the information is represented by a continuously varying signal. In step 1504, a "reference signal" is created, which, as indicated in block 1506, has an amplitude that is a function of the information signal 4502. In one embodiment of the invention, the reference signal is created by combining the information signal 4502 with a bias signal. In another embodiment of the invention, the reference signal is comprised of only the information signal 4502. One skilled in the relevant art(s) will recognize that any number of embodiments exist wherein the reference signal will vary as a function of the information signal.

An oscillating signal 4504 (FIG. 45B) is generated at step 1508, and at step 1510, the reference signal (information signal 4502) is gated at a frequency that is a function of the oscillating signal 4504. The gated referenced signal is a harmonically rich signal 4506 (FIG. 45C) with a continuous periodic waveform and is generated at step 1512. This harmonically rich signal 4506 as indicated in block 1514 is substantially a rectangular wave which has a fundamental frequency equal to the frequency at which the reference signal (information signal 4502) is gated. In addition, the rectangular wave has pulse amplitudes that are a function of the amplitude of the reference signal (information signal 4502). One skilled in the relevant art(s) will recognize the physical limitations to and mathematical obstacles against achieving an exact or perfect rectangular waveform and it is not the intent of the present invention that a perfect rectangular waveform be generated or needed. Again, as stated above, for ease of discussion, the term "rectangular waveform" will be used to refer to waveforms that are substantially rectangular. In a similar manner, the term "square wave" will refer to those waveforms that are substantially square and it is not the intent of the present invention that a perfect square wave be generated or needed.

Figure 45A:
FIGS. 45A–45F illustrate exemplary waveforms (for an amplitude modulation mode operating in an amplitude shift keying embodiment) at a plurality of points in an exemplary high level circuit diagram, highlighting the characteristics of the first three harmonics.
Figure 45B:
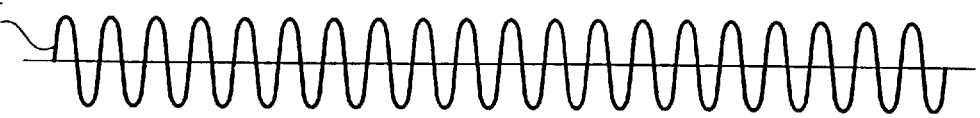
Figure 45C:
Figure 45D:
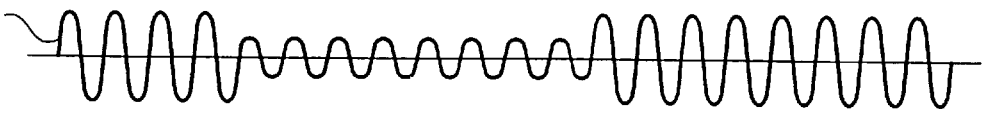
Figure 45E:
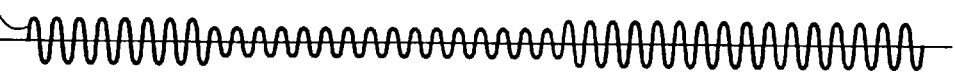
Figure 45F:
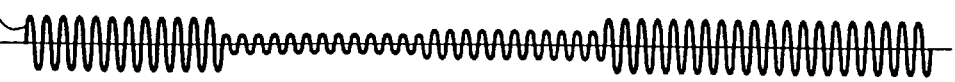

As stated before, a harmonically rich signal 4506, such as the rectangular wave as indicated in block 1514, has sinusoidal components (harmonics) at frequencies that are integer multiples of the fundamental frequency of the underlying waveform (the Fourier component frequencies). The first three harmonic waveforms are shown in FIGS. 45D, 45E, and 45F. In fact, there are an infinite number of harmonics. In step 1516, the unwanted frequencies are removed, and as indicated in block 1518, the remaining frequency is at the desired EM output. As an example, the first (fundamental) harmonic 4510 and the second harmonic 4512 along with the fourth, fifth, etc., harmonics (not shown) might be filtered out leaving the third harmonic 4514 as the desired EM signal as indicated in block 1518.

The EM signal is prepared for transmission in step 1520, and in step 1522, the EM signal is transmitted.

3.2.3.2 Structural Description.

Figure 16:
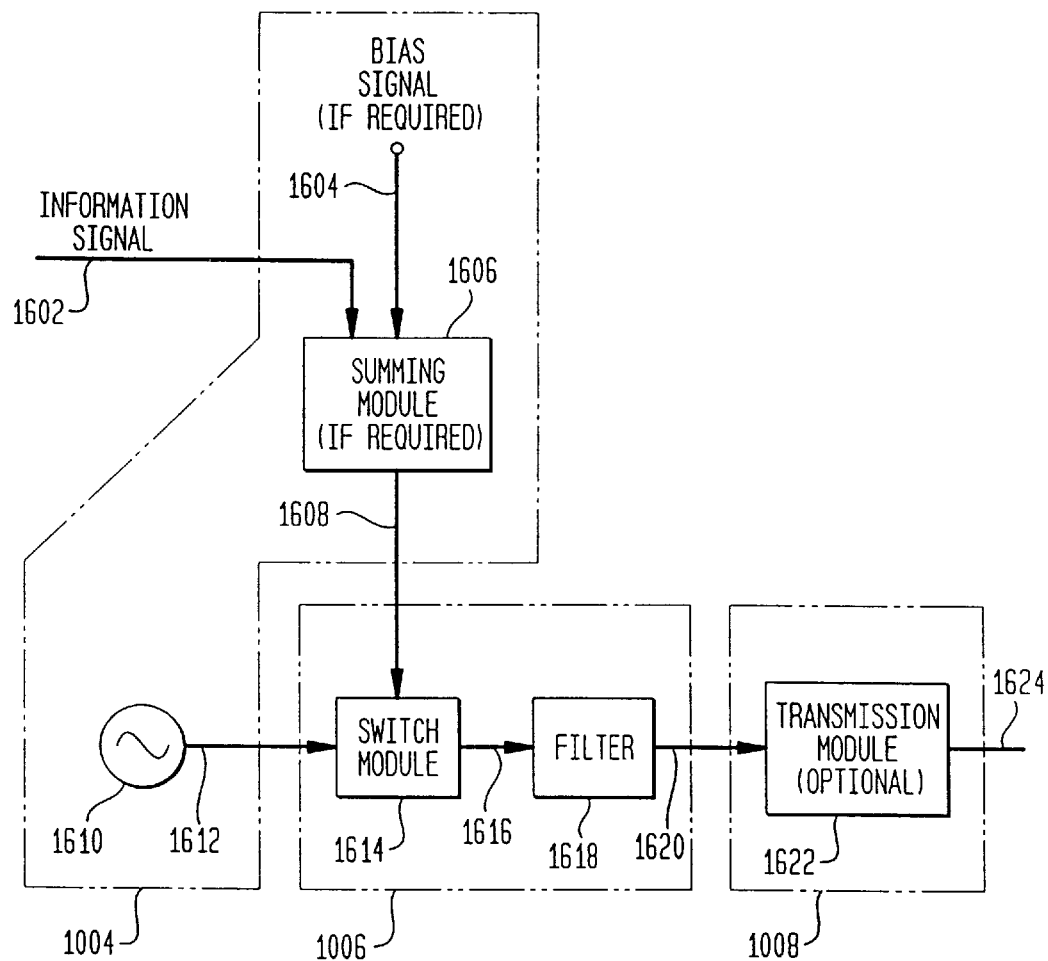
FIG. 16 illustrates an exemplary structural block diagram of the third embodiment (i.e., AM mode) of the present invention.

FIG. 16 is a block diagram of a transmitter according to an embodiment of the invention. This embodiment of the transmitter is shown as an AM transmitter 1600. AM transmitter 1600 includes a local oscillator 1610, a summing module 1606, a switch module 1614, a filter 1618, and a transmission module 1622 that accepts an information signal 1602 and outputs a transmitted signal 1624. The operation and structure of exemplary components are described below: an exemplary local oscillator is described below at sections 3.3.2–3.3.2.2; an exemplary a switch module is described below at sections 3.3.7–3.3.7.2; an exemplary filter is described below at sections 3.3.9–3.3.9.2; and an exemplary transmission module is described below at sections 3.3.10–3.3.10.2.

Preferably, the local oscillator 1610, summing module 1606, switch module 1614, filter 1618, and transmission module 1622 process an information signal 1602 in the manner shown in the operational flowchart 1500. In other words, AM transmitter 1600 is the structural embodiment for performing the operational steps of flowchart 1500. However, it should be understood that the scope and spirit of the present invention includes other structural embodiments for performing the steps of flowchart 1500. The specifics of these other structural embodiments will be apparent to persons skilled in the relevant art(s) based on the discussion contained herein.

The operation of the transmitter 1600 will now be described in detail with reference to the flowchart 1500. In step 1502, information signal 1602 (for example, see FIG. 45A) from a source (not shown) is routed to summing module 1606 (if required), thereby producing a reference signal 1608. In step 1508, an oscillating signal 1612 is generated by local oscillator 1610 (for example, see FIG. 45B) and in step 1510, switch module 1614 gates the reference voltage 1608 at a rate that is a function of the oscillating signal 1612. The result of the gating is a harmonically rich signal 1616 (for example, see FIG. 45C) with a continuous and periodic waveform. This waveform is preferably a rectangular wave, such as a square wave or a pulse (although, the invention is not limited to this embodiment), and is comprised of a plurality of sinusoidal waves whose frequencies are integer multiples of the fundamental frequency of the waveform. These sinusoidal waves are referred to as the harmonics of the underlying waveform, and a Fourier analysis will determine the relative amplitude of each harmonic (for an example of the first three harmonics, see FIGS. 45D, 45E, and 45F). When amplitude modulation is applied, the amplitude of the pulses in rectangular waveform 1616 vary as a function of reference signal 1608. As a result, this change in amplitude of the pulses has a proportional effect on the absolute amplitude of all of the harmonics. In other words, the AM is embedded on top of each of the harmonics. In step 1516, a filter 1618 filters out the undesired harmonic frequencies (for example, the first harmonic 4510, the second harmonic 4512, and the fourth, fifth, etc., harmonics , not shown), and outputs an electromagnetic (EM) signal 1620 at the desired harmonic frequency (for example, the third harmonic, see FIG. 45F). In step 1520, EM signal 1620 is routed to transmission module 1622 (optional), where it is prepared for transmission. In step 1522, the transmission module 1622 outputs a transmitted signal 1624.

Note that the description of the AM embodiment given herein shows the information signal being gated, thus applying the amplitude modulation to the harmonically rich signal. However, is would be apparent based on the teachings contained herein, that the information signal can be modulated onto the harmonically rich signal or onto a filtered harmonic at any point in the circuit.

3.2.4 Fourth Embodiment: In -phase/Quadrature-phase Modulation ("I/Q") Mode.

In-phase/quadrature-phase modulation ("I/Q") is a specific subset of a phase modulation (PM) embodiment. Because "I/Q" is so pervasive, it is described herein as a separate embodiment. However, it should be remembered that since it is a specific subset of PM, the characteristics of PM also apply to "I/Q."

In this embodiment, two information signals are accepted. An in-phase signal ("I") is modulated such that its phase varies as a function of one of the information signals, and a quadrature-phase signal ("Q") is modulated such that its phase varies as a function of the other information signal. The two modulated signals are combined to form an "I/Q" modulated signal and transmitted.

3.2.4.1 Operational Description.

Figure 17:
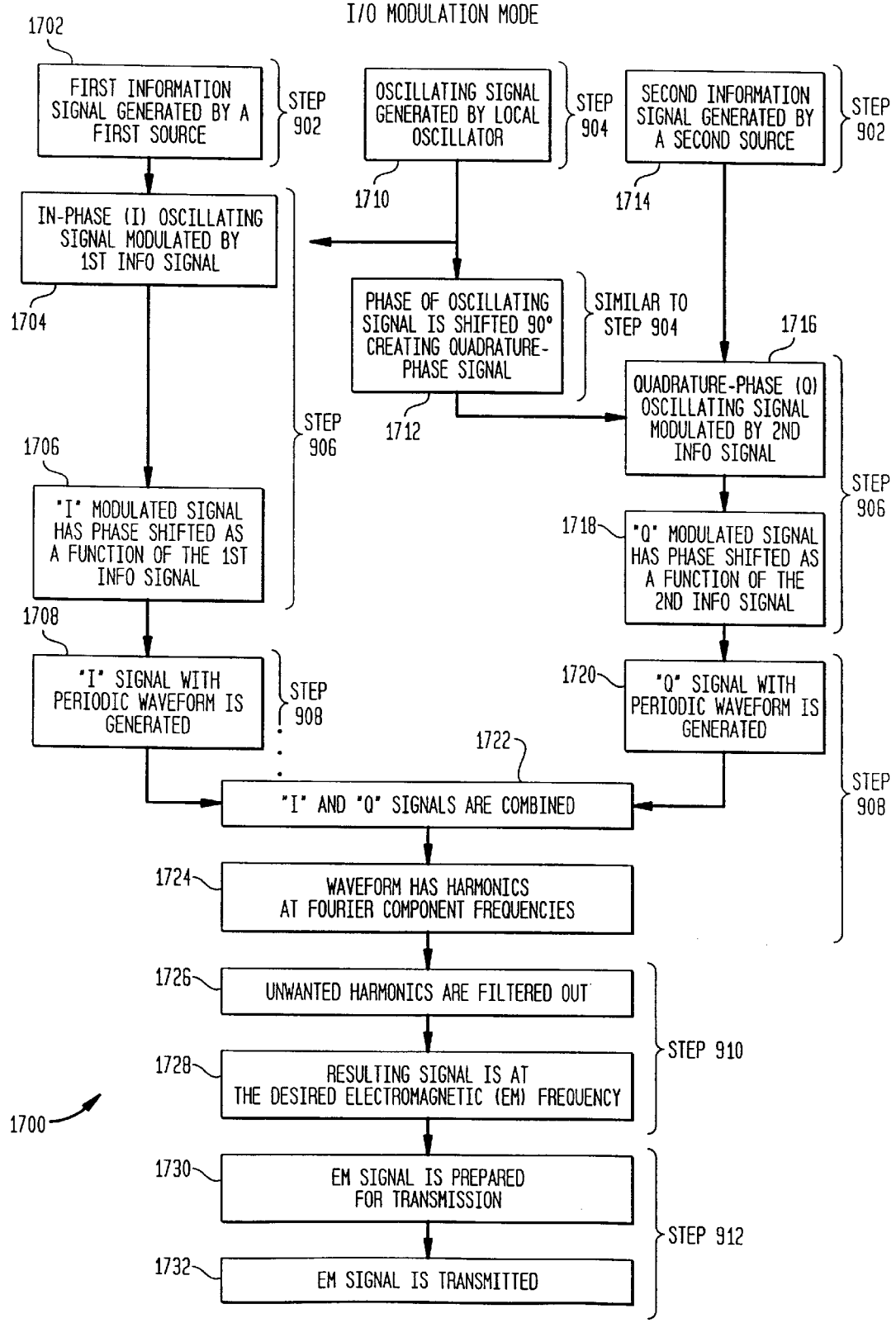
FIG. 17 illustrates the operational flowchart of a fourth embodiment (i.e., "I/Q" mode) of the present invention.

The flow chart of FIG. 17 demonstrates the method of operation of the transmitter in the in-phase/quadrature-phase modulation ("I/Q") mode. In step 1702, a first information signal is generated by a first source. This information signal may be analog, digital, or any combination thereof. In step 1710, an in-phase oscillating signal (referred to as the "I" signal) is generated and in step 1704, it is modulated by the first information signal. This results in the "I" modulated signal as indicated in block 1706 wherein the phase of the "I" modulated signal is varied as a function of the first information signal.

In step 1714, a second information signal is generated. Again, this signal may be analog, digital, or any combination thereof, and may be different than the first information signal. In step 1712, the phase of "I" oscillating signal generated in step 1710 is shifted, creating a quadrature-phase oscillating signal (referred to as the "Q" signal). In step 1716, the "Q" signal is modulated by the second information signal. This results in the "Q" modulated signal as indicated in block 1718 wherein the phase of the "Q" modulated signal is varied as a function of the second information signal.

An "I" signal with a continuous periodic waveform is generated at step 1708 using the "I" modulated signal, and a "Q" signal with a continuous periodic waveform is generated at step 1720 using the "Q" modulated signal. In step 1722, the "I" periodic waveform and the "Q" periodic waveform are combined forming what is referred to as the "I/Q" periodic waveform as indicated in block 1724. As stated before, a continuous and periodic waveform, such as a "I/Q" rectangular wave as indicated in block 1724, has sinusoidal components (harmonics) at frequencies that are integer multiples of the fundamental frequency of the underlying waveform (the Fourier component frequencies). In step 1726, the unwanted frequencies are removed, and as indicated in block 1728, the remaining frequency is at the desired EM output.

The "I/Q" EM signal is prepared for transmission in step 1730, and in step 1732, the "I/Q" EM signal is transmitted.

3.2.4.2 Structural Description.

Figure 18:
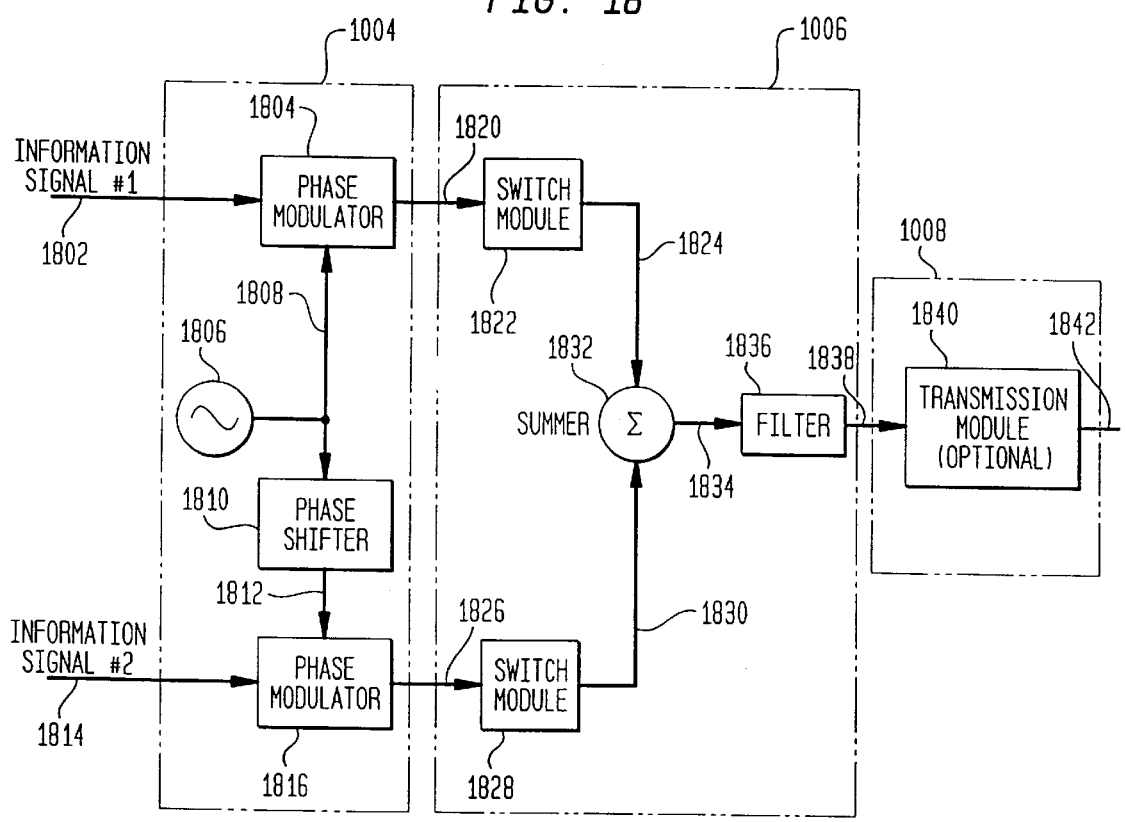
FIG. 18 illustrates an exemplary structural block diagram of the fourth embodiment (i.e., "I/Q" mode) of the present invention.

FIG. 18 is a block diagram of a transmitter according to an embodiment of the invention. This embodiment of the transmitter is shown as an "I/Q" transmitter 1800. "I/Q" transmitter 1800 includes a local oscillator 1806, a phase shifter 1810, two phase modulators 1804 & 1816, two switch modules 1822 & 1828, a summer 1832, a filter 1836, and a transmission module 1840. The "I/Q" transmitter accepts two information signals 1802 & 1814 and outputs a transmitted signal 1420. The operation and structure of exemplary components are described below: an exemplary phase modulator is described below at sections 3.3.4–3.3.4.2; an exemplary local oscillator is described below at sections 3.3.2– 3.3.2.2; an exemplary phase shifter is described below at sections 3.3.3–3.3.3.2; an exemplary switch module is described below at sections 3.3.6–3.3.6.2; an exemplary summer is described below at sections 3.3.8–3.3.8.2; an exemplary filter is described below at sections 3.3.9–3.3.9.2; and an exemplary transmission module is described below at sections 3.3.10–3.3.10.2.

Preferably, the local oscillator 1806, phase shifter 1810, phase modulators 1804 & 1816, switch modules 1822 & 1828, summer 1832, filter 1836, and transmission module 1840 process the information signal in the manner shown in the operational flowchart 1700. In other words, "I/Q" transmitter 1800 is the structural embodiment for performing the operational steps of flowchart 1700. However, it should be understood that the scope and spirit of the present invention includes other structural embodiments for performing the steps of flowchart 1700. The specifics of these other structural embodiments will be apparent to persons skilled in the relevant art(s) based on the discussion contained herein.

The operation of the transmitter 1800 will now be described in detail with reference to the flowchart 1700 In step 1702, a first information signal 1802 from a source (not shown) is routed to the first phase modulator 1804. In step 1710, an "I" oscillating signal 1808 from local oscillator 1806 is generated and in step 1704, "I" oscillating signal 1808 is modulated by first information signal 1802 in the first phase modulator 1804, thereby producing an "I" modulated signal 1820. In step 1708, the first switch module 1822 generates a harmonically rich "I" signal 1824 with a continuous and periodic waveform.

In step 1714, a second information signal 1814 from a source (not shown) is routed to the second phase modulator 1816. In step 1712, the phase of oscillating signal 1808 is shifted by phase shifter 1810 to create "Q" oscillating signal 1812. In step 1716, "Q" oscillating signal 1812 is modulated by second information signal 1814 in the second phase modulator 1816, thereby producing "Q" modulated signal 1826. In step 1720, the second switch module 1828 generates a harmonically rich "Q" signal 1830 with a continuous and periodic waveform. Harmonically rich "I" signal 1824 and harmonically rich "Q" signal 1830 are preferably rectangular waves, such as square waves or pulses (although, the invention is not limited to this embodiment), and are comprised of pluralities of sinusoidal waves whose frequencies are integer multiples of the fundamental frequency of the waveforms. These sinusoidal waves are referred to as the harmonics of the underlying waveforms, and a Fourier analysis will determine the amplitude of each harmonic.

In step 1722, harmonically rich "I" signal 1824 and harmonically rich "Q" signal 1830 are combined by summer 1832 to create harmonically rich "I/Q" signal 1834. In step 1726, a filter 1836 filters out the undesired harmonic frequencies, and outputs an "I/Q" electromagnetic (EM) signal 1838 at the desired harmonic frequency. In step 1730, "I/Q" EM signal 1838 is routed to transmission module 1840 (optional), where it is prepared for transmission. In step 1732, the transmission module 1840 outputs a transmitted signal 1842.

It will be apparent to those skilled in the relevant art(s) that an alternate embodiment exists wherein the harmonically rich "I" signal 1824 and the harmonically rich "Q" signal 1830 may be filtered before they are summed, and further, another alternate embodiment exists wherein "I" modulated signal 1820 and "Q" modulated signal 1826 may be summed to create an "I/Q" modulated signal before being routed to a switch module.

3.2.5 Other Embodiments.

Other embodiments of the up-converter of the present invention being used as a transmitter (or in other applications) may use subsets and combinations of modulation techniques. These would be apparent to one skilled in the relevant art(s) based on the teachings disclosed herein, and include, but are not limited to, quadrature amplitude modulation (QAM), and embedding two forms of modulation onto a signal for up-conversion.

Figure 62:
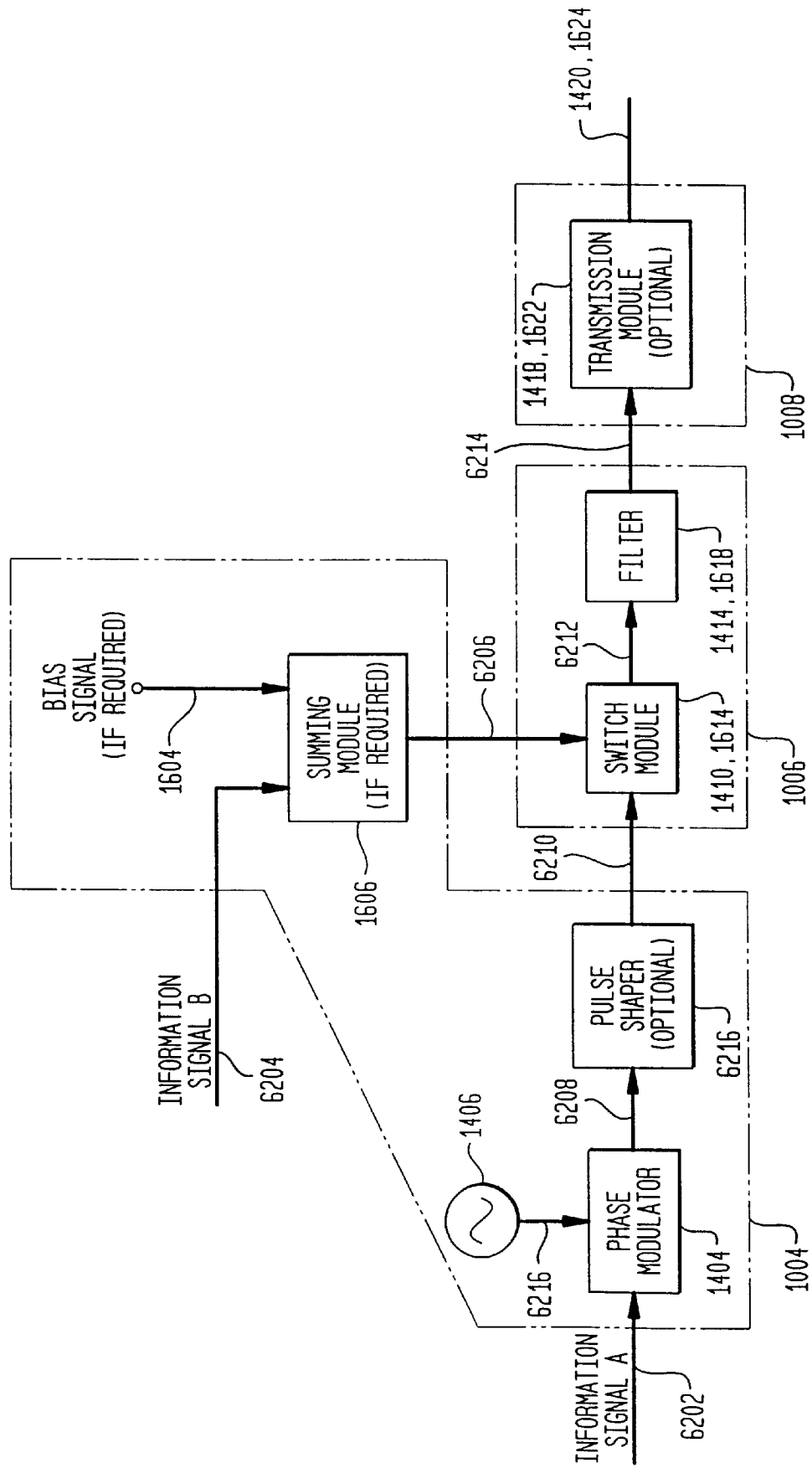
FIG. 62 illustrates an exemplary structural block diagram for an alternative embodiment of the present invention (i.e., a mode wherein AM is combined with PM)
Figure 63A:
FIGS. 63A–63H illustrate exemplary waveforms (for the embodiment of FIG. 62) at a plurality of points in an exemplary high level circuit diagram, highlighting the characteristics of the first two harmonics.
Figure 63B:
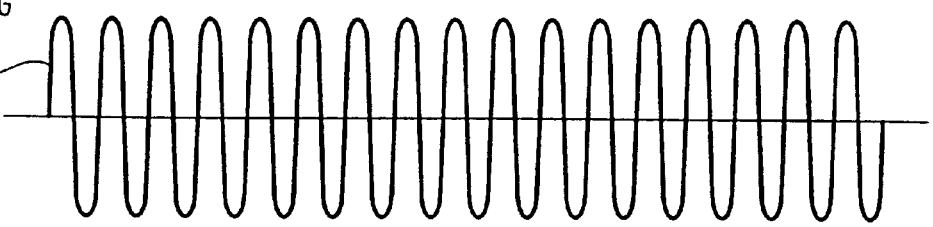
Figure 63C:
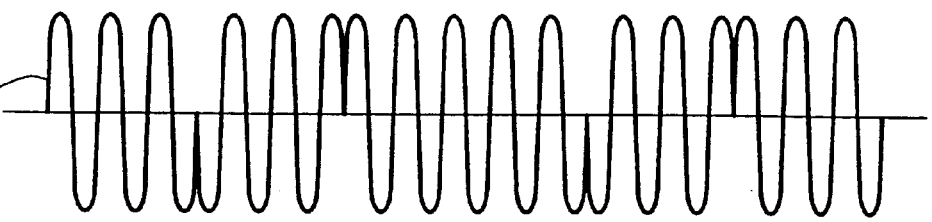
Figure 63D:
Figure 63E:
Figure 63F:
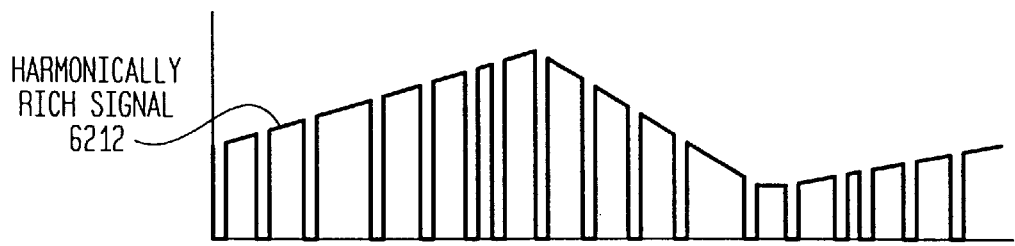
Figure 63G:
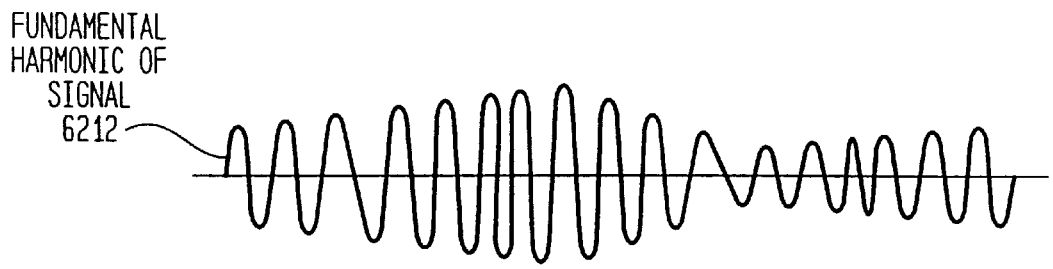
Figure 63H:
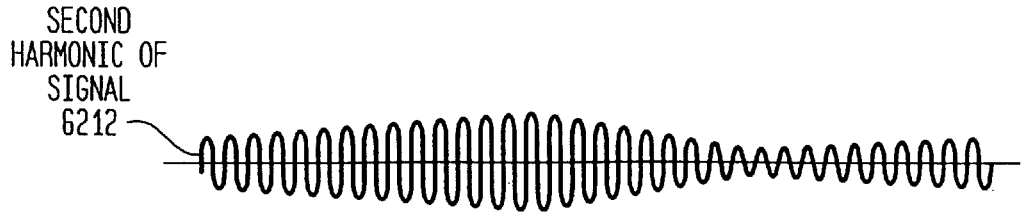

An exemplary circuit diagram illustrating the combination of two modulations is found in FIG. 62. This example uses AM combined with PM. The waveforms shown in FIG. 63 illustrate the phase modulation of a digital information signal "A" 6202 combined with the amplitude modulation of an analog information signal "B" 6204. An oscillating signal 6216 (FIG. 63B) and information signal "A" 6202 (FIG. 63A) are received by phase modulator 1404, thereby creating a phase modulated signal 6208 (FIG. 63C). Note that for illustrative purposes, and not limiting, the information signal is shown as a digital signal, and the phase modulation is shown as shifting the phase of the oscillating signal by 180°. Those skilled in the relevant art(s) will appreciate that the information signal could be analog (although typically it is digital), and that phase modulations other than 180° may also be used. FIG. 62 shows a pulse shaper 6216 receiving phase modulated signal 6208 and outputting a pulse-shaped PM signal 6210. The pulse shaper is optional, depending on the selection and design of the phase modulator 1404. Information signal "B" 6304 and bias signal 1604 (if required) are combined by summing module 1606 (optional) to create reference signal 6206 (FIG. 63E). Pulse-shaped PM signal 6210 is routed to switch module 1410, 1614 where it gates the reference signal 6206 thereby producing a harmonically rich signal 6212 (FIG. 63F). It can be seen that the amplitude of harmonically rich signal 6212 varies as a function of reference signal 6206, and the period and pulse width of harmonically rich signal 6212 are substantially the same as pulse-shaped PM signal 6210. FIG. 63 only illustrates the fundamental and second harmonics of harmonically rich signal 6212. In fact, there may be an infinite number of harmonics, but for illustrative purposes (and not limiting) the first two harmonics are sufficient to illustrate that both the phase modulation and the amplitude modulation that are present on the harmonically rich signal 6212 are also present on each of the harmonics. Filter 1414, 1618 will remove the unwanted harmonics, and a desired harmonic 6214 is routed to transmission module 1418, 1622 (optional) where it is prepared for transmission. Transmission module 1418, 1622 then outputs a transmitted signal 1420, 1624. Those skilled in the relevant art(s) will appreciate that these examples are provided for illustrative purposes only and are not limiting.

The embodiments described above are provided for purposes of illustration. These embodiments are not intended to limit the invention. Alternate embodiments, differing slightly or substantially from those described herein, will be apparent to persons skilled in the relevant art(s) based on the teachings contained herein. Such alternate embodiments include, but are not limited to, combinations of modulation techniques in an "I/Q" mode. Such alternate embodiments fall within the scope and spirit of the present invention.

3.3 Methods and Systems for Implementing the Embodiments.

Exemplary operational and/or structural implementations related to the method(s), structure(s), and/or embodiments described above are presented in this section (and its subsections). These components and methods are presented herein for purposes of illustration, and not limitation. The invention is not limited to the particular examples of components and methods described herein. Alternatives (including equivalents, extensions, variations, deviations, etc., of those described herein) will be apparent to persons skilled in the relevant art(s) based on the teachings contained herein. Such alternatives fall within the scope and spirit of the present invention.

3.3.1 The Voltage Controlled Oscillator (FM Mode).

As discussed above, the frequency modulation (FM) mode embodiment of the invention uses a voltage controlled oscillator (VCO). See, as an example, VCO 1204 in FIG. 12. The invention supports numerous embodiments of the VCO. Exemplary embodiments of the VCO 2304 (FIG. 23) are described below. However, it should be understood that these examples are provided for illustrative purposes only. The invention is not limited to these embodiments.

3.3.1.1 Operational Description.

The information signal 2302 is accepted and an oscillating signal 2306 whose frequency varies as a function of the information signal 2302 is created. Oscillating signal 2306 is also referred to as frequency modulated intermediate signal 2306. The information signal 2302 may be analog or digital or a combination thereof, and may be conditioned to ensure it is within the desired range.

In the case where the information signal 2302 is digital, the oscillating signal 2306 may vary between discrete frequencies. For example, in a binary system, a first frequency corresponds to a digital "high," and a second frequency corresponds to a digital "low." Either frequency may correspond to the "high" or the "low," depending on the convention being used. This operation is referred to as frequency shift keying (FSK) which is a subset of FM. If the information signal 2302 is analog, the frequency of the oscillating signal 2306 will vary as a function of that analog signal, and is not limited to the subset of FSK described above.

The oscillating signal 2306 is a frequency modulated signal which can be a sinusoidal wave, a rectangular wave, a triangular wave, a pulse, or any other continuous and periodic waveform. As stated above, one skilled in the relevant art(s) will recognize the physical limitations to and mathematical obstacles against achieving exact or perfect waveforms and it is not the intent of the present invention that a perfect waveform be generated or needed. Again, as stated above, for ease of discussion, the term "rectangular waveform" will be used to refer to waveforms that are substantially rectangular, the term "square wave" will refer to those waveforms that are substantially square, the term "triangular wave" will refer to those waveforms that are substantially triangular, and the term "pulse" will refer to those waveforms that are substantially a pulse, and it is not the intent of the present invention that a perfect square wave, triangle wave, or pulse be generated or needed.

3.3.1.2 Structural Description.

The design and use of a voltage controlled oscillator 2304 is well known to those skilled in the relevant art(s). The VCO 2304 may be designed and fabricated from discrete components, or it may be purchased "off the shelf." VCO 2304 accepts an information signal 2302 from a source. The information signal 2302 is at baseband and generally is an electrical signal within a prescribed voltage range. If the information is digital, the voltage will be at discrete levels. If the information is analog, the voltage will be continuously variable between an upper and a lower level. The VCO 2304 uses the voltage of the information signal 2302 to cause a modulated oscillating signal 2306 to be output. The information signal 2302, because it is a baseband signal and is used to modulate the oscillating signal, may be referred to as the modulating baseband signal 2302.

The frequency of the oscillating signal 2306 varies as a function of the voltage of the modulating baseband signal 2302. If the modulating baseband signal 2302 represents digital information, the frequency of the oscillating signal 2306 will be at discrete levels. If, on the other hand, the modulating baseband signal 2302 represents analog information, the frequency of the oscillating signal 2306 will be continuously variable between its higher and lower frequency limits. The oscillating signal 2306 can be a sinusoidal wave, a rectangular wave, a triangular wave, a pulse, or any other continuous and periodic waveform.

The frequency modulated oscillating signal 2306 may then be used to drive a switch module 2802.

3.3.2 The Local Oscillator (PM, AM, and "IIQ" Modes).

Figure 24:
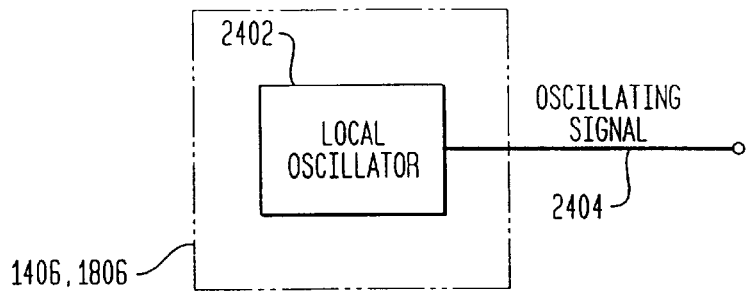
FIG. 24 illustrates an implementation example of a local oscillator (LO)

As discussed above, the phase modulation (PM) and amplitude modulation (AM) mode embodiments of the invention use a local oscillator. So too does the in-phase/quadrature-phase modulation ("I/Q") mode embodiment. See, as an example, local oscillator 1406 in FIG. 14, local oscillator 1610 in FIG. 16, and local oscillator 1806 in FIG. 18. The invention supports numerous embodiments of the local oscillator. Exemplary embodiments of the local oscillator 2402 (FIG. 24) are described below. However, it should be understood that these examples are provided for illustrative purposes only. The invention is not limited to these embodiments.

3.3.2.1 Operational Description.

An oscillating signal 2404 is generated. The frequency of the signal 2404 may be selectable, but generally is not considered to be "variable." That is, the frequency may be selected to be a specific value for a specific implementation, but generally it does not vary as a function of the information signal 2302 (i.e., the modulating baseband signal).

The oscillating signal 2404 generally is a sinusoidal wave, but it may also be a rectangular wave, a triangular wave, a pulse, or any other continuous and periodic waveform. As stated above, one skilled in the relevant art(s) will recognize the physical limitations to and mathematical obstacles against achieving exact or perfect waveforms and it is not the intent of the present invention that a perfect waveform be generated or needed. Again, as stated above, for ease of discussion, the term "rectangular waveform" will be used to refer to waveforms that are substantially rectangular, the term "square wave" will refer to those waveforms that are substantially square, the term "triangular wave" will refer to those waveforms that are substantially triangular, and the term "pulse" will refer to those waveforms that are substantially a pulse, and it is not the intent of the present invention that a perfect square wave, triangle wave, or pulse be generated or needed.

3.3.2.2 Structural Description.

The design and use of a local oscillator 2402 is well known to those skilled in the relevant art(s). A local oscillator 2402 may be designed and fabricated from discrete components or it may be purchased "off the shelf." A local oscillator 2402 is generally set to output a specific frequency. The output can be "fixed" or it can be "selectable," based on the design of the circuit. If it is fixed, the output is considered to be substantially a fixed frequency that cannot be changed. If the output frequency is selectable, the design of the circuit will allow a control signal to be applied to the local oscillator 2402 to change the frequency for different applications. However, the output frequency of a local oscillator 2402 is not considered to be "variable" as a function of an information signal 2302 such as the modulating baseband signal 2302. (If it were desired for the output frequency of an oscillator to be variable as a function of an information signal, a VCO would preferably be used.) The oscillating signal 2404 generally is a sinusoidal wave, but it may also be a rectangular wave, a triangular wave, a pulse, or any other continuous and periodic waveform.

The output of a local oscillator 2402 may be an input to other circuit components such as a phase modulator 2606, a phase shifting circuit 2504, switch module 3102, etc.

3.3.3 The Phase Shifter ("IIQ" Mode).

Figure 25:
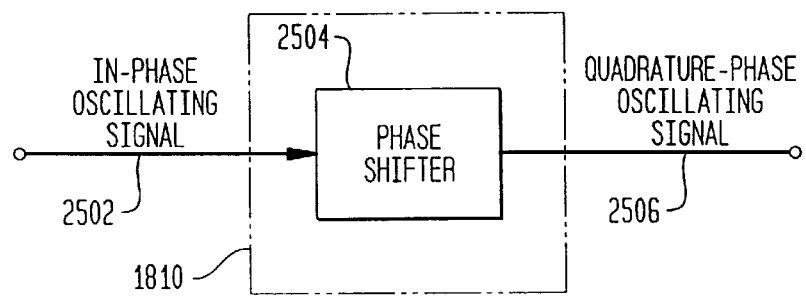
FIG. 25 illustrates an implementation example of a phase shifter.

As discussed above, the in-phase/quadrature-phase modulation ("I/Q") mode embodiment of the invention uses a phase shifter. See, as an example, phase shifter 1810 in FIG. 18. The invention supports numerous embodiments of the phase shifter. Exemplary embodiments of the phase shifter 2504 (FIG. 25) are described below. The invention is not limited to these embodiments. The description contained herein is for a "90° phase shifter." The 90° phase shifter is used for ease of explanation, and one skilled in the relevant art(s) will understand that other phase shifts can be used without departing from the intent of the present invention.

3.3.3.1 Operational Description.

An "in-phase" oscillating signal 2502 is received and a "quadrature-phase" oscillating signal 2506 is output. If the in-phase ("I") signal 2502 is referred to as being a sine wave, then the quadrature-phase ("Q") signal 2506 can be referred to as being a cosine wave (i.e., the "Q" signal 2506 is 90° out of phase with the "I" signal 2502). However, they may also be rectangular waves, triangular waves, pulses, or any other continuous and periodic waveforms. As stated above, one skilled in the relevant art(s) will recognize the physical limitations to and mathematical obstacles against achieving exact or perfect waveforms and it is not the intent of the present invention that a perfect waveform be generated or needed. Again, as stated above, for ease of discussion, the term "rectangular waveform" will be used to refer to waveforms that are substantially rectangular, the term "square wave" will refer to those waveforms that are substantially square, the term "triangular wave" will refer to those waveforms that are substantially triangular, and the term "pulse" will refer to those waveforms that are substantially a pulse, and it is not the intent of the present invention that a perfect square wave, triangle wave, or pulse be generated or needed. Regardless of the shapes of the waveforms, the "Q" signal 2506 is out of phase with the "I" signal 2506 by one-quarter period of the waveform. The frequency of the "I" and "Q" signals 2502 and 2506 are substantially equal.

The discussion contained herein will be confined to the more prevalent embodiment wherein there are two intermediate signals separated by 90°. This is not limiting on the invention. It will be apparent to those skilled in the relevant art(s) that the techniques tough herein and applied to the "I/Q" embodiment of the present invention also apply to more exotic embodiments wherein the intermediate signals are shifted by some amount other than 90°, and also wherein there may be more than two intermediate frequencies.

3.3.3.2 Structural Description.

The design and use of a phase shifter 2504 is well known to those skilled in the relevant art(s). A phase shifter 2504 may be designed and fabricated from discrete components or it may be purchased "off the shelf." A phase shifter accepts an "in-phase" ("I") oscillating signal 2502 from any of a number of sources, such as a VCO 2304 or a local oscillator 2402, and outputs a "quadrature-phase" ("Q") oscillating signal 2506 that is substantially the same frequency and substantially the same shape as the incoming "I" signal 2502, but with the phase shifted by 90°. Both the "I" and "Q" signals 2502 and 2506 are generally sinusoidal waves, but they may also be rectangular waves, triangular waves, pulses, or any other continuous and periodic waveforms. Regardless of the shapes of the waveforms, the "Q" signal 2506 is out of phase with the "I" signal 2502 by one-quarter period of the waveform. Both the "I" and "Q" signals 2502 and 2506 may be modulated.

The output of a phase shifter 2504 may be used as an input to a phase modulator 2606.

3.3.4 The Phase Modulator (PM and "IIQ " Modes).

Figure 26:
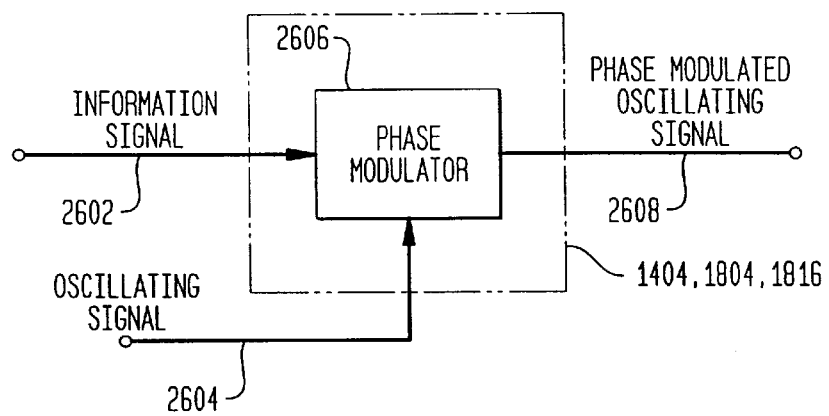
FIG. 26 illustrates an implementation example of a phase modulator.

As discussed above, the phase modulation (PM) mode embodiment including the in-phase/quadrature-phase modulation ("I/Q") mode embodiment of the invention uses a phase modulator. See, as an example, phase modulator 1404 of FIG. 14 and phase modulators 1804 and 1816 of FIG. 18. The invention supports numerous embodiments of the phase modulator. Exemplary embodiments of the phase modulator 2606 (FIG. 26) are described below. However, it should be understood that these examples are provided for illustrative purposes only. The invention is not limited to these embodiments.

3.3.4.1 Operational Description.

An information signal 2602 and an oscillating signal 2604 are accepted, and a phase modulated oscillating signal 2608 whose phase varies as a function of the information signal 2602 is output. The information signal 2602 may be analog or digital and may be conditioned to ensure it is within the desired range. The oscillating signal 2604 can be a sinusoidal wave, a rectangular wave, a triangular wave, a pulse, or any other continuous and periodic waveform. As stated above, one skilled in the relevant art(s) will recognize the physical limitations to and mathematical obstacles against achieving exact or perfect waveforms and it is not the intent of the present invention that a perfect waveform be generated or needed. Again, as stated above, for ease of discussion, the term "rectangular waveform" will be used to refer to waveforms that are substantially rectangular, the term "square wave" will refer to those waveforms that are substantially square, the term "triangular wave" will refer to those waveforms that are substantially triangular, and the term "pulse" will refer to those waveforms that are substantially a pulse, and it is not the intent of the present invention that a perfect square wave, triangle wave, or pulse be generated or needed. The modulated oscillating signal 2608 is also referred to as the modulated intermediate signal 2608.

In the case where the information signal 2602 is digital, the modulated intermediate signal 2608 will shift phase between discrete values, the first phase (e.g., for a signal represented by $\sin(\omega t+\theta_o)$) corresponding to a digital "high," and the second phase (e.g., for a signal represented by $\sin(\omega t+\theta_o+\delta)$, where $\delta$ represents the amount the phase has been shifted) corresponding to a digital "low." Either phase may correspond to the "high" or the "low," depending on the convention being used. This operation is referred to as phase shift keying (PSK) which is a subset of PM.

If the information signal 2602 is analog, the phase of the modulated intermediate signal 2608 will vary as a function of the information signal 2602 and is not limited to the subset of PSK described above.

The modulated intermediate signal 2608 is a phase modulated signal which can be a sinusoidal wave, a rectangular wave, a triangular wave, a pulse, or any other continuous and periodic waveform, and which has substantially the same period as the oscillating signal 2604.

3.3.4.2 Structural Description.

The design and use of a phase modulator 2606 is well known to those skilled in the relevant art(s). A phase modulator 2606 may be designed and fabricated from discrete components, or it may be purchased "off the shelf." A phase modulator 2606 accepts an information signal 2602 from a source and an oscillating signal 2604 from a local oscillator 2402 or a phase shifter 2504. The information signal 2602 is at baseband and is generally an electrical signal within a prescribed voltage range. If the information is digital, the voltage will be at discrete levels. If the information is analog, the voltage will be continuously variable between an upper and a lower level as a function of the information signal 2602. The phase modulator 2606 uses the voltage of the information signal 2602 to modulate the oscillating signal 2604 and causes a modulated intermediate signal 2608 to be output. The information signal 2602, because it is a baseband signal and is used to modulate the oscillating signal, may be referred to as the modulating baseband signal 2604.

The modulated intermediate signal 2608 is an oscillating signal whose phase varies as a function of the voltage of the modulating baseband signal 2602. If the modulating baseband signal 2602 represents digital information, the phase of the modulated intermediate signal 2608 will shift by a discrete amount (e.g., the modulated intermediate signal 2608 will shift by an amount $\delta$ between $\sin(\omega t+\theta_o)$ and $\sin(\omega t+\theta_o+\delta)$). If, on the other hand, the modulating baseband signal 2602 represents analog information, the phase of the modulated intermediate signal 2608 will continuously shift between its higher and lower phase limits as a function of the information signal 2602. In one exemplary embodiment, the upper and lower limits of the modulated intermediate signal 2608 can be represented as $\sin(\omega t+\theta_o)$ and $\sin(\omega t+\theta_o+\pi)$. In other embodiments, the range of the phase shift may be less than π. The modulated intermediate signal 2608 can be a sinusoidal wave, a rectangular wave, a triangular wave, a pulse, or any other continuous and periodic waveform.

The phase modulated intermediate signal 2608 may then be used to drive a switch module 2802.

3.3.5 The Summing Module (AM Mode).

Figure 27:
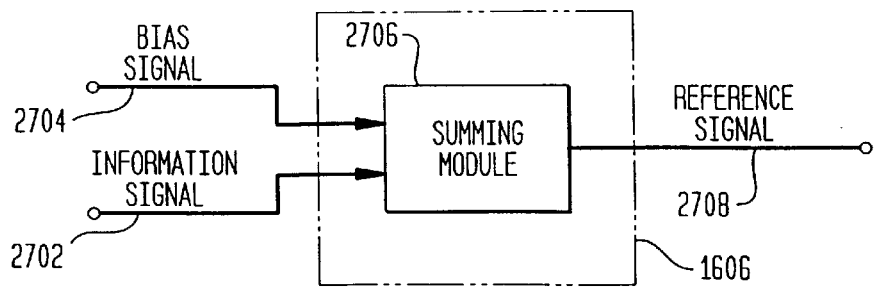
FIG. 27 illustrates an implementation example of a summing amplifier.

As discussed above, the amplitude modulation (AM) mode embodiment of the invention uses a summing module. See, as an example, summing module 1606 in FIG. 16. The invention supports numerous embodiments of the summing module. Exemplary embodiments of the summing module 2706 (FIG. 27) are described below. However, it should be understood that these examples are provided for illustrative purposes only. The invention is not limited to these embodiments. It may also be used in the "I/Q" mode embodiment when the modulation is AM. The summing module 2706 need not be used in all AM embodiments.

3.3.5.1 Operational Description.

An information signal 2702 and a bias signal 2702 are accepted, and a reference signal is output. The information signal 2702 may be analog or digital and may be conditioned to ensure it is within the proper range so as not to damage any of the circuit components. The bias signal 2704 is usually a direct current (DC) signal.

In the case where the information signal 2702 is digital, the reference signal 2706 shifts between discrete values, the first value corresponding to a digital "high," and the second value corresponding to a digital "low." Either value may correspond to the "high" or the "low," depending on the convention being used. This operation is referred to as amplitude shift keying (ASK) which is a subset of AM.

If the information signal 2702 is analog, the value of the reference signal 2708 will vary linearly between upper and lower extremes which correspond to the upper and lower limits of the information signal 2702. Again, either extreme of the reference signal 2708 range may correspond to the upper or lower limit of the information signal 2702 depending on the convention being used.

The reference signal 2708 is a digital or analog signal and is substantially proportional to the information signal 2702.

3.3.5.2 Structural Description.

The design and use of a summing module 2706 is well known to those skilled in the relevant art(s). A summing module 2706 may be designed and fabricated from discrete components, or it may be purchased "off the shelf." A summing module 2706 accepts an information signal 2702 from a source. The information signal 2702 is at baseband and generally is an electrical signal within a prescribed voltage range. If the information is digital, the information signal 2702 is at either of two discrete levels. If the information is analog, the information signal 2702 is continuously variable between an upper and a lower level. The summing module 2706 uses the voltage of the information signal 2702 and combines it with a bias signal 2704. The output of the summing module 2706 is called the reference signal 2708. The purpose of the summing module 2706 is to cause the reference signal 2708 to be within a desired signal range. One skilled in the relevant art(s) will recognize that the information signal 2702 may be used directly, without being summed with a bias signal 2704, if it is already within the desired range. The information signal 2702 is a baseband signal, but typically, in an AM embodiment, it is not used to directly modulate an oscillating signal. The amplitude of the reference signal 2708 is at discrete levels if the information signal 2702 represents digital information. On the other hand, the amplitude of the reference signal 2708 is continuously variable between its higher and lower limits if the information signal 2702 represents analog information. The amplitude of the reference signal 2708 is substantially proportional to the information signal 2702, however, a positive reference signal 2708 need not represent a positive information signal 2702.

The reference signal 2708 is routed to the first input 3108 of a switch module 3102. In one exemplary embodiment, a resistor 2824 is connected between the output of the summing module 2706 (or the source of the information signal 2702 in the embodiment wherein the summing amplifier 2706 is not used) and the switch 3116 of the switch module 3102.

3.3.6 The Switch Module (FM, PM, and "I/Q" Modes).

Figure 28A:
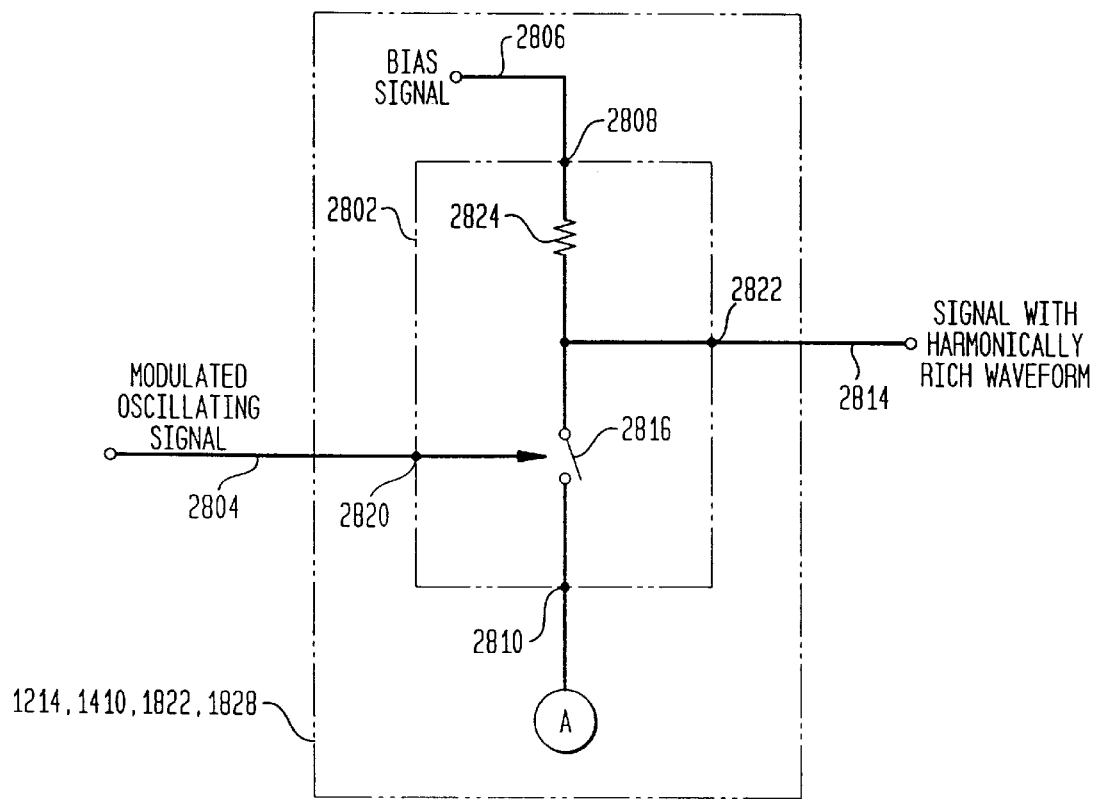
FIGS. 28A–28C illustrate an implementation example of a switch module for the FM and PM modes.
Figure 28B:
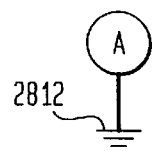
Figure 28C:
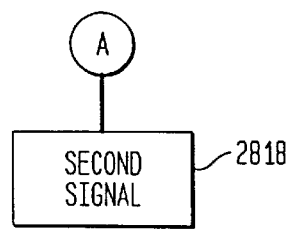

As discussed above, the frequency modulation (FM), phase modulation (PM), and the in-phase/quadrature-phase modulation ("I/Q") mode embodiments of the invention use a switching assembly referred to as switch module 2802 (FIGS. 28A–28C). As an example, switch module 2802 is a component in switch module 1214 in FIG. 12, switch module 1410 in FIG. 14, and switch modules 1822 and 1828 in FIG. 18. The invention supports numerous embodiments of the switch module. Exemplary embodiments of the switch module 2802 are described below. However, it should be understood that these examples are provided for illustrative purposes only. The invention is not limited to these embodiments. The switch module 2802 and its operation in the FM, PM, and "I/Q" mode embodiments is substantially the same as its operation in the AM mode embodiment, described in sections 3.3.7–3.3.7.2 below.

3.3.6.1 Operational Description.

A bias signal 2806 is gated as a result of the application of a modulated oscillating signal 2804, and a signal with a harmonically rich waveform 2814 is created. The bias signal 2806 is generally a fixed voltage. The modulated oscillating signal 2804 can be frequency modulated, phase modulated, or any other modulation scheme or combination thereof. In certain embodiments, such as in certain amplitude shift keying modes, the modulated oscillating signal 2804 may also be amplitude modulated. The modulated oscillating signal 2804 can be a sinusoidal wave, a rectangular wave, a triangular wave, a pulse, or any other continuous and periodic waveform. In a preferred embodiment, modulated oscillating signal 2804 would be a rectangular wave. As stated above, one skilled in the relevant art(s) will recognize the physical limitations to and mathematical obstacles against achieving exact or perfect waveforms and it is not the intent of the present invention that a perfect waveform be generated or needed. Again, as stated above, for ease of discussion, the term "rectangular waveform" will be used to refer to waveforms that are substantially rectangular, the term "square wave" will refer to those waveforms that are substantially square, the term "triangular wave" will refer to those waveforms that are substantially triangular, and the term "pulse" will refer to those waveforms that are substantially a pulse, and it is not the intent of the present invention that a perfect square wave, triangle wave, or pulse be generated or needed.

The signal with harmonically rich waveform 2814, hereafter referred to as the harmonically rich signal 2814, is a continuous and periodic waveform that is modulated substantially the same as the modulated oscillating signal 2804. That is, if the modulated oscillating signal 2804 is frequency modulated, the harmonically rich signal 2814 will also be frequency modulated, and if the modulated oscillating signal 2804 is phase modulated, the harmonically rich signal 2814 will also be phase modulated. (In one embodiment, the harmonically rich signal 2814 is a substantially rectangular waveform.) As stated before, a continuous and periodic waveform, such as a rectangular wave, has sinusoidal components (harmonics) at frequencies that are integer multiples of the fundamental frequency of the underlying waveform (the Fourier component frequencies). Thus, the harmonically rich signal 2814 is composed of sinusoidal signals at frequencies that are integer multiples of the fundamental frequency of itself.

3.3.6.2 Structural Description.

The switch module 2802 of an embodiment of the present invention is comprised of a first input 2808, a second input 2810, a control input 2820, an output 2822, and a switch 2816. A bias signal 2806 is applied to the first input 2808 of the switch module 2802. Generally, the bias signal 2806 is a fixed voltage, and in one embodiment of the invention, a resistor 2824 is located between the bias signal 2806 and the switch 2816. The second input 2810 of the switch module 2802 is generally at electrical ground 2812. However, one skilled in the relevant art(s) will recognize that alternative embodiments exist wherein the second input 2810 may not be at electrical ground 2812, but rather a second signal 2818, provided that the second signal 2818 is different than the bias signal 2806.

A modulated oscillating signal 2804 is connected to the control input 2820 of the switch module 2802. The modulated oscillating signal 2804 may be frequency modulated or phase modulated. (In some circumstances and embodiments, it may be amplitude modulated, such as in on/off keying, but this is not the general case, and will not be described herein.) The modulated oscillating signal 2804 can be a sinusoidal wave, a rectangular wave, a triangular wave, a pulse, or any other continuous and periodic waveform. In a preferred embodiment, it would be a rectangular wave. The modulated oscillating signal 2804 causes the switch 2816 to close and open.

The harmonically rich signal 2814 described in section 3.3.6.1 above, is found at the output 2822 of the switch module 2802. The harmonically rich signal 2814 is a continuous and periodic waveform that is modulated substantially the same as the modulated oscillating signal 2804. That is, if the modulated oscillating signal 2804 is frequency modulated, the harmonically rich signal 2814 will also be frequency modulated, and if the modulated oscillating signal 2804 is phase modulated, the harmonically rich signal 2814 will also be phase modulated. In one embodiment, the harmonically rich signal 2814 has a substantially rectangular waveform. As stated before, a continuous and periodic waveform, such as a rectangular wave, has sinusoidal components (harmonics) at frequencies that are integer multiples of the fundamental frequency of the underlying waveform (the Fourier component frequencies). Thus, the harmonically rich signal 2814 is composed of sinusoidal signals at frequencies that are integer multiples of the fundamental frequency of itself. Each of these sinusoidal signals is also modulated substantially the same as the continuous and periodic waveform (i.e., the modulated oscillating signal 2804) from which it is derived.

The switch module 2802 operates as follows. When the switch 2816 is "open," the output 2822 of switch module 2802 is at substantially the same voltage level as bias signal 2806. Thus, since the harmonically rich signal 2814 is connected directly to the output 2822 of switch module 2802, the amplitude of harmonically rich signal 2814 is equal to the amplitude of the bias signal 2806. When the modulated oscillating signal 2804 causes the switch 2816 to become "closed," the output 2822 of switch module 2802 becomes connected electrically to the second input 2810 of switch module 2802 (e.g., ground 2812 in one embodiment of the invention), and the amplitude of the harmonically rich signal 2814 becomes equal to the potential present at the second input 2810 (e.g., zero volts for the embodiment wherein the second input 2810 is connected to electrical ground 2812). When the modulated oscillating signal 2804 causes the switch 2816 to again become "open," the amplitude of the harmonically rich signal 2814 again becomes equal to the bias signal 2806. Thus, the amplitude of the harmonically rich signal 2814 is at either of two signal levels, i.e., bias signal 2806 or ground 2812, and has a frequency that is substantially equal to the frequency of the modulated oscillating signal 2804 that causes the switch 2816 to open and close. The harmonically rich signal 2814 is modulated substantially the same as the modulated oscillating signal 2804. One skilled in the relevant art(s) will recognize that any one of a number of switch designs will fulfill the scope and spirit of the present invention as described herein.

Figure 29A:
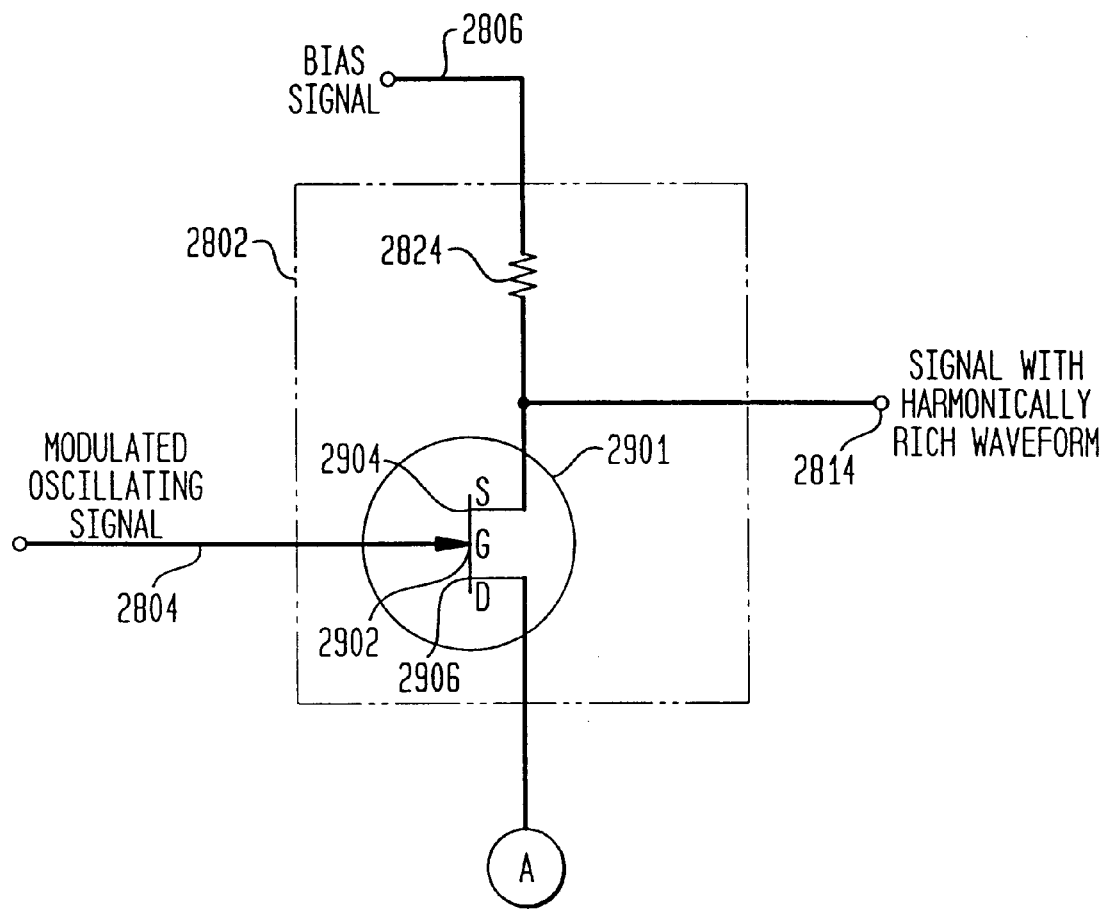
FIG. 29A–29C illustrate an example of the switch module of FIGS. 28A–28C wherein the switch is a GaAsFET.
Figure 29B:
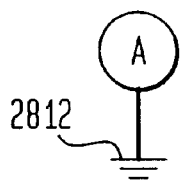
Figure 29C:
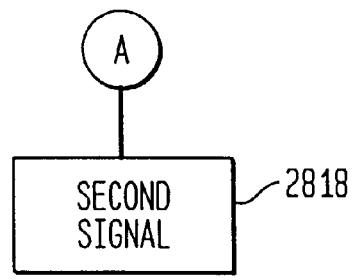
Figure 30A:
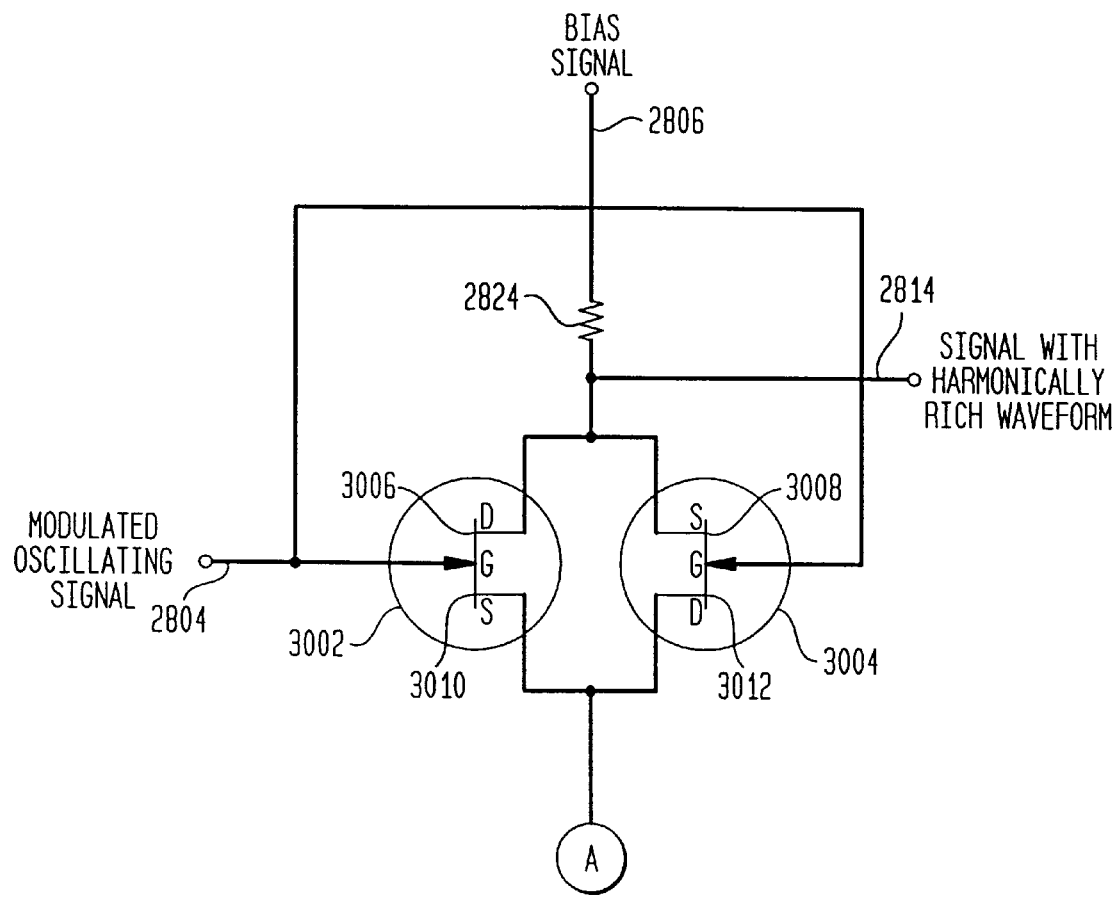
FIGS. 30A–30C illustrate an example of a design to ensure symmetry for a GaAsFET implementation in the FM and PM modes.
Figure 30B:
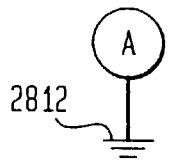
Figure 30C:
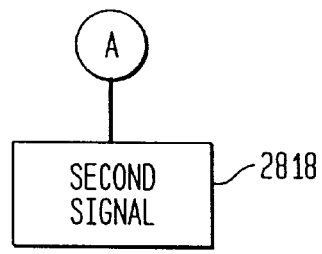

In an embodiment of the invention, the switch 2816 is a semiconductor device, such as a diode ring. In another embodiment, the switch is a transistor, such as a field effect transistor (FET). In an embodiment wherein the FET is gallium arsenide (GaAs), switch module 2802 can be designed as seen in FIGS. 29A–29C, where the modulated oscillating signal 2804 is connected to the gate 2902 of the GaAsFET 2901, the bias signal 2806 is connected through a bias resistor 2824 to the source 2904 of the GaAsFET 2901, and electrical ground 2812 is connected to the drain 2906 of GaAsFET 2901. (In an alternate embodiment shown in FIG. 29C, a second signal 2818 may be connected to the drain 2906 of GaAsFET 2901.) Since the drain and the source of GaAsFETs are interchangeable, the bias signal 2806 can be applied to either the source 2904 or to the drain 2906. If there is concern that there might be some source-drain asymmetry in the GaAsFET, the switch module can be designed as shown in FIGS. 30A–30C, wherein two GaAs-FETs 3002 and 3004 are connected together, with the source 3010 of the first 3002 connected to the drain 3012 of the second 3004, and the drain 3006 of the first 3002 being connected to the source 3008 of the second 3004. This design arrangement will balance substantially all asymmetries. Other switch designs and implementations will be apparent to persons skilled in the relevant art(s).

The output 2822 of the switch module 2802, i.e., the harmonically rich signal 2814, can be routed to a filter 3504 in the FM and PM modes or to a Summer 3402 in the "I/Q" mode.

3.3.7 The Switch Module (AM Mode).

Figure 31A:
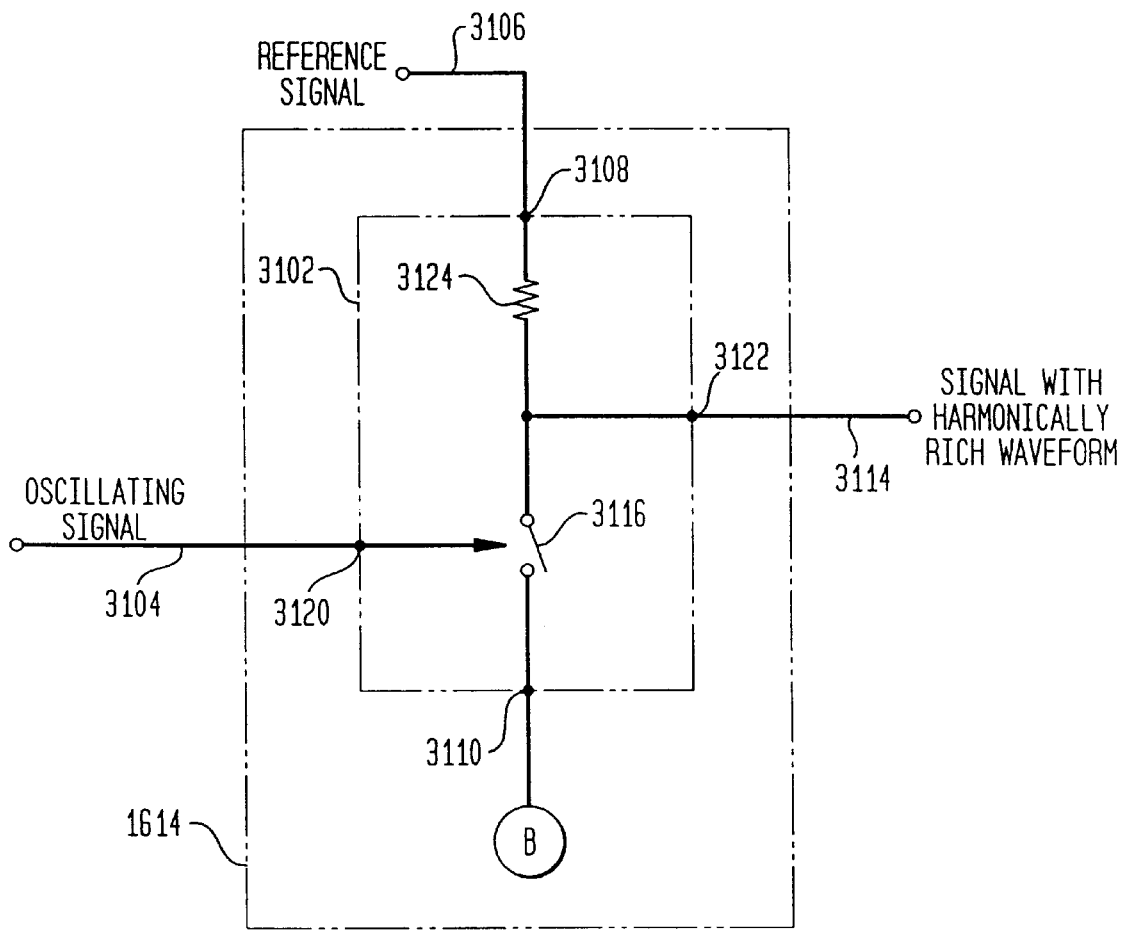
FIGS. 31A–31C illustrate an implementation example of a switch module for the AM mode.
Figure 31B:
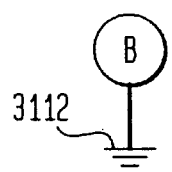
Figure 31C:
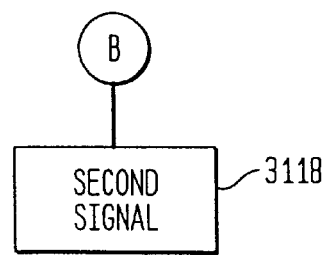

As discussed above, the amplitude modulation (AM) mode embodiment of the invention uses a switching assembly referred to as switch module 3102 (FIGS. 31A–31C). As an example, switch module 3102 is a component in switch module 1614 of FIG. 16. The invention supports numerous embodiments of the switch module. Exemplary embodiments of the switch module 3102 are described below. However, it should be understood that these examples are provided for illustrative purposes only. The invention is not limited to these embodiments. The switch module 3102 and its operation in the AM mode embodiment is substantially the same as its operation in the FM, PM, and "I/Q" mode embodiments described in sections 3.3.6–3.3.6.2 above.

3.3.7.1 Operational Description.

A reference signal 3106 is gated as a result of the application of an oscillating signal 3104, and a signal with a harmonically rich waveform 3114 is created. The reference signal 3106 is a function of the information signal 2702 and may, for example, be either the summation of the information signal 2702 with a bias signal 2704 or it may be the information signal 2702 by itself. In the AM mode, the oscillating signal 3104 is generally not modulated, but can be.

The oscillating signal 3104 can be a sinusoidal wave, a rectangular wave, a triangular wave, a pulse, or any other continuous and periodic waveform. In a preferred embodiment, it would be a rectangular wave. As stated above, one skilled in the relevant art(s) will recognize the physical limitations to and mathematical obstacles against achieving exact or perfect waveforms and it is not the intent of the present invention that a perfect waveform be generated or needed. Again, as stated above, for ease of discussion, the term "rectangular waveform" will be used to refer to waveforms that are substantially rectangular, the term "square wave" will refer to those waveforms that are substantially square, the term "triangular wave" will refer to those waveforms that are substantially triangular, and the term "pulse" will refer to those waveforms that are substantially a pulse, and it is not the intent of the present invention that a perfect square wave, triangle wave, or pulse be generated or needed.

The signal with a harmonically rich waveform 3114, hereafter referred to as the harmonically rich signal 3114, is a continuous and periodic waveform whose amplitude is a function of the reference signal. That is, it is an AM signal. In one embodiment, the harmonically rich signal 3114 has a substantially rectangular waveform. As stated before, a continuous and periodic waveform, such as a rectangular wave, will have sinusoidal components (harmonics) at frequencies that are integer multiples of the fundamental frequency of the underlying waveform (the Fourier component frequencies). Thus, harmonically rich signal 3114 is composed of sinusoidal signals at frequencies that are integer multiples of the fundamental frequency of itself.

Those skilled in the relevant art(s) will recognize that alternative embodiments exist wherein combinations of modulations (e.g., PM and ASK, FM and AM, etc.) may be employed simultaneously. In these alternate embodiments, the oscillating signal 3104 may be modulated. These alternate embodiments will be apparent to persons skilled in the relevant art(s), and thus will not be described herein.

3.3.7.2 Structural Description.

The switch module 3102 of the present invention is comprised of a first input 3108, a second input 3110, a control input 3120, an output 3122, and a switch 3116. A reference signal 3106 is applied to the first input 3108 of the switch module 3102. Generally, the reference signal 3106 is a function of the information signal 2702, and may either be the summation of the information signal 2702 with a bias signal or it may be the information signal 2702 by itself. In one embodiment of the invention, a resistor 3124 is located between the reference signal 3106 and the switch 3116. The second input 3110 of the switch module 3102 is generally at electrical ground 3112, however, one skilled in the relevant art(s) will recognize that alternative embodiments exist wherein the second input 3110 may not be at electrical ground 3112, but rather connected to a second signal 3118. In an alternate embodiment, the inverted value of the reference signal 3106 is connected to the second input 3110 of the switch module 3102.

An oscillating signal 3104 is connected to the control input 3120 of the switch module 3102. Generally, in the AM mode, the oscillating signal 3104 is not modulated, but a person skilled in the relevant art(s) will recognize that there are embodiments wherein the oscillating signal 3104 may be frequency modulated or phase modulated, but these will not be described herein. The oscillating signal 3104 can be a sinusoidal wave, a rectangular wave, a triangular wave, a pulse, or any other continuous and periodic waveform. In a preferred embodiment, it would be a rectangular wave. The oscillating signal 3104 causes the switch 3116 to close and open.

The harmonically rich signal 3114 described in section 3.3.7.1 above is found at the output 3122 of the switch module 3102. The harmonically rich signal 3114 is a continuous and periodic waveform whose amplitude is a function of the amplitude of the reference signal. In one embodiment, the harmonically rich signal 3114 has a substantially rectangular waveform. As stated before, a continuous and periodic waveform, such as a rectangular wave, has sinusoidal components (harmonics) at frequencies that are integer multiples of the fundamental frequency of the underlying waveform (the Fourier component frequencies). Thus, harmonically rich signal 3114 is composed of sinusoidal signals at frequencies that are integer multiples of the fundamental frequency of itself. As previously described, the relative amplitude of the harmonics of a continuous periodic waveform is generally a function of the ratio of the pulse width of the rectangular wave and the period of the fundamental frequency, and can be determined by doing a Fourier analysis of the periodic waveform. When the amplitude of the periodic waveform varies, as in the AM mode of the invention, the change in amplitude of the periodic waveform has a proportional effect on the absolute amplitude of the harmonics. In other words, the AM is embedded on top of each of the harmonics.

The description of the switch module 3102 is substantially as follows: When the switch 3116 is "open," the amplitude of the harmonically rich signal 3114 is substantially equal to the reference signal 3106. When the oscillating signal 3104 causes the switch 3116 to become "closed," the output 3122 of the switch module 3102 becomes connected electrically to the second input 3110 of the switch module 3102 (e.g., ground 3112 in one embodiment), and the amplitude of the harmonically rich signal 3114 becomes equal to the value of the second input 3110 (e.g., zero volts for the embodiment wherein the second input 3110 is connected to electrical ground 3112). When the oscillating signal 3104 causes the switch 3116 to again become "open," the amplitude of the harmonically rich signal 3114 again becomes substantially equal to the reference signal 3106. Thus, the amplitude of the harmonically rich signal 3114 is at either of two signal levels, i.e., reference signal 3106 or ground 3112, and has a frequency that is substantially equal to the frequency of the oscillating signal 3104 that causes the switch 3116 to open and close. In an alternate embodiment wherein the second input 3110 is connected to the second signal 3118, the harmonically rich signal 3114 varies between the reference signal 3106 and the second signal 3118. One skilled in the relevant art(s) will recognize that any one of a number of switch module designs will fulfill the scope and spirit of the present invention.

Figure 32A:
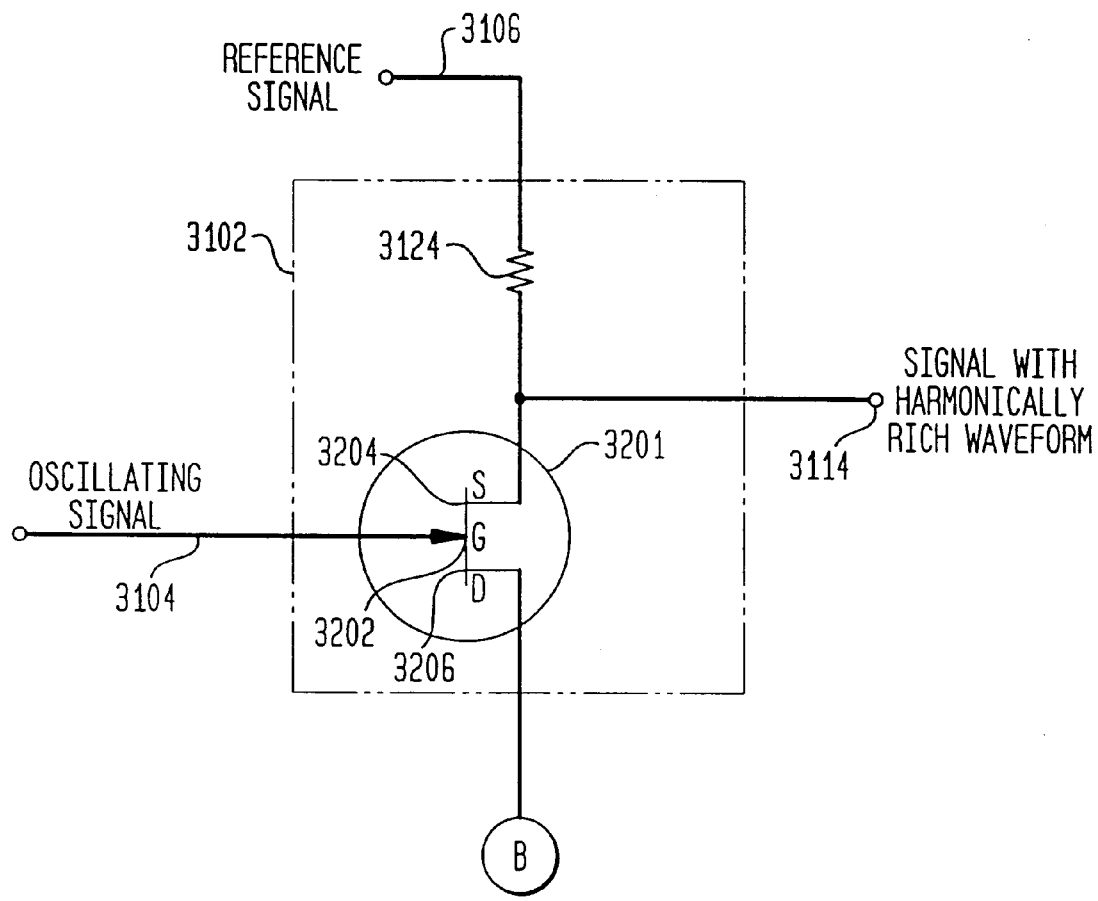
FIGS. 32A–32C illustrate the switch module of FIGS. 31A–31C wherein the switch is a GaAsFET.
Figure 32B:
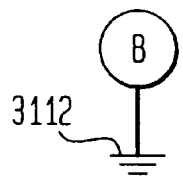
Figure 32C:
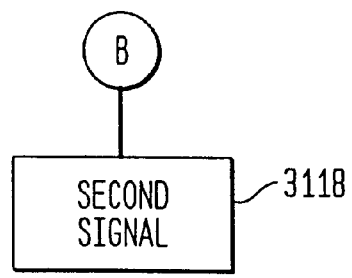
Figure 33A:
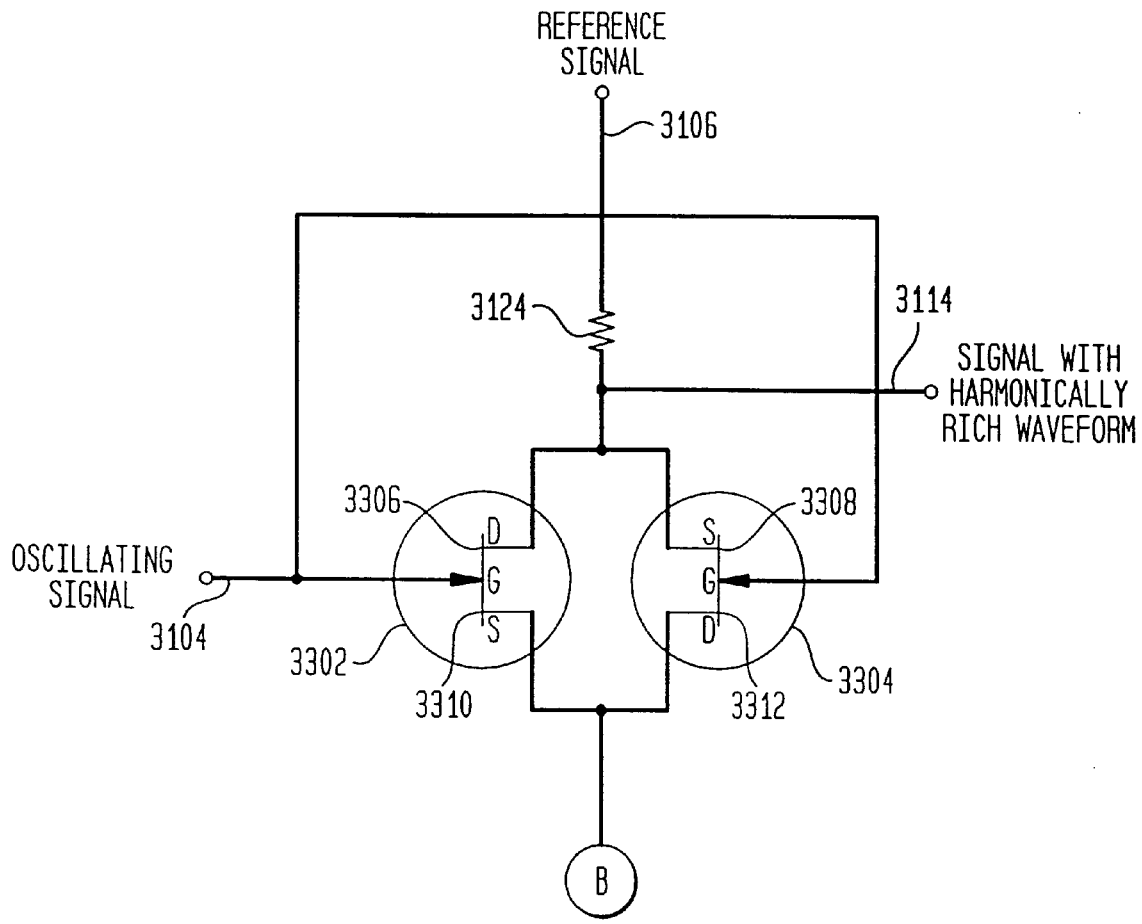
FIGS. 33A–33C illustrates an example of a design to ensure symmetry for a GaAsFET implementation in the AM mode.
Figure 33B:
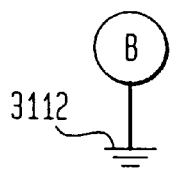
Figure 33C:
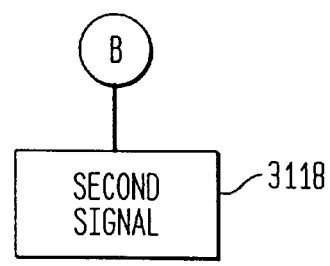

In an embodiment of the invention, the switch 3116 is a semiconductor device, such as a diode ring. In another embodiment, the switch is a transistor, such as, but not limited to, a field effect transistor (FET). In an embodiment wherein the FET is gallium arsenide (GaAs), the module can be designed as seen in FIGS. 32A–32C, where the oscillating signal 3104 is connected to the gate 3202 of the GaAsFET 3201, the reference signal 3106 is connected to the source 3204, and electrical ground 3112 is connected to the drain 3206 (in the embodiment where ground 3112 is selected as the value of the second input 3110 of the switch module 3102). Since the drain and the source of GaAsFETs are interchangeable, the reference signal 3106 can be applied to either the source 3204 or to the drain 3206. If there is concern that there might be some source-drain asymmetry in the GaAsFET 3201, the switch 3116 can be designed as shown in FIGS. 33A–33C, wherein two GaAsFETs 3302 and 3304 are connected together, with the source 3310 of the first 3302 connected to the drain 3312 of the second 3304, and the drain 3306 of the first 3302 being connected to the source 3308 of the second 3304. This design arrangement will substantially balance all asymmetries. Other switch designs and implementations will be apparent to persons skilled in the relevant art(s).

The output 3122 of the switch module 3102, i.e., the harmonically rich signal 3114, can be routed to a filter 3504 in the AM mode.

3.3.8 The Summer ("IIQ" Mode).

Figure 34:
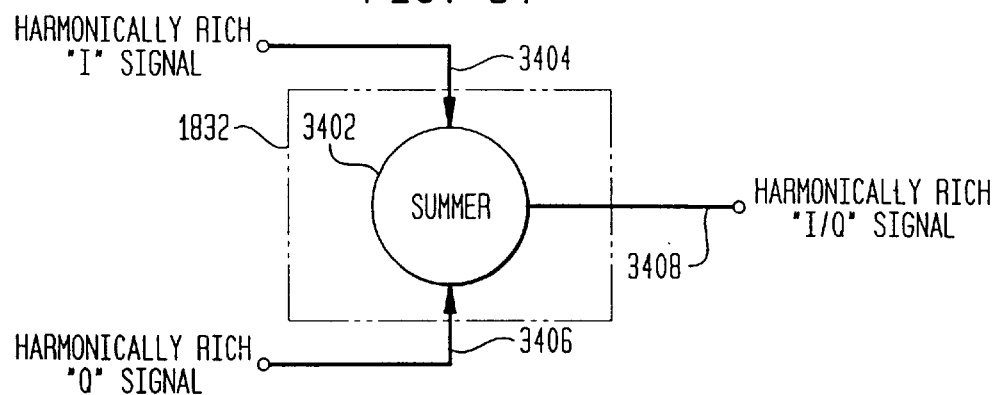
FIG. 34 illustrates an implementation example of a summer.

As discussed above, the in-phase/quadrature-phase modulation ("I/Q") mode embodiment of the invention uses a summer. See, as an example, summer 1832 in FIG. 18. The invention supports numerous embodiments of the summer. Exemplary embodiments of the summer 3402 (FIG. 34) are described below. However, it should be understood that these examples are provided for illustrative purposes only. The invention is not limited to these embodiments.

3.3.8.1 Operational Description.

An "I" modulated signal 3404 and a "Q" modulated signal 3406 are combined and an "I/Q" modulated signal 3408 is generated. Generally, both "I" and "Q" modulated signals 3404 and 3406 are harmonically rich waveforms, which are referred to as the harmonically rich "I" signal 3404 and the harmonically rich "Q" signal 3406. Similarly, "I/Q" modulated signal 3408 is harmonically rich and is referred to as the harmonically rich "I/Q" signal. In one embodiment, these harmonically rich signals have substantially rectangular waveforms. As stated above, one skilled in the relevant art(s) will recognize the physical limitations to and mathematical obstacles against achieving exact or perfect waveforms and it is not the intent of the present invention that a perfect waveform be generated or needed.

In a typical embodiment, the harmonically rich "I" signal 3404 and the harmonically rich "Q" signal 3406 are phase modulated, as is the harmonically rich "I/Q" signal 3408. A person skilled in the relevant art(s) will recognize that other modulation techniques, such as amplitude modulating the "I/Q" signal, may also be used in the "I/Q" mode without deviating from the scope and spirit of the invention.

As stated before, a continuous and periodic waveform, such as harmonically rich "I/Q" signal 3408, has sinusoidal components (harmonics) at frequencies that are integer multiples of the fundamental frequency of the underlying waveform (the Fourier component frequencies). Thus, harmonically rich "I/Q" signal 3408 is composed of sinusoidal signals at frequencies that are integer multiples of the fundamental frequency of itself. These sinusoidal signals are also modulated substantially the same as the continuous and periodic waveform from which they are derived. That is, in this embodiment, the sinusoidal signals are phase modulated, and include the information from both the "I" modulated signal and the "Q" modulated signal.

3.3.8.2 Structural Description.

The design and use of a summer 3402 is well known to those skilled in the relevant art(s). A summer 3402 may be designed and fabricated from discrete components, or it may be purchased "off the shelf." A summer 3402 accepts a harmonically rich "I" signal 3404 and a harmonically rich "Q" signal 3406, and combines them to create a harmonically rich "I/Q" signal 3408. In a preferred embodiment of the invention, the harmonically rich "I" signal 3404 and the harmonically rich "Q" signal 3406 are both phase modulated. When the harmonically rich "I" signal 3404 and the harmonically rich "Q" signal 3406 are both phase modulated, the harmonically rich "I/Q" signal 3408 is also phase modulated.

As stated before, a continuous and periodic waveform, such as the harmonically rich "I/Q" signal 3408, has sinusoidal components (harmonics) at frequencies that are integer multiples of the fundamental frequency of the underlying waveform (the Fourier component frequencies). Thus, the harmonically rich "I/Q" signal 3408 is composed of "I/Q" sinusoidal signals at frequencies that are integer multiples of the fundamental frequency of itself. These "I/Q" sinusoidal signals are also phase modulated substantially the same as the continuous and periodic waveform from which they are derived (i.e., the harmonically rich "I/Q" signal 3408).

The output of the summer 3402 is then routed to a filter 3504.

3.3.9 The Filter (FM, PM, AM, and "I/Q" Modes).

Figure 35:
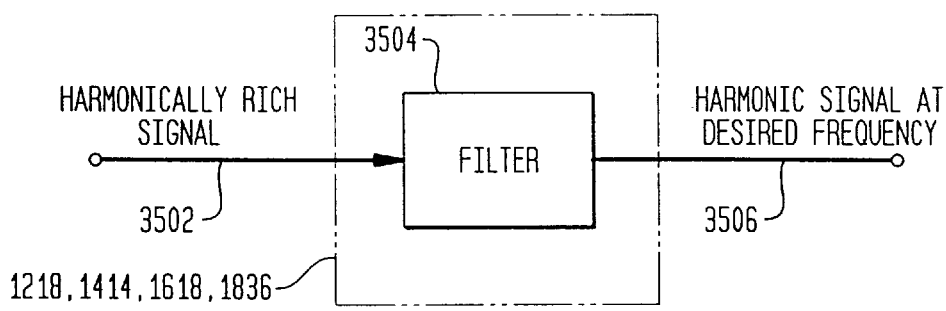
FIG. 35 illustrates an implementation example of a filter.

As discussed above, all modulation mode embodiments of the invention use a filter. See, as an example, filter 1218 in FIG. 12, filter 1414 in FIG. 14, filter 1618 in FIG. 16, and filter 1836 in FIG. 18. The invention supports numerous embodiments of the filter. Exemplary embodiments of the filter 3504 (FIG. 35) are described below. However, it should be understood that these examples are provided for illustrative purposes only. The invention is not limited to these embodiments.

3.3.9.1 Operational Description.

A modulated signal with a harmonically rich waveform 3502 is accepted. It is referred to as the harmonically rich signal 3502. As stated above, a continuous and periodic waveform, such as the harmonically rich signal 3502, is comprised of sinusoidal components (harmonics) at frequencies that are integer multiples of the fundamental frequency of the underlying waveform from which they are derived. These are called the Fourier component frequencies. In one embodiment of the invention, the undesired harmonic frequencies are removed, and the desired frequency 3506 is output. In an alternate embodiment, a plurality of harmonic frequencies are output.

The harmonic components of the harmonically rich signal 3502 are modulated in the same manner as the harmonically rich signal 3502 itself. That is, if the harmonically rich signal 3502 is frequency modulated, all of the harmonic components of that signal are also frequency modulated. The same is true for phase modulation, amplitude modulation, and "I/Q" modulation.

3.3.9.2 Structural Description.

The design and use of a filter 3504 is well known to those skilled in the relevant art(s). A filter 3504 may be designed and fabricated from discrete components or it may be purchased "off the shelf." The filter 3504 accepts the harmonically rich signal 3502 from the switch module 2802 or 3102 in the FM, PM, and AM modes, and from the summer 3402 in the "I/Q" mode. The harmonically rich signal 3502 is a continuous and periodic waveform. As such, it is comprised of sinusoidal components (harmonics) that are at frequencies that are integer multiples of the fundamental frequency of the underlying harmonically rich signal 3502. The filter 3504 removes those sinusoidal signals having undesired frequencies. The signal 3506 that remains is at the desired frequency, and is called the desired output signal 3506.

To achieve this result, according to an embodiment of the invention, a filter 3504 is required to filter out the unwanted harmonics of the harmonically rich signal 3502.

Figure 36:
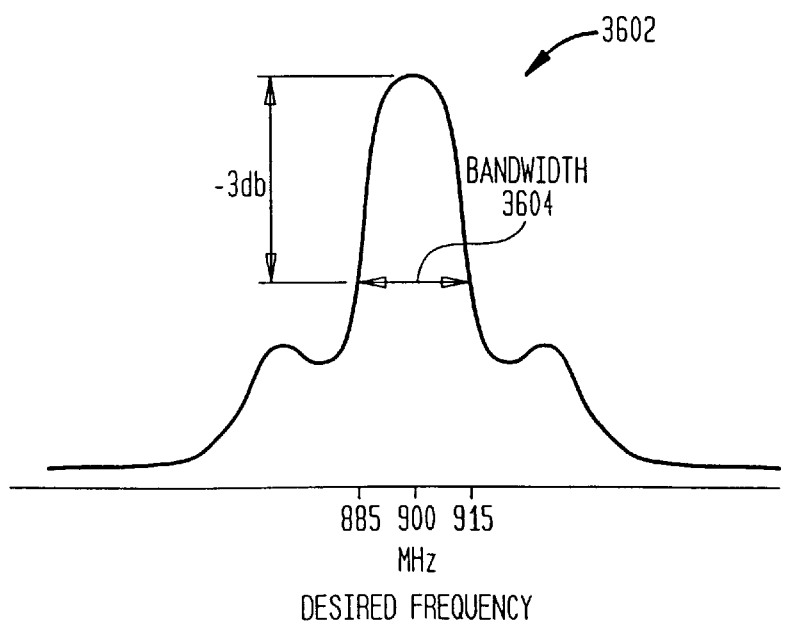
FIG. 36 is a representative spectrum demonstrating the calculation of "Q;"

The term "Q" is used to represent the ratio of the center frequency of the desired output signal 3506 to the half power band width. Looking at FIG. 36 we see a desired frequency 3602 of 900 MHz. The filter 3504 is used to ensure that only the energy at that frequency 3602 is transmitted. Thus, the bandwidth 3604 at half power (the so-called "3 dB down" point) should be as narrow as possible. The ratio of frequency 3602 to bandwidth 3604 is defined as "Q." As shown on FIG. 36, if the "3 dB down" point is at plus or minus 15 MHz, the value of Q will be 900±(15+15) or 30. With the proper selection of elements for any particular frequency, Qs on the order of 20 or 30 are achievable.

Figure 37A:
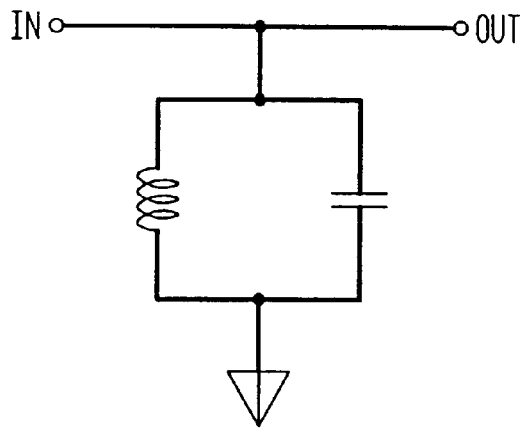
FIGS. 37A and 37B are representative examples of filter circuits.
Figure 37B:
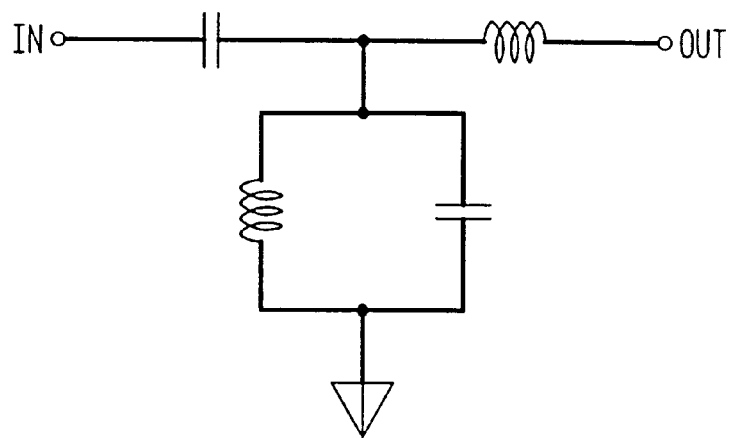

For crisp broadcast frequencies, it is desired that Q be as high as possible and practical, based on the given application and environment. The purpose of the filter 3504 is to filter out the unwanted harmonics of the harmonically rich signal. The circuits are tuned to eliminate all other harmonics except for the desired frequency 3506 (e.g., the 900 MHz harmonic 3602). Turning now to FIGS. 37A and 37B, we see examples of filter circuits. One skilled in the relevant art(s) will recognize that a number of filter designs will accomplish the desired goal of passing the desired frequency while filtering the undesired frequencies.

FIG. 37A illustrates a circuit having a capacitor in parallel with an inductor and shunted to ground. In FIG. 37B, a capacitor is in series with an inductor, and a parallel circuit similar to that in FIG. 37A is connected between the capacitor and inductor and shunted to ground.

The modulated signal at the desired frequency 3506 may then be routed to the transmission module 3804.

3.3.10 The Transmission Module (FM, PM, AM, and "I/Q" Modes).

Figure 38:
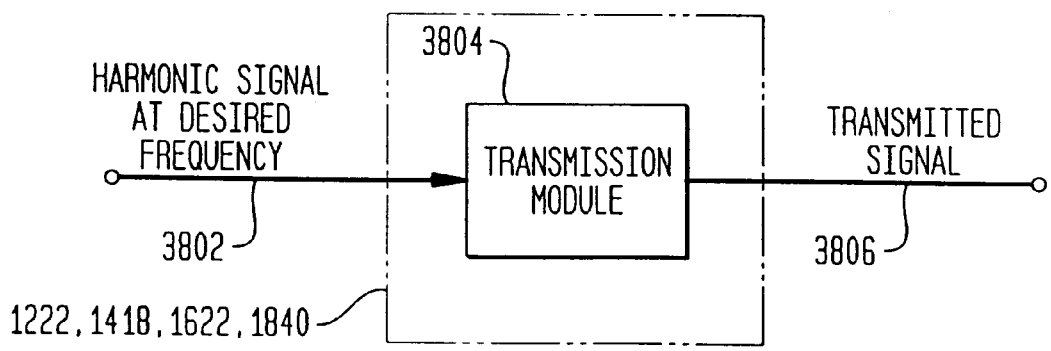
FIG. 38 illustrates an implementation example of a transmission module.
Figure 39A:
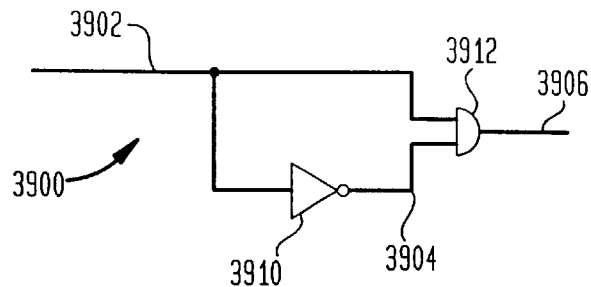
FIG. 39A shows a first exemplary pulse shaping circuit using digital logic devices for a squarewave input from an oscillator.
Figure 39B:
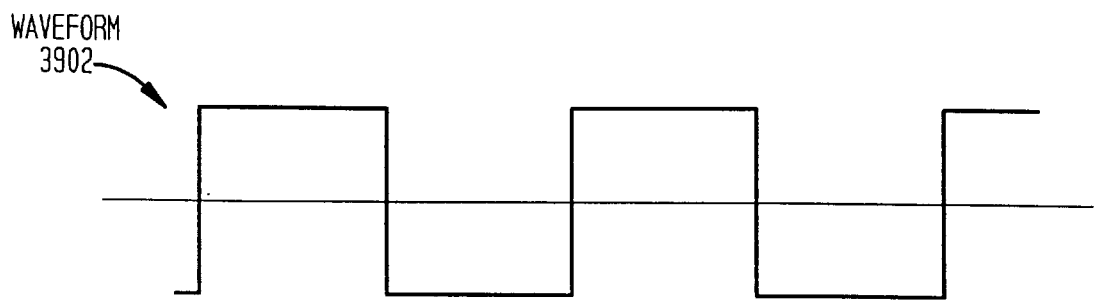
FIGS. 39B, 39C, and 39D illustrate waveforms associated with the FIG. 39A circuit.
Figure 39C:
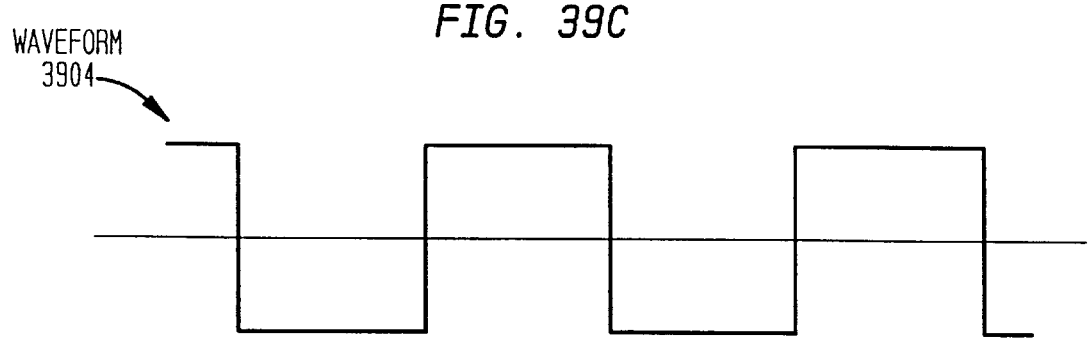
Figure 39D:
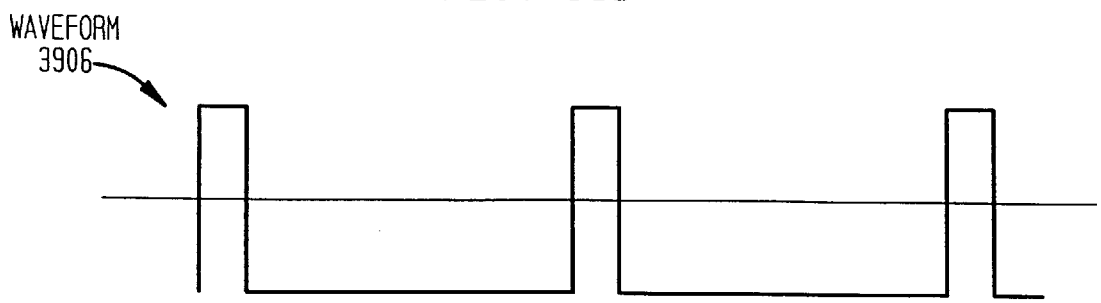
Figure 40A:
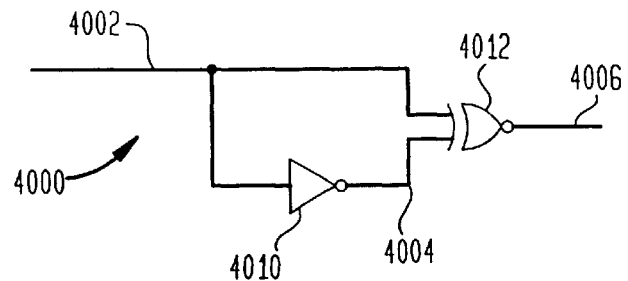
FIG. 40A shows a second exemplary pulse shaping circuit using digital logic devices for a squarewave input from an oscillator.
Figure 40B:
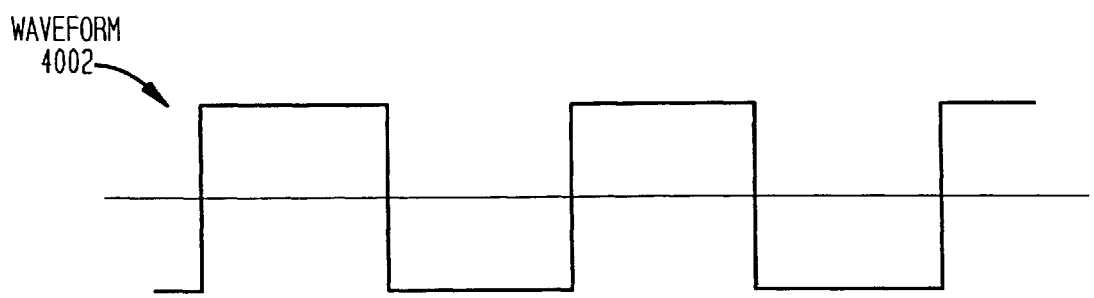
FIGS. 40B, 40C, and 40D illustrate waveforms associated with the FIG. 40A circuit.
Figure 40C:
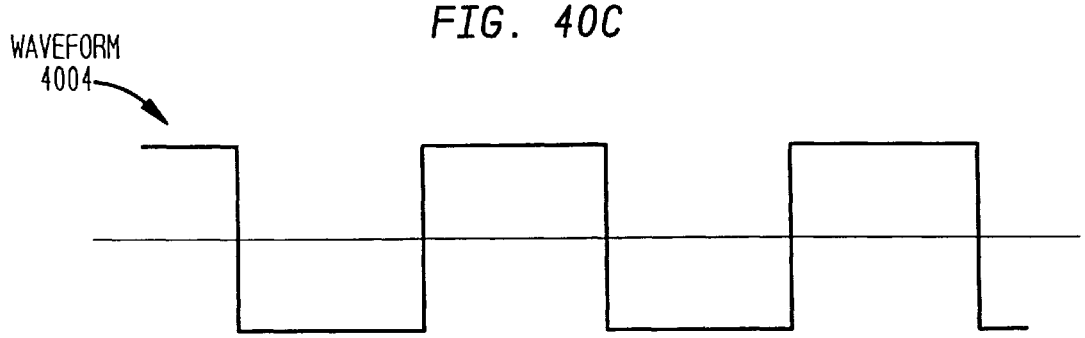
Figure 40D:
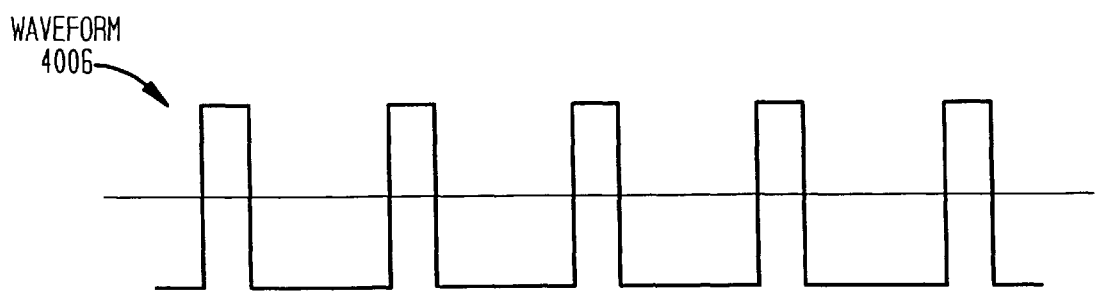

As discussed above, the modulation mode embodiments of the invention preferably use a transmission module. See, as an example, transmission module 1222 in FIG. 12, transmission module 1418 in FIG. 14, transmission module 1622 in FIG. 16, and transmission module 1840 in FIG. 18. The transmission module is optional, and other embodiments may not include a transmission module. The invention supports numerous embodiments of the transmission module. Exemplary embodiments of the transmission module 3804 (FIG. 38) are described below. However, it should be understood that these examples are provided for illustrative purposes only. The invention is not limited to these embodiments.

3.3.10.1 Operational Description.

A modulated signal at the desired frequency 3802 is accepted and is transmitted over the desired medium, such as, but not limited to, over-the-air broadcast or point-to-point cable.

3.3.10.2 Structural Description.

The transmission module 3804 receives the signal at the desired EM frequency 3802. If it is intended to be broadcast over the air, the signal may be routed through an optional antenna interface and then to the antenna for broadcast. If it is intended for the signal to be transmitted over a cable from one point to another, the signal may be routed to an optional line driver and out through the cable. One skilled in the relevant art(s) will recognize that other transmission media may be used.

3.3.11 Other Implementations.

The implementations described above are provided for purposes of illustration. These implementations are not intended to limit the invention. Other implementation embodiments are possible and covered by the invention, such as but not limited to software, software/hardware, and firmware implementations of the systems and components of the invention. Alternate implementations and embodiments, differing slightly or substantially from those described herein, will be apparent to persons skilled in the relevant art(s) based on the teachings contained herein. Such alternate implementations fall within the scope and spirit of the present invention.

4. Harmonic Enhancement.

4.1 High Level Description.

This section (including its subsections) provides a high-level description of harmonic enhancement according to the present invention. In particular, pulse shaping is described at a high-level. Also, a structural implementation for achieving this process is described at a high-level. This structural implementation is described herein for illustrative purposes, and is not limiting. In particular, the process described in this section can be achieved using any number of structural implementations, one of which is described in this section. The details of such structural implementations will be apparent to persons skilled in the relevant art(s) based on the teachings contained herein.

It is noted that some embodiments of the invention include harmonic enhancement, whereas other embodiments do not.

4.1.1 Operational Description.

To better understand the generation and extraction of harmonics, and the purpose behind shaping the waveforms to enhance the harmonics, the following discussion of Fourier analysis as it applies to the present invention is offered.

A discovery made by Baron Jean B. J. Fourier (1768–1830) showed that continuous and periodic waveforms are comprised of a plurality of sinusoidal components, called harmonics. More importantly, the frequency of these components are integer multiples of the frequency of the original waveform (called the fundamental frequency). The amplitude of each of these component waveforms depends on the shape of the original waveform. The derivations and proofs of Baron Fourier's analysis are well known to those skilled in the relevant art(s).

The most basic waveform which is continuous and periodic is a sine wave. It has but one harmonic, which is at the fundamental frequency. This is also called the first harmonic. Since it only has one component, the amplitude of the harmonic component is equal to the amplitude of the original waveform, i.e., the sine wave itself. The sine wave is not considered to be "harmonically rich."

An impulse train is the other extreme case of a periodic waveform. Mathematically, it is considered to have zero width. The mathematical analysis in this case shows that there are harmonics at all multiples of the frequency of the impulse. That is, if the impulse has a frequency of $F_i$, then the harmonics are sinusoidal waves at $1 \cdot F_i$, $2 \cdot F_i$, $3 \cdot F_i$, $4 \cdot F_i$, etc. As the analysis also shows in this particular case, the amplitude of all of the harmonics are equal. This is indeed, a "harmonically rich" waveform, but is realistically impractical with current technology.

A more typical waveform is a rectangular wave, which is a series of pulses. Each pulse will have a width (called a pulse width, or "τ"), and the series of pulses in the waveform will have a period ("T" which is the inverse of the frequency, i.e., $T=1/F_r$, where "$F_r$" is the fundamental frequency of the rectangular wave). One form of rectangular wave is the square wave, where the signal is at a first state (e.g., high) for the same amount of time that it is at the second state (e.g., low). That is, the ratio of the pulse width to period (τ/T) is 0.5. Other forms of rectangular waves, other than square waves, are typically referred to simply as "pulses," and have τ/T<0.5 (i.e., the signal will be "high" for a shorter time than it is "low"). The mathematical analysis shows that there are harmonics at all of the multiples of the fundamental frequency of the signal. Thus, if the frequency of the rectangular waveform is $F_r$, then the frequency of the first harmonic is $1 \cdot F_r$, the frequency of the second harmonic is $2 \cdot F_r$, the frequency of the third harmonic is $3 \cdot F_r$, and so on. There are some harmonics for which the amplitude is zero. In the case of a square wave, for example, the "null points" are the even harmonics. For other values of τ/T, the "null points" can be determined from the mathematical equations. The general equation for the amplitude of the harmonics in a rectangular wave having an amplitude of $A_{pulse}$ is as follows:

$$\text{Amplitude}(n^{th}\ \text{harmonic}) = A_n = \{[A_{pulse}][(2/\pi)/n]\sin[n \cdot \pi \cdot (\tau/T)]\} \quad \text{EQ. 1}$$

Table 6000 of FIG. 60 shows the amplitudes of the first fifty harmonics for rectangular waves having six different τ/T ratios. The τ/T ratios are 0.5 (a square wave), 0.25, 0.10, 0.05, 0.01, and 0.005. (One skilled in the relevant art(s) will recognize that $A_{pulse}$ is set to unity for mathematical comparison.) From this limited example, it can be seen that the ratio of pulse width to period is a significant factor in determining the relative amplitudes of the harmonics. Notice too, that for the case where τ/T=0.5 (i.e., a square wave), the relationship stated above (i.e., only odd harmonics are present) holds. Note that as τ/T becomes small (i.e., the pulse approaches an impulse), the amplitudes of the harmonics becomes substantially "flat." That is, there is very little decrease in the relative amplitudes of the harmonics. One skilled in the relevant art(s) will understand how to select the desired pulse width for any given application based on the teachings contained herein. It can also be shown mathematically and experimentally that if a signal with a continuous and periodic waveform is modulated, that modulation is also present on every harmonic of the original waveform.

From the foregoing, it can be seen how pulse width is an important factor in assuring that the harmonic waveform at the desired output frequency has sufficient amplitude to be useful without requiring elaborate filtering or unnecessary amplification.

Another factor in assuring that the desired harmonic has sufficient amplitude is how the switch 2816 and 3116 (FIGS. 28A and 31A) in the switch module 2802 and 3102 responds to the control signal that causes the switch to close and to open (i.e., the modulated oscillating signal 2804 of FIG. 28 and the oscillating signal 3104 of FIG. 31). In general, switches have two thresholds. In the case of a switch that is normally open, the first threshold is the voltage required to cause the switch to close. The second threshold is the voltage level at which the switch will again open. The convention used herein for ease of illustration and discussion (and not meant to be limiting) is for the case where the switch is closed when the control signal is high, and open when the control signal is low. It would be apparent to one skilled in the relevant art(s) that the inverse could also be used. Typically, these voltages are not identical, but they may be. Another factor is how rapidly the switch responds to the control input once the threshold voltage has been applied. The objective is for the switch to close and open such that the bias/reference signal is "crisply" gated. That is, preferably, the impedance through the switch must change from a high impedance (an open switch) to a low impedance (a closed switch) and back again in a very short time so that the output signal is substantially rectangular.

It is an objective of this invention in the transmitter embodiment that the intelligence in the information signal is to be transmitted. That is, the information is modulated onto the transmitted signal. In the FM and PM modes, to achieve this objective, the information signal is used to modulate the oscillating signal 2804. The oscillating signal 2804 then causes the switch 2816 to close and open. The information that is modulated onto the oscillating signal 2804 must be faithfully reproduced onto the signal that is output from the switch circuit (i.e., the harmonically rich signal 2814). For this to occur efficiently, in embodiments of the invention, the switch 2816 preferably closes and opens crisply so that the harmonically rich signal 2814 changes rapidly from the bias/reference signal 2806 (or 3106) to ground 2812 (or the second signal level 2818 in the alternate embodiment). This rapid rise and fall time is desired so that the harmonically rich signal 2814 will be "harmonically rich." (In the case of AM, the oscillating signal 3104 is not modulated, but the requirement for "crispness" still applies.)

For the switch 2816 to close and open crisply, the oscillating signal 2804 must also be crisp. If the oscillating signal 2804 is sinusoidal, the switch 2816 will open and close when the threshold voltages are reached, but the pulse width of the harmonically rich signal 2814 may not be as small as is needed to ensure the amplitude of the desired harmonic of the harmonically rich signal 2814 is sufficiently high to allow transmission without elaborate filtering or unnecessary amplification. Also, in the embodiment wherein the switch 2816 is a GaAsFET 2901, if the oscillating signal 2804 that is connected to the gate 2902 of the GaAsFET 2901 (i.e., the signal that causes the switch 2816 to close and open) is a sinusoidal wave, the GaAsFET 2901 will not crisply close and open, but will act more like an amplifier than a switch. (That is, it will conduct during the time that the oscillating signal is rising and falling below the threshold voltages, but will not be a "short.") In order to make use of the benefits of a GaAsFET's capability to close and open at high frequencies, the oscillating signal 2804 connected to the gate 2902 preferably has a rapid rise and fall time. That is, it is preferably a rectangular waveform, and preferably has a pulse width to period ratio the same as the pulse width to period ratio of the harmonically rich signal 2814.

As stated above, if a signal with a continuous and periodic waveform is modulated, that modulation occurs on every harmonic of the original waveform. Thus, in the FM and PM modes, when the information is modulated onto the oscillating signal 2804 and the oscillating signal 2804 is used to cause the switch 2816 to close and open, the resulting harmonically rich signal 2814 that is output from the switch module 2802 will also be modulated. If the oscillating signal 2804 is crisp, the switch 2816 will close and open crisply, the harmonically rich signal 2814 will be harmonically rich, and each of the harmonics of the harmonically rich signal 2814 will have the information modulated on it.

Because it is desired that the oscillating signal 2804 be crisp, harmonic enhancement may be needed in some embodiments. Harmonic enhancement may also be called "pulse shaping" since the purpose is to shape the oscillating signal 2804 into a string of pulses of a desired pulse width. If the oscillating signal is sinusoidal, harmonic enhancement will shape the sinusoidal signal into a rectangular (or substantially rectangular) waveform with the desired pulse width to period ratio. If the oscillating signal 2804 is already a square wave or a pulse, harmonic enhancement will shape it to achieve the desired ratio of pulse width to period. This will ensure an efficient transfer of the modulated information through the switch.

Three exemplary embodiments of harmonic enhancement are described below for illustrative purposes. However, the invention is not limited to these embodiments. Other embodiments will be apparent to persons skilled in the relevant art(s) based on the teachings contained herein.

4.1.2 Structural Description.

The shape of the oscillating signal 2804 causes the switch 2816 to close and open. The shape of the oscillating signal 2804 and the selection of the switch 2816 will determine how quickly the switch 2816 closes and opens, and how long it stays closed compared to how long it stays open. This then will determine the "crispness" of the harmonically rich signal 2814. (That is, whether the harmonically rich signal 2814 is substantially rectangular, trapezoidal, triangular, etc.) As shown above, in order to ensure that the desired harmonic has the desired amplitude, the shape of the oscillating signal 2804 should be substantially optimized.

Figure 46:
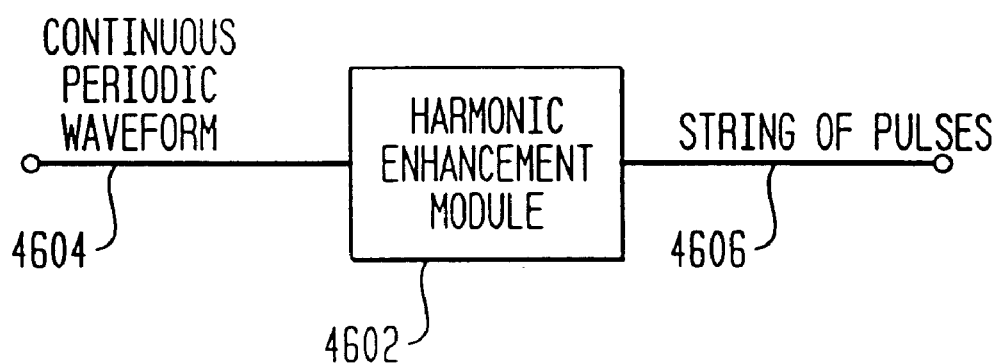
FIG. 46 illustrates an implementation example of a harmonic enhancement module.

The harmonic enhancement module (HEM) 4602 (FIG. 46) is also referred to as a "pulse shaper." It "shapes" the oscillating signals 2804 and 3104 that drive the switch modules 2802 and 3102 described in sections 3.3.6–3.3.6.2 and 3.3.7– 3.3.7.2. Harmonic enhancement module 4602 preferably transforms a continuous and periodic waveform 4604 into a string of pulses 4606. The string of pulses 4606 will have a period, "T," determined by both the frequency of the continuous and periodic waveform 4604 and the design of the pulse shaping circuit within the harmonic enhancement module 4602. Also, each pulse will have a pulse width, "τ" determined by the design of the pulse shaping circuit. The period of the pulse stream, "T," determines the frequency of the switch closing (the frequency being the inverse of the period), and the pulse width of the pulses, "τ," determines how long the switch stays closed.

In the embodiment described above in sections 3.3.6–3.3.6.2 (and 3.3.7–3.3.7.2), when the switch 2816 (or 3116) is open, the harmonically rich signal 2814 (or 3114) will have an amplitude substantially equal to the bias signal 2806 (or reference signal 3106). When the switch 2816 (or 3116) is closed, the harmonically rich signal 2814 (or 3114) will have an amplitude substantially equal to the potential of signal 2812 or 2818 (or 3112 or 3118) of the second input 2810 (or 3110) of the switch module 2802 (or 3102). Thus, for the case where the oscillating signal 2804 (or 3104) driving the switch module 2802 (or 3102) is substantially rectangular, the harmonically rich signal 2814 (or 3114) will have substantially the same frequency and pulse width as the shaped oscillating signal 2804 (or 3104) that drives the switch module 2802 (or 3102). This is true for those cases wherein the oscillating signal 2804 (or 3104) is a rectangular wave. One skilled in the relevant art(s) will understand that the term "rectangular wave" can refer to all waveforms that are substantially rectangular, including square waves and pulses.

The purpose of shaping the signal is to control the amount of time that the switch 2816 (or 3116) is closed. As stated above, the harmonically rich signal 2814 (or 3114) has a substantially rectangular waveform. Controlling the ratio of the pulse width of the harmonically rich signal 2814 (or 3114) to its period will result in the shape of the harmonically rich signal 2814 (or 3114) being substantially optimized so that the relative amplitudes of the harmonics are such that the desired harmonic can be extracted without unnecessary and elaborate amplification and filtering.

4.2 Exemplary Embodiments.

Various embodiments related to the method(s) and structure(s) described above are presented in this section (and its subsections). These embodiments are described herein for purposes of illustration, and not limitation. The invention is not limited to these embodiments. Alternate embodiments (including equivalents, extensions, variations, deviations, etc., of the embodiments described herein) will be apparent to persons skilled in the relevant art(s) based on the teachings contained herein. The invention is intended and adapted to include such alternate embodiments.

4.2.1 First Embodiment: When a Square Wave Feeds the Harmonic Enhancement Module to Create One Pulse per Cycle.

4.2.1.1 Operational Description.

According to this embodiment, a continuous periodic waveform 4604 is received and a string of pulses 4606 is output. The continuous periodic waveform 4604 may be a square wave or any other continuous periodic waveform that varies from a value recognized as a "digital low" to a value recognized as a "digital high." One pulse is generated per cycle of the continuous and periodic waveform 4604. The description given herein will be for the continuous periodic waveform 4604 that is a square wave, but one skilled in the relevant art(s) will appreciate that other waveforms may also be "shaped" into waveform 4606 by this embodiment.

4.2.1.2 Structural Description.

In this first embodiment of a harmonic enhancement module 4602, herein after referred to as a pulse shaping circuit 4602, a continuous periodic waveform 4604 that is a square wave is received by the pulse shaping circuit 4602. The pulse shaping circuit 4602 is preferably comprised of digital logic devices that result in a string of pulses 4606 being output that has one pulse for every pulse in the continuous periodic waveform 4604, and preferably has a τ/T ratio less than 0.5.

4.2.2 Second Embodiment: When a Square Wave Feeds the Harmonic Enhancement Module to Create Two Pulses per Cycle.

4.2.2.1 Operational Description.

In this embodiment, a continuous periodic waveform 4604 is received and a string of pulses 4606 is output. In this embodiment, there are two pulses output for every period of the continuous periodic waveform 4604. The continuous periodic waveform 4604 may be a square wave or any other continuous periodic waveform that varies from a value recognized as a "digital low" to a value recognized as a "digital high." The description given herein will be for a continuous periodic waveform 4604 that is a square wave, but one skilled in the relevant art(s) will appreciate that other waveforms may also be "shaped" into waveform 4606 by this embodiment.

4.2.2.2 Structural Description.

In this second embodiment of a pulse shaping circuit 4602, a continuous periodic waveform 4604 that is a square wave is received by the pulse shaping circuit 4602. The pulse shaping circuit 4602 is preferably comprised of digital logic devices that result in a string of pulses 4606 being output that has two pulses for every pulse in the continuous periodic waveform 4604, and preferably has a τ/T ratio less than 0.5.

4.2.3 Third Embodiment: When Any Waveform Feeds the Module.

4.2.3.1 Operational Description.

In this embodiment, a continuous periodic waveform 4604 of any shape is received and a string of pulses 4606 is output.

4.2.3.2 Structural Description.

In this third embodiment of a pulse shaping circuit 4602, a continuous periodic waveform 4604 of any shape is received by the pulse shaping circuit 4602. The pulse shaping circuit 4602 is preferably comprised of a series of stages, each stage shaping the waveform until it is substantially a string of pulses 4606 with preferably a τ/T ratio less than 0.5.

4.2.4 Other Embodiments.

The embodiments described above are provided for purposes of illustration. These embodiments are not intended to limit the invention. Alternate embodiments, differing slightly or substantially from those described herein, will be apparent to persons skilled in the relevant art(s) based on the teachings contained herein. Such alternate embodiments fall within the scope and spirit of the present invention.

4.3 Implementation Examples.

Exemplary operational and/or structural implementations related to the method(s), structure(s), and/or embodiments described above are presented in this section (and its subsections). These components and methods are presented herein for purposes of illustration, and not limitation. The invention is not limited to the particular examples of components and methods described herein. Alternatives (including equivalents, extensions, variations, deviations, etc., of those described herein) will be apparent to persons skilled in the relevant art(s) based on the teachings contained herein. Such alternatives fall within the scope and spirit of the present invention.

4.3.1 First Digital Logic Circuit.

An exemplary implementation of the first embodiment described in sections 4.2.1–4.2.1.2 is illustrated in FIG. 39. In particular, the circuit shown in FIG. 39A is a typical circuit design for a pulse shaping circuit 4602 using digital logic devices. Also shown in FIGS. 39B–39D are representative waveforms at three nodes within the circuit. In this embodiment, pulse shaper 3900 uses an inverter 3910 and an AND gate 3912 to produce a string of pulses. An inverter, such as inverter 3910, changes the sign of the input, and an AND gate, such as AND gate 3912, outputs a digital "high" when all of the input signals are digital "highs." The input to pulse shaper 3900 is waveform 3902, and, for illustrative purposes, is shown here as a square wave. The output of inverter 3910 is waveform 3904, which is also a square wave. However, because of the circuitry of the inverter 3910, there is a delay between the application of the input and the corresponding sign change of the output. If waveform 3902 starts "low," waveform 3904 will be "high" because it has been inverted by inverter 3910. When waveform 3902 switches to "high," AND gate 3912 will momentarily see two "high" signals, thus causing its output waveform 3906 to be "high." When inverter 3910 has inverted its input (waveform 3902) and caused waveform 3904 to become "low," AND gate 3912 will then see only one "high" signal, and the output waveform 3906 will become "low." Thus, the output waveform 3906 will be "high" for only the period of time that both waveforms 3902 and 3904 are high, which is the time delay of the inverter 3910. Accordingly, as is apparent from FIGS. 39B–39D, pulse shaper 3900 receives a square wave and generates a string of pulses, with one pulse generated per cycle of the square wave.

4.3.2 Second Digital Logic Circuit.

An exemplary implementation of the second embodiment described in sections 4.2.2–4.2.2.2 is illustrated in FIG. 40. In particular, the circuit of FIG. 40A is a typical circuit design for a pulse shaping circuit 4602 using digital logic devices. Also shown in FIGS. 40B–40D are representative waveforms at three nodes within the circuit. In this embodiment, pulse shaping circuit 4000 uses an inverter 4010 and an exclusive NOR (XNOR) gate 4012. An XNOR, such as XNOR 4012, outputs a digital "high" when both inputs are digital "highs" and when both signals are digital "lows." Waveform 4002, which is shown here as a square wave identical to that shown above as waveform 3902, begins in the "low" state. Therefore, the output of inverter 4010 will begin at the "high" state. Thus, XNOR gate 4012 will see one "high" input and one "low" input, and its output waveform 4006 will be "low." When waveform 4002 changes to "high," XNOR gate 4012 will have two "high" inputs until the waveform 4004 switches to "low." Because it sees two "high" inputs, its output waveform 4006 will be "high." When waveform 4004 becomes "low," XNOR gate 4012 will again see one "high" input (waveform 4002) and one "low" input (waveform 4004). When waveform 4002 switches back to "low," XNOR gate 4012 will see two "low" inputs, and its output will become "high." Following the time delay of inverter 4010, waveform 4004 will change to "high," and XNOR gate 4012 will again see one "high" input (waveform 4004) and one "low" input (waveform 4002). Thus, waveform 4006 will again switch to "low." Accordingly, as is apparent from FIGS. 40B–40D, pulse shaper 4000 receives a square wave and generates a string of pulses, with two pulses generated per cycle of the square wave.

4.3.3 Analog Circuit.

Figure 41:
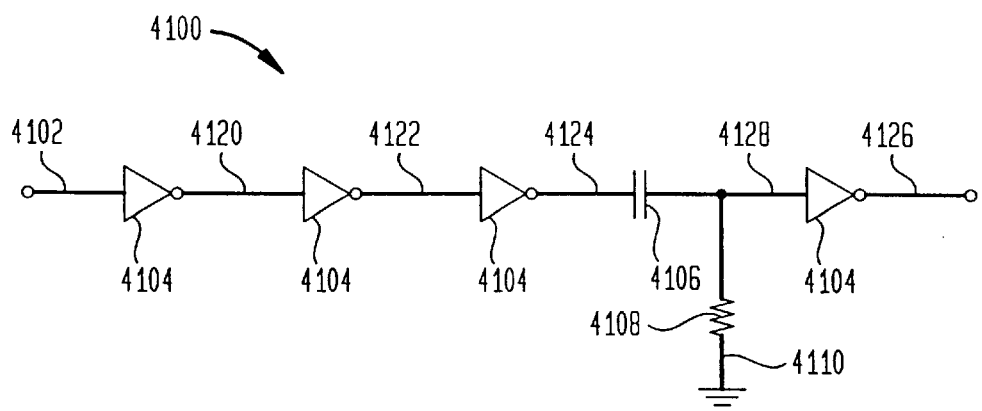
FIG. 41 shows a third exemplary pulse shaping circuit for any input from an oscillator.
Figure 42A:
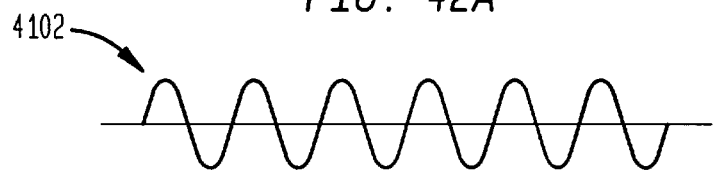
FIGS. 42A, 42B, 42C, 42D, and 42E illustrate representative waveforms associated with the FIG. 41 circuit.
Figure 42B:
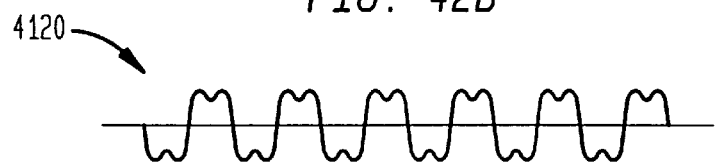
Figure 42C:
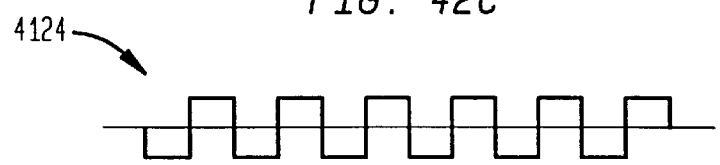
Figure 42D:
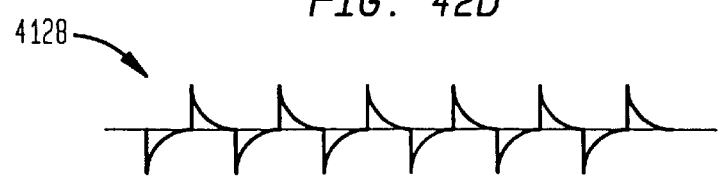
Figure 42E:
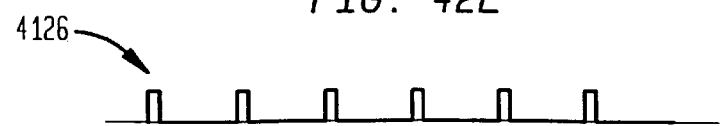

An exemplary implementation of the third embodiment described in sections 4.2.3–4.2.3.2 is illustrated in FIG. 41. In particular, the circuit shown in FIG. 41 is a typical pulse shaping circuit 4602 where an input signal 4102 is shown as a sine wave. Input signal 4102 feeds the first circuit element 4104, which in turn feeds the second, and so on. Typically, three circuit elements 4104 produce incrementally shaped waveforms 4120, 4122, and 4124 before feeding a capacitor 4106. The output of capacitor 4106 is shunted to ground 4110 through a resistor 4108 and also feeds a fourth circuit element 4104. An output signal 4126 is a pulsed output, with a frequency that is a function of the frequency of input signal 4102.

Figure 43:
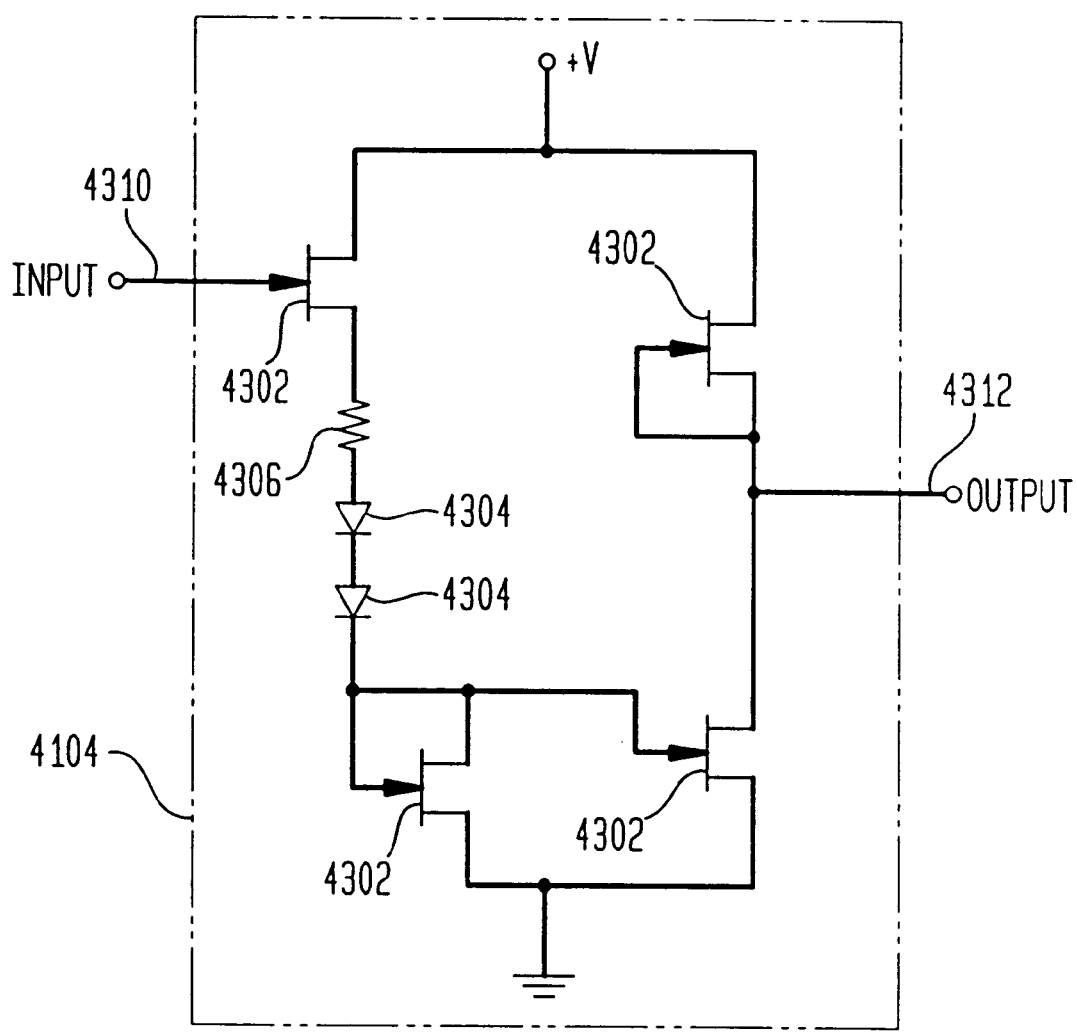
FIG. 43 shows the internal circuitry for elements of FIG. 41 according to an embodiment of the invention.

An exemplary circuit for circuit elements 4104 is shown in FIG. 43. Circuit 4104 is comprised of an input 4310, an output 4312, four FETs 4302, two diodes 4304, and a resistor 4306. One skilled in the relevant art(s) would recognize that other pulse shaping circuit designs could also be used without deviating from the scope and spirit of the invention.

4.3.4 Other Implementations.

The implementations described above are provided for purposes of illustration. These implementations are not intended to limit the invention. Alternate implementations, differing slightly or substantially from those described herein, will be apparent to persons skilled in the relevant art(s) based on the teachings contained herein. Such alternate implementations fall within the scope and spirit of the present invention.

5. Amplifier Module.

5.1 High Level Description.

This section (including its subsections) provides a high-level description of the amplifier module according to the present invention. In particular, amplification is described at a high-level. Also, a structural implementation for achieving signal amplification is described at a high-level. This structural implementation is described herein for illustrative purposes, and is not limiting. In particular, the process described in this section can be achieved using any number of structural implementations, one of which is described in this section. The details of such structural implementations will be apparent to persons skilled in the relevant art(s) based on the teachings contained herein.

5.1.1 Operational Description.

Even though the present invention is intended to be used without requiring amplification, there may be circumstance when, in the embodiment of the present invention wherein it is being used as a transmitter, it may prove desirable to amplify the modulated signal before it is transmitted. In another embodiment of the invention wherein it is being used as a stable signal source for a frequency or phase comparator, it may also be desirable to amplify the resultant signal at the desired frequency.

The requirement may come about for a number of reasons. A first may be that the bias/reference signal is too low to support the desired use. A second may be because the desired output frequency is very high relative to the frequency of the oscillating signal that controls the switch. A third reason may be that the shape of the harmonically rich signal is such that the amplitude of the desired harmonic is low.

In the first case, recall that the amplitude of the bias/reference signal determines the amplitude of the harmonically rich signal which is present at the output of the switch circuit. (See sections 3.3.6–3.3.6.2 and 3.3.7–3.3.7.2.) Further recall that the amplitude of the harmonically rich signal directly impacts the amplitude of each of the harmonics. (See the equation in section 4. 1, above.)

In the second instance, if the frequency of the oscillating signal is relatively low compared to the desired output frequency of the up-converter, a high harmonic will be needed. As an example, if the oscillating signal is 60 MHz, and the desired output frequency is at 900 MHz, the $15^{th}$ harmonic will be needed. In the case where $\tau/T$ is 0.1, it can be seen from Table 6000 of FIG. 60 that the amplitude of the $15^{th}$ harmonic ($A_{15}$) is 0.0424, which is 21.5% of the amplitude of the first harmonic ($A_1=0.197$). There may be instances wherein this is insufficient for the desired use, and consequently it must be amplified.

The third circumstance wherein the amplitude of the output may need to be amplified is when the shape of the harmonically rich signal in not "crisp" enough to provide harmonics with enough amplitude for the desired purpose. If, for example, the harmonically rich signal is substantially triangular, and given the example above where the oscillating signal is 60 MHz and the desired output signal is 900 MHz, the $15^{th}$ harmonic of the triangular wave is 0.00180. This is significantly lower than the amplitude of the $15^{th}$ harmonic of the "0.1" rectangular wave (shown above to be 0.0424) and can be mathematically shown to be 0.4% of the amplitude of the $1^{st}$ harmonic of the triangular wave (which is 0.405). Thus, in this example, the $1^{st}$ harmonic of the triangular wave has an amplitude that is larger than the amplitude of the $1^{st}$ harmonic of the "0.1" rectangular wave, but at the $15^{th}$ harmonic, the triangular wave is significantly lower than the "0.1" rectangular wave.

Another reason that the desired harmonic may need to be amplified is that circuit elements such as the filter may cause attenuation in the output signal for which a designer may wish to compensate.

The desired output signal can be amplified in a number of ways. One is to amplify the bias/reference signal to ensure that the amplitude of the harmonically rich wave form is high. A second is to amplify the harmonically rich waveform itself. A third is to amplify the desired harmonic only. The examples given herein are for illustrative purposes only and are not meant to be limiting on the present invention. Other techniques to achieve amplification of the desired output signal would be apparent to those skilled in the relevant art(s).

5.1.2 Structural Description.

In one embodiment, a linear amplifier is used to amplify the bias/reference signal. In another embodiment, a linear amplifier is used to amplify the harmonically rich signal. And in yet another embodiment, a linear amplifier is used to amplify the desired output signal. Other embodiments, including the use of non-linear amplifiers, will be apparent to persons skilled in the relevant art(s).

5.2 Exemplary Embodiment.

An embodiment related to the method(s) and structure(s) described above is presented in this section (and its subsections). This embodiment is described herein for purposes of illustration, and not limitation. The invention is not limited to this embodiment. Alternate embodiments (including equivalents, extensions, variations, deviations, etc., of the embodiment described herein) will be apparent to persons skilled in the relevant art(s) based on the teachings contained herein. The invention is intended and adapted to include such alternate embodiments.

5.2.1 Linear Amplifier.

Figure 47:
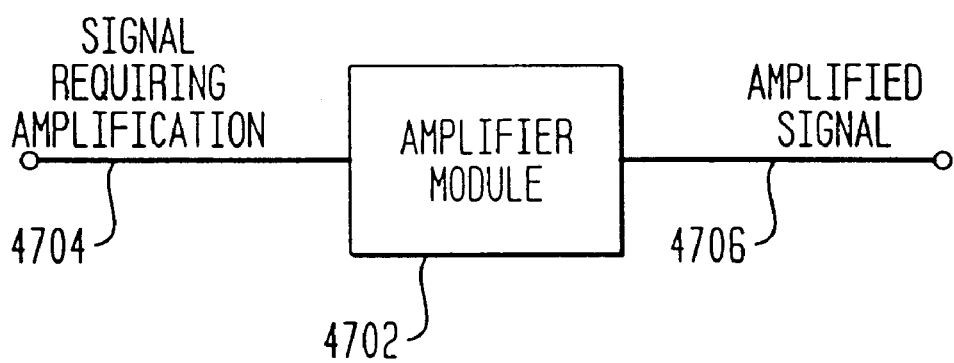
FIG. 47 illustrates an implementation example of an amplifier module.

The exemplary linear amplifier described herein will be directed towards an amplifier composed of solid state electronic devices to be inserted in the circuit at one or more points. Other amplifiers suitable for use with the invention will be apparent to persons skilled in the relevant art(s). As shown in FIG. 47, an amplifier module 4702 receives a signal requiring amplification 4704 and outputs an amplified signal 4706. It would be apparent to one skilled in the relevant art(s) that a plurality of embodiments may be employed without deviating from the scope and intent of the invention described herein.

5.2.1.1 Operational Description.

The desired output signal can be amplified in a number of ways. Such amplification as described in the section may be in addition to the techniques described above to enhance the shape of the harmonically rich signal by pulse shaping of the oscillating signal that causes the switch to close and open.

5.2.1.2 Structural Description.

In one embodiment, a linear amplifier is placed between the bias/reference signal and the switch module. This will increase the amplitude of the bias/reference signal, and as a result, will raise the amplitude of the harmonically rich signal that is the output of the switch module. This will have the effect of not only raising the amplitude of the harmonically rich signal, it will also raise the amplitude of all of the harmonics. Some potential limitation of this embodiment are: the amplified bias/reference signal may exceed the voltage design limit for the switch in the switch circuit; the harmonically rich signal coming out of the switch circuit may have an amplitude that exceeds the voltage design limits of the filter; and/or unwanted distortion may occur from having to amplify a wide bandwidth signal.

A second embodiment employs a linear amplifier between the switch module and the filter. This will raise the amplitude of the harmonically rich signal. It will also raise the amplitude of all of the harmonics of that signal. In an alternate implementation of this embodiment, the amplifier is tuned so that it only amplifies the desired frequencies. Thus, it acts both as an amplifier and as a filter. A potential limitation of this embodiment is that when the harmonically rich signal is amplified to raise a particular harmonic to the desired level the amplitude of the whole waveform is amplified as well. For example, in the case where the amplitude of the pulse, $A_{pulse}$, is equal to 1.0, to raise the $15^{th}$ harmonic from 0.0424 volts to 0.5 volts, the amplitude of each pulse in the harmonically rich signal, $A_{pulse}$, will increase from 1.0 to 11.8 volts. This may well exceed the voltage design limit of the filter.

A third embodiment of an amplifier module will place a linear amplifier between the filter and the transmission module. This will only raise the amplitude of the desired harmonic, rather than the entire harmonically rich signal.

Other embodiments, such as the use of non-linear amplifiers, will be apparent to one skilled in the relevant art(s), and will not be described herein.

5.2.2 Other Embodiments.

The embodiments described above are provided for purposes of illustration. These embodiments are not intended to limit the invention. Alternate embodiments, differing slightly or substantially from those described herein, will be apparent to persons skilled in the relevant art(s) based on the teachings contained herein. Such alternate embodiments fall within the scope and spirit of the present invention.

5.3 Implementation Examples.

Exemplary operational and/or structural implementations related to the method(s), structure(s), and/or embodiments described above are presented in this section (and its subsections). These components and methods are presented herein for purposes of illustration, and not limitation. The invention is not limited to the particular examples of components and methods described herein. Alternatives (including equivalents, extensions, variations, deviations, etc., of those described herein) will be apparent to persons skilled in the relevant art(s) based on the teachings contained herein. Such alternatives fall within the scope and spirit of the present invention.

5.3.1 Linear Amplifier.

Although described below as if it were placed after the filter, the amplifier may also be placed before the filter without deviating from the intent of the invention

5.3.1.1 Operational Description.

According to embodiments of the invention, a linear amplifier receives a first signal at a first amplitude, and outputs a second signal at a second amplitude, wherein the second signal is proportional to the first signal. It is a objective of an amplifier that the information embedded onto the first signal waveform will also be embedded onto the second signal. Typically, it is desired that there be as little distortion in the information as possible.

In a preferred embodiment, the second signal is higher in amplitude than the first signal, however, there may be implementations wherein it is desired that the second signal be lower than the first signal (i.e., the first signal will be attenuated).

5.3.1.2 Structural Description.

The design and use of a linear amplifier is well known to those skilled in the relevant art(s). A linear amplifier may be designed and fabricated from discrete components, or it may be purchased "off the shelf."

Figure 48A:
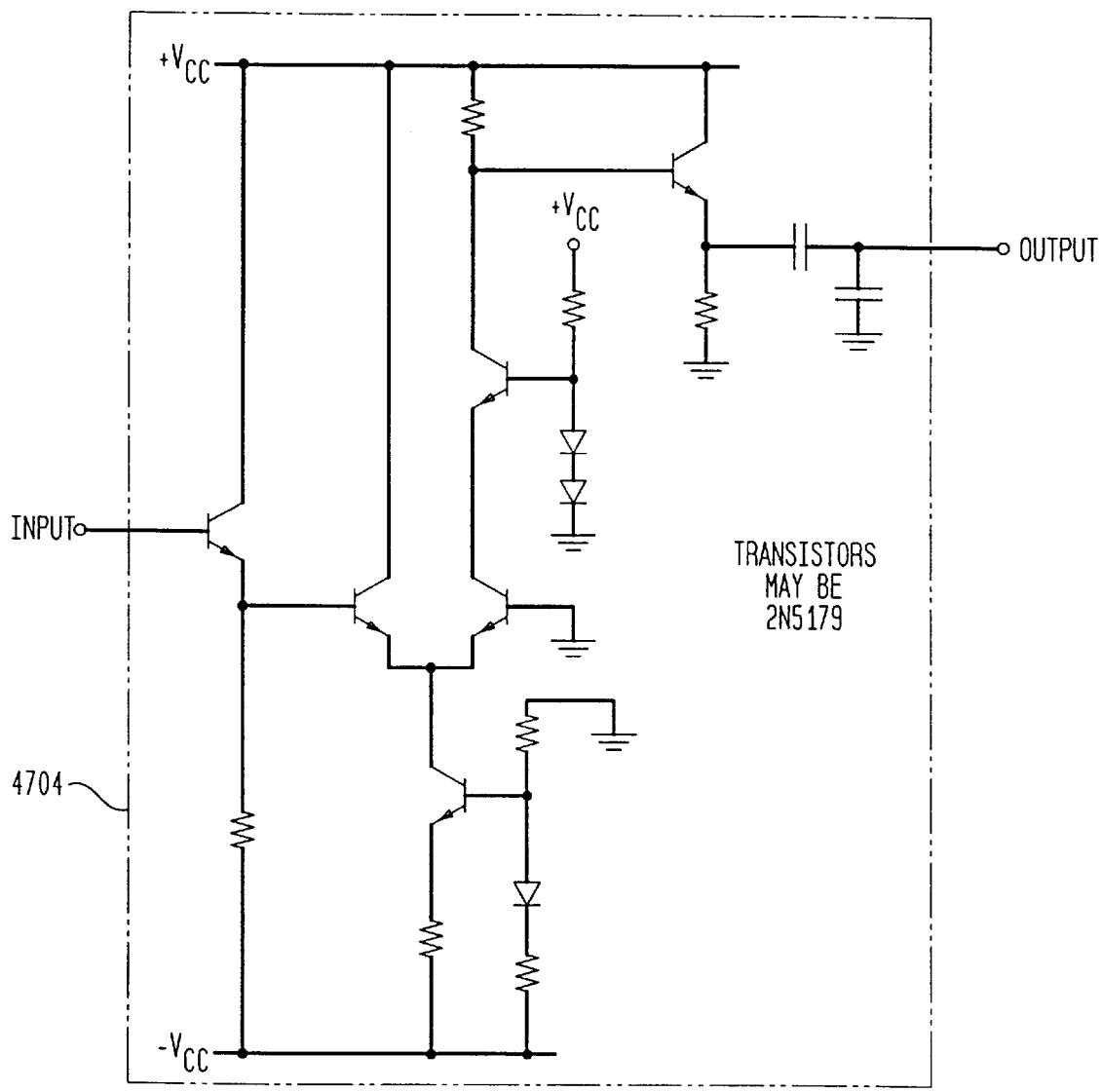
FIGS. 48A and 48B illustrate exemplary circuits for a linear amplifier.
Figure 48B:
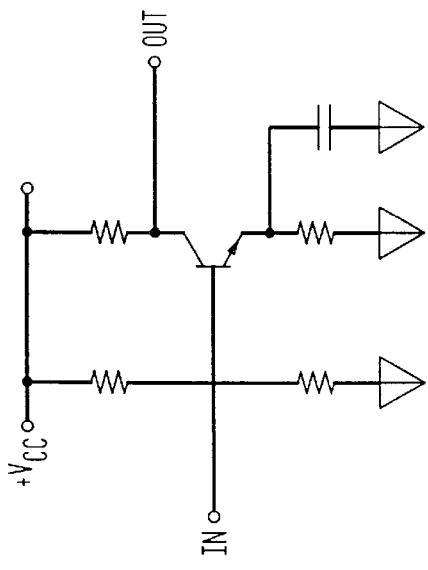

Exemplary amplifiers are seen in FIG. 48. In the exemplary circuit diagram of FIG. 48A, six transistors are used in a wideband amplifier. In the more basic exemplary circuit of FIG. 48B, the amplifier is composed of one transistor, four resistors, and a capacitor. Those skilled in the relevant art(s) will recognize that numerous alternative designs may be used.

5.3.2 Other Implementations.

The implementations described above are provided for purposes of illustration. These implementations are not intended to limit the invention. Alternate implementations, differing slightly or substantially from those described herein, will be apparent to persons skilled in the relevant art(s) based on the teachings contained herein. Such alternate implementations fall within the scope and spirit of the present invention.

6. Receiver/Transmitter System.

The present invention is for a method and system for up-conversion of electromagnetic signals. In one embodiment, the invention is a source of a stable high frequency reference signal. In a second embodiment, the invention is a transmitter.

This section describes a third embodiment. In the third embodiment, the transmitter of the present invention to be used in a receiver/transmitter communications system. This third embodiment may also be referred to as the communications system embodiment, and the combined receiver/transmitter circuit is referred to as a "transceiver." There are several alternative enhancements to the communications systems embodiment.

The following sections describe systems and methods related to exemplary embodiments for a receiver/transmitter system. It should be understood that the invention is not limited to the particular embodiments described below. Equivalents, extensions, variations, deviations, etc., of the following will be apparent to persons skilled in the relevant art(s) based on the teachings contained herein. Such equivalents, extensions, variations, deviations, etc., are within the scope and spirit of the present invention.

6.1 High Level Description.

This section provides a high-level description of a receiver/transmitter system according to the present invention. The implementations are described herein for illustrative purposes, and are not limiting. In particular, any number of functional and structural implementations may be used, several of which are described in this section. The details of such functional and structural implementations will be apparent to persons skilled in the relevant art(s) based on the teachings contained herein.

According to a first embodiment of the transmitter of the present invention is used with a traditional superheterodyne receiver. In this embodiment, the transmitter and the receiver can operate either in a full-duplex mode or in a half-duplex mode. In a full duplex mode, the transceiver can transmit and receive simultaneously. In the half-duplex mode, the transceiver can either transmit or receive, but cannot do both simultaneously. The full-duplex and the half-duplex modes will be discussed together for this embodiment.

A second embodiment of the transceiver is for the transmitter of the present invention to be used with a universal frequency down conversion circuit being used as a receiver. In this embodiment the transceiver is used in a half-duplex mode.

A third embodiment of the transceiver is for the transmitter of the present invention to be used with a universal frequency down conversion circuit, where the transceiver is used in a full-duplex mode.

These embodiments of the transceiver are described below.

6.2 Exemplary Embodiments and Implementation Examples.

Various embodiments related to the method(s) and structure(s) described above and exemplary operational and/or structural implementations related to those embodiments are presented in this section (and its subsections). These embodiments, components, and methods are described herein for purposes of illustration, and not limitation. The invention is not limited to these embodiments or to the particular examples of components and methods described herein. Alternatives (including equivalents, extensions, variations, deviations, etc., of those described herein) will be apparent to persons skilled in the relevant art(s) based on the teachings contained herein. Such alternatives fall within the scope and spirit of the present invention, and the invention is intended and adapted to include such alternatives.

6.2.1 First Embodiment: The Transmitter of the Present Invention Being Used in a Circuit with a Superheterodyne Receiver.

Figure 49:
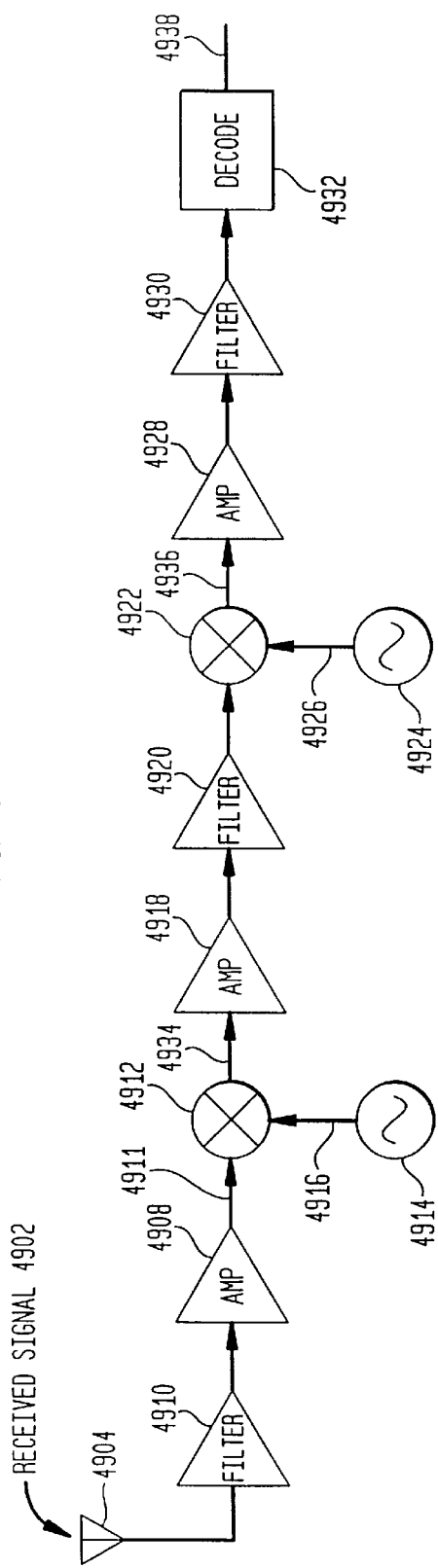
FIG. 49 illustrates a typical superheterodyne receiver.

A typical superheterodyne receiver is shown in FIG. 49. An antenna 4904 receives a signal 4902. Typically, signal 4902 is a radio frequency (RF) signal which is routed to a filter 4910 and an amplifier 4908. The filter 4910 removes all but a frequency range that includes the desired frequency, and the amplifier 4908 ensures that the signal strength will be sufficient for further processing. The output of amplifier 4908 is a signal 4911.

A local oscillator 4914 generates an oscillating signal 4916 which is combined with signal 4911 by mixer 4912. The output of mixer 4912 is a signal 4934 which is amplified by an amplifier 4918 and filtered by a filter 4920. The purpose of amplifier 4918 is to ensure that the strength of signal 4934 is sufficient for further processing, and the purpose of filter 4920 is to remove the undesired frequencies.

A second local oscillator 4924 generates a second oscillating signal 4926 which is combined with the amplified/filtered signal 4934 by a mixer 4922. The output of mixer 4922 is signal 4936. Again, an amplifier 4928 and a filter 4930 ensure that the signal 4936 is at the desired amplitude and frequency. The resulting signal is then routed to decoder 4932 where the intelligence is extracted to obtain baseband signal 4938.

Signal 4934 is referred to as the first intermediate frequency (IF) signal, and signal 4936 is referred to as the second IF signal. Thus, the combination of local oscillator 4914 and mixer 4912 can be referred to as the first IF stage, and the combination of local oscillator 4924 and mixer 4922 can be referred to as the second IF stage.

Exemplary frequencies for the circuit of FIG. 49 are as follows. Signal 4902 may be 900 MHz. The oscillator signal 4916 may be at 830 MHz, which will result in the frequency of the first IF signal, signal 4934, being at 70 MHz. If the second oscillating signal 4926 is at 59 MHz, the second IF signal, signal 4936, would be at 11 MHz. This frequency is typical of second IF frequencies.

Other superheterodyne receiver configurations are well known and these can be used in the transceiver embodiments of the invention. Also, the exemplary frequencies mentioned above are provide for illustrative purposes only, and are not limiting.

Figure 50:
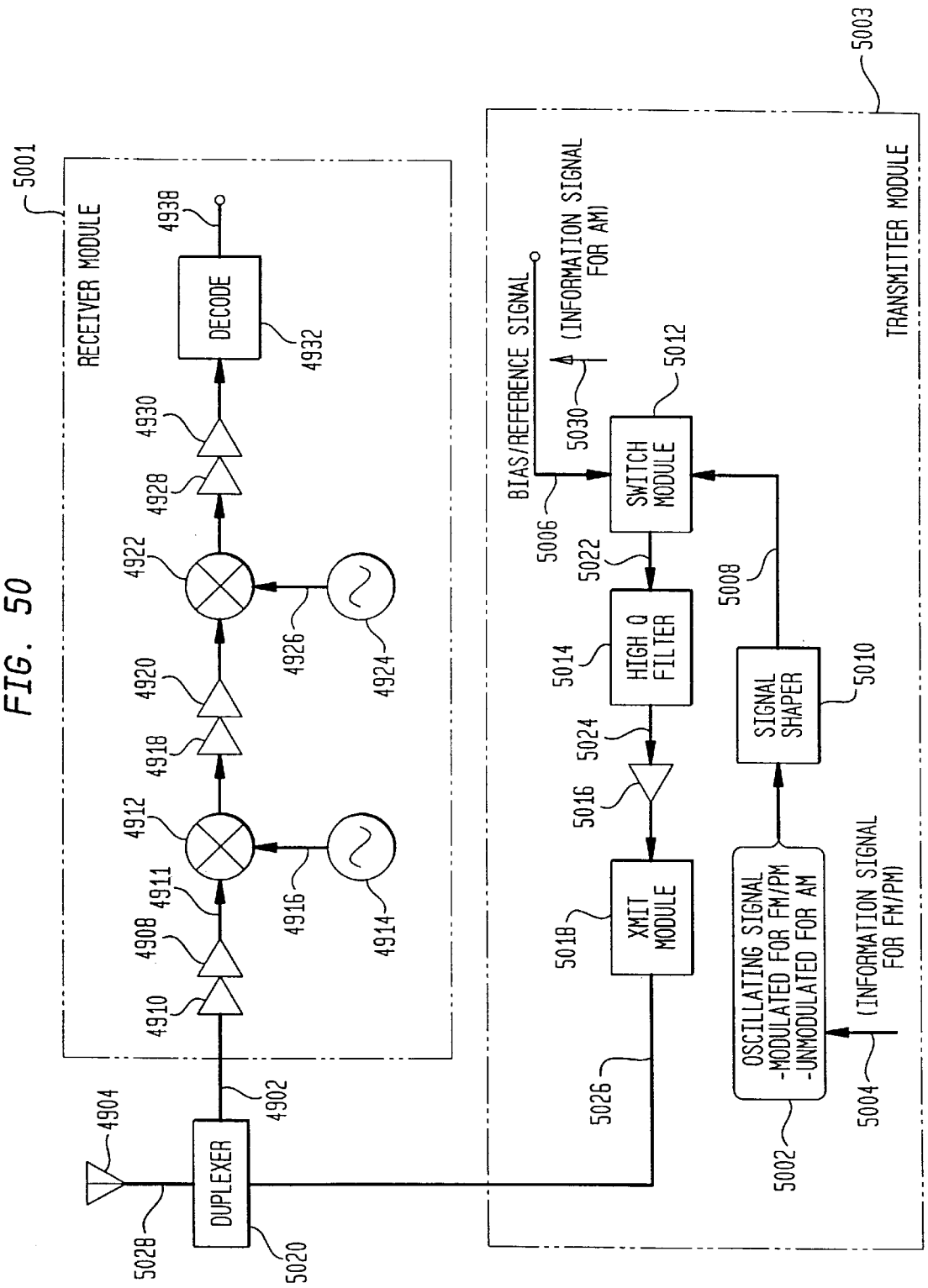
FIG. 50 illustrates a transmitter according to an embodiment of the present invention in a transceiver circuit with a typical superheterodyne receiver in a full-duplex mode.

FIG. 50 shows a transmitter of the present invention in a transceiver circuit with a typical superheterodyne receiver. Accordingly, FIG. 50 illustrates an exemplary transceiver circuit of the invention. The transceiver includes a receiver module 5001, which is implemented using any superheterodyne receiver configuration, and which is described above. The transceiver also includes a transmitter module 5003, which is described below.

In the FM and PM modes, an information signal 5004 modulates an intermediate signal to produce the oscillating signal 5002. Oscillating signal 5002 is shaped by signal shaper 5010 to produce a string of pulses 5008 (see the discussion above regarding the benefits of harmonic enhancement). The string of pulses 5008 drives the switch module 5012. In the FM/PM modes, a bias/reference signal 5006 is also received by switch module 5012. The output of switch module 5012 is a harmonically rich signal 5022. Harmonically rich signal 5022 is comprised of a plurality of sinusoidal components, and is routed to a "high Q" filter that will remove all but the desired output frequency(ies). The desired output frequency 5024 is amplified by an amplifier 5016 and routed to a transmission module 5018 which outputs a transmission signal 5026 which is routed to a duplexer 5020. The purpose of duplexer 5020 is to permit a single antenna to be used simultaneously for both receiving and transmitting signals. The combination of received signal 4902 and transmission signal 5026 is a duplexed signal 5028.

In the AM mode, the same circuit of FIG. 50 applies, except: (1) an information signal 5030 replaces information signal 5004; (2) bias/reference signal 5006 is a function of the information signal 5030; and (3) oscillating signal 5002 is not modulated.

This description is for the full-duplex mode of the transceiver wherein the transmitting portion of the communications system is a separate circuit than the receiver portion. A possible embodiment of a half-duplex mode is described below.

Figure 51A:
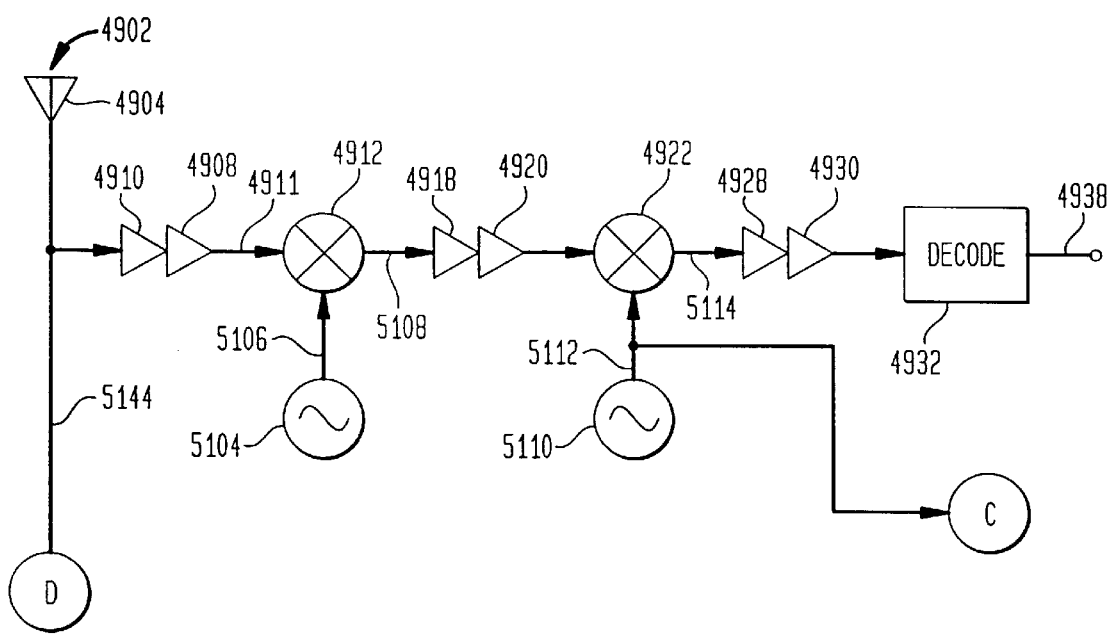
FIGS. 51A, 51B, 51C, and 51D illustrate a transmitter according to an embodiment of the present invention in a transceiver circuit using a common oscillator with a typical superheterodyne receiver in a half-duplex mode.

Alternate embodiments of the transceiver are possible. For example, FIGS. 51A through 51D illustrate an embodiment of the transceiver wherein it may be desired, for cost or other considerations, for an oscillator to be shared by both the transmitter portion and the receiver portion of the circuit. To do this, a trade off must be made in selecting the frequency of the oscillator. In FIG. 51A, a local oscillator 5104 generates an oscillating signal 5106 which is mixed with signal 4911 to generate a first IF signal 5108. A local oscillator 5110 generates a second oscillating signal 5112 which is mixed with the first IF signal 5108 to generate a second IF signal 5114. For the example herein, the frequencies of the oscillating signals 5106 and 5112 will be lower than the frequencies of signal 4911 and first IF signal 5108, respectively. (One skilled in the relevant art(s) will recognize that, because the mixers 4912 and 4922 create both the sum and the difference of the signals they receive, the oscillator frequencies could be higher than the signal frequencies.)

As described in the example above, a typical second IF frequency is 11 MHz. The selection of this IF frequency is less flexible than is the selection of the first IF frequency, since the second IF frequency is routed to a decoder where the signal is demodulated and decoded. Typically, demodulators and decoders are designed to receive signals at a predetermined, fixed frequency, e.g., 11 MHz. If this is the case, the combination of the first IF signal 5108 and the second oscillating signal 5112 must generate a second IF signal with a second IF frequency of 11 MHz. Recall that the received signal 4902 was 900 MHz in the example above. To achieve the second IF signal frequency of 11 MHz, the frequencies of the oscillating signals 4916 and 4926 were set at 830 MHz and 59 MHz. Before setting the frequencies of the oscillating signals 5106 and 5112, the desired frequency of the transmitted signal must be determined. If it, too, is 900 MHz, then the frequency of the oscillating signal that causes the switch in the present invention to open and close must be a "sub-harmonic" of 900 MHz. That is, it must be the quotient of 900 MHz divided by an integer. (In other words, 900 MHz must be a harmonic of the oscillating signal that drives the switch.) The table below is a list of some of the sub-harmonics of 900 MHz:

| sub-harmonic | frequency |
| --- | --- |
| 1st | 900 MHz |
| 2nd | 450 |

-continued

| sub-harmonic | frequency |
|---|---|
| 3rd | 300 |
| 4th | 225 |
| 5th | 180 |
| 10th | 90 |
| 15th | 60 |

Recall that the frequency of the second oscillating signal 4926 in FIGS. 49 and 50 was 59 MHz. Notice that the frequency of the $15^{th}$ sub-harmonic is 60 MHz. If the frequency of oscillating signal 5112 of FIG. 51 were set at 60 MHz, it could also be used as the oscillating signal to operate the switches in switch module 5126 of FIG. 51B and switch module 5136 of FIG. 51C. If this were done, the frequency of the first IF signal would be 71 MHz (rather than 70 MHz in the previous example of a stand-alone receiver), as indicated below:

First IF frequency=Second IF frequency+Second oscillating frequency=11 MHz+60 MHz=71 MHz The frequency of the first oscillating signal 5106 can be determined from the values of the first IF frequency and the frequency of the received signal 4902. In this example, the frequency of the received signal is 900 MHz and the frequency of the first IF signal is 71 MHz. Therefore, the frequency of the first oscillating signal 5106 must be 829 MHz, as indicated below:

$$\text{First oscillating frequency} = \text{Freq of received signal} - \text{First IF freq}$$
$$= 900 \text{ MHz} - 71 \text{ MHz}$$
$$= 829 \text{ MHz}$$

Thus the frequencies of the oscillating signals 5106 and 5112 are 829 MHz and 60 MHz, respectively.

Figure 51B:
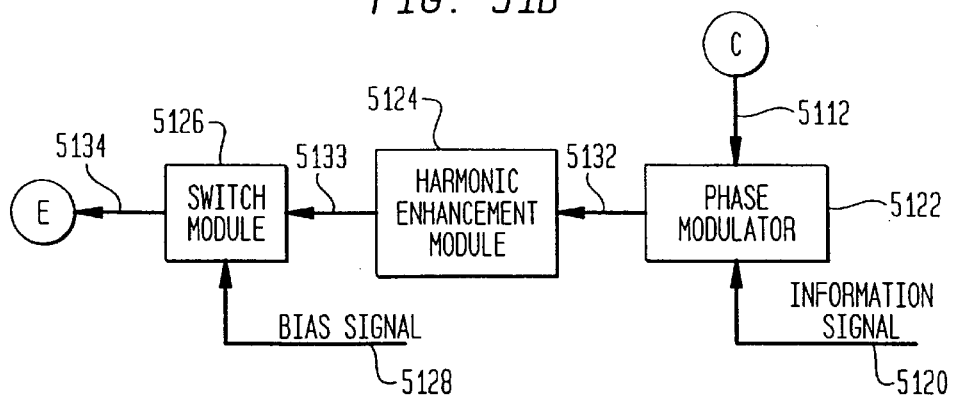

In FIG. 51B, the PM embodiment is shown. The second oscillating signal 5112 is routed to a phase modulator 5122 where it is modulated by the information signal 5120 to generate a PM signal 5132. PM signal 5132 is routed to a harmonic enhancement module 5124 to create a string of pulses 5133. The string of pulses 5133 is also a phase modulated signal and is used to cause the switch in switch module 5126 to open and close. Also entering switch module 5126 is a bias signal 5128. The output of switch module 5126 is a harmonically rich signal 5134.

Figure 51C:
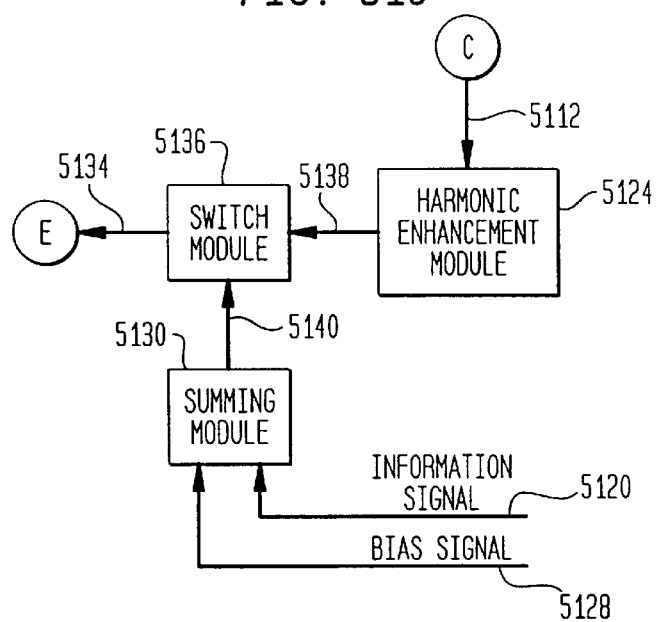

In FIG. 51C, the AM embodiment is shown. The second oscillating signal 5112 directly enters the harmonic enhancement module 5124 to create a string of pulses 5138. String of pulses 5138 (not modulated in this embodiment) then enters a switch module 5136 where it causes a switch to open and close. Also entering switch module 5136 is a reference signal 5140. Reference signal is created by summing module 5130 by combining information signal 5120 with bias signal 5128. It is well known to those skilled in the relevant art(s) that the information signal 5120 may be used as the reference signal without being combined with the bias signal 5128. The output of switch module 5136 is a harmonically rich signal 5134.

The scope of the invention includes an FM embodiment wherein the oscillator 5110 of the receiver circuit is used as a source for an oscillating signal for the transmitter circuit. In the embodiments discussed above, the FM embodiment requires a voltage controlled oscillator (VCO) rather than a simple local oscillator. There are circuit designs that would be apparent to those skilled in the relevant art(s) based on the discussion contained herein, wherein a VCO is used in place of a local oscillator in the receiver circuit.

Figure 51D:
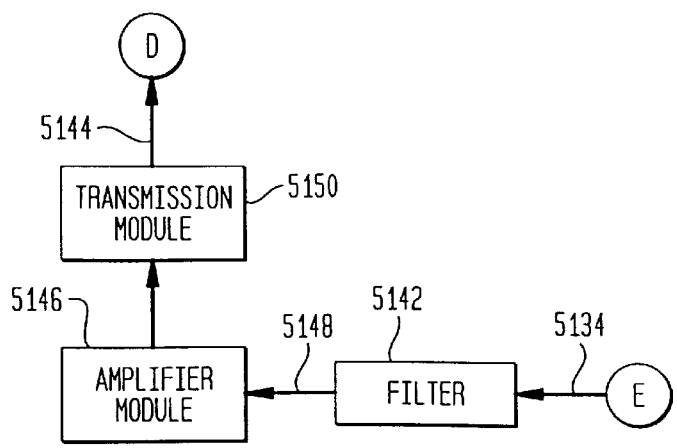

In FIG. 51D, the harmonically rich signal 5134 is filtered by a filter 5142, which removes all but the desired output frequency 5148. The desired output frequency 5148 is amplified by amplifier module 5146 and routed to transmission module 5150. The output of transmission module 5150 is a transmission signal 5144. Transmission signal 5144 is then routed to the antenna 4904 for transmission.

Those skilled in the relevant art(s) will understand that there are numerous combinations of oscillator frequencies, stages, and circuits that will meet the scope and intent of this invention. Thus, the description included herein is for illustrative purposes only and not meant to be limiting.

6.2.2 Second Embodiment: The Transmitter of the Present Invention Being Used with a Universal Frequency Down-Converter in a Half-Duplex Mode.

Figure 52:
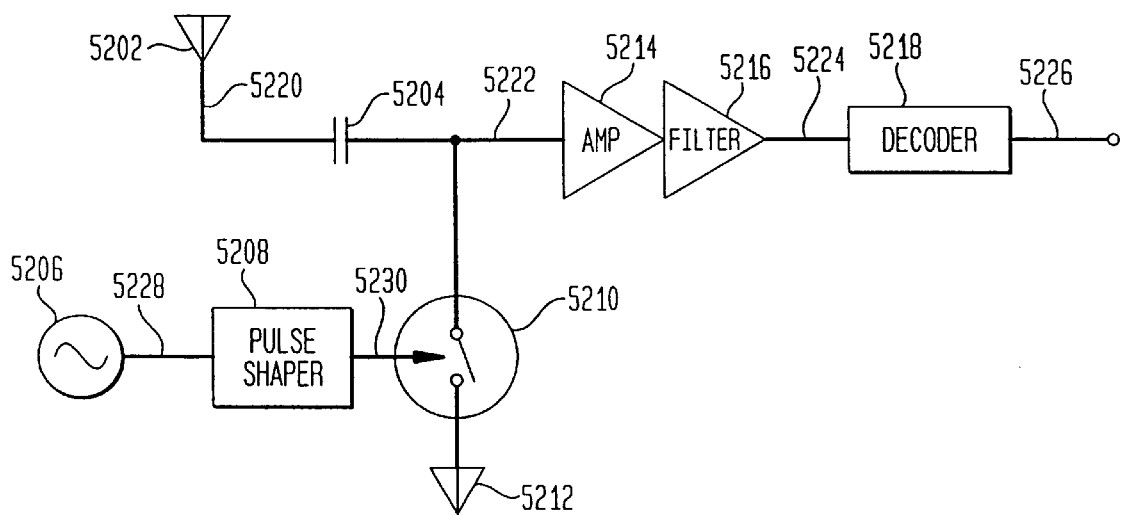
FIG. 52 illustrates an exemplary receiver using universal frequency down conversion techniques according to an embodiment.

An exemplary receiver using universal frequency down conversion techniques is shown in FIG. 52 and described in section 6.3, below. An antenna 5202 receives an electromagnetic (EM) signal 5220. EM signal 5220 is routed through a capacitor 5204 to a first terminal of a switch 5210. The other terminal of switch 5210 is connected to ground 5212 in this exemplary embodiment. A local oscillator 5206 generates an oscillating signal 5228 which is routed through a pulse shaper 5208. The result is a string of pulses 5230. The selection of the oscillator 5206 and the design of the pulse shaper 5208 control the frequency and pulse width of the string of pulses 5230. The string of pulses 5230 control the opening and closing of switch 5210. As a result of the opening and closing of switch 5210, a down converted signal 5222 results. Down converted signal 5222 is routed through an amplifier 5214 and a filter 5216, and a filtered signal 5224 results. In a preferred embodiment, filtered signal 5224 is at baseband, and a decoder 5218 may only be needed to convert digital to analog or to remove encryption before outputting the baseband information signal. This then is a universal frequency down conversion receiver operating in a direct down conversion mode, in that it receives the EM signal 5220 and down converts it to baseband signal 5226 without requiring an IF or a demodulator. In an alternate embodiment, the filtered signal 5224 may be at an "offset" frequency. That is, it is at an intermediate frequency, similar to that described above for the second IF signal in a typical superheterodyne receiver. In this case, the decoder 5218 would be used to demodulate the filtered signal so that it could output a baseband signal 5226.

Figure 53:
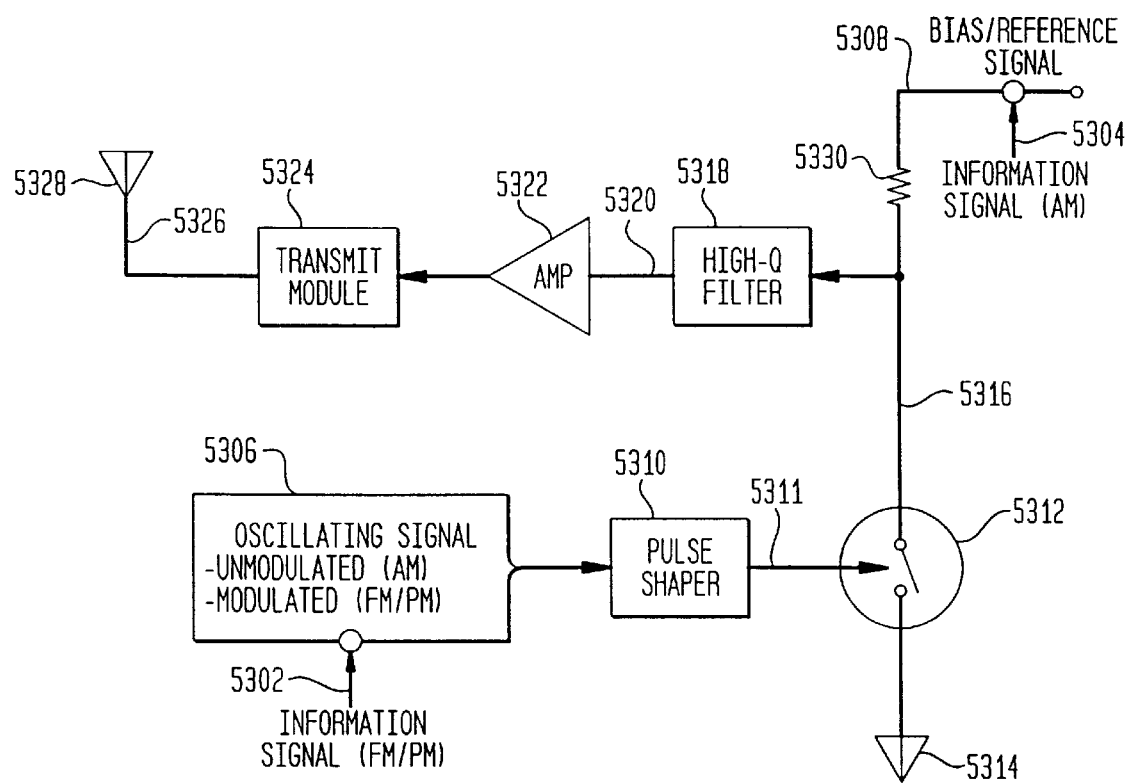
FIG. 53 illustrates an exemplary transmitter of the present invention.

An exemplary transmitter using the present invention is shown in FIG. 53. In the FM and PM embodiments, an information signal 5302 modulates an oscillating signal 5306 which is routed to a pulse shaping circuit 5310 which outputs a string of pulses 5311. The string of pulses 5311 controls the opening and closing of the switch 5312. One terminal of switch 5312 is connected to ground 5314, and the second terminal of switch 5312 is connected through a resistor 5330 to a bias/reference signal 5308. In the FM and PM modes, bias/reference signal 5308 is preferably a non-varying signal, often referred to simply as the bias signal. In the AM mode, the oscillating signal 5306 is not modulated, and the bias/reference signal is a function of the information signal 5304. In one embodiment, information signal 5304 is combined with a bias voltage to generate the reference signal 5308. In an alternate embodiment, the information signal 5304 is used without being combined with a bias voltage. Typically, in the AM mode, this bias/reference signal is referred to as the reference signal to distinguish it from the bias signal used in the FM and PM modes. The output of switch 5312 is a harmonically rich signal 5316 which is routed to a "high Q" filter which removes the unwanted frequencies that exist as harmonic components of harmonically rich signal 5316. Desired frequency 5320 is amplified by amplifier module 5322 and routed to transmission module 5324 which outputs a transmission signal 5326. Transmission signal is output by antenna 5328 in this embodiment.

Figure 54A:
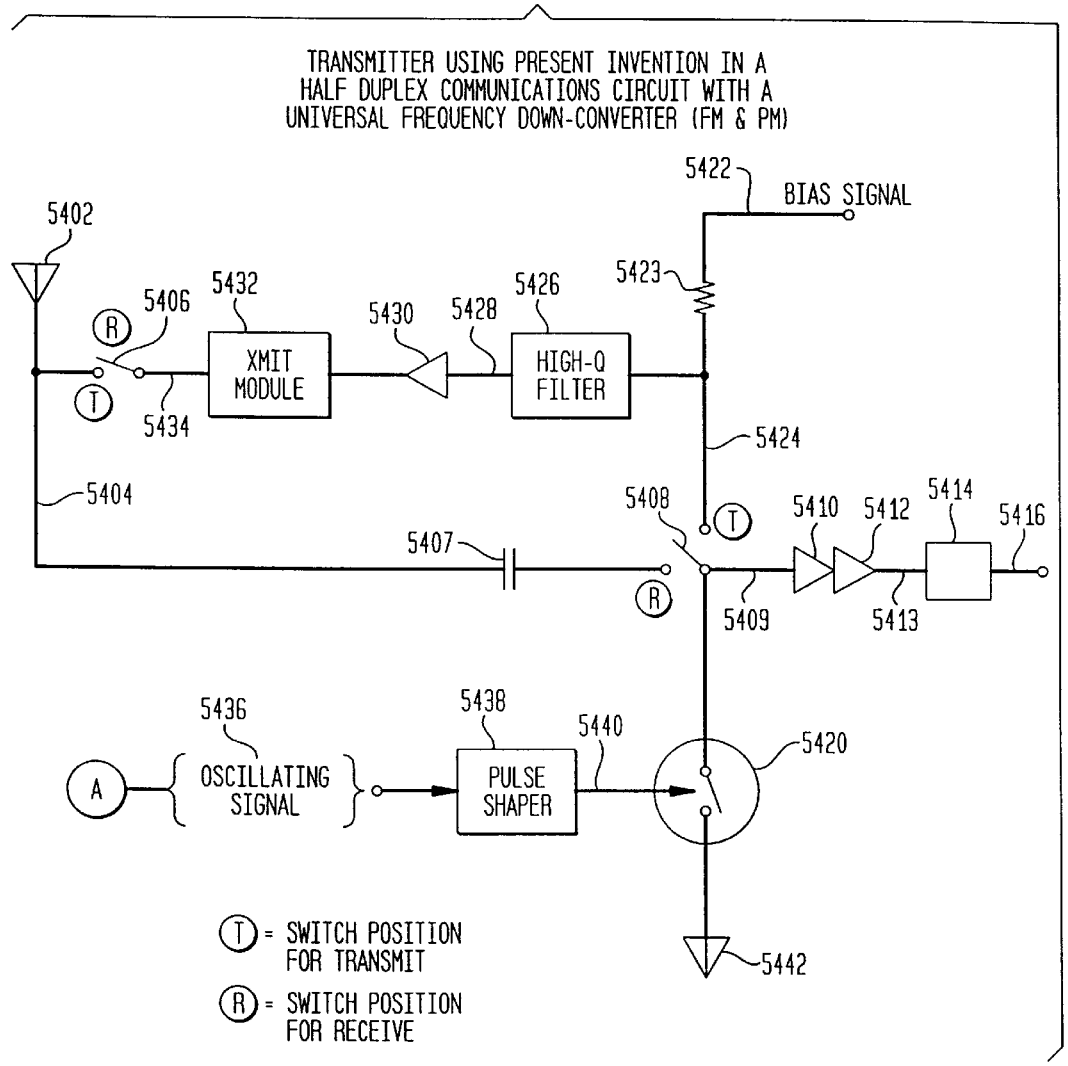
FIGS. 54A, 54B, and 54C illustrate an exemplary transmitter of the present invention in a transceiver circuit with a universal frequency down conversion receiver operating in a half-duplex mode for the FM and PM modulation embodiment.
Figure 54B:
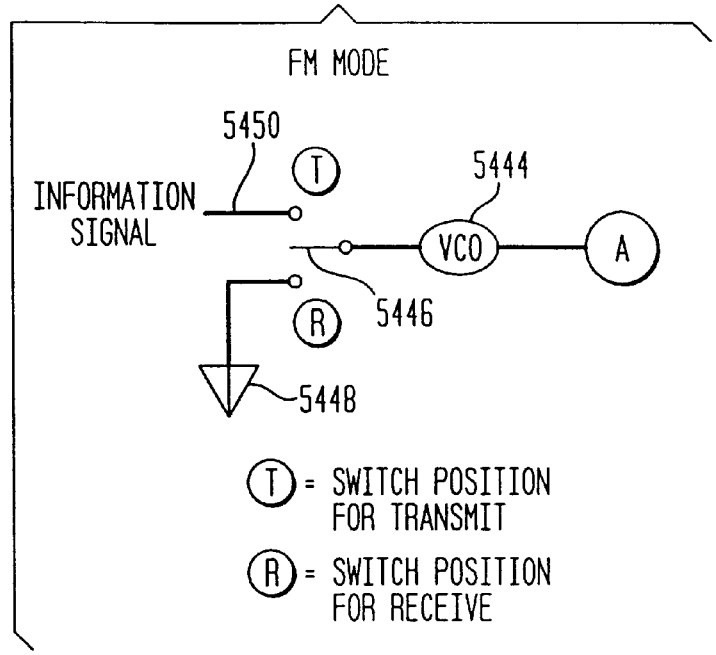
Figure 54C:
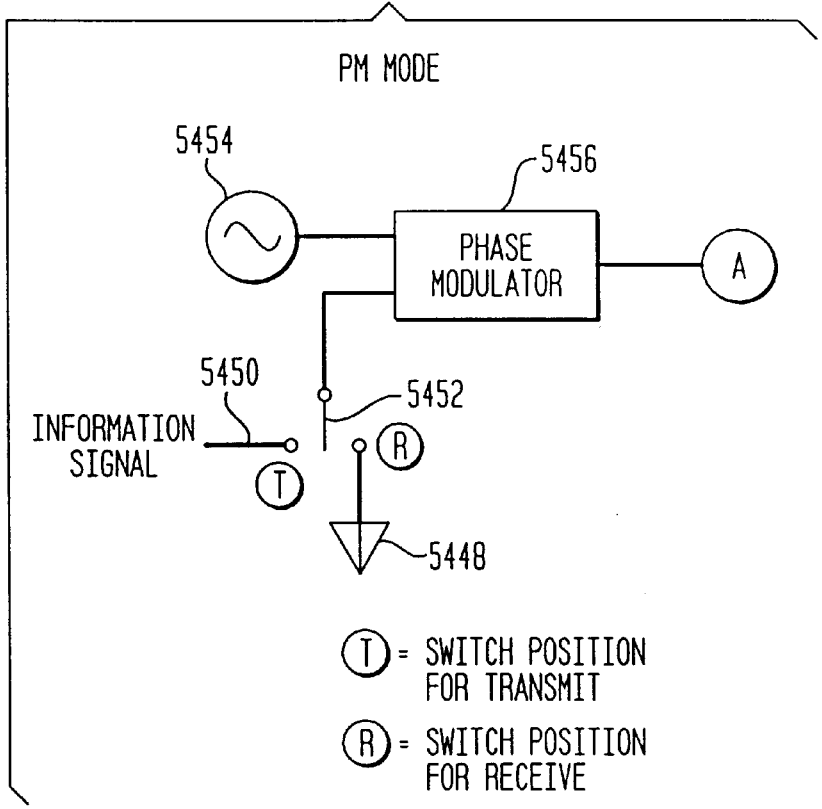

For the FM and PM modulation modes, FIGS. 54A, 54B, and 54C show the combination of the present invention of the transmitter and the universal frequency down-conversion receiver in the half-duplex mode according to an embodiment of the invention. That is, the transceiver can transmit and receive, but it cannot do both simultaneously. It uses a single antenna 5402, a single oscillator 5444/5454 (depending on whether the transmitter is in the FM or PM modulation mode), a single pulse shaper 5438, and a single switch 5420 to transmit and to receive. In the receive function, "Receiver/transmitter" (R/T) switches 5406, 5408, and 5446/5452 (FM or PM) would all be in the receive position, designated by (R). The antenna 5402 receives an EM signal 5404 and routes it through a capacitor 5407. In the FM modulation mode, oscillating signal 5436 is generated by a voltage controlled oscillator (VCO) 5444. Because the transceiver is performing the receive function, switch 5446 connects the input to the VCO 5444 to ground 5448. Thus, VCO 5444 will operate as if it were a simple oscillator. In the PM modulation mode, oscillating signal 5436 is generated by local oscillator 5454 which is routed through phase modulator 5456. Since the transceiver is performing the receive function, switch 5452 is connected to ground 5448, and there is no modulating input to phase modulator. Thus, local oscillator 5454 and phase modulator 5456 operate as if they were a simple oscillator. One skilled in the relevant art(s) will recognize based on the discussion contained herein that there are numerous embodiments wherein an oscillating signal 5436 can be generated to control the switch 5420.

Oscillating signal 5436 is shaped by pulse shaper 5438 to produce a string of pulses 5440. The string of pulses 5440 cause the switch 5420 to open and close. As a result of the switch opening and closing, a down converted signal 5409 is generated. The down converted signal 5409 is amplified and filtered to create a filtered signal 5413. In an embodiment, filtered signal 5413 is at baseband and, as a result of the down conversion, is demodulated. Thus, a decoder 5414 may not be required except to convert digital to analog or to decrypt the filtered signal 5413. In an alternate embodiment, the filtered signal 5413 is at an "offset" frequency, so that the decoder 5414 is needed to demodulate the filtered signal and create a demodulated baseband signal.

When the transceiver is performing the transmit function, the R/T switches 5406, 5408, and 5446/5452 (FM or PM) are in the (T) position. In the FM modulation mode, an information signal 5450 is connected by switch 5446 to VCO 5444 to create a frequency modulated oscillating signal 5436. In the PM modulation mode switch 5452 connects information signal 5450 to the phase modulator 5456 to create a phase modulated oscillating signal 5436. Oscillation signal 5436 is routed through pulse shaper 5438 to create a string of pulses 5440 which in turn cause switch 5420 to open and close. One terminal of switch 5420 is connected to ground 5442 and the other is connected through switch R/T 5408 and resistor 5423 to a bias signal 5422. The result is a harmonically rich signal 5424 which is routed to a "high Q" filter 5426 which removes the unwanted frequencies that exist as harmonic components of harmonically rich signal 5424. Desired frequency 5428 is amplified by amplifier module 5430 and routed to transmission module 5432 which outputs a transmission signal 5434. Again, because the transceiver is performing the transmit function, R/T switch 5406 connects the transmission signal to the antenna 5402.

Figure 55:
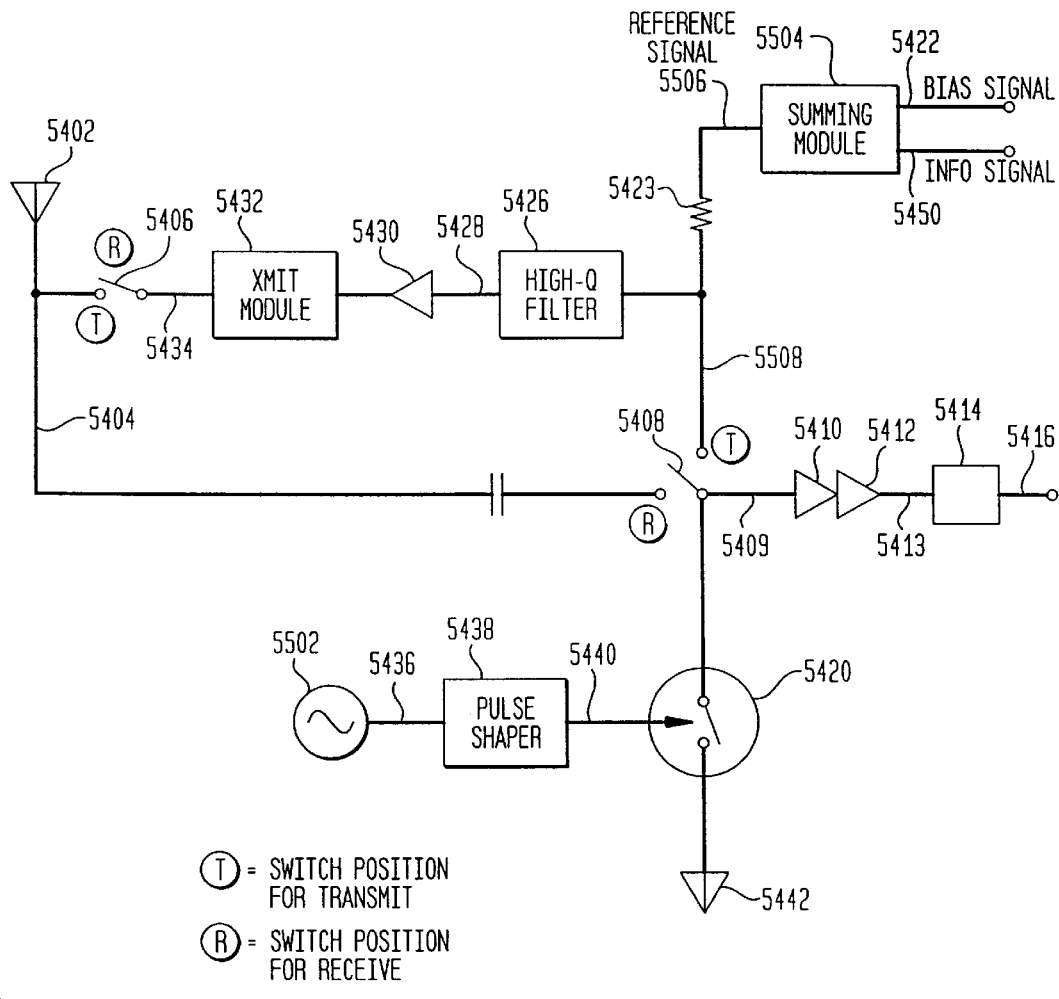
FIG. 55 illustrates an exemplary transmitter of the present invention in a transceiver circuit with a universal frequency down conversion receiver operating in a half-duplex mode for the AM modulation embodiment.

In the AM modulation mode, the transceiver operates in the half duplex mode as shown in FIG. 55. The only distinction between this modulation mode and the FM and PM modulation modes described above, is that the oscillating signal 5436 is generated by a local oscillator 5502, and the switch 5420 is connected through the R/T switch 5408 and resistor 5423 to a reference signal 5506. Reference signal 5506 is generated when information signal 5450 and bias signal 5422 are combined by a summing module 5504. It is well known to those skilled in the relevant art(s) that the information signal 5450 may be used as the reference signal 5506 without being combined with the bias signal 5422, and may be connected directly (through resistor 5423 and R/T switch 5408) to the switch 5420.

6.2.3 Third Embodiment: The Transmitter of the Present Invention Being Used with a Universal Frequency Down Converter in a Full-Duplex Mode.

Figure 56:
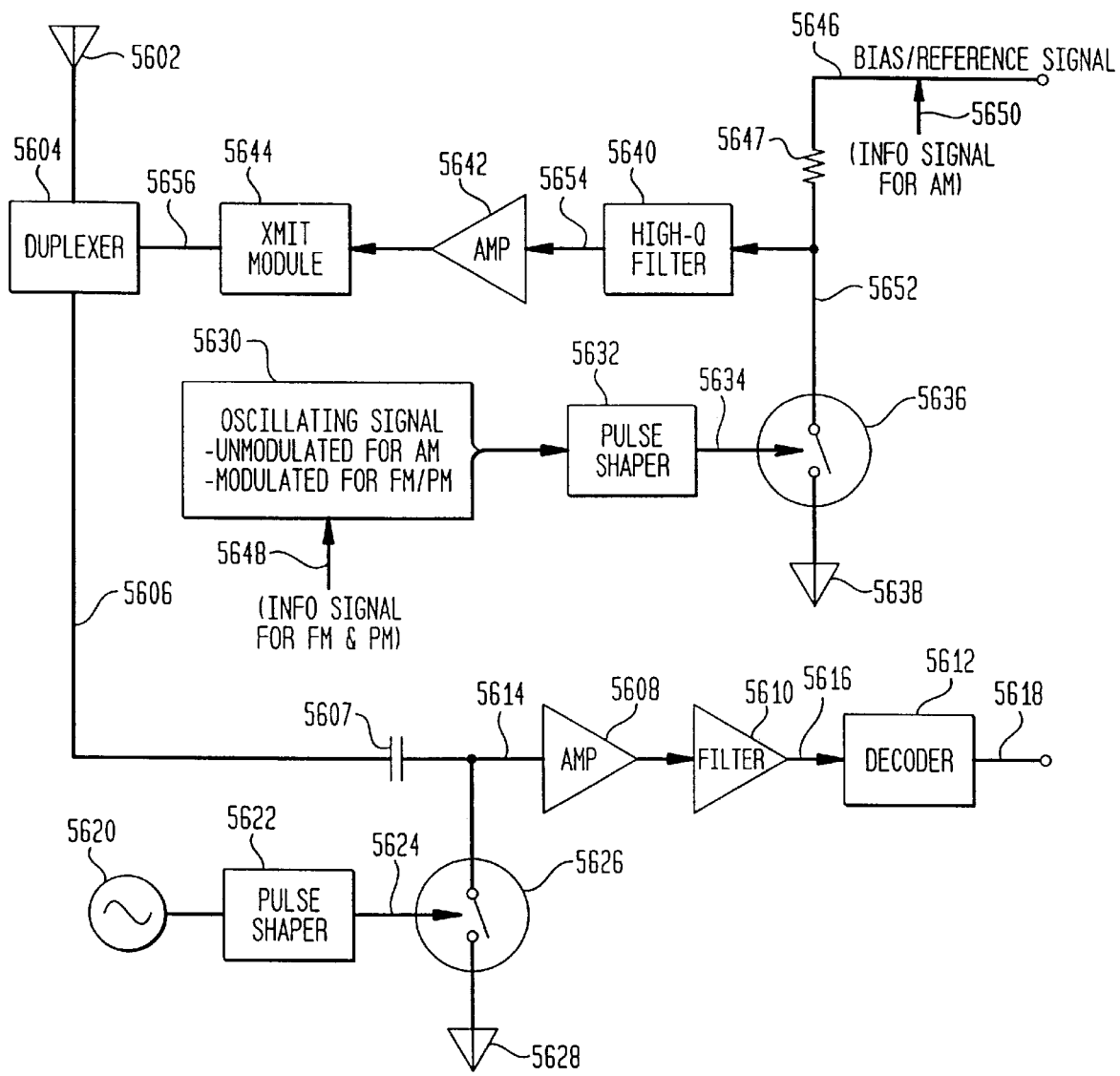
FIG. 56 illustrates an exemplary transmitter of the present invention in a transceiver circuit with a universal frequency down conversion receiver operating in a full-duplex mode.

The full-duplex mode differs from the half-duplex mode in that the transceiver can transmit and receive simultaneously. Referring to FIG. 56, to achieve this, the transceiver preferably uses a separate circuit for each function. A duplexer 5604 is used in the transceiver to permit the sharing of an antenna 5602 for both the transmit and receive functions.

The receiver function performs as follows. The antenna 5602 receives an EM signal 5606 and routes it through a capacitor 5607 to one terminal of a switch 5626. The other terminal of switch 5626 is connected to ground 5628, and the switch is driven as a result of a string of pulses 5624 created by local oscillator 5620 and pulse shaper 5622. The opening and closing of switch 5626 generates a down converted signal 5614. Down converted signal 5614 is routed through a amplifier 5608 and a filter 5610 to generate filtered signal 5616. Filtered signal 5616 may be at baseband and be demodulated or it may be at an "offset" frequency. If filtered signal 5616 is at an offset frequency, decoder 5612 will demodulate it to create the demodulated baseband signal 5618. In a preferred embodiment, however, the filtered signal 5616 will be a demodulated baseband signal, and decoder 5612 may not be required except to convert digital to analog or to decrypt filtered signal 5616. This receiver portion of the transceiver can operate independently from the transmitter portion of the transceiver.

The transmitter function is performed as follows. In the FM and PM modulation modes, an information signal 5648 modulates an oscillating signal 5630. In the AM modulation mode, the oscillating signal 5630 is not modulated. The oscillating signal is shaped by pulse shaper 5632 and a string of pulses 5634 is created. This string of pulses 5634 causes a switch 5636 to open and close. One terminal of switch 5636 is connected to ground 5638, and the other terminal is connected through a resistor 5647 to a bias/reference signal 5646. In the FM and PM modulation modes, bias/reference signal 5646 is referred to as a bias signal 5646, and it is substantially non-varying. In the AM modulation mode, an information signal 5650 may be combined with the bias signal to create what is referred to as the reference signal 5646. The reference signal 5646 is a function of the information signal 5650. It is well known to those skilled in the relevant art(s) that the information signal 5650 may be used as the bias/reference signal 5646 directly without being summed with a bias signal. A harmonically rich signal 5652 is generated and is filtered by a "high Q" filter 5640, thereby producing a desired signal 5654. The desired signal 5654 is amplified by amplifier 5642 and routed to transmission module 5644. The output of transmission module 5644 is transmission signal 5656. Transmission signal 5656 is routed to duplexer 5604 and then transmitted by antenna 5602. This transmitter portion of the transceiver can operate independently from the receiver portion of the transceiver.

Thus, as described above, the transceiver embodiment the present invention as shown in FIG. 56 can perform full-duplex communications in all modulation modes.

6.2.4 Other Embodiments and Implementations.

Other embodiments and implementations of the receiver/transmitter of the present invention would be apparent to one skilled in the relevant art(s) based on the discussion herein.

The embodiments and implementations described above are provided for purposes of illustration. These embodiments and implementations are not intended to limit the invention. Alternatives, differing slightly or substantially from those described herein, will be apparent to persons skilled in the relevant art(s) based on the teachings contained herein. Such alternate embodiments and implementations fall within the scope and spirit of the present invention.

6.3 Summary Description of Down-conversion Using a Universal Frequency Translation Module.

The following discussion describes down-converting using a Universal Frequency Translation Module. The down-conversion of an EM signal by aliasing the EM signal at an aliasing rate is fully described in co-pending U.S. patent application Ser. No. 09/176,022, entitled "Method and System for Down-converting an Electromagnetic Signal," Attorney Docket Number 1744.0010000, the full disclosure of which is incorporated herein by reference. A relevant portion of the above mentioned patent application is summarized below to describe down-converting an input signal to produce a down-converted signal that exists at a lower frequency or a baseband signal.

Figure 64A:
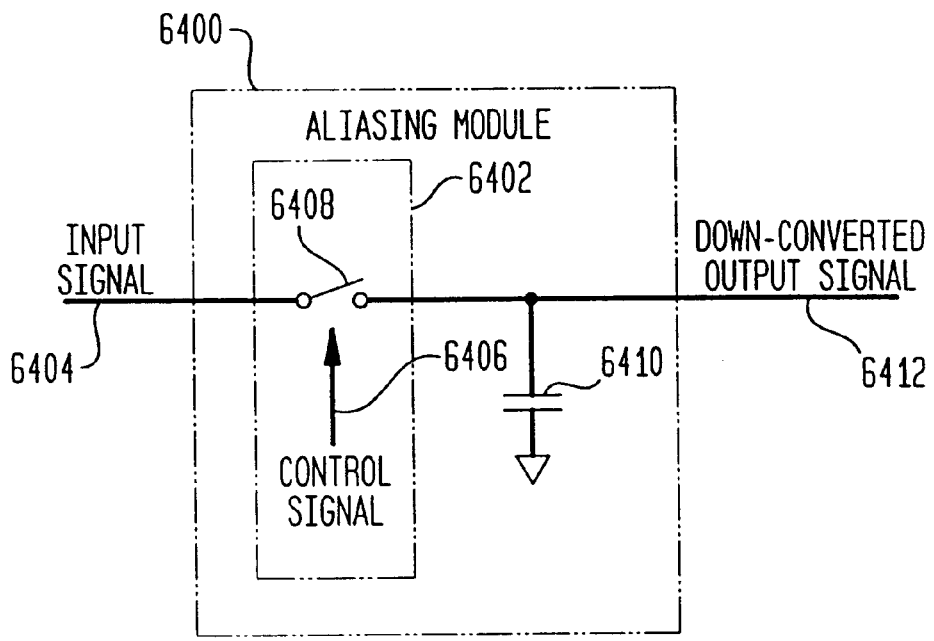
Figures 1, 64A:
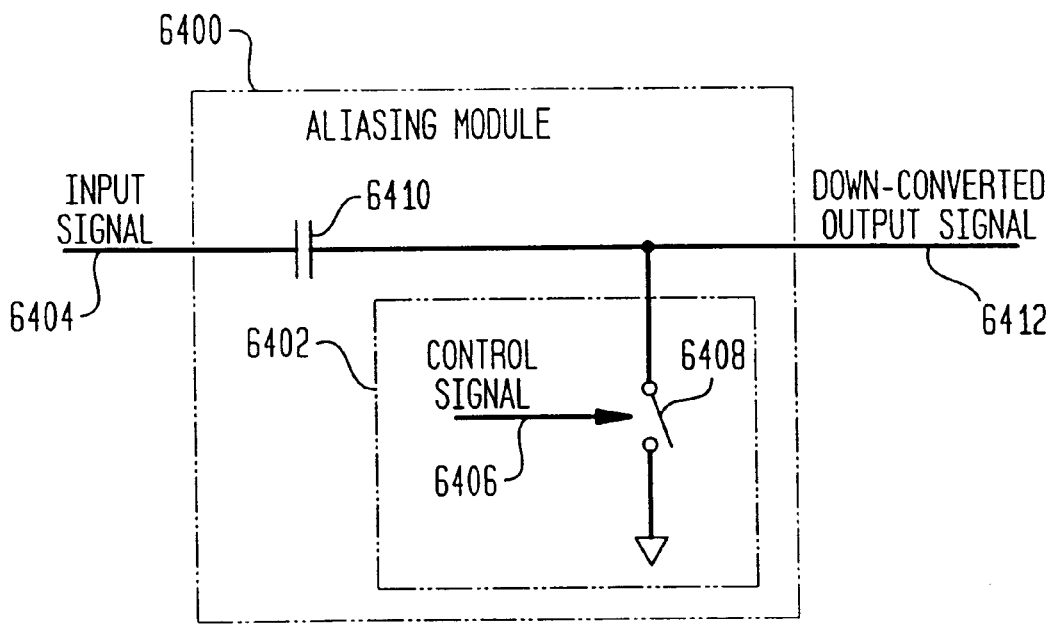

FIG. 64A illustrates an aliasing module 6400 for down-conversion using a universal frequency translation (UFT) module 6402 which down-converts an EM input signal 6404. In particular embodiments, aliasing module 6400 includes a switch 6408 and a capacitor 6410. The electronic alignment of the circuit components is flexible. That is, in one implementation, the switch 6408 is in series with input signal 6404 and capacitor 6410 is shunted to ground (although it may be other than ground in configurations such as differential mode). In a second implementation (see FIG. 64A-1), the capacitor 6410 is in series with the input signal 6404 and the switch 6408 is shunted to ground (although it may be other than ground in configurations such as differential mode). Aliasing module 6400 with UFT module 6402 can be easily tailored to down-convert a wide variety of electromagnetic signals using aliasing frequencies that are well below the frequencies of the EM input signal 6404.

In one implementation, aliasing module 6400 down-converts the input signal 6404 to an intermediate frequency (IF) signal. In another implementation, the aliasing module 6400 down-converts the input signal 6404 to a demodulated baseband signal. In yet another implementation, the input signal 6404 is a frequency modulated (FM) signal, and the aliasing module 6400 down-converts it to a non-FM signal, such as a phase modulated (PM) signal or an amplitude modulated (AM) signal. Each of the above implementations is described below.

In an embodiment, the control signal 6406 includes a train of pulses that repeat at an aliasing rate that is equal to, or less than, twice the frequency of the input signal 6404 In this embodiment, the control signal 6406 is referred to herein as an aliasing signal because it is below the Nyquist rate for the frequency of the input signal 6404. Preferably, the frequency of control signal 6406 is much less than the input signal 6404.

Figure 64B:
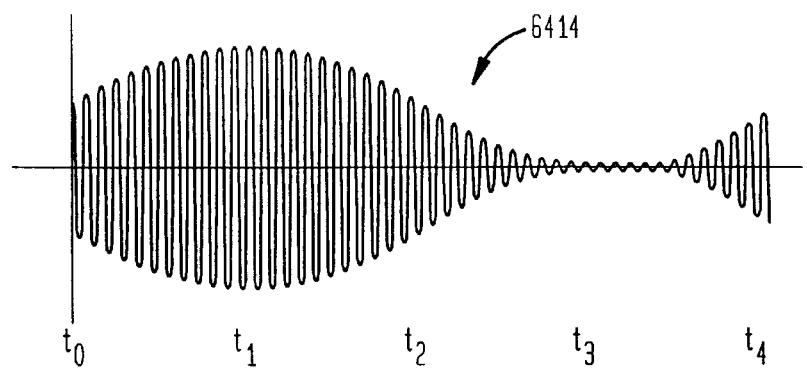
FIGS. 64B–64F illustrate exemplary waveforms at a plurality of points in the FIGS. 64A and 64A1 circuits.
Figure 64C:
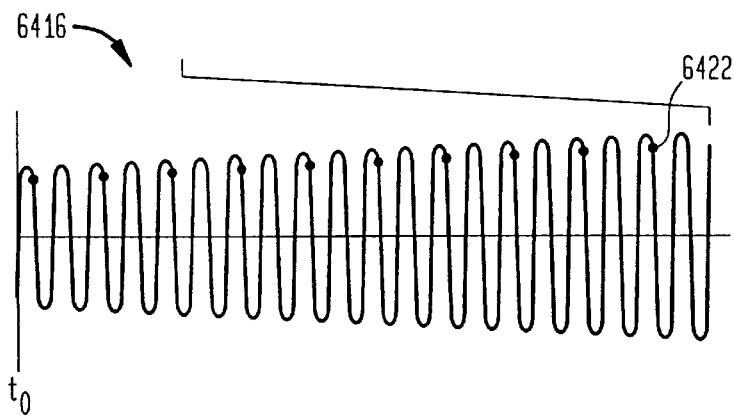
Figure 64D:
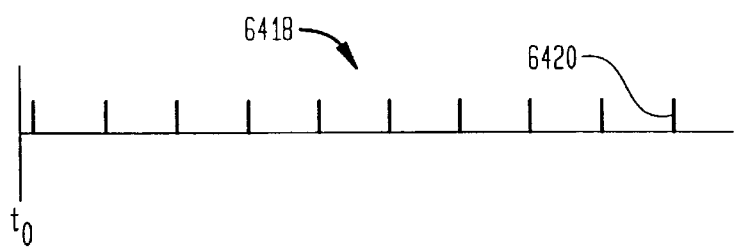
Figure 64E:
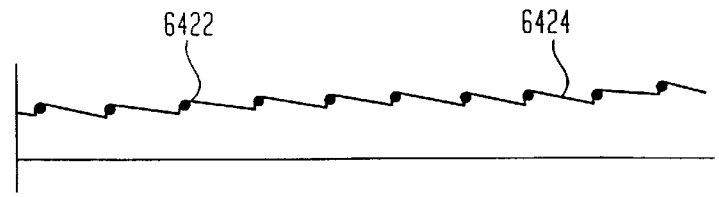

The train of pulses 6418 as shown in FIG. 64D controls the switch 6408 to alias the input signal 6404 with the control signal 6406 to generate a down-converted output signal 6412. More specifically, in an embodiment, switch 6408 closes on a first edge of each pulse 6420 of FIG. 64D and opens on a second edge of each pulse. When the switch 6408 is closed, the input signal 6404 is coupled to the capacitor 6410, and charge is transferred from the input signal to the capacitor 6410. The charge stored during successive pulses forms down-converted output signal 6412.

Exemplary waveforms are shown in FIGS. 64B–64F.

FIG. 64B illustrates an analog amplitude modulated (AM) carrier signal 6414 that is an example of input signal 6404. For illustrative purposes, in FIG. 64C, an analog AM carrier signal portion 6416 illustrates a portion of the analog AM carrier signal 6414 on an expanded time scale. The analog AM carrier signal portion 6416 illustrates the analog AM carrier signal 6414 from time $t_0$ to time $t_1$.

FIG. 64D illustrates an exemplary aliasing signal 6418 that is an example of control signal 6406. Aliasing signal 6418 is on approximately the same time scale as the analog AM carrier signal portion 6416. In the example shown in FIG. 64D, the aliasing signal 6418 includes a train of pulses 6420 having negligible apertures that tend towards zero (the invention is not limited to this embodiment, as discussed below). The pulse aperture may also be referred to as the pulse width as will be understood by those skilled in the art(s). The pulses 6420 repeat at an aliasing rate, or pulse repetition rate of aliasing signal 6418. The aliasing rate is determined as described below, and further described in co-pending U.S. patent application Ser. No. 09/176,022, entitled "Method and System for Down-converting an Electromagnetic Signal," Attorney Docket Number 1744.0010000.

Figure 64F:
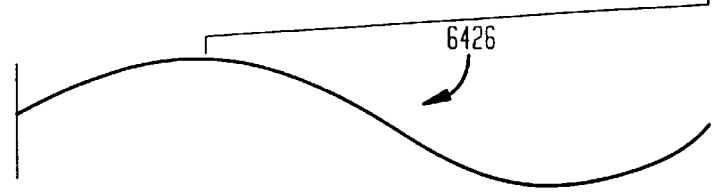

As noted above, the train of pulses 6420 (i.e., control signal 6406) control the switch 6408 to alias the analog AM carrier signal 6416 (i.e., input signal 6404) at the aliasing rate of the aliasing signal 6418. Specifically, in this embodiment, the switch 6408 closes on a first edge of each pulse and opens on a second edge of each pulse. When the switch 6408 is closed, input signal 6404 is coupled to the capacitor 6410, and charge is transferred from the input signal 6404 to the capacitor 6410. The charge transferred during a pulse is referred to herein as an under-sample. Exemplary under-samples 6422 form down-converted signal portion 6424 (FIG. 64E) that corresponds to the analog AM carrier signal portion 6416 (FIG. 64C) and the train of pulses 6420 (FIG. 64D). The charge stored during successive under-samples of AM carrier signal 6414 form the down-converted signal 6424 (FIG. 64E) that is an example of down-converted output signal 6412 (FIG. 64A). In FIG. 64F a demodulated baseband signal 6426 represents the demodulated baseband signal 6424 after filtering on a compressed time scale. As illustrated, down-converted signal 6426 has substantially the same "amplitude envelope" as AM carrier signal 6414. Therefore, FIGS. 64B–64F illustrate down-conversion of AM carrier signal 6414.

The waveforms shown in FIGS. 64B–64F are discussed herein for illustrative purposes only, and are not limiting. Additional exemplary time domain and frequency domain drawings, and exemplary methods and systems of the invention relating thereto, are disclosed in co-pending U.S. patent application Ser. No. 09/176,022, entitled "Method and System for Down-converting an Electromagnetic Signal," Attorney Docket Number 1744.0010000.

The aliasing rate of control signal 6406 determines whether the input signal 6404 is down-converted to an IF signal, down-converted to a demodulated baseband signal, or down-converted from an FM signal to a PM or an AM signal. Generally, relationships between the input signal 6404, the aliasing rate of the control signal 6406, and the down-converted output signal 6412 are illustrated below:

(Freq. of input signal 6404)=n·(Freq. of control signal 6406)±(Freq. of down-converted output signal 6412)

For the examples contained herein, only the "+" condition will be discussed. The value of n represents a harmonic or sub-harmonic of input signal 6404 (e.g., n=0.5, 1, 2, 3, . . . ).

When the aliasing rate of control signal 6406 is off-set from the frequency of input signal 6404, or off-set from a harmonic or sub-harmonic thereof, input signal 6404 is down-converted to an IF signal. This is because the under-sampling pulses occur at different phases of subsequent cycles of input signal 6404. As a result, the under-samples form a lower frequency oscillating pattern. If the input signal 6404 includes lower frequency changes, such as amplitude, frequency, phase, etc., or any combination thereof, the charge stored during associated under-samples reflects the lower frequency changes, resulting in similar changes on the down-converted IF signal. For example, to down-convert a 901 MHz input signal to a 1 MHz IF signal, the frequency of the control signal 6406 would be calculated as follows:

(Freq$_{input}$−Freq$_{IF}$)/n=Freq$_{control}$ (901 MHz−1 MHz)/n=900/n

For n=0.5, 1, 2, 3, 4, etc., the frequency of the control signal 6406 would be substantially equal to 1.8 GHz, 900 MHz, 450 MHz, 300 MHz, 225 MHz, etc.

Exemplary time domain and frequency domain drawings, illustrating down-conversion of analog and digital AM, PM and FM signals to IF signal, and exemplary methods and systems thereof, are disclosed in co-pending U.S. patent application Ser. No. 09/176,022, entitled "Method and System for Down-converting an Electromagnetic Signal," Attorney Docket Number 1744.0010000.

Alternatively, when the aliasing rate of the control signal 6406 is substantially equal to the frequency of the input signal 6404, or substantially equal to a harmonic or sub-harmonic thereof, input signal 6404 is directly down-converted to a demodulated baseband signal. This is because, without modulation, the under-sampling pulses occur at the same point of subsequent cycles of the input signal 6404. As a result, the under-samples form a constant output baseband signal. If the input signal 6404 includes lower frequency changes, such as amplitude, frequency, phase, etc., or any combination thereof, the charge stored during associated under-samples reflects the lower frequency changes, resulting in similar changes on the demodulated baseband signal. For example, to directly down-convert a 900 MHz input signal to a demodulated baseband signal (i.e., zero IF), the frequency of the control signal 6406 would be calculated as follows:

(Freq$_{input}$−Freq$_{IF}$)/n=Freq$_{control}$ (900 MHz−0 MHz)/n=900 MHz/n

For n=0.5, 1, 2, 3, 4, etc., the frequency of the control signal 6406 should be substantially equal to 1.8 GHz, 900 MHz, 450 MHz, 300 MHz, 225 MHz, etc.

Exemplary time domain and frequency domain drawings, illustrating direct down-conversion of analog and digital AM and PM signals to demodulated baseband signals, and exemplary methods and systems thereof, are disclosed in the co-pending U.S. patent application Ser. No. 09/176,022, entitled "Method and System for Down-converting an Electromagnetic Signal," Attorney Docket Number 1744.0010000.

Alternatively, to down-convert an input FM signal to a non-FM signal, a frequency within the FM bandwidth must be down-converted to baseband (i.e., zero IF). As an example, to down-convert a frequency shift keying (FSK) signal (a sub-set of FM) to a phase shift keying (PSK) signal (a subset of PM), the mid-point between a lower frequency $F_1$ and an upper frequency $F_2$ (that is, $[(F_1+F_2)\div 2]$) of the FSK signal is down-converted to zero IF. For example, to down-convert an FSK signal having $F_1$ equal to 899 MHz and $F_2$ equal to 901 MHz, to a PSK signal, the aliasing rate of the control signal 6406 would be calculated as follows:

$$\text{Frequency of the input} = (F_1 + F_2) \div 2$$
$$= (899 \text{ MHz} + 901 \text{ MHz}) \div 2$$
$$= 900 \text{ MHz}$$

Frequency of the down-converted signal=0 (i.e., baseband)

(Freq$_{input}$−Freq$_{IF}$)/n=Freq$_{control}$ (900 MHz−0 MHz)/n=900 MHz/n

For n=0.5, 1, 2, 3, etc., the frequency of the control signal 6406 should be substantially equal to 1.8 GHz, 900 MHz, 450 MHz, 300 MHz, 225 MHz, etc. The frequency of the down-converted PSK signal is substantially equal to one half the difference between the lower frequency $F_1$ and the upper frequency $F_2$.

As another example, to down-convert a FSK signal to an amplitude shift keying (ASK) signal (a subset of AM), either the lower frequency $F_1$ or the upper frequency $F_2$ of the FSK signal is down-converted to zero IF. For example, to down-convert an FSK signal having $F_1$ equal to 900 MHz and $F_2$ equal to 901 MHz, to an ASK signal, the aliasing rate of the control signal 6406 should be substantially equal to:

(900 MHz−0 MHz)/n=900 MHz/n, or (901 MHz−0 MHz)/n=901 MHz/n.

For the former case of 900 MHz/n, and for n=0.5, 1, 2, 3, 4, etc., the frequency of the control signal 6406 should be substantially equal to 1.8 GHz, 900 MHz, 450 MHz, 300 MHz, 225 MHz, etc. For the latter case of 901 MHz/n, and for n=0.5, 1, 2, 3, 4, etc., the frequency of the control signal 6406 should be substantially equal to 1.802 GHz, 901 MHz, 450.5 MHz, 300.333 MHz, 225.25 MHz, etc. The frequency of the down-converted AM signal is substantially equal to the difference between the lower frequency $F_1$ and the upper frequency $F_2$ (i.e., 1 MHz).

Exemplary time domain and frequency domain drawings, illustrating down-conversion of FM signals to non-FM signals, and exemplary methods and systems thereof, are disclosed in the co-pending U.S. patent application Ser. No. 09/176,022, entitled "Method and System for Down-converting an Electromagnetic Signal."

In an embodiment, the pulses of the control signal 6406 have negligible apertures that tend towards zero. This makes the UFT module 6402 a high input impedance device. This configuration is useful for situations where minimal disturbance of the input signal may be desired.

In another embodiment, the pulses of the control signal 6406 have non-negligible apertures that tend away from zero. This makes the UFT module 6402 a lower input impedance device. This allows the lower input impedance of the UFT module 6402 to be substantially matched with a source impedance of the input signal 6404. This also improves the energy transfer from the input signal 6404 to the down-converted output signal 6412, and hence the efficiency and signal to noise (s/n) ratio of UFT module 6402.

Exemplary systems and methods for generating and optimizing the control signal 6406 and for otherwise improving energy transfer and s/n ratio, are disclosed in the co-pending U.S. patent application Ser. No. 09/176,022, entitled "Method and System for Down-converting an Electromagnetic Signal".

7. Designing a Transmitter According to an Embodiment of the Present Invention.

This section (including its subsections) provides a high-level description of an exemplary process to be used to design a transmitter according to an embodiment of the present invention. The techniques described herein are also applicable to designing a frequency up-converter for any application, and for designing the applications themselves. The descriptions are contained herein for illustrative purposes and are not limiting. Alternatives (including equivalents, extensions, variations, deviations, etc., of those described herein) will be apparent to persons skilled in the relevant art(s) based on the teachings contained herein. Such alternatives fall within the scope and spirit of the present invention, and the invention is intended and adapted to include such alternative.

Figure 57A:
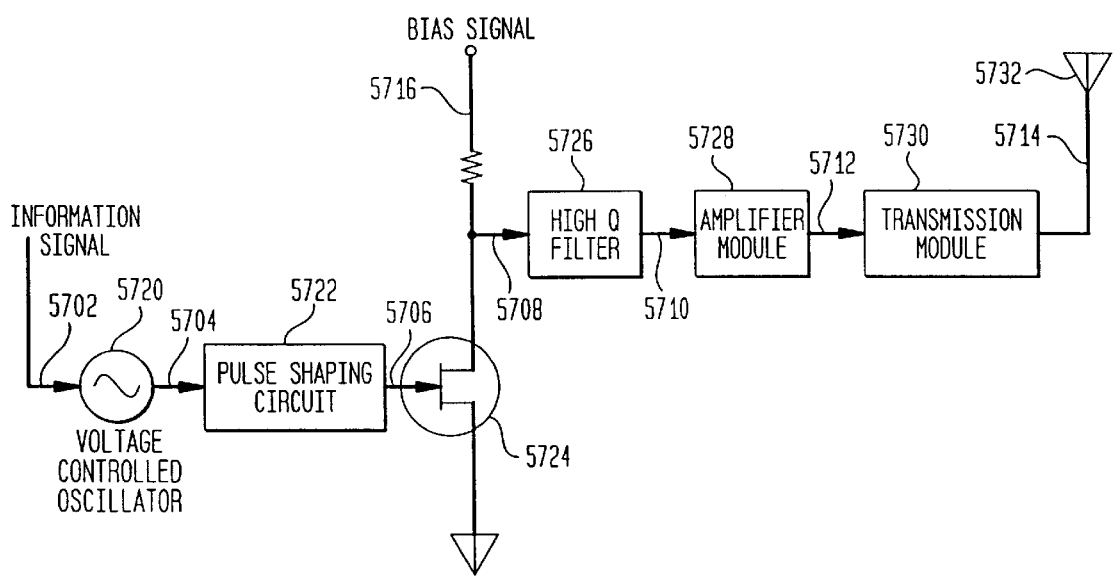
FIGS. 57A–57C illustrate an exemplary transmitter of the present invention being used in frequency modulation, phase modulation, and amplitude modulation embodiments, including a pulse shaping circuit and an amplifier module.
Figure 57B:
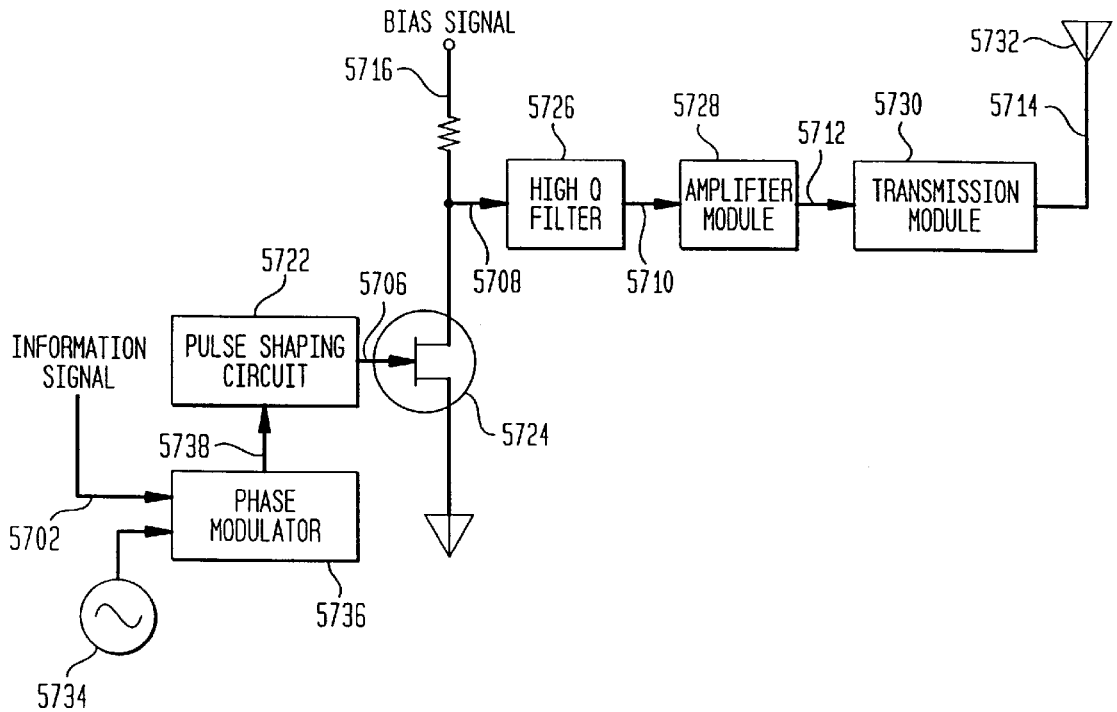
Figure 57C:
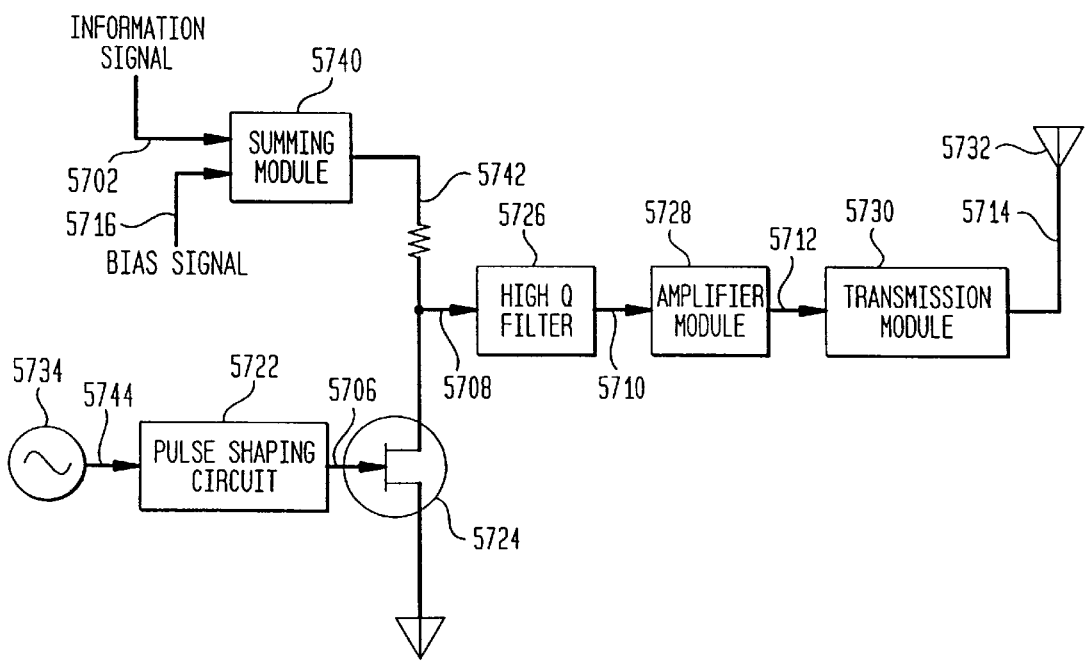

The discussion herein describes an exemplary process to be used to design a transmitter according to an embodiment of the present invention. An exemplary circuit for a transmitter of the present invention operating in the FM embodiment is shown in FIG. 57A. Likewise, FIG. 57B illustrates the transmitter of the present invention operating in the PM embodiment, and FIG. 57C shows the transmitter of the present invention operating in the AM embodiment. These circuits have been shown in previous figures, but are presented here to facilitate the discussion of the design. As the "I/Q" embodiment of the present invention is a subset of the PM embodiment, it will not be shown in a separate figure here, since the design approach will be very similar to that for the PM embodiment.

Depending on the application and on the implementation, some of the design considerations may not apply. For example, and without limitation, in some cases it may not be necessary to optimize the pulse width or to include an amplifier.

7.1 Frequency of the Transmission Signal.

The first step in the design process is to determine the frequency of the desired transmission signal 5714. This is typically determined by the application for which the transmitter is to be used. The present invention is for a transmitter that can be used for all frequencies within the electromagnetic (EM) spectrum. For the examples herein, the explanation will focus on the use of the transmitter in the 900 MHz to 950 MHz range. Those skilled in the relevant art(s) will recognize that the analysis contained herein may be used for any frequency or frequency range.

7.2 Characteristics of the Transmission Signal.

Once the frequency of the desired transmission signal 5714 is known, the characteristics of the signal must be determined. These characteristics include, but are not limited to, whether the transmitter will operate at a fixed frequency or over a range of frequencies, and if it is to operate over a range of frequencies, whether those frequencies are continuous or are divided into discrete "channels." If the frequency range is divided into discrete channels, the spacing between the channels must be ascertained. As an example, cordless phones operating in this frequency range may operate on discrete channels that are 50 KHz apart. That is, if the cordless phones operate in the 905 MHz to 915 MHz range (inclusive), the channels could be found at 905.000, 905.050, 905.100, . . . , 914.900, 914.950, and 915.000.

7.3 Modulation Scheme.

Another characteristic that must be ascertained is the desired modulation scheme that is to be used. As described above in sections 2.1–2.2.4, above, these modulation schemes include FM, PM, AM, etc., and any combination or subset thereof, specifically including the widely used "I/Q" subset of PM. Just as the frequency of the desired transmission signal 5714 is typically determined by the intended application, so too is the modulation scheme.

7.4 Characteristics of the Information Signal.

The characteristics of an information signal 5702 are also factors in the design of the transmitter circuit. Specifically, the bandwidth of the information signal 5702 defines the minimum frequency for an oscillating signal 5704, 5738, 5744 (for the FM, PM, and AM modes, respectively).

7.5 Characteristics of the Oscillating Signal.

The desired frequency of the oscillating signal 5704, 5738, 5744 is also a function of the frequency and characteristics of the desired transmission signal 5714. Also, the frequency and characteristics of the desired transmission signal 5714 are factors in determining the pulse width of the pulses in a string of pulses 5706. Note that the frequency of the oscillating signal 5704, 5738, 5744 is substantially the same as the frequency of the string of pulses 5706. (An exception, which is discussed below, is when a pulse shaping circuit 5722 increases the frequency of the oscillating signal 5704, 5738, 5744 in a manner similar to that described above in section 4.3.2.) Note also that the frequency and pulse width of the string of pulses 5706 is substantially the same as the frequency and pulse width of a harmonically rich signal 5708.

7.5.1 Frequency of the Oscillating Signal.

The frequency of the oscillating signal 5704, 5738, 5744 must be a subharmonic of the frequency of the desired transmission signal 5714. A subharmonic is the quotient obtained by dividing the fundamental frequency, in this case the frequency of the desired transmission signal 5714, by an integer. When describing the frequency of certain signals, reference is often made herein to a specific value. It is understood by those skilled in the relevant art(s) that this reference is to the nominal center frequency of the signal, and that the actual signal may vary in frequency above and below this nominal center frequency based on the desired modulation technique being used in the circuit. As an example to be used herein, if the frequency of the desired transmission signal is 910 MHz, and it is to be used in an FM mode where, for example, the frequency range of the modulation is 40 KHz, the actual frequency of the signal will vary ±20 KHz around the nominal center frequency as a function of the information being transmitted. That is, the frequency of the desired transmission signal will actually range between 909.980 MHz and 910.020 MHz.

The first ten subharmonics of a 910.000 MHz signal are given below.

| harmonic | frequency |
| --- | --- |
| 1st | 910.000MHz |
| 2nd | 455.000 |
| 3rd | 303.333... |
| 4th | 227.500 |
| 5th | 182.000 |
| 6th | 151.666... |
| 7th | 130.000 |
| 8th | 113.750 |
| 9th | 101.111... |
| 10th | 91.000 |

The oscillating signal 5704, 5738, 5744 can be at any one of these frequencies or, if desired, at a lower subharmonic. For discussion herein, the $9^{th}$ subharmonic will be chosen. Those skilled in the relevant art(s) will understand that the analysis herein applies regardless of which harmonic is chosen. Thus the nominal center frequency of the oscillating signal 5704, 5738, 5744 will be 101.1111 MHz. Recalling that in the FM mode, the frequency of the desired transmission signal 5714 is actually 910.000 MHz±0.020 MHz, it can be shown that the frequency of the oscillating signal 5704 will vary ±0.00222 MHz (i.e., from 101.10889 MHz to 101.11333 MHz). The frequency and frequency sensitivity of the oscillating signal 5704 will drive the selection or design of the voltage controlled oscillator (VCO) 5720.

Another frequency consideration is the overall frequency range of the desired transmission signal. That is, if the transmitter is to be used in the cordless phone of the above example and will transmit on all channels between 905 MHz and 915 MHz, the VCO 5720 (for the FM mode) or the local oscillator (LO) 5734 (for the PM and AM modes) will be required to generate oscillating frequencies 5704, 5738, 5744 that range from 100.5556 MHz to 101.6667 MHz. (That is, the $9^{th}$ subharmonic of 910 MHz±5 MHz). In some applications, such as the cellular phone, the frequencies will change automatically, based on the protocols of the overall cellular system (e.g., moving from one cell to an adjacent cell). In other applications, such as a police radio, the frequencies will change based on the user changing channels.

In some applications, different models of the same transmitter will transmit signals at different frequencies, but each model will, itself, only transmit a single frequency. A possible example of this might be remote controlled toy cars, where each toy car operates on its own frequency, but, in order for several toy cars to operate in the same area, there are several frequencies at which they could operate. Thus, the design of the VCO 5720 or LO 5734 will be such that it is able to be tuned to a set frequency when the circuit is fabricated, but the user will typically not be able to adjust the frequency.

It is well known to those skilled in the relevant art(s) that several of the criteria to be considered in the selection or design of an oscillator (VCO 5720 or LO 5734) include, but are not limited to, the nominal center frequency of the desired transmission signal 5714, the frequency sensitivity caused by the desired modulation scheme, the range of all possible frequencies for the desired transmission signal 5714, and the tuning requirements for each specific application. Another important criterion is the determination of the subharmonic to be used, but unlike the criteria listed above which are dependent on the desired application, there is some flexibility in the selection of the subharmonic.

7.5.2 Pulse Width of the String of Pulses.

Once the frequency of the oscillating signal 5704, 5738, 5744 has been selected, the pulse width of the pulses in the stream of pulses 5706 must be determined. (See sections 4–4.3.4, above, for a discussion of harmonic enhancement and the impact the pulse-width-to-period ratio has on the relative amplitudes of the harmonics in a harmonically rich signal 5708.) In the example used above, the $9^{th}$ subharmonic was selected as the frequency of the oscillating signal 5704, 5738, 5744. In other words, the frequency of the desired transmission signal will be the $9^{th}$ harmonic of the oscillating signal 5704, 5738, 5744. One approach in selecting the pulse width might be to focus entirely on the frequency of the oscillating signal 5704, 5738, 5744 and select a pulse width and observe its operation in the circuit. For the case where the harmonically rich signal 5708 has a unity amplitude, and the pulse-width-to-period ratio is 0.1, the amplitude of the $9^{th}$ harmonic will be 0.0219. Looking again at Table 6000 and FIG. 58 it can be seen that the amplitude of the $9^{th}$ harmonic is higher than that of the $10^{th}$ harmonic (which is zero) but is less than half the amplitude of the $8^{th}$ harmonic. Because the $9^{th}$ harmonic does have an amplitude, this pulse-width-to-period ratio could be used with proper filtering. Typically, a different ratio might be selected to try and find a ratio that would provide a higher amplitude.

Looking at Eq. 1 in section 4.1.1, it is seen that the relative amplitude of any harmonic is a function of the number of the harmonic and the pulse-width-to-period ratio of the underlying waveform. Applying calculus of variations to the equation, the pulse-width-to-period ratio that yields the highest amplitude harmonic for any given harmonic can be determined.

From Eq. 1, where $A_n$ is the amplitude of the $n^{th}$ harmonic, $$A_n = [A_{pulse}][(2/\pi)/n]\sin\{n\cdot\pi\cdot(\tau/T)\} \qquad \text{Eq. 2}$$

If the amplitude of the pulse, $A_{pulse}$, is set to unity (i.e., equal to 1), the equation becomes $$A_n = [2/(n\cdot\pi)]\sin[n\cdot\pi\cdot(\tau/T)] \qquad \text{Eq. 3}$$

From this equation, it can be seen that for any value of n (the harmonic) the amplitude of that harmonic, $A_n$, is a function of the pulse-width-to-period ratio, $\tau/T$. To determine the highest value of $A_n$ for a given value of n, the first derivative of $A_n$ with respect to $\tau/T$ is taken. This gives the following equations.

$$\delta(A_n)/\delta(\tau/T) = \delta\{[2/(n\cdot\tau)]\sin[n\cdot\pi\cdot(\tau/T)]\}/\delta(\tau/T) \qquad \text{Eq. 4}$$

$$= [2/(n\cdot\pi)]\delta[\sin[n\cdot\pi\cdot(\tau/T)]]/\delta(\tau/T) \qquad \text{Eq. 5}$$

$$= [2/(n\cdot\pi)]\cos[n\cdot\pi\cdot(\tau/T)] \qquad \text{Eq. 6}$$

From calculus of variations, it is known that when the first derivative is set equal to zero, the value of the variable that will yield a relative maximum (or minimum) can be determined.

$$\delta(A_n)/\delta(\tau/T)=0 \quad \text{Eq. 7}$$

$$[2/(n\cdot\pi)]\cos[n\cdot\pi\cdot(\tau/T)]=0 \quad \text{Eq. 8}$$

$$\cos[n\cdot\pi\cdot(\tau/T)]=0 \quad \text{Eq. 9}$$

From trigonometry, it is known that for Eq. 9 to be true, $$n\cdot\pi\cdot(\tau/T)=\pi/2 \text{ (or } 3\pi/2, 5\pi/2, \text{ etc.)} \quad \text{Eq. 10}$$

$$\tau/T=(\pi/2)/(n\cdot\pi) \quad \text{Eq. 11}$$

$$\tau/T=1/(2\cdot n) \text{ (or } 3/(2\cdot n), 5/(2\cdot n), \text{ etc.)} \quad \text{Eq. 12}$$

Figure 59:
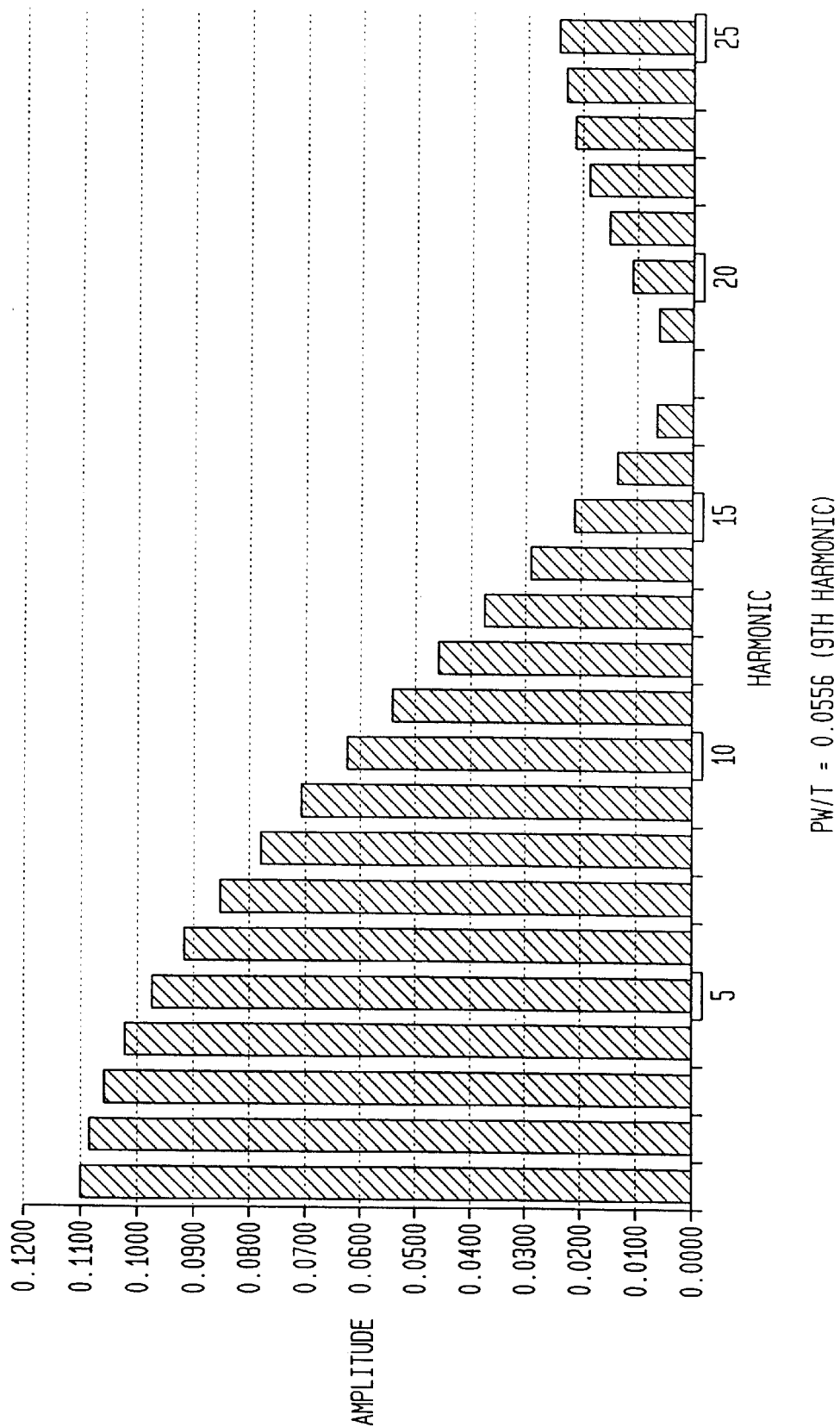
FIG. 59 illustrates harmonic amplitudes for a pulse-width-to-period ratio of 0.0556.

The above derivation is well known to those skilled in the relevant art(s). From Eq. 12, it can be seen that if the pulse-width-to-period ratio is equal to $1/(2\cdot n)$, the amplitude of the harmonic should be substantially optimum. For the case of the $9^{th}$ harmonic, Eq. 12 will yield a pulse-width-to-period ratio of $1/(2\cdot 9)$ or 0.0556. For the amplitude of this $9^{th}$ harmonic, Table 6100 of FIG. 61 shows that it is 0.0796. This is an improvement over the previous amplitude for a pulse-width-to-period ratio of 0.1. Table 6100 also shows that the $9^{th}$ harmonic for this pulse-width-to-period ratio has the highest amplitude of any $9^{th}$ harmonic, which bears out the derivation above. The frequency spectrum for a pulse-width-to-period ratio of 0.0556 is shown in FIG. 59. (Note that other pulse-width-to-period ratios of $3/(2\cdot n)$, $5/(2\cdot n)$, etc., will have amplitudes that are equal to but not larger than this one.)

This is one approach to determining the desired pulse-width-to-period ratio. Those skilled in the relevant art(s) will understand that other techniques may also be used to select a pulse-width-to-period ratio.

7.6 Design of the Pulse Shaping Circuit.

Once the determination has been made as to the desired frequency of the oscillating signal 5704, 5738, 5744 and of the pulse width, the pulse shaping circuit 5722 can be designed. Looking back to sections 4–4.3.4 it can be seen that the pulse shaping circuit 5722 can not only produce a pulse of a desired pulse width, but it can also cause the frequency of the string of pulses 5706 to be higher than the frequency of the oscillating signal 5704, 5738, 5744. Recall that the pulse-width-to-period ratio applies to the pulse-width-to-period ratio of the harmonically rich signal 5708 and not to the pulse-width-to-period ratio of the oscillating signal 5704, 5738, 5744, and that the frequency and pulse width of the harmonically rich signal 5708 mirrors the frequency and pulse width of the string of pulses 5706. Thus, if in the selection of the VCO 5720 or LO 5734 it was desired to choose an oscillator that is lower than that required for the selected harmonic, the pulse shaping circuit 5733 can be used to increase the frequency. Going back to the previous example, the frequency of the oscillating signal 5704, 5738, 5744 could be 50.5556 MHz rather than 101.1111 MHz if the pulse shaping circuit 5722 was designed such as discussed in sections 4.2.2–4.2.2.2 (shown in FIGS. 40A–40D) not only to shape the pulse, but also to double the frequency. While that discussion was specifically for a square wave input, those skilled in the relevant art(s) will understand that similar techniques will apply to non-rectangular waveforms (e.g., a sinusoidal wave). This use of the pulse shaping circuit to double the frequency has a possible advantage in that it allows the design and selection of an oscillator (VCO 5720 of LO 5734) with a lower frequency, if that is a consideration.

It should also be understood that the pulse shaping circuit 5722 is not always required. If the design or selection of the VCO 5720 or LO 5734 was such that the oscillating signal 5704, 5738, 5744 was a substantially rectangular wave, and that substantially rectangular wave had a pulse-width-to-period ratio that was adequate, the pulse shaping circuit 5722 could be eliminated.

7.7 Selection of the Switch.

The selection of a switch 5724 can now be made. The switch 5724 is shown in the examples of FIGS. 57A, 57B, and 57C as a GaAsFET. However, it may be any switching device of any technology that can open and close "crisply" enough to accommodate the frequency and pulse width of the string of pulses 5706.

7.8 Design of the Filter.

The design of the filter 5726 is determined by the frequency and frequency range of the desired transmission signal 5714. As discussed above in sections 3.3.9–3.3.9.2, the term "Q" is used to describe the ratio of the center frequency of the output of the filter to the bandwidth of the "3 dB down" point. The trade offs that were made in the selection of the subharmonic to be used is a factor in designing the filter. That is, if, as an excursion to the example given above, the frequency of the desired transmission signal were again 910 MHz, but the desired subharmonic were the $50^{th}$ subharmonic, then the frequency of that $50^{th}$ subharmonic would be 18.2000 MHz. This means that the frequencies seen by the filter will be 18.200 MHz apart. Thus, the "Q" will need to be high enough to avoid allowing information from the adjacent frequencies being passed through. The other consideration for the "Q" of the filter is that it must not be so tight that it does not permit the usage of the entire range of desired frequencies.

7.9 Selection of an Amplifier.

An amplifier module 5728 will be needed if the signal is not large enough to be transmitted or if it is needed for some downstream application. This can occur because the amplitude of the resultant harmonic is too small. It may also occur if the filter 5726 has attenuated the signal.

7.10 Design of the Transmission Module.

A transmission module 5730, which is optional, ensures that the output of the filter 5726 and the amplifier module 5728 is able to be transmitted. In the implementation wherein the transmitter is used to broadcast EM signals over the air, the transmission module matches the impedance of the output of the amplifier module 5728 and the input of an antenna 5732. This techniques is well known to those skilled in the relevant art(s). If the signal is to be transmitted over a point-to-point line such as a telephone line (or a fiber optic cable) the transmission module 5730 may be a line driver (or an electrical-to-optical converter for fiber optic implementation).

What is claimed is:

1. An apparatus for communicating, comprising:

a first switch module that receives a first oscillating signal and a first bias signal, wherein said first oscillating signal causes said first switch module to gate said first bias signal and thereby generate a first periodic signal having a first plurality of harmonics, said first periodic signal having an amplitude that is a function of said first bias signal;

a second switch module that receives a second oscillating signal and a second bias signal, wherein said second oscillating signal causes said second switch module to gate said second bias signal and thereby generate a second periodic signal having a second plurality of harmonics, said second periodic signal having an amplitude that is a function of said second bias signal;

a summer coupled to said first switch module and to said second switch module, said summer to receive and combine said first periodic signal and said second periodic signal, and to output a combined periodic signal having a combined plurality of harmonics; and a filter coupled to said summer, said filter to isolate at least one of said combined plurality of harmonics.

2. The apparatus of claim 1, wherein said first oscillating signal and said second oscillating signal have substantially the same frequency and are out of phase with each other by substantially 90°.

3. The apparatus of claim 1, wherein said first oscillating signal is a first modulated oscillating signal and said second oscillating signal is a second modulated oscillating signal;

said first periodic signal is modulated substantially the same as said first modulated oscillating signal, and wherein each of said first plurality of harmonics is modulated substantially the same as said first periodic signal; and said second periodic signal is modulated substantially the same as said second modulated oscillating signal, and wherein each of said second plurality of harmonics is modulated substantially the same as said second periodic signal.

4. An apparatus for frequency up-conversion, comprising:

a switch module that receives an oscillating signal and a bias signal, wherein said oscillating signal causes said switch module to gate said bias signal and thereby generate a periodic signal having a plurality of harmonics, said periodic signal having an amplitude that is a function of said bias signal; and a filter coupled to said switch module to isolate at least one of said plurality of harmonics.

5. The apparatus of claim 4, wherein said oscillating signal is a modulated oscillating signal, wherein said periodic signal is modulated substantially the same as said modulated oscillating signal, and wherein each of said plurality of harmonics is modulated substantially the same as said periodic signal.

6. The apparatus of claim 4, wherein said oscillating signal is a frequency modulated oscillating signal.

7. The apparatus of claim 4, wherein said oscillating signal is a phase modulated oscillating signal.

8. The apparatus of claim 4, wherein said oscillating signal is a modulated oscillating signal wherein said modulated oscillating signal is a function of a first information signal, and wherein said bias signal is a function of a second information signal.

9. A method of communicating, comprising the steps of:

(1) accepting a modulated oscillating signal;

(2) gating a bias signal at a rate that is a function of said modulated oscillating signal to create a periodic signal having a plurality of harmonics, said periodic signal having an amplitude that is a function of said bias signal, said periodic signal being modulated substantially the same as said modulated oscillating signal, and each of said harmonics being modulated substantially the same as said modulated oscillating signal, at least one of said plurality of harmonics being a desired harmonic at a desired frequency.

10. The method of claim 9, further comprising the step of:

(3) isolating said desired harmonic.

11. The method of claim 9, wherein step (1) further comprises:

shaping said modulated oscillating signal to create a string of pulses; and step (2) comprises gating a bias signal at a rate that is a function of said string of pulses to create a periodic signal having a plurality of harmonics, at least one of said plurality of harmonics being a desired harmonic.

12. A method of communicating, comprising the steps of:

(1) gating a reference signal at a rate that is a function of a modulated oscillating signal to create a periodic signal having a plurality of harmonics, said modulated oscillating signal being a function of a first information signal and said reference signal being a function of a second information signal, said periodic signal having an amplitude that is a function of said reference signal, and at least one of said plurality of harmonics being a desired harmonic; and (2) outputting said periodic signal.

13. The method of claim 12, further comprising the step of:

(3) isolating said desired harmonic from said periodic signal.

14. The method of claim 12, wherein step (1) comprises:

(a) shaping a modulated oscillating signal to create a string of pulses, and (b) gating a reference signal with said string of pulses.

15. An apparatus for communicating comprising:

a transmitting subsystem comprising a modulator to accept an information signal and to output a modulated oscillating signal, a switch to output a harmonically rich signal comprised of a plurality of harmonics, said switch controlled by a control signal, said signal being said modulated oscillating signal, said switch having a first input connected to a bias signal at a first potential and a second input connected to a second potential, said harmonically rich signal having an amplitude that is a function of said bias signal, a filter to accept said harmonically rich signal and to output one or more desired harmonics from said plurality of harmonics; and a receiving subsystem.

16. The apparatus of claim 15, wherein said receiving subsystem is a universal frequency down-converter.

17. The apparatus of claim 15, wherein said transmitting subsystem further comprises:

a pulse shaper to accept said modulated oscillating signal and to output a string of modulated pulses, and wherein said string of modulated pulses is said control signal.

18. An apparatus for communicating, comprising:

a first switch module to receive a first oscillating signal and a first bias signal, wherein said first oscillating signal causes said first switch module to gate said first bias signal and thereby generate a first periodic signal having a first plurality of harmonics, said first periodic signal having an amplitude that is a function of said first bias signal, said first bias signal being a function of a first information signal;

a second switch module to receive a second oscillating signal and a second bias signal, wherein said second oscillating signal causes said second switch module to gate said second bias signal and thereby generate a second periodic signal having a second plurality of harmonics, said second periodic signal having an amplitude that is a function of said second bias signal, said second bias signal being a function of a second information signal;

a summer coupled to said first switch module and to said second switch module, said summer to receive and combine said first periodic signal and said second periodic signal, and to output a combined periodic signal having a combined plurality of harmonics; and a filter coupled to said summer, said filter to isolate at least one of said combined plurality of harmonics.

19. The apparatus of claim 18, wherein said first information signal is a first digital information signal, and said second information signal is a second digital information signal, said first digital information signal being comprised of a plurality of discrete states, and said second digital information signal being comprised of a plurality of discrete states.

20. The apparatus of claim 18, wherein said first oscillating signal is a first modulated oscillating signal and said second oscillating signal is a second modulated oscillating signal.

21. An apparatus for frequency up-conversion, comprising:

a pulse shaping module to receive an oscillating signal and to output a shaped string of pulses that is a function of said oscillating signal;

a switch module to receive said shaped string of pulses and a bias signal, wherein said shaped string of pulses causes said switch module to gate said bias signal and thereby generate a periodic signal having a plurality of harmonics, said bias signal being a function of an information signal, said periodic signal having an amplitude that is a function of said bias signal; and a filter coupled to said switch module to isolate one or more desired harmonics of said plurality of harmonics.

22. An apparatus for communicating comprising:
(a) a transmitting subsystem comprising:
(1) a switch module having a first input connected to a bias signal, a control input connected to a control signal, and an output generating a periodic signal, wherein said control signal is an oscillating signal, said control signal causing said switch module to gate said bias signal, said periodic signal having an amplitude that is a function of said bias signal, and said periodic signal being a harmonically rich signal comprised of a plurality of harmonics, and
(2) a filter to accept said harmonically rich signal and to output one or more desired harmonics from said plurality of harmonics; and
(b) a receiving subsystem.

23. The apparatus of claim 22, wherein said transmitting subsystem further comprises:

a pulse shaper to accept said oscillating signal and to output a string of pulses, and wherein said string of pulses causes said switch module to gate said bias signal.

24. The apparatus of claim 22, wherein said receiving subsystem comprises:

an aliasing module, further comprising:
(1) a universal frequency translation (UFT) module, said UFT module aliasing an electromagnetic signal according to an aliasing signal having an aliasing rate to down-convert said electromagnetic signal, and transferring energy from said electromagnetic signal at said aliasing rate;
(2) a signal generator generating said aliasing signal, said aliasing signal comprising a plurality of pulses having non-negligible apertures; and
(3) a storage device storing energy from said UFT module.

25. A method of communicating, comprising the steps of:
(1) shaping an oscillating signal to create a string of pulses that is a function of said oscillating signal;
(2) gating a reference signal at a rate that is a function of said string of pulses to create a periodic signal having a plurality of harmonics, said reference signal being a function of an information signal, and at least one of said plurality of harmonics being a desired harmonic; and
(3) outputting said periodic signal, said periodic signal having an amplitude that is a function of said reference signal.

26. The method of claim 25, further comprising the step of:
(4) isolating said desired harmonic from said periodic signal.

27. The apparatus of claim 1, further comprising:

a first pulse shaping module connected to said first switch module, said first pulse shaping module accepting said first oscillating signal and outputting a first shaped oscillating signal, wherein said first shaped oscillating signal causes said first switch module to gate said first bias signal;

a second pulse shaping module connected to said second switch module, said second pulse shaping module accepting said second oscillating signal and outputting a second shaped oscillating signal, wherein said second shaped oscillating signal causes said second switch module to gate said second bias signal.

28. The apparatus of claim 27, wherein one of said first plurality of harmonics of said first periodic signal is a first desired harmonic, one of said second plurality of harmonics of said second periodic signal is a second desired harmonic, and one of said combined plurality of harmonics of said combined periodic signal is a combined desired harmonic, wherein:

said first shaped oscillating signal has a first control pulse width, said first desired harmonic has a first desired period, the ratio of said first control pulse width to said first desired period is a first shaping ratio, and said first pulse shaping module shapes said first oscillating signal by regulating said first control pulse width so that said first shaping ratio is substantially equal to or less than one-half of "m(1)", where "m(1)" is any integer; and said second shaped oscillating signal has a second control pulse width, said second desired harmonic has a second desired period, the ratio of said second control pulse width to said second desired period is a second shaping ratio, and said second pulse shaping module shapes said second oscillating signal by regulating said second control pulse width so that said second shaping ratio is substantially equal to or less than one-half of "m(2)", where "m(2)" is any integer.

29. The apparatus of claim 28, wherein said first shaping ratio is substantially equal to or less than 0.5.

30. The apparatus of claim 28, wherein said second shaping ratio is substantially equal to or less than 0.5.

31. The apparatus of claim 28, wherein said second shaping ratio is substantially equal to said first shaping ratio.

32. The apparatus of claim 28, wherein said first shaping ratio is greater than 0.5.

33. The apparatus of claim 28, wherein said second shaping ratio is greater than 0.5.

34. The apparatus of claim 27, wherein one of said first plurality of harmonics of said first periodic signal is a desired harmonic, wherein:

said first shaped oscillating signal has a control pulse width, said desired harmonic has a desired period, the ratio of said control pulse width to said desired period is a shaping ratio, and said first pulse shaping module shapes said first oscillating signal by regulating said control pulse width so that said shaping ratio is substantially equal to or less than one-half of "m(1)", where "m(1)" is any integer.

35. The apparatus of claim 34, wherein said shaping ratio is substantially equal to or less than 0.5.

36. The apparatus of claim 35, wherein one of said second plurality of harmonics of said second periodic signal is a second desired harmonic, wherein:

said second shaped oscillating signal has a second control pulse width, said second desired harmonic has a second desired period, the ratio of said second control pulse width to said second desired period is a second shaping ratio;

said second pulse shaping module shapes said second oscillating signal by regulating said second control pulse width so that said second shaping ratio is substantially equal to or less than one-half of "m(2)", where "m(2)" is any integer; and wherein said second desired period is substantially equal to said desired period.

37. The apparatus of claim 36, wherein said second shaping ratio is substantially equal to or less than 0.5.

38. The apparatus of claim 27, wherein one of said combined plurality of harmonics of said combined periodic signal is a combined desired harmonic, wherein:

said first shaped oscillating signal has a first control pulse width, said combined desired harmonic has a combined desired period, the ratio of said first control pulse width to said combined desired period is a first shaping ratio, and said first pulse shaping module shapes said first oscillating signal by regulating said first control pulse width so that said first shaping ratio is substantially equal to or less than one-half of "m(1)", where "m(1)" is any integer; and said second shaped oscillating signal has a second control pulse width, the ratio of said second control pulse width to said combined desired period is a second shaping ratio, and said second pulse shaping module shapes said second oscillating signal by regulating said second control pulse width so that said second shaping ratio is substantially equal to or less than one-half of "m(2)", where "m(2)" is any integer.

39. The apparatus of claim 38, wherein said first shaping ratio is substantially equal to or less than 0.5.

40. The apparatus of claim 38, wherein said second shaping ratio is substantially equal to or less than 0.5.

41. The apparatus of claim 38, wherein said second shaping ratio is substantially equal to said first shaping ratio.

42. The apparatus of claim 27, wherein one of said first plurality of harmonics of said first periodic signal is a first desired harmonic, one of said second plurality of harmonics of said second periodic signal is a second desired harmonic, and one of said combined plurality of harmonics of said combined periodic signal is a combined desired harmonic, wherein:

said first shaped oscillating signal has a first control frequency, a first control pulse width, and a first control period, said first control period being the inverse of said first control frequency, said first desired harmonic has a first desired frequency and a first desired period, said first desired period being the inverse of said first desired frequency; wherein said first desired frequency is substantially equal to "n(1)" times said first control frequency, where "n(1)" is a first desired integer, the ratio of said first control pulse width to said first control period is a first control ratio, and said first pulse shaping module shapes said first oscillating signal by regulating said first control pulse width so that said first control ratio is substantially equal to or less than one-half of "m(1)" divided by "n(1)", where "m(1)" is any integer;

said second shaped oscillating signal has a second control frequency, a second control pulse width, and a second control period, said second control period being the inverse of said second control frequency, said second desired harmonic has a second desired frequency and a second desired period, said second desired period being the inverse of said second desired frequency; wherein said second desired frequency is substantially equal to "n(2)" times said second control frequency, where "n(2)" is a second desired integer, the ratio of said second control pulse width to said second control period is a second control ratio, and said second pulse shaping module shapes said second oscillating signal by regulating said second control pulse width so that said second control ratio is substantially equal to or less than one-half of "m(2)" divided by "n(2)", where "m(2)" is any integer.

43. The apparatus of claim 42, wherein said first control ratio is substantially equal to or less than 0.5.

44. The apparatus of claim 42, wherein said second control ratio is substantially equal to or less than 0.5.

45. The apparatus of claim 42, wherein said first control ratio is substantially equal to or less than 0.1.

46. The apparatus of claim 42, wherein said second control ratio is substantially equal to or less than 0.1.

47. The apparatus of claim 42, wherein said first control ratio is substantially equal to or less than 0.05.

48. The apparatus of claim 42, wherein said second control ratio is substantially equal to or less than 0.05.

49. The apparatus of claim 42, wherein said first control ratio is substantially equal to or less than 0.01.

50. The apparatus of claim 42, wherein said second control ratio is substantially equal to or less than 0.01.

51. The apparatus of claim 42, wherein said second control ratio is substantially equal to said first control ratio.

52. The apparatus of claim 42, wherein said first control ratio is greater than 0.5.

53. The apparatus of claim 42, wherein said second control ratio is greater than 0.5.

54. The apparatus of claim 27, wherein one of said first plurality of harmonics of said first periodic signal is a desired harmonic, wherein:

said first shaped oscillating signal has a control frequency, a control pulse width, and a control period, said control period being the inverse of said control frequency, said desired harmonic has a desired frequency and a desired period, said desired period being the inverse of said desired frequency; wherein said desired frequency is substantially equal to "n(1)" times said control frequency, where "n(1)" is a desired integer, the ratio of said control pulse width to said control period is a control ratio, and said first pulse shaping module shapes said first oscillating signal by regulating said control pulse width so that said control ratio is substantially equal to or less than one-half of "m(1)" divided by "n(1)", where "m(1)" is any integer.

55. The apparatus of claim 54, wherein said control ratio is substantially equal to or less than 0.5.

56. The apparatus of claim 54, wherein said control ratio is substantially equal to or less than 0.1.

57. The apparatus of claim 54, wherein said control ratio is substantially equal to or less than 0.05.

58. The apparatus of claim 54, wherein said control ratio is substantially equal to or less than 0.01.

59. The apparatus of claim 54, wherein one of said second plurality of harmonics of said second periodic signal is a second desired harmonic, wherein:

said second shaped oscillating signal has a second control frequency, a second control pulse width, and a second control period, said second control period being the inverse of said second control frequency, said second desired harmonic has a second desired frequency and a second desired period, said second desired period being the inverse of said second desired frequency; wherein said second desired frequency is substantially equal to "n(2)" times said second control frequency, where "n(2)" is a second desired integer, the ratio of said second control pulse width to said second control period is a second control ratio, and said second pulse shaping module shapes said second oscillating signal by regulating said second control pulse width so that said second control ratio is substantially equal to or less than one-half of "m(2)" divided by "n(2)", where "m(2)" is any integer; and wherein said second desired frequency is substantially equal to said desired frequency.

60. The apparatus of claim 59, wherein said second control ratio is substantially equal to or less than 0.5.

61. The apparatus of claim 59, wherein said second control ratio is substantially equal to or less than 0.1.

62. The apparatus of claim 59, wherein said second control ratio is substantially equal to or less than 0.05.

63. The apparatus of claim 59, wherein said second control ratio is substantially equal to or less than 0.01.

64. The apparatus of claim 27, wherein one of said combined plurality of harmonics of said combined periodic signal is a combined desired harmonic, wherein:

said first shaped oscillating signal has a first control frequency, a first control pulse width, and a first control period, said first control period being the inverse of said first control frequency, said combined desired harmonic has a combined desired frequency and a combined desired period, said combined desired period being the inverse of said combined desired frequency; wherein said combined desired frequency is substantially equal to "n(1)" times said first control frequency, where "n(1)" is a first combined desired integer, the ratio of said first control pulse width to said first control period is a first control ratio, and said first pulse shaping module shapes said first oscillating signal by regulating said first control pulse width so that said first control ratio is substantially equal to or less than one-half of "m(1)" divided by "n(1)", where "m(1)" is any integer;

said second shaped oscillating signal has a second control frequency, a second control pulse width, and a second control period, said second control period being the inverse of said second control frequency; wherein combined desired frequency is substantially equal to "n(2)" times said second control frequency, where "n(2)" is a second combined desired integer, the ratio of said second control pulse width to said second control period is a second control ratio; and said second pulse shaping module shapes said second oscillating signal by regulating said second control pulse width so that said second control ratio is substantially equal to or less than one-half of "m(2)" divided by "n(2)", where "m(2)" is any integer.

65. The apparatus of claim 64, wherein said first control ratio is substantially equal to or less than 0.5.

66. The apparatus of claim 64, wherein said second control ratio is substantially equal to or less than 0.5.

67. The apparatus of claim 64, wherein said first control ratio is substantially equal to or less than 0.1.

68. The apparatus of claim 64, wherein said second control ratio is substantially equal to or less than 0.1.

69. The apparatus of claim 64, wherein said first control ratio is substantially equal to or less than 0.05.

70. The apparatus of claim 64, wherein said second control ratio is substantially equal to or less than 0.05.

71. The apparatus of claim 64, wherein said first control ratio is substantially equal to or less than 0.01.

72. The apparatus of claim 64, wherein said second control ratio is substantially equal to or less than 0.01.

73. The apparatus of claim 64, wherein said second control ratio is substantially equal to said first control ratio.

74. The apparatus of claim 1, wherein said first oscillating signal is modulated with a digital information signal.

75. The apparatus of claim 1, wherein said second oscillating signal is modulated with a digital information signal.

76. The apparatus of claim 1, wherein said first oscillating signal is modulated with an analog information signal.

77. The apparatus of claim 1, wherein said second oscillating signal is modulated with an analog information signal.

78. The apparatus of claim 1, wherein said first oscillating signal is a phase modulated oscillating signal.

79. The apparatus of claim 1, wherein said second oscillating signal is a phase modulated oscillating signal.

80. The apparatus of claim 1, wherein said first switch module is a electromechanical device.

81. The apparatus of claim 1, wherein said first switch module is a electronic device.

82. The apparatus of claim 81, wherein said electronic device is a semiconductor device.

83. The apparatus of claim 82, wherein said semiconductor device is a transistor.

84. The apparatus of claim 83, wherein said transistor is a field effect transistor.

85. The apparatus of claim 84, wherein said field effect transistor is a gallium arsenide field effect transistor.

86. The apparatus of claim 84, wherein said field effect transistor is a complementary metal oxide semiconductor field effect transistor.

87. The apparatus of claim 1, wherein said second switch module is a electromechanical device.

88. The apparatus of claim 1, wherein said second switch module is a electronic device.

89. The apparatus of claim 88, wherein said electronic device is a semiconductor device.

90. The apparatus of claim 89, wherein said semiconductor device is a transistor.

91. The apparatus of claim 90, wherein said transistor is a field effect transistor.

92. The apparatus of claim 91, wherein said field effect transistor is a gallium arsenide field effect transistor.

93. The apparatus of claim 91, wherein said field effect transistor is a complementary metal oxide semiconductor field effect transistor.

94. The apparatus of claim 1, wherein said first plurality of harmonics are harmonics of the fundamental frequency of said first periodic signal and said second plurality of harmonics are harmonics of the fundamental frequency of said second periodic signal.

95. The apparatus of claim 1, wherein:

said first switch module accepts a first control signal, said first control signal being a function of said first oscillating signal, wherein said first control signal causes said first switch module to gate said first bias signal, said first control signal having a first control frequency, "F(control);"

said second switch module accepts a second control signal, said second control signal being a function of said second oscillating signal, wherein said second control signal causes said second switch module to gate said second bias signal, said second control signal having a second control frequency substantially equal to said first control frequency, "F(control);"

wherein said combined periodic signal has a combined periodic signal pulse width, "PW(periodic signal, combined)," and a combined periodic signal amplitude, "A(periodic signal,combined);" wherein one of said combined plurality of harmonics is a desired harmonic, said desired harmonic having a desired frequency, "F(desired)," and a desired amplitude, "A(desired);"

whereby the ratio of "A(desired)" to "A(periodic signal, combined)" is substantially equal to:

$$\{[2 \cdot F(control)]/[\pi \cdot F(desired)]\} \cdot \{\sin[\pi \cdot F(desired) \cdot PW(periodic\ signal, combined)]\}.$$

96. The apparatus of claim 1, wherein:

said first switch module accepts a first control signal, said first control signal being a function of said first oscillating signal, wherein said first control signal causes said first switch module to gate said first bias signal, said first control signal having a first control frequency, said first control frequency being a gating frequency, "F(gating)," a first control period, said first control period being a gating period, "T(gating)," and a first control pulse width, "PW(control, 1)," said first control period being the inverse of said first control frequency;

said second switch module accepts a second control signal, said second control signal being a function of said second oscillating signal, wherein said second control signal causes said second switch module to gate said second bias signal, said second control signal having a second control frequency substantially equal to said gating frequency, "F(gating)," a second control period substantially equal to said gating period, "T(gating)," and a second control pulse width, "PW (control,2)," said second control period being the inverse of said second control frequency;

wherein said combined periodic signal has a combined periodic signal frequency, "F(periodic signal, combined)," a combined periodic signal period, "T(periodic signal,combined)," a combined periodic signal pulse width, "PW(periodic signal,combined)," and a combined periodic signal amplitude, "A(periodic signal,combined)," said combined periodic signal period being the inverse of said combined periodic signal frequency;

wherein one of said combined plurality of harmonics is a desired harmonic, said desired harmonic having a desired frequency, "F(desired)," a desired period, "T(desired)," and a desired amplitude, "A(desired)," said desired period being the inverse of said desired frequency; wherein said desired frequency is substantially equal to "n" times said gating frequency, where "n" is a desired integer, wherein the ratio of said desired amplitude to said combined periodic signal amplitude is an amplitude ratio, "AR;"

whereby:

$$AR = [2/(\pi \cdot n)] \cdot \sin\{\pi \cdot n \cdot [PW(periodic\ signal, combined)/T(gating)]\}.$$

97. The apparatus of claim 1, wherein said filter is centered at a frequency other than the frequency of said first oscillating signal or said second oscillating signal.

98. The apparatus of claim 1, wherein said first plurality of harmonics has a first harmonic content, and wherein the characteristics of said first switch module determine said first harmonic content; and said second plurality of harmonics has a second harmonic content, and wherein the characteristics of said second switch module determine said second harmonic content.

99. The apparatus of claim 1, wherein said first oscillating signal is a first modulated oscillating signal and said second oscillating signal is a second modulated oscillating signal;

said first plurality of harmonics has a first harmonic content, and wherein the characteristics of said first switch module determine said first harmonic content;

said second plurality of harmonics has a second harmonic content, and wherein the characteristics of said second switch module determine said second harmonic content; and said filter is centered at a frequency other than the frequency of said first oscillating signal or said second oscillating signal.

100. The apparatus of claim 4, further comprising a pulse shaping module connected to said switch module, said pulse shaping module accepting said oscillating signal and outputting a shaped oscillating signal, wherein said shaped oscillating signal causes said switch module to gate said bias signal.

101. The apparatus of claim 100, wherein one of said plurality of harmonics of said periodic signal is a desired harmonic, wherein:

said shaped oscillating signal has a control pulse width, said desired harmonic has a desired period, the ratio of said control pulse width to said desired period is a shaping ratio, and said pulse shaping module shapes said oscillating signal by regulating said control pulse width so that said shaping ratio is substantially equal to or less than one-half of "m", where "m" is any integer.

102. The apparatus of claim 101, wherein said shaping ratio is substantially equal to or less than 0.5.

103. The apparatus of claim 101, wherein said shaping ratio is greater than 0.5.

104. The apparatus of claim 100, wherein one of said plurality of harmonics of said periodic signal is a desired harmonic, wherein:

said shaped oscillating signal has a control frequency, a control pulse width, and a control period, said control period being the inverse of said control frequency, said desired harmonic has a desired frequency and a desired period, said desired period being the inverse of said desired frequency; wherein said desired frequency is substantially equal to "n" times said control frequency, where "n" is a desired integer, the ratio of said control pulse width to said control period is a control ratio, and said pulse shaping module shapes said oscillating signal by regulating said control pulse width so that said control ratio is substantially equal to or less than one-half of "m" divided by "n", where "m" is any integer.

105. The apparatus of claim 104, wherein said control ratio is substantially equal to or less than 0.5.

106. The apparatus of claim 104, wherein said control ratio is substantially equal to or less than 0.1.

107. The apparatus of claim 104, wherein said control ratio is substantially equal to or less than 0.05.

108. The apparatus of claim 104, wherein said control ratio is substantially equal to or less than 0.01.

109. The apparatus of claim 104, wherein said control ratio is greater than 0.5.

110. The apparatus of claim 4, wherein said oscillating signal is a digital information signal.

111. The apparatus of claim 4, wherein said oscillating signal is a analog information signal.

112. The apparatus of claim 4, wherein said switch module is an electromechanical device.

113. The apparatus of claim 4, wherein said switch module is an electronic device.

114. The apparatus of claim 113, wherein said electronic device is a semiconductor device.

115. The apparatus of claim 114, wherein semiconductor device is a transistor.

116. The apparatus of claim 115, wherein said transistor is a field effect transistor.

117. The apparatus of claim 116, wherein said field effect transistor is a gallium arsenide field effect transistor.

118. The apparatus of claim 116, wherein said field effect transistor is a complementary metal oxide semiconductor field effect transistor.

119. The apparatus of claim 4, wherein said plurality of harmonics are harmonics of the fundamental frequency of said periodic signal.

120. The apparatus of claim 4, wherein:

said switch module accepts a control signal, said control signal being a function of said oscillating signal, wherein said control signal causes said switch module to gate said bias signal, said control signal having a control frequency, "F(control);" wherein said periodic signal has a periodic signal pulse width, "PW(periodic signal)," and a periodic signal amplitude, "A(periodic signal)," said periodic signal amplitude being a function of said bias signal; wherein one of said plurality of harmonics is a desired harmonic, said desired harmonic having a desired frequency, "F(desired)," and a desired amplitude, "A(desired);"

whereby the ratio of "A(desired)" to "A(periodic signal)" is substantially equal to:

$$\{[2 \cdot F(control)]/[\pi \cdot F(desired)]\} \cdot \{\sin[\pi \cdot (desired) \cdot PW(periodic signal)]\}.$$

121. The apparatus of claim 4, wherein:

said switch module accepts a control signal, said control signal being a function of said oscillating signal, wherein said control signal causes said switch module to gate said bias signal, said control signal having a control frequency, "F(control)," a control period, "T(control)," and a control pulse width, "PW(control)," said control period being the inverse of said control frequency; wherein said periodic signal has a periodic signal frequency, "F(periodic signal)," a periodic signal period, "T(periodic signal)," a periodic signal pulse width, "PW(periodic signal)," and a periodic signal amplitude, "A(periodic signal)," said periodic signal period being the inverse of said periodic signal frequency and said periodic signal amplitude being a function of said bias signal; wherein one of said plurality of harmonics is a desired harmonic, said desired harmonic having a desired frequency, "F(desired)," a desired period, "T(desired)," and a desired amplitude, "A(desired)," said desired period being the inverse of said desired frequency; wherein said desired frequency is substantially equal to "n" times said control frequency, where "n" is a desired integer, wherein the ratio of said desired amplitude to said periodic signal amplitude is an amplitude ratio, "AR;"

whereby:

$$AR=[2/(\pi \cdot n)]\sin\{\pi \cdot n \cdot [PW(periodic signal)/T(control)]\}.$$

122. The apparatus of claim 4, wherein said filter is centered at a frequency other than the frequency of said oscillating signal.

123. The apparatus of claim 4, wherein said plurality of harmonics has a harmonic content, and wherein the characteristics of said switch module determine said harmonic content.

124. The apparatus of claim 4, wherein said oscillating signal is a modulated oscillating signal;

said plurality of harmonics has a harmonic content, and wherein the characteristics of said switch module determine said harmonic content; and said filter is centered at a frequency other than the frequency of said oscillating signal.

125. The method of claim 11, wherein said string of pulses has a control pulse width, wherein said desired harmonic has a desired period, wherein the ratio of the control pulse width to the desired period is a shaping ratio, and wherein said shaping step further comprises the step of:

regulating the control pulse width so that the shaping ratio is substantially equal to or less than one-half of "m", where "m" is any integer.

126. The method of claim 125, wherein the regulating step comprises:

regulating the control pulse width so that the shaping ratio is substantially equal to or less than 0.5.

127. The method of claim 125, wherein said shaping ratio is greater than 0.5.

128. The method of claim 11, wherein said string of pulses has a control frequency, a control pulse width, and a control period, said control period being the inverse of said control frequency; wherein said desired harmonic has a desired frequency and a desired period, said desired period being the inverse of said desired frequency; wherein said desired frequency is substantially equal to "n" times said control frequency, where "n" is a desired integer; wherein the ratio of said control pulse width to said control period is a control ratio; and wherein said shaping step further comprises the step of:

regulating the control pulse width so that the control ratio is substantially equal to or less than one-half of "m" divided by "n", where "m" is any integer.

129. The method of claim 128, wherein the regulating step comprises:

regulating the control pulse width so that the control ratio is substantially equal to or less than 0.5.

130. The method of claim 128, wherein the regulating step comprises:

regulating the control pulse width so that the control ratio is substantially equal to or less than 0.1.

131. The method of claim 128, wherein the regulating step comprises:

regulating the control pulse width so that the control ratio is substantially equal to or less than 0.01.

132. The method of claim 128, wherein said control ratio is greater than 0.5.

133. The method of claim 9, wherein step (1) comprises:

accepting a modulated oscillating signal, said modulated oscillating signal being a frequency modulated oscillating signal.

134. The method of claim 9, wherein step (1) comprises:

accepting a modulated oscillating signal, said modulated oscillating signal being a phase modulated oscillating signal.

135. The method of claim 9, wherein step (1) comprises:

accepting a modulated oscillating signal, wherein said modulated oscillating signal is modulated with a digital information signal.

136. The method of claim 9, wherein step (1) comprises:

accepting a modulated oscillating signal, wherein said modulated oscillating signal is modulated with an analog information signal.

137. The method of claim 9, wherein said gating step is performed by an electromechanical device.

138. The method of claim 9, wherein said gating step is performed by an electronic device.

139. The method of claim 138, wherein said electronic device is a semiconductor device.

140. The method of claim 139, wherein said semiconductor device is a transistor.

141. The method of claim 140, wherein said transistor is a field effect transistor.

142. The method of claim 141, wherein said field effect transistor is a gallium arsenide field effect transistor.

143. The method of claim 141, wherein said field effect transistor is a complementary metal oxide semiconductor field effect transistor.

144. The method of claim 9, wherein said plurality of harmonics are harmonics of the fundamental frequency of said periodic signal.

145. The method of claim 9, wherein:

said bias signal is gated at a rate that is a function of a control signal, said control signal being a function of said modulated oscillating signal, said control signal having a control frequency, "F(control);" wherein said periodic signal has a periodic signal pulse width, "PW(periodic signal)," and a periodic signal amplitude, "A(periodic signal)," said periodic signal amplitude being a function of said bias signal; wherein said desired harmonic has a desired frequency, "F(desired)," and a desired amplitude, "A(desired);"

whereby the ratio of "A(desired)" to "A(periodic signal)" is substantially equal to:

$$\{[2 \cdot F(control)]/[\pi \cdot F(desired)]\} \cdot \{\sin[\pi \cdot F(desired) \cdot PW(periodic\ signal)]\}.$$

146. The method of claim 9, wherein:

said bias signal is gated at a rate that is a function of a control signal, said control signal being a function of said modulated oscillating signal, said control signal having a control frequency, "F(control)," a control period, "T(control)," and a control pulse width, "PW(control)," said control period being the inverse of said control frequency; wherein said periodic signal has a periodic signal frequency, "F(periodic signal)," a periodic signal period, "T(periodic signal)," a periodic signal pulse width, "PW(periodic signal)," and a periodic signal amplitude, "A(periodic signal)," said periodic signal period being the inverse of said periodic signal frequency and said periodic signal amplitude being a function of said bias signal; wherein said desired harmonic has a desired frequency, "F(desired)," a desired period, "T(desired)," and a desired amplitude, "A(desired)," said desired period being the inverse of said desired frequency; wherein said desired frequency is substantially equal to "n" times said control frequency, where "n" is a desired integer, wherein the ratio of said desired amplitude to said periodic signal amplitude is an amplitude ratio, "AR;"

whereby:

$$AR=[2/(\pi \cdot n)] \cdot \sin\{\pi \cdot n \cdot [PW(periodic\ signal)/T(control)]\}.$$

147. The method of claim 9, further comprising the step of filtering said periodic signal with a filter, said filter being centered at a frequency other than the frequency of said modulated oscillating signal.

148. The method of claim 9, wherein said plurality of harmonics has a harmonic content, and wherein the characteristics of said gating determine said harmonic content.

149. The method of claim 9, wherein said plurality of harmonics has a harmonic content, and wherein the characteristics of said gating determine said harmonic content; and further comprising the step of filtering said periodic signal with a filter, said filter being centered at a frequency other than the frequency of said modulated oscillating signal.

150. The method of claim 14, wherein said string of pulses has a control pulse width, wherein said desired harmonic has a desired period, wherein the ratio of the control pulse width to the desired period is a shaping ratio, and wherein step (1)(a) further comprises the step of:

regulating the control pulse width so that the shaping ratio is substantially equal to or less than one-half of "m", where "m" is any integer.

151. The method of claim 150, wherein the regulating step comprises:

regulating the control pulse width so that the shaping ratio is substantially equal to or less than 0.5.

152. The method of claim 150, wherein said shaping ratio is greater than 0.5.

153. The method of claim 14, wherein said string of pulses has a control frequency, a control pulse width, and a control period, said control period being the inverse of said control frequency; wherein said desired harmonic has a desired frequency and a desired period, said desired period being the inverse of said desired frequency; wherein said desired frequency is substantially equal to "n" times said control frequency, where "n" is a desired integer; wherein the ratio of said control pulse width to said control period is a control ratio; and wherein step (1)(a) further comprises the step of:

regulating the control pulse width so that the control ratio is substantially equal to or less than one-half of "m" divided by "n", where "m" is any integer.

154. The method of claim 153, wherein the regulating step comprises:
  regulating the control pulse width so that the control ratio is substantially equal to or less than 0.5.
155. The method of claim 153, wherein the regulating step comprises:
  regulating the control pulse width so that the control ratio is substantially equal to or less than 0.1.
156. The method of claim 153, wherein the regulating step comprises:
  regulating the control pulse width so that the control ratio is substantially equal to or less than 0.05.
157. The method of claim 153, wherein the regulating step comprises:
  regulating the control pulse width so that the control ratio is substantially equal to or less than 0.01.
158. The method of claim 153, wherein said control ratio is greater than 0.5.
159. The method of claim 12, wherein step (1) comprises:
  gating a reference signal at a rate that is a function of a frequency modulated oscillating signal to create a periodic signal having a plurality of harmonics, said frequency modulated oscillating signal being a function of a first information signal and said reference signal being a function of a second information signal, and at least one of said plurality of harmonics being a desired harmonic.
160. The method of claim 12, wherein step (1) comprises:
  gating a reference signal at a rate that is a function of a phase modulated oscillating signal to create a periodic signal having a plurality of harmonics, said phase modulated oscillating signal being a function of a first information signal and said reference signal being a function of a second information signal, and at least one of said plurality of harmonics being a desired harmonic.
161. The method of claim 12, wherein step (1) comprises:
  gating a reference signal at a rate that is a function of a modulated oscillating signal to create a periodic signal having a plurality of harmonics, said modulated oscillating signal being a function of a first information signal, said first information signal being a digital information signal and said reference signal being a function of a second information signal, and at least one of said plurality of harmonics being a desired harmonic.
162. The method of claim 12, wherein step (1) comprises:
  gating a reference signal at a rate that is a function of a modulated oscillating signal to create a periodic signal having a plurality of harmonics, said modulated oscillating signal being a function of a first information signal, said first information signal being an analog information signal and said reference signal being a function of a second information signal, and at least one of said plurality of harmonics being a desired harmonic.
163. The method of claim 12, wherein said gating step is performed by an electromechanical device.
164. The method of claim 12, wherein said gating step is performed by an electronic device.
165. The method of claim 164, wherein said electronic device is a semiconductor device.
166. The method of claim 165, wherein said semiconductor device is a transistor.
167. The method of claim 166, wherein said transistor is a field effect transistor.
168. The method of claim 167, wherein said field effect transistor is a gallium arsenide field effect transistor.
169. The method of claim 167, wherein said field effect transistor is a complementary metal oxide semiconductor field effect transistor.
170. The method of claim 12, wherein said plurality of harmonics are harmonics of the fundamental frequency of said periodic signal.
171. The method of claim 12, wherein:
  said reference signal is gated at a rate that is a function of a control signal, said control signal being a function of said modulated oscillating signal, said control signal having a control frequency, "F(control);" wherein said periodic signal has a periodic signal pulse width, "PW (periodic signal)," and a periodic signal amplitude, "A(periodic signal)," said periodic signal amplitude being a function of said reference signal; wherein said desired harmonic has a desired frequency, "F(desired)," and a desired amplitude, "A(desired);"
  whereby the ratio of "A(desired)" to "A(periodic signal)" is substantially equal to:
  $\{[2 \cdot F(control)]/[\pi \cdot F(desired)]\} \cdot \{\sin[\pi \cdot F(desired) \cdot PW(periodic\ signal)]\}$.
172. The method of claim 12, wherein:
  said reference signal is gated at a rate that is a function of a control signal, said control signal being a function of said modulated oscillating signal, said control signal having a control frequency, "F(control)," a control period, "T(control)," and a control pulse width, "PW (control)," said control period being the inverse of said control frequency; wherein said periodic signal has a periodic signal frequency, "F(periodic signal)," a periodic signal period, "T(periodic signal)," a periodic signal pulse width, "PW(periodic signal)," and a periodic signal amplitude, "A(periodic signal)," said periodic signal period being the inverse of said periodic signal frequency and said periodic signal amplitude being a function of said reference signal; wherein said desired harmonic has a desired frequency, "F(desired)," a desired period, "T(desired)," and a desired amplitude, "A(desired)," said desired period being the inverse of said desired frequency; wherein said desired frequency is substantially equal to "n" times said control frequency, where "n" is a desired integer, wherein the ratio of said desired amplitude to said periodic signal amplitude is an amplitude ratio, "AR;"
  whereby:

$AR=[2/(\pi \cdot n)] \cdot \sin\{\pi \cdot n \cdot [PW(periodic\ signal)/T(control)]\}$.

173. The method of claim 12, further comprising the step of filtering said periodic signal with a filter, said filter being centered at a frequency other than the frequency of said modulated oscillating signal.
174. The method of claim 12, wherein
  said plurality of harmonics has a harmonic content, and wherein the characteristics of said gating determine said harmonic content.
175. The method of claim 12, wherein
  said plurality of harmonics has a harmonic content, and wherein the characteristics of said gating determine said harmonic content; and
  further comprising the step of filtering said periodic signal with a filter, said filter being centered at a frequency other than the frequency of said modulated oscillating signal.

176. The apparatus of claim 17, wherein one of said one or more desired harmonics is a preferred harmonic, wherein:
said string of modulated pulses has a control pulse width, said preferred harmonic has a preferred period, the ratio of said control pulse width to said preferred period is a shaping ratio, and
said pulse shaper shapes said string of modulated pulses by regulating said control pulse width so that said shaping ratio is substantially equal to or less than one-half of "m", where "m" is any integer.

177. The apparatus of claim 176, wherein said shaping ratio is substantially equal to or less than 0.5.

178. The apparatus of claim 176, wherein said shaping ratio is greater than 0.5.

179. The apparatus of claim 17, wherein one of said one or more desired harmonics is a preferred harmonic, wherein:
said string of modulated pulses has a control frequency, a control pulse width, and a control period, said control period being the inverse of said control frequency, said preferred harmonic has a preferred frequency and a preferred period, said preferred period being the inverse of said preferred frequency; wherein said preferred frequency is substantially equal to "n" times said control frequency, where "n" is a desired integer, the ratio of said control pulse width to said control period is a control ratio, and
said pulse shaper shapes said string of modulated pulses by regulating said control pulse width so that said control ratio is substantially equal to or less than one-half of "m" divided by "n", where "m" is any integer.

180. The apparatus of claim 179, wherein said control ratio is substantially equal to or less than 0.5.

181. The apparatus of claim 179, wherein said control ratio is substantially equal to or less than 0.1.

182. The apparatus of claim 179, wherein said control ratio is substantially equal to or less than 0.05.

183. The apparatus of claim 179, wherein said control ratio is substantially equal to or less than 0.01.

184. The apparatus of claim 179, wherein said control ratio is greater than 0.5.

185. The apparatus of claim 15, wherein said modulated oscillating signal is a modulated digital information signal.

186. The apparatus of claim 15, wherein said modulated oscillating signal is a modulated analog information signal.

187. The apparatus of claim 15, wherein said modulator is a frequency modulator.

188. The apparatus of claim 15, wherein said modulator is a phase modulator.

189. The apparatus of claim 15, wherein said switch module is an electromechanical device.

190. The apparatus of claim 15, wherein said switch module is an electronic device.

191. The apparatus of claim 190, wherein said electronic device is a semiconductor device.

192. The apparatus of claim 191, wherein semiconductor device is a transistor.

193. The apparatus of claim 192, wherein said transistor is a field effect transistor.

194. The apparatus of claim 193, wherein said field effect transistor is a gallium arsenide field effect transistor.

195. The apparatus of claim 193, wherein said field effect transistor is a complementary metal oxide semiconductor field effect transistor.

196. The apparatus of claim 15, wherein said plurality of harmonics are harmonics of the fundamental frequency of said harmonically rich signal.

197. The apparatus of claim 15, wherein:
said switch accepts a control signal, said control signal being a function of said modulated oscillating signal, wherein said control signal causes said switch to gate said bias signal, said control signal having a control frequency, "F(control);" wherein said harmonically rich (HR) signal has an HR signal pulse width, "PW (HR signal)," and an HR signal amplitude, "A(HR signal)," said HR signal amplitude being a function of said bias signal; wherein one of said one or more harmonics is a preferred harmonic, said preferred harmonic having a preferred frequency, "F(preferred)," and a preferred amplitude, "A(preferred);"
whereby the ratio of "A(preferred)" to "A(HR signal)" is substantially equal to:

$$\{[2 \cdot F(control)]/[\pi \cdot F(preferred)]\} \cdot \{\sin[\pi \cdot F(preferred) \cdot PW(HR\ signal)]\}.$$

198. The apparatus of claim 15, wherein:
said switch accepts a control signal, said control signal being a function of said modulated oscillating signal, wherein said control signal causes said switch to gate said bias signal, said control signal having a control frequency, "F(control)," a control period, "T(control)," and a control pulse width, "PW(control)," said control period being the inverse of said control frequency; wherein said harmonically rich (HR) signal has an HR signal frequency, "F(HR signal)," an HR signal period, "T(HR signal)," an HR signal pulse width, "PW(HR signal)," and an HR signal amplitude, "A(HR signal)," said HR signal period being the inverse of said HR signal frequency and said HR signal amplitude being a function of said bias signal; wherein one of said one or more harmonics is a preferred harmonic, said preferred harmonic having a preferred frequency, "F(preferred)," a preferred period, "T(preferred)," and a preferred amplitude, "A(preferred)," said preferred period being the inverse of said preferred frequency; wherein said preferred frequency is substantially equal to "n" times said control frequency, where "n" is a preferred integer, wherein the ratio of said preferred amplitude to said HR signal amplitude is an amplitude ratio, "AR;"
whereby:

$$AR=[2/(\pi \cdot n)] \cdot \sin\{\pi \cdot n \cdot [PW(HR\ signal)/T(control)]\}.$$

199. The apparatus of claim 15, wherein said filter is centered at a frequency other than the frequency of said modulated oscillating signal.

200. The apparatus of claim 15, wherein
said plurality of harmonics has a harmonic content, and wherein the characteristics of said switch determine said harmonic content.

201. The apparatus of claim 15, wherein
said harmonically rich signal has an amplitude that is a function of said bias signal.

202. The apparatus of claim 15, wherein
said harmonically rich signal has an amplitude that is a function of said bias signal;
said plurality of harmonics has a harmonic content, and wherein the characteristics of said switch determine said harmonic content; and
said filter is centered at a frequency other than the frequency of said modulated oscillating signal.

203. The apparatus of claim 18, further comprising:
a first pulse shaping module connected to said first switch module, said first pulse shaping module accepting said first oscillating signal and outputting a first shaped oscillating signal;

a second pulse shaping module connected to said second switch module, said second pulse shaping module accepting said second oscillating signal and outputting a second shaped oscillating signal.

204. The apparatus of claim 203, wherein one of said first plurality of harmonics of said first periodic signal is a first desired harmonic, one of said second plurality of harmonics of said second periodic signal is a second desired harmonic, and one of said combined plurality of harmonics of said combined periodic signal is a combined desired harmonic, wherein:

said first shaped oscillating signal has a first control pulse width, said first desired harmonic has a first desired period, the ratio of said first control pulse width to said first desired period is a first shaping ratio, and said first pulse shaping module shapes said first oscillating signal by regulating said first control pulse width so that said first shaping ratio is substantially equal to or less than one-half of "m(1)", where "m(1)" is any integer; and said second shaped oscillating signal has a second control pulse width, said second desired harmonic has a second desired period, the ratio of said second control pulse width to said second desired period is a second shaping ratio, and said second pulse shaping module shapes said second oscillating signal by regulating said second control pulse width so that said second shaping ratio is substantially equal to or less than one-half of "m(2)", where "m(2)" is any integer.

205. The apparatus of claim 204, wherein said first shaping ratio is substantially equal to or less than 0.5.

206. The apparatus of claim 204, wherein said second shaping ratio is substantially equal to or less than 0.5.

207. The apparatus of claim 204, wherein said second shaping ratio is substantially equal to said first shaping ratio.

208. The apparatus of claim 204, wherein said first shaping ratio is greater than 0.5.

209. The apparatus of claim 204, wherein said second shaping ratio is greater than 0.5.

210. The apparatus of claim 203, wherein one of said first plurality of harmonics of said first periodic signal is a desired harmonic, wherein:

said first shaped oscillating signal has a control pulse width, said desired harmonic has a desired period, the ratio of said control pulse width to said desired period is a shaping ratio, and said first pulse shaping module shapes said first oscillating signal by regulating said control pulse width so that said shaping ratio is substantially equal to or less than one-half of "m(1)", where "m(1)" is any integer.

211. The apparatus of claim 210, wherein said shaping ratio is substantially equal to or less than 0.5.

212. The apparatus of claim 210, wherein one of said second plurality of harmonics of said second periodic signal is a second desired harmonic, wherein:

said second shaped oscillating signal has a second control pulse width, said second desired harmonic has a second desired period, the ratio of said second control pulse width to said second desired period is a second shaping ratio;

said second pulse shaping module shapes said second oscillating signal by regulating said second control pulse width so that said second shaping ratio is substantially equal to or less than one-half of "m(2)", where "m(2)" is any integer; and wherein said second desired period is substantially equal to said desired period.

213. The apparatus of claim 212, wherein said second shaping ratio is substantially equal to or less than 0.5.

214. The apparatus of claim 203, wherein one of said combined plurality of harmonics of said combined periodic signal is a combined desired harmonic, wherein:

said first shaped oscillating signal has a first control pulse width, said combined desired harmonic has a combined desired period, the ratio of said first control pulse width to said combined desired period is a first shaping ratio, and said first pulse shaping module shapes said first oscillating signal by regulating said first control pulse width so that said first shaping ratio is substantially equal to or less than one-half of "m(1)", where "m(1)" is any integer; and said second shaped oscillating signal has a second control pulse width, the ratio of said second control pulse width to said combined desired period is a second shaping ratio, and said second pulse shaping module shapes said second oscillating signal by regulating said second control pulse width so that said second shaping ratio is substantially equal to or less than one-half of "m(2)", where "m(2)" is any integer.

215. The apparatus of claim 214, wherein said first shaping ratio is substantially equal to or less than 0.5.

216. The apparatus of claim 214, wherein said second shaping ratio is substantially equal to or less than 0.5.

217. The apparatus of claim 214, wherein said second shaping ratio is substantially equal to said first shaping ratio.

218. The apparatus of claim 203, wherein one of said first plurality of harmonics of said first periodic signal is a first desired harmonic, one of said second plurality of harmonics of said second periodic signal is a second desired harmonic, and one of said combined plurality of harmonics of said combined periodic signal is a combined desired harmonic, wherein:

said first shaped oscillating signal has a first control frequency, a first control pulse width, and a first control period, said first control period being the inverse of said first control frequency, said first desired harmonic has a first desired frequency and a first desired period, said first desired period being the inverse of said first desired frequency; wherein said first desired frequency is substantially equal to "n(1)" times said first control frequency, where "n(1)" is a first desired integer, the ratio of said first control pulse width to said first control period is a first control ratio, and said first pulse shaping module shapes said first oscillating signal by regulating said first control pulse width so that said first control ratio is substantially equal to or less than one-half of "m(1)" divided by "n(1)", where "m(1)" is any integer;

said second shaped oscillating signal has a second control frequency, a second control pulse width, and a second control period, said second control period being the inverse of said second control frequency, said second desired harmonic has a second desired frequency and a second desired period, said second desired period being the inverse of said second desired frequency; wherein said second desired frequency is substantially equal to "n(2)" times said second control frequency, where "n(2)" is a second desired integer, the ratio of said second control pulse width to said second control period is a second control ratio, and said second pulse shaping module shapes said second oscillating signal by regulating said second control pulse width so that said second control ratio is substantially equal to or less than one-half of "m(2)" divided by "n(2)", where "m(2)" is any integer.

219. The apparatus of claim 218, wherein said first control ratio is substantially equal to or less than 0.5.

220. The apparatus of claim 218, wherein said second control ratio is substantially equal to or less than 0.5.

221. The apparatus of claim 218, wherein said first control ratio is substantially equal to or less than 0.1.

222. The apparatus of claim 218, wherein said second control ratio is substantially equal to or less than 0.1.

223. The apparatus of claim 218, wherein said first control ratio is substantially equal to or less than 0.05.

224. The apparatus of claim 218, wherein said second control ratio is substantially equal to or less than 0.05.

225. The apparatus of claim 218, wherein said first control ratio is substantially equal to or less than 0.01.

226. The apparatus of claim 218, wherein said second control ratio is substantially equal to or less than 0.01.

227. The apparatus of claim 218, wherein said second control ratio is substantially equal to said first control ratio.

228. The apparatus of claim 218, wherein said first control ratio is greater than 0.5.

229. The apparatus of claim 218, wherein said second control ratio is greater than 0.5.

230. The apparatus of claim 203, wherein one of said first plurality of harmonics of said first periodic signal is a desired harmonic, wherein:

said first shaped oscillating signal has a control frequency, a control pulse width, and a control period, said control period being the inverse of said control frequency, said desired harmonic has a desired frequency and a desired period, said desired period being the inverse of said desired frequency; wherein said desired frequency is substantially equal to "n(1)" times said control frequency, where "n(1)" is a desired integer, the ratio of said control pulse width to said control period is a control ratio, and said first pulse shaping module shapes said first oscillating signal by regulating said control pulse width so that said control ratio is substantially equal to or less than one-half of "m(1)" divided by "n(1)", where "m(1)" is any integer.

231. The apparatus of claim 230, wherein said control ratio is substantially equal to or less than 0.5.

232. The apparatus of claim 230, wherein said control ratio is substantially equal to or less than 0.1.

233. The apparatus of claim 230, wherein said control ratio is substantially equal to or less than 0.05.

234. The apparatus of claim 230, wherein said control ratio is substantially equal to or less than 0.01.

235. The apparatus of claim 230, wherein one of said second plurality of harmonics of said second periodic signal is a second desired harmonic, wherein:

said second shaped oscillating signal has a second control frequency, a second control pulse width, and a second control period, said second control period being the inverse of said second control frequency, said second desired harmonic has a second desired frequency and a second desired period, said second desired period being the inverse of said second desired frequency; wherein said second desired frequency is substantially equal to "n(2)" times said second control frequency, where "n(2)" is a second desired integer, the ratio of said second control pulse width to said second control period is a second control ratio, and said second pulse shaping module shapes said second oscillating signal by regulating said second control pulse width so that said second control ratio is substantially equal to or less than one-half of "m(2)" divided by "n(2)", where "m(2)" is any integer; and wherein said second desired frequency is substantially equal to said desired frequency.

236. The apparatus of claim 235, wherein said second control ratio is substantially equal to or less than 0.5.

237. The apparatus of claim 235, wherein said second control ratio is substantially equal to or less than 0.1.

238. The apparatus of claim 235, wherein said second control ratio is substantially equal to or less than 0.05.

239. The apparatus of claim 235, wherein said second control ratio is substantially equal to or less than 0.01.

240. The apparatus of claim 203, wherein one of said combined plurality of harmonics of said combined periodic signal is a combined desired harmonic, wherein:

said first shaped oscillating signal has a first control frequency, a first control pulse width, and a first control period, said first control period being the inverse of said first control frequency, said combined desired harmonic has a combined desired frequency and a combined desired period, said combined desired period being the inverse of said combined desired frequency; wherein said combined desired frequency is substantially equal to "n(1)" times said first control frequency, where "n(1)" is a first combined desired integer, the ratio of said first control pulse width to said first control period is a first control ratio, and said first pulse shaping module shapes said first oscillating signal by regulating said first control pulse width so that said first control ratio is substantially equal to or less than one-half of "m(1)" divided by "n(1)", where "m(1)" is any integer;

said second shaped oscillating signal has a second control frequency, a second control pulse width, and a second control period, said second control period being the inverse of said second control frequency; wherein said combined desired frequency is substantially equal to "n(2)" times said second control frequency, where "n(2)" is a second combined desired integer, the ratio of said second control pulse width to said second control period is a second control ratio; and said second pulse shaping module shapes said second oscillating signal by regulating said second control pulse width so that said second control ratio is substantially equal to or less than one-half of "m(2)" divided by "n(2)", where "m(2)" is any integer.

241. The apparatus of claim 240, wherein said first control ratio is substantially equal to or less than 0.5.

242. The apparatus of claim 240, wherein said second control ratio is substantially equal to or less than 0.5.

243. The apparatus of claim 240, wherein said first control ratio is substantially equal to or less than 0.1.

244. The apparatus of claim 240, wherein said second control ratio is substantially equal to or less than 0.1.

245. The apparatus of claim 240, wherein said first control ratio is substantially equal to or less than 0.05.

246. The apparatus of claim 240, wherein said second control ratio is substantially equal to or less than 0.05.

247. The apparatus of claim 240, wherein said first control ratio is substantially equal to or less than 0.01.

248. The apparatus of claim 240, wherein said second control ratio is substantially equal to or less than 0.01.

249. The apparatus of claim 240, wherein said second control ratio is substantially equal to said first control ratio.

250. The apparatus of claim 18, wherein said first switch module is an electromechanical device.

251. The apparatus of claim 18, wherein said first switch module is an electronic device.

252. The apparatus of claim 251, wherein said electronic device is a semiconductor device.

253. The apparatus of claim 252, wherein said semiconductor device is a transistor.

254. The apparatus of claim 253, wherein said transistor is a field effect transistor.

255. The apparatus of claim 254, wherein said field effect transistor is a gallium arsenide field effect transistor.

256. The apparatus of claim 254, wherein said field effect transistor is a complementary metal oxide semiconductor field effect transistor.

257. The apparatus of claim 18, wherein said second switch module is an electromechanical device.

258. The apparatus of claim 18, wherein said second switch module is an electronic device.

259. The apparatus of claim 258, wherein said electronic device is a semiconductor device.

260. The apparatus of claim 259, wherein said semiconductor device is a transistor.

261. The apparatus of claim 260, wherein said transistor is a field effect transistor.

262. The apparatus of claim 261, wherein said field effect transistor is a gallium arsenide field effect transistor.

263. The apparatus of claim 261, wherein said field effect transistor is a complementary metal oxide semiconductor field effect transistor.

264. The apparatus of claim 18, wherein said first plurality of harmonics are harmonics of the fundamental frequency of said first periodic signal and said second plurality of harmonics are harmonics of the fundamental frequency of said second periodic signal.

265. The apparatus of claim 18, wherein:

said first switch module accepts a first control signal, said first control signal being a function of said first oscillating signal, wherein said first control signal causes said first switch module to gate said first bias signal, said first control signal having a first control frequency, "F(control);"

said second switch module accepts a second control signal, said second control signal being a function of said second oscillating signal, wherein said second control signal causes said second switch module to gate said second bias signal, said second control signal having a second control frequency substantially equal to said first control frequency, "F(control);"

wherein said combined periodic signal has a combined periodic signal pulse width, "PW(periodic signal, combined)," and a combined periodic signal amplitude, "A(periodic signal,combined);" wherein one of said combined plurality of harmonics is a desired harmonic, said desired harmonic having a desired frequency, "F(desired)," and a desired amplitude, "A(desired);"

whereby the ratio of "A(desired)" to "A(periodic signal, combined)" is substantially equal to:

$$\{[2 \cdot F(\text{control})]/[\pi \cdot F(\text{desired})]\} \cdot \{\sin[\pi \cdot F(\text{desired}) \cdot PW(\text{periodic signal,combined})]\}.$$

266. The apparatus of claim 18, wherein:

said first switch module accepts a first control signal, said first control signal being a function of said first oscillating signal, wherein said first control signal causes said first switch module to gate said first bias signal, said first control signal having a first control frequency, said first control frequency being a gating frequency, "F(gating)," a first control period, said first control period being a gating period, "T(gating)," and a first control pulse width, "PW(control,1)," said first control period being the inverse of said first control frequency;

said second switch module accepts a second control signal, said second control signal being a function of said second oscillating signal, wherein said second control signal causes said second switch module to gate said second bias signal, said second control signal having a second control frequency substantially equal to said gating frequency, "F(gating)," a second control period substantially equal to said gating period, "T(gating)," and a second control pulse width, "PW (control,2)," said second control period being the inverse of said second control frequency;

wherein said combined periodic signal has a combined periodic signal frequency, "F(periodic signal, combined)," a combined periodic signal period, "T(periodic signal,combined)," a combined periodic signal pulse width, "PW(periodic signal,combined)," and a combined periodic signal amplitude, "A(periodic signal,combined)," said combined periodic signal period being the inverse of said combined periodic signal frequency;

wherein one of said combined plurality of harmonics is a desired harmonic, said desired harmonic having a desired frequency, "F(desired)," a desired period, "T(desired)," and a desired amplitude, "A(desired)," said desired period being the inverse of said desired frequency; wherein said desired frequency is substantially equal to "n" times said gating frequency, where "n" is a desired integer, wherein the ratio of said desired amplitude to said combined periodic signal amplitude is an amplitude ratio, "AR;"

whereby:

$$AR=[2/(\pi \cdot n)] \cdot \sin\{\pi \cdot n \cdot [PW(\text{periodic signal,combined})/T(\text{gating})]\}.$$

267. The apparatus of claim 18, wherein said filter is centered at a frequency other than the frequency of said first oscillating signal or said second oscillating signal.

268. The apparatus of claim 18, wherein said first plurality of harmonics has a first harmonic content, and wherein the characteristics of said first switch module determine said first harmonic content; and said second plurality of harmonics has a second harmonic content, and wherein the characteristics of said second switch module determine said second harmonic content.

269. The apparatus of claim 18, wherein said first oscillating signal is a first modulated oscillating signal and said second oscillating signal is a second modulated oscillating signal;

said first plurality of harmonics has a first harmonic content, and wherein the characteristics of said first switch module determine said first harmonic content;

said second plurality of harmonics has a second harmonic content, and wherein the characteristics of said second switch module determine said second harmonic content; and said filter is centered at a frequency other than the frequency of said first oscillating signal or said second oscillating signal.

270. The apparatus of claim 18, wherein said first information signal is a first digital information signal, and said second information signal is a second digital information signal, said first digital information signal being comprised of a plurality of discrete states, and said second digital information signal being comprised of a plurality of discrete states;

said first plurality of harmonics has a first harmonic content, and wherein the characteristics of said first switch module determine said first harmonic content;

said second plurality of harmonics has a second harmonic content, and wherein the characteristics of said second switch module determine said second harmonic content; and said filter is centered at a frequency other than the frequency of said first oscillating signal or said second oscillating signal.

271. The apparatus of claim 21, wherein one of said one or more desired harmonics is a preferred harmonic, wherein:

said shaped string of pulses has a control pulse width, said preferred harmonic has a preferred period, the ratio of said control pulse width to said preferred period is a shaping ratio, and said pulse shaping module shapes said shaped string of pulses by regulating said control pulse width so that said shaping ratio is substantially equal to or less than one-half of "m", where "m" is any integer.

272. The apparatus of claim 271 herein said shaping ratio is substantially equal to or less than 0.5.

273. The apparatus of claim 271 herein said shaping ratio is greater than 0.5.

274. The apparatus of claim 21, wherein one of said one or more desired harmonics is a preferred harmonic, wherein:

said shaped string of pulses has a control frequency, a control pulse width, and a control period, said control period being the inverse of said control frequency, said preferred harmonic has a preferred frequency and a preferred period, said preferred period being the inverse of said preferred frequency; wherein said preferred frequency is substantially equal to "n" times said control frequency, where "n" is a desired integer, the ratio of said control pulse width to said control period is a control ratio, and said pulse shaping module shapes said shaped string of pulses by regulating said control pulse width so that said control ratio is substantially equal to or less than one-half of "m" divided by "n", where "m" is any integer.

275. The apparatus of claim 274, wherein said control ratio is substantially equal to or less than 0.5.

276. The apparatus of claim 274, wherein said control ratio is substantially equal to or less than 0.1.

277. The apparatus of claim 274, wherein said control ratio is substantially equal to or less than 0.05.

278. The apparatus of claim 274, wherein said control ratio is substantially equal to or less than 0.01.

279. The apparatus of claim 274, wherein said control ratio is greater than 0.5.

280. The apparatus of claim 21, wherein said information signal is a digital information signal.

281. The apparatus of claim 21, wherein said information signal is an analog information signal.

282. The apparatus of claim 21, wherein said switch module is an electromechanical device.

283. The apparatus of claim 21, wherein said switch module is an electronic device.

284. The apparatus of claim 283, wherein said electronic device is a semiconductor device.

285. The apparatus of claim 284, wherein said semiconductor device is a transistor.

286. The apparatus of claim 285, wherein said transistor is a field effect transistor.

287. The apparatus of claim 286, wherein said field effect transistor is a gallium arsenide field effect transistor.

288. The apparatus of claim 286, wherein said field effect transistor is a complementary metal oxide semiconductor field effect transistor.

289. The apparatus of claim 21, wherein said plurality of harmonics are harmonics of the fundamental frequency of said periodic signal.

290. The apparatus of claim 21, wherein:

said shaped string of pulses has a control frequency, "F(control);" wherein said periodic signal has a periodic signal pulse width, "PW(periodic signal)," and a periodic signal amplitude, "A(periodic signal)," said periodic signal amplitude being a function of said bias signal; wherein one of said one or more desired harmonics is a preferred harmonic, said preferred harmonic having a preferred frequency, "F(preferred)," and a preferred amplitude, "A(preferred);"

whereby the ratio of "A(preferred)" to "A(periodic signal)" is substantially equal to:

$$\{[2 \cdot F(control)]/[\pi \cdot F(preferred)]\} \cdot \{\sin[\pi \cdot F(preferred) \cdot PW(periodic\ signal)]\}.$$

291. The apparatus of claim 21, wherein:

said switch module accepts a control signal, said control signal being a function of said oscillating signal, wherein said control signal causes said switch module to gate said bias signal, said control signal having a control frequency, "F(control)," a control period, "T(control)," and a control pulse width, "PW(control)," said control period being the inverse of said control frequency; wherein said periodic signal has a periodic signal frequency, "F(periodic signal)," a periodic signal period, "T(periodic signal)," a periodic signal pulse width, "PW(periodic signal)," and a periodic signal amplitude, "A(periodic signal)," said periodic signal period being the inverse of said periodic signal frequency and said periodic signal amplitude being a function of said bias signal; wherein one of said one or more desired harmonics is a preferred harmonic, said preferred harmonic having a preferred frequency, "F(preferred)," a preferred period, "T(preferred)," and a preferred amplitude, "A(preferred)," said preferred period being the inverse of said preferred frequency; wherein said preferred frequency is substantially equal to "n" times said control frequency, where "n" is a preferred integer, wherein the ratio of said preferred amplitude to said periodic signal amplitude is an amplitude ratio, "AR;"

whereby:

$$AR = [2/(\pi \cdot n)] \cdot \sin\{\pi \cdot n \cdot [PW(periodic\ signal)/T(control)]\}.$$

292. The apparatus of claim 21, wherein said filter is centered at a frequency other than the frequency of said oscillating signal.

293. The apparatus of claim 21, wherein said plurality of harmonics has a harmonic content, and wherein the characteristics of said switch module determine said harmonic content.

294. The apparatus of claim 21, wherein
said plurality of harmonics has a harmonic content, and wherein the characteristics of said switch module determine said harmonic content;
said filter is centered at a frequency other than the frequency of said oscillating signal; and wherein
said shaped string of pulses has a control frequency, "F(control);" wherein said periodic signal has a periodic signal pulse width, "PW(periodic signal)," and a periodic signal amplitude, "A(periodic signal)," said periodic signal amplitude being a function of said bias signal; wherein one of said one or more desired harmonics is a preferred harmonic, said preferred harmonic having a preferred frequency, "F(preferred)," and a preferred amplitude, "A(preferred);"
whereby the ratio of "A(preferred)" to "A(periodic signal)" is substantially equal to:

$$\{[2 \cdot F(control)]/[\pi \cdot F(preferred)]\} \cdot \{sin[n \cdot F(preferred) \cdot PW(periodic\ signal)]\}.$$

295. The apparatus of claim 23, wherein one of said one or more desired harmonics is a preferred harmonic, wherein:
said string of pulses has a control pulse width, said preferred harmonic has a preferred period, the ratio of said control pulse width to said preferred period is a shaping ratio, and
said pulse shaper shapes said string of pulses by regulating said control pulse width so that said shaping ratio is substantially equal to or less than one-half of "m", where "m" is any integer.

296. The apparatus of claim 295, wherein said shaping ratio is substantially equal to or less than 0.5.

297. The apparatus of claim 295, wherein said shaping ratio is greater than 0.5.

298. The apparatus of claim 24, wherein one of said one or more desired harmonics is a preferred harmonic, wherein:
said string of pulses has a control frequency, a control pulse width, and a control period, said control period being the inverse of said control frequency, said preferred harmonic has a preferred frequency and a preferred period, said preferred period being the inverse of said preferred frequency; wherein said preferred frequency is substantially equal to "n" times said control frequency, where "n" is a desired integer, the ratio of said control pulse width to said control period is a control ratio, and
said pulse shaper shapes said string of pulses by regulating said control pulse width so that said control ratio is substantially equal to or less than one-half of "m" divided by "n", where "m" is any integer.

299. The apparatus of claim 298, wherein said control ratio is substantially equal to or less than 0.5.

300. The apparatus of claim 298, wherein said control ratio is substantially equal to or less than 0.1.

301. The apparatus of claim 298, wherein said control ratio is substantially equal to or less than 0.05.

302. The apparatus of claim 298, wherein said control ratio is substantially equal to or less than 0.01.

303. The apparatus of claim 298, wherein said control ratio is greater than 0.5.

304. The apparatus of claim 22, wherein said oscillating signal is a modulated digital information signal.

305. The apparatus of claim 22, wherein said oscillating signal is a modulated analog information signal.

306. The apparatus of claim 22, further comprising a frequency modulator.

307. The apparatus of claim 22, further comprising a phase modulator.

308. The apparatus of claim 22, wherein said switch module is an electromechanical device.

309. The apparatus of claim 22, wherein said switch module is an electronic device.

310. The apparatus of claim 309, wherein said electronic device is a semiconductor device.

311. The apparatus of claim 310, wherein said semiconductor device is a transistor.

312. The apparatus of claim 311, wherein said transistor is a field effect transistor.

313. The apparatus of claim 312, wherein said field effect transistor is a gallium arsenide field effect transistor.

314. The apparatus of claim 312, wherein said field effect transistor is a complementary metal oxide semiconductor field effect transistor.

315. The apparatus of claim 22, wherein said plurality of harmonics are harmonics of the fundamental frequency of said periodic signal.

316. The apparatus of claim 22, wherein:
said control signal has a control frequency, "F(control);" wherein said periodic signal has a periodic signal pulse width, "PW(periodic signal)," and a periodic signal amplitude, "A(periodic signal)," said periodic signal amplitude being a function of said bias signal; wherein one of said one or more desired harmonics is a preferred harmonic, said preferred harmonic having a preferred frequency, "F(preferred)," and a preferred amplitude, "A(preferred);"
whereby the ratio of "A(preferred)" to "A(periodic signal)" is substantially equal to:

$$\{[2 \cdot F(control)]/[\pi \cdot F(preferred)]\} \cdot \{sin[\pi \cdot F(preferred) \cdot PW(periodic\ signal)]\}.$$

317. The apparatus of claim 22, wherein:
said control signal has a control frequency, "F(control)," a control period, "T(control)," and a control pulse width, "PW(control)," said control period being the inverse of said control frequency; wherein said periodic signal has a periodic signal frequency, "F(periodic signal)," a periodic signal period, "T(periodic signal)," a periodic signal pulse width, "PW(periodic signal)," and a periodic signal amplitude, "A(periodic signal)," said periodic signal period being the inverse of said periodic signal frequency and said periodic signal amplitude being a function of said bias signal; wherein one of said one or more desired harmonics is a preferred harmonic, said preferred harmonic having a preferred frequency, "F(preferred)," a preferred period, "T(preferred)," and a preferred amplitude, "A(preferred)," said preferred period being the inverse of said preferred frequency; wherein said preferred frequency is substantially equal to "n" times said control frequency, where "n" is a preferred integer, wherein the ratio of said preferred amplitude to said periodic signal amplitude is an amplitude ratio, "AR;"
whereby:

$$AR=[2/(\pi \cdot n)] \cdot sin\{\pi \cdot n \cdot [PW(periodic\ signal)/T(control)]\}.$$

318. The apparatus of claim 22, wherein said filter is centered on a frequency other than the frequency of said oscillating signal.

319. The apparatus of claim 22, wherein
said plurality of harmonics has a harmonic content, and wherein the characteristics of said switch module determine said harmonic content.

320. The apparatus of claim 22, wherein
said plurality of harmonics has a harmonic content, and wherein the characteristics of said switch module determine said harmonic content; and
said filter is centered on a frequency other than the frequency of said oscillating signal.

321. The apparatus of claim 24, wherein said storage device is a capacitor.

322. The apparatus of claim 24, wherein said storage device is an inductor.

323. The apparatus of claim 24, wherein said receiving subsystem receives said electromagnetic signal via a communication medium.

324. The apparatus of claim 323, wherein said communication medium comprises a wired medium.

325. The apparatus of claim 323, wherein said communication medium comprises a wireless medium.

326. The apparatus of claim 24, wherein said electromagnetic signal is an unmodulated signal.

327. The apparatus of claim 24, wherein said electromagnetic signal is a modulated signal.

328. The apparatus of claim 327, wherein said electromagnetic signal is an amplitude modulated signal.

329. The apparatus of claim 327, wherein said electromagnetic signal is a frequency modulated signal.

330. The apparatus of claim 327, wherein said electromagnetic signal is a phase modulated signal.

331. The apparatus of claim 24, wherein:
said signal generator generates an energy transfer signal comprising a string of pulses, said string of pulses controlling opening and closing of a switch to transfer energy from said electromagnetic signal.

332. The apparatus of claim 24, wherein each pulse in said string of pulses has an aperture that increases the time that said switch is closed thereby reducing an impedance of said switch.

333. The apparatus of claim 331, wherein each pulse in said string of pulses has an aperture that is widened by a non-negligible amount that tends away from zero time in duration to extend the time that said switch is closed thereby of increasing energy transferred from said electromagnetic signal.

334. The apparatus of claim 331, wherein said apertures of said pulses are a non-zero fraction of a period of said electromagnetic signal.

335. The apparatus of claim 333, wherein said apertures of said pulses are one or more periods of said electromagnetic signal plus or minus a non-zero fraction of a period of said electromagnetic signal.

336. The apparatus of claim 313, wherein energy transferred from said electromagnetic signal is sufficient to drive loads without additional buffering or amplification, including high impedance loads and low impedance loads.

337. The apparatus of claim 333, wherein widening of said apertures of said pulses by a non-negligible amount that tends away from zero time in duration to extend the time that said switch is closed to increase energy transferred from said electromagnetic signal prevents substantial voltage reproduction of said electromagnetic signal during said apertures.

338. The apparatus of claim 331, wherein an impedance of said switch is matched to a source impedance to increase energy transferred from said electromagnetic signal.

339. The apparatus of claim 331, wherein an impedance of said switch is matched to a load impedance to increase energy transferred from said electromagnetic signal.

340. The apparatus of claim 24, wherein said electromagnetic signal is connected to said switch via a resonant circuit, said resonant circuit storing energy from components of said electromagnetic signal while said switch is open, and wherein energy stored in said resonant circuit is discharged via said switch while said switch is closed, to thereby increase energy transfer from said electromagnetic signal.

341. The apparatus of claim 340, wherein said resonant circuit is configured to appear as high impedance to a first range of frequencies including a frequency of said electromagnetic signal, and configured to appear as a low impedance to a second range of frequencies including a frequency of said output signal, such that passage of components of said electromagnetic signal in said first range of frequencies is impeded through said resonant circuit, and such that passage of components of said electromagnetic signal in said second range of frequencies is not so impeded through said resonant circuit.

342. The apparatus of claim 24, wherein:
said signal generator generates an energy transfer signal comprising a string of pulses, said string of pulses controlling opening and closing of a switch to transfer energy from said electromagnetic signal;
each pulse in said string of pulses has an aperture that increases the time that said switch is closed for a purpose of reducing an impedance of said switch;
each pulse in said string of pulses has an aperture that is widened by a non-negligible amount that tends away from zero time in duration to extend the time that said switch is closed for a purpose of increasing energy transferred from said electromagnetic signal;
said apertures of said pulses are one of (a) or (b)
(a) a non-zero fraction of a period of said electromagnetic signal;
(b) one or more periods of said electromagnetic signal plus or minus a non-zero fraction of a period of said electromagnetic signal;
energy transferred from said electromagnetic signal is sufficient to drive loads without additional buffering or amplification, including high impedance loads and low impedance loads;
widening of said apertures of said pulses by a non-negligible amount that tends away from zero time in duration to extend the time that said switch is closed to increase energy transferred from said electromagnetic signal prevents substantial voltage reproduction of said electromagnetic signal during said apertures.

343. The apparatus of claim 342, wherein an impedance of said switch is matched to a to a source impedance to increase energy transferred from said electromagnetic signal.

344. The apparatus of claim 342, wherein an impedance of said switch is matched to a load impedance to increase energy transferred from said electromagnetic signal.

345. The apparatus of claim 342, wherein said electromagnetic signal is connected to said switch via a resonant circuit, said resonant circuit storing energy from components of said electromagnetic signal while said switch is open, and wherein energy stored in said resonant circuit is discharged via said switch while said switch is closed, to thereby increase energy transfer from said electromagnetic signal.

346. The apparatus of claim 342, wherein said resonant circuit is configured to appear as high impedance to a first range of frequencies including a frequency of said electromagnetic signal, and configured to appear as a low impedance to a second range of frequencies including a frequency of said output signal, such that passage of components of said electromagnetic signal in said first range of frequencies is impeded through said resonant circuit, and such that passage of components of said electromagnetic signal in said second range of frequencies is not so impeded through said resonant circuit.

347. The apparatus of claim 24, wherein said storage device is a capacitive device, wherein:
said capacitive device has a capacitance, a first charged state, a second charged state, and a discharge rate;
said first charged state corresponds to a charge on said capacitive device at the end of each pulse in said plurality of pulses;
said second charged state corresponds to a charge on said capacitive device at the beginning of a subsequent pulse in said plurality of pulses;
said discharge rate is a function of said capacitance of said capacitive device, said discharge rate being a rate at which said first charged state changes to said second charged state; and
a ratio of said second charged state to said first charged state is a charged ratio.

348. The apparatus of claim 347, wherein said capacitance of said capacitive device is such that said discharge rate results in said charged ratio being small.

349. The method of claim 25, wherein said string of pulses has a control pulse width, wherein said desired harmonic has a desired period, wherein the ratio of the control pulse width to the desired period is a shaping ratio, and wherein step (1) further comprises the step of:
regulating the control pulse width so that the shaping ratio is substantially equal to or less than one-half of "m", where "m" is any integer.

350. The method of claim 349, wherein the regulating step comprises:
regulating the control pulse width so that the shaping ratio is substantially equal to or less than 0.5.

351. The method of claim 349, wherein said shaping ratio is greater than 0.5.

352. The method of claim 349, wherein "m" is any odd integer.

353. The method of claim 25, wherein said string of pulses has a control frequency, a control pulse width, and a control period, said control period being the inverse of said control frequency; wherein said desired harmonic has a desired frequency and a desired period, said desired period being the inverse of said desired frequency; wherein said desired frequency is substantially equal to "n" times said control frequency, where "n" is a desired integer; wherein the ratio of said control pulse width to said control period is a control ratio; and wherein step (1) further comprises the step of:
regulating the control pulse width so that the control ratio is substantially equal to or less than one-half of "m" divided by "n", where "m" is any integer.

354. The method of claim 353, wherein the regulating step comprises:
regulating the control pulse width so that the control ratio is substantially equal to or less than 0.5.

355. The method of claim 353, wherein the regulating step comprises:
regulating the control pulse width so that the control ratio is substantially equal to or less than 0.1.

356. The method of claim 353, wherein the regulating step comprises:
regulating the control pulse width so that the control ratio is substantially equal to or less than 0.05.

357. The method of claim 353, wherein the regulating step comprises:
regulating the control pulse width so that the control ratio is substantially equal to or less than 0.01.

358. The method of claim 353, wherein said control ratio is greater than 0.5.

359. The method of claim 353, wherein "m" is any odd integer.

360. The method of claim 25, wherein step (2) comprises:
gating a reference signal at a rate that is a function of said string of pulses to create a periodic signal having a plurality of harmonics, said reference signal being a function of an analog information signal, and at least one of said plurality of harmonics being a desired harmonic.

361. The method of claim 25, wherein step (2) comprises:
gating a reference signal at a rate that is a function of said string of pulses to create a periodic signal having a plurality of harmonics, said reference signal being a function of a digital information signal, and at least one of said plurality of harmonics being a desired harmonic.

362. The method of claim 25, wherein said gating step is performed by an electromechanical device.

363. The method of claim 25, wherein said gating step is performed by an electronic device.

364. The method of claim 363, wherein said electronic device is a semiconductor device.

365. The method of claim 364, wherein said semiconductor device is a transistor.

366. The method of claim 365, wherein said transistor is a field effect transistor.

367. The method of claim 366, wherein said field effect transistor is a gallium arsenide field effect transistor.

368. The method of claim 366, wherein said field effect transistor is a complementary metal oxide semiconductor field effect transistor.

369. The method of claim 25, wherein said plurality of harmonics are harmonics of the fundamental frequency of said periodic signal.

370. The method of claim 25, wherein:
said reference signal is gated at a rate that is a function of a control signal, said control signal having a control frequency, wherein said periodic signal has a periodic signal pulse width, "PW(periodic signal)," and a periodic signal amplitude, "A(periodic signal)," said periodic signal amplitude being a function of said reference signal; wherein said desired harmonic has a desired frequency, "F(desired)," and a desired amplitude, "A(desired);"
whereby the ratio of "A(desired)" to "A(periodic signal)" is substantially equal to:

$$\{[2 \cdot F(\text{control})]/[\pi \cdot F(\text{desired})]\} \cdot \{\sin[\pi \cdot F(\text{desired}) \cdot PW(\text{periodic signal})]\}.$$

371. The method of claim 25, wherein:
said reference signal is gated at a rate that is a function of a control signal, said control signal having a control frequency, "F(control)," a control period, "T(control)," and a control pulse width, "PW(control)," said control period being the inverse of said control frequency; wherein said periodic signal has a periodic signal frequency, "F(periodic signal)," a periodic signal period, "T(periodic signal)," a periodic signal pulse width, "PW(periodic signal)," and a periodic signal amplitude, "A(periodic signal)," said periodic signal period being the inverse of said periodic signal frequency and said periodic signal amplitude being a function of said reference signal; wherein said desired harmonic has a desired frequency, "F(desired)," a desired period, "T(desired)," and a desired amplitude, "A(desired)," said desired period being the inverse of said desired frequency; wherein said desired frequency is substantially equal to "n" times said control frequency, where "n" is a desired integer, wherein the ratio of said desired amplitude to said periodic signal amplitude is an amplitude ratio, "AR;" whereby:

$$AR = [2/(\pi \cdot n)] \cdot \sin\{\pi \cdot n \cdot [PW(\text{periodic signal})/T(\text{control})]\}.$$

372. The method of claim 25, further comprising the step of filtering said periodic signal with a filter, said filter being centered at a frequency other than the frequency of said oscillating signal.

373. The method of claim 25, wherein said plurality of harmonics has a harmonic content, and wherein the characteristics of said gating determine said harmonic content.

374. The method of claim 26, wherein said plurality of harmonics has a harmonic content, and wherein the characteristics of said gating determine said harmonic content; and further comprising the step of filtering said periodic signal with a filter, said filter being centered at a frequency other than the frequency of said oscillating signal.

\* \* \* \* \*

UNITED STATES PATENT AND TRADEMARK OFFICE
CERTIFICATE OF CORRECTION

PATENT NO. : 6,091,940
DATED : July 18, 2000
INVENTOR(S) : Sorrells et al.

It is certified that error appears in the above-identified patent and that said Letters Patent is hereby corrected as shown below:

Title page,
Item [56], References Cited, U.S. PATENT DOCUMENTS, "3-39632" should be replaced with -- 2-39632 --.

Column 1,
Line 12, please replace "09/170,002" with -- 09/176,022 --.

Column 67,
Line 45, please replace "signal wherein" with -- signal, wherein --.

Column 68,
Line 31, please replace "said signal" with -- said control signal --.

Column 71,
Line 13, please replace "35" with -- 34 --.

Column 77,
Line 30, please replace "wherein semiconductor" with -- wherein said semiconductor --.
Lines 58-59, please replace "sin[π·(desired)" with -- sin[π·F(desired) --.

Column 83,
Line 56, please replace "wherein semiconductor" with -- wherein said semiconductor --.

Column 91,
Lines 31 and 33, please replace "herein" with -- wherein --.

Column 93,
Line 19, please replace "sin[n·F" with -- sin[π·F --.

Column 95,
Line 33, please replace "24" with -- 331 --.

Column 96,
Line 48, please replace "to a to a source" with -- to a source --.

Column 98,
Line 45, please replace "frequency, wherein" with -- frequency, F(control); wherein --.

UNITED STATES PATENT AND TRADEMARK OFFICE
CERTIFICATE OF CORRECTION

PATENT NO.    : 6,091,940
DATED         : July 18, 2000
INVENTOR(S)   : Sorrells et al.

It is certified that error appears in the above-identified patent and that said Letters Patent is hereby corrected as shown below:

Column 100,
Line 8, please replace "26" with -- 25 --.

Signed and Sealed this

Fourth Day of November, 2003

JAMES E. ROGAN
*Director of the United States Patent and Trademark Office*